US009223219B2

(12) United States Patent
Enomoto et al.

(10) Patent No.: US 9,223,219 B2
(45) Date of Patent: Dec. 29, 2015

(54) PATTERN FORMING METHOD, ACTINIC RAY-SENSITIVE OR RADIATION-SENSITIVE RESIN COMPOSITION AND RESIST FILM

(75) Inventors: Yuichiro Enomoto, Shizuoka (JP); Shinji Tarutani, Shizuoka (JP); Sou Kamimura, Shizuoka (JP); Kaoru Iwato, Shizuoka (JP); Keita Kato, Shizuoka (JP); Akinori Shibuya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 348 days.

(21) Appl. No.: 13/521,164

(22) PCT Filed: Jan. 7, 2011

(86) PCT No.: PCT/JP2011/050597
§ 371 (c)(1), (2), (4) Date: Jul. 9, 2012

(87) PCT Pub. No.: WO2011/083872
PCT Pub. Date: Jul. 14, 2011

(65) Prior Publication Data

US 2012/0282548 A1 Nov. 8, 2012

(30) Foreign Application Priority Data

Jan. 8, 2010 (JP) ................................ 2010-003386
Mar. 30, 2010 (JP) ................................ 2010-077431
Nov. 24, 2010 (JP) ................................ 2010-261576

(51) Int. Cl.
*G03F 7/30* (2006.01)
*G03F 7/038* (2006.01)
*G03F 7/20* (2006.01)
*G03F 7/32* (2006.01)
*G03F 7/004* (2006.01)
*G03F 7/039* (2006.01)
*G03F 7/075* (2006.01)

(52) U.S. Cl.
CPC .............. *G03F 7/325* (2013.01); *G03F 7/0045* (2013.01); *G03F 7/0046* (2013.01); *G03F 7/0382* (2013.01); *G03F 7/0397* (2013.01); *G03F 7/2041* (2013.01); *G03F 7/0758* (2013.01)

(58) Field of Classification Search
None
See application file for complete search history.

(56) References Cited

U.S. PATENT DOCUMENTS 4,491,628 A * 1/1985 Ito et al. ........................ 430/176
2004/0253537 A1 12/2004 Rushkin et al.
2007/0087287 A1 * 4/2007 Watanabe et al. .......... 430/270.1
2008/0241736 A1 10/2008 Kobayashi et al.
2008/0318171 A1 12/2008 Tsubaki
2009/0011365 A1 1/2009 Kobayashi et al.
2009/0011366 A1 1/2009 Tsubaki et al.
2009/0170026 A1 7/2009 Sugiyama et al.
2009/0286182 A1 11/2009 Harada et al.
2011/0033803 A1 2/2011 Hatakeyama et al.
2011/0236826 A1 9/2011 Hatakeyama et al.
2013/0209936 A1 8/2013 Hatakeyama et al.

FOREIGN PATENT DOCUMENTS

EP 1 795 960 A2 6/2007
EP 2003504 A2 12/2008
JP 2000122295 A 4/2000
JP 2000206694 A 7/2000
JP 2006131739 A 5/2006
JP 2006195050 A 7/2006
JP 2006259582 A 9/2006
JP 2006276657 A 10/2006
JP 2006317803 A 11/2006
JP 2007114613 A 5/2007
JP 2008203639 A 9/2008
JP 2008239918 A 10/2008
JP 2008241870 A 10/2008
JP 2008281974 A 11/2008
JP 2008281975 A 11/2008
JP 2008292975 A 12/2008
JP 2009-031767 A 2/2009
JP 2009175651 A 8/2009
JP 2011-053666 A 3/2011
JP 2011-221513 A 11/2011
TW 200910024 A 3/2009

(Continued)

OTHER PUBLICATIONS

English translation of JP 2008-241870, A (2008) from machine translation from AIPN Japan Patent Office National Center for Industrial Property Information and Training, generated Jun. 12, 2013, 41 pages.*

(Continued)

*Primary Examiner* — Cynthia Hamilton
(74) *Attorney, Agent, or Firm* — Sughrue Mion, PLLC

(57) ABSTRACT

Provided is a pattern forming method comprising (i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises (A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid.

36 Claims, No Drawings

(56) References Cited

FOREIGN PATENT DOCUMENTS

| | | | |
|---|---|---|---|
| WO | 2009096941 | A1 | 8/2009 |
| WO | 2011/037246 | A1 | 3/2011 |

OTHER PUBLICATIONS

English translation of JP 2006-276657, A (2006) from machine translation from AIPN Japan Patent Office National Center for Industrial Property Information and Training, generated Apr. 6, 2014.52 pages plus 9 pages.*

Omnova solutions "PolyFoxTM pf-636, PF-656, PF-6320 & PF-6520" 3 pages downloaded from www.omnova.com on Sep. 8, 2014 with a copyright date of Jun. 2011.*

Office Action dated Dec. 4, 2012 in Japanese Application No. 2010-003386.

Office Action dated Nov. 27, 2013 issued by the Intellectual Property Office of Singapore in counterpart Singapore Patent Application No. 201204944-1.

Extended European Search Report, dated Sep. 23, 2013, issued by the European Patent Office in counterpart European Application No. 11731870.9.

Lutz, Walter et al, "Darstellung und Reaktionen des Trifluormethylisocyanats," Anorganisch-Chemisches Institut der Universitat Heidelberg, Chem. Ber. 112, pp. 2158-2166. 1979.

Office Action dated May 7, 2013 from the Japanese Patent Office in counterpart Japanese Application No. 2010-003386.

International Search Report dated Mar. 22, 2011 in counterpart international application No. PCT/JP2011/050597.

Written Opinion dated Mar. 22, 2011 in counterpart international application No. PCT/JP2011/050597.

Office Action issued Feb. 4, 2014 by the Japanese Patent Office in corresponding Japanese Application No. 2011-002060.

Communication dated Aug. 12, 2014 issued by the Japanese Patent Office in counterpart Japanese Patent Application No. 2013-005419.

Office Action dated Jun. 25, 2015, issued by the Taiwanese Patent Office in counterpart Taiwanese Patent Application No. 100100660.

* cited by examiner

PATTERN FORMING METHOD, ACTINIC RAY-SENSITIVE OR RADIATION-SENSITIVE RESIN COMPOSITION AND RESIST FILM

TECHNICAL FIELD

The present invention relates to a pattern forming method applicable to the process of producing a semiconductor such as IC or the production of a liquid crystal device or a circuit board such as thermal head and further to the lithography in other photo-fabrication processes, an actinic ray-sensitive or radiation-sensitive resin composition used in the pattern forming method, and a resist film. More specifically, the present invention relates to a pattern forming method suitable for exposure by an ArF exposure apparatus, an ArF immersion-type projection exposure apparatus or an EUV exposure apparatus each using a light source that emits far ultraviolet light at a wavelength of 300 nm or less, an actinic ray-sensitive or radiation-sensitive resin composition used in the pattern forming method, and a resist film.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure with excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, and an aqueous alkali developer of 2.38 mass % TMAH (an aqueous tetramethylammonium hydroxide solution) is being used for general purposes.

Also, due to miniaturization of a semiconductor device, the trend is moving into a shorter wavelength of the exposure light source and a higher numerical aperture (higher NA) of the projection lens, and an exposure machine using an ArF excimer laser with a wavelength of 193 nm as a light source has been developed at present. Furthermore, for example, a so-called immersion method of filling a high refractive-index liquid (hereinafter sometimes referred to as an "immersion liquid") between the projection lens and the sample, and an EUV lithography of performing the exposure to ultraviolet light at a shorter wavelength (13.5 nm) have been heretofore proposed as a technique for raising the resolution.

However, it is actually very difficult to find out an appropriate combination of a resist composition, a developer, a rinsing solution and the like necessary for forming a pattern with overall good performance, and more improvements are being demanded. In particular, the resolved line width of the resist becomes finer, and this requires to improve the line edge roughness performance of a line pattern and improve the in-plane uniformity of a pattern dimension.

Under these circumstances, various configurations have been recently proposed as the positive resist composition (see, for example, JP-A-2008-203639 (the term "JP-A" as used herein means an "unexamined published Japanese patent application"), JP-A-2007-114613, JP-A-2006-131739, and JP-A-2000-122295). On the other hand, as well as a positive resist composition predominating at present, a negative chemical amplification resist composition for pattern formation by alkali development is also being studied (see, for example, JP-A-2006-317803, JP-A-2006-259582, JP-A-2006-195050, and JP-A-2000-206694). Because, in the production of a semiconductor device or the like, patterns having various profiles such as line, trench and hole need to be formed and some patterns are difficult to form by the current positive resist.

In recent years, a pattern forming method using a negative developer, that is, an organic solvent-containing developer, is also being developed (see, for example, JP-A-2008-281974, JP-A-2008-281975, and JP-A-2008-292975).

In the pattern formation by alkali development using the conventional negative resist, it is demanded to more improve the line width variation (LWR), focus latitude (DOF) and other various performances, which are presumed to be ascribable mainly to swelling at the development.

A double developing technique as a double patterning technology for further raising the resolution is described in JP-A-2008-292975, where by making use of such a property that when exposed, the polarity of a resin in a resist composition becomes high in the high light intensity region and is maintained as low in the low light intensity region, the high exposure region of a specific resist film is dissolved with a high-polarity developer and the low exposure region is dissolved with an organic solvent-containing developer, whereby the region of medium exposure dose is allowed to remain without being dissolved at the development and a line-and-space pattern having a pitch half the pitch of the exposure mask is formed.

SUMMARY OF INVENTION

An object of the present invention is to solve the above-described problems and provide a pattern forming method capable of forming a pattern favored with wide focus latitude (DOF), small line width variation (LWR) and excellent pattern profile and reduced in the bridge defect, an actinic ray-sensitive or radiation-sensitive resin composition (preferably a chemical amplification resist composition, more preferably a chemical amplification negative resist composition), and a resist film.

The present invention includes the following configurations, and the object above can be attained by these configurations.

[1] A pattern forming method comprising:

(i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid.

[2] The pattern forming method according to the above [1], wherein the resin (A) contains a first repeating unit having a group capable of decomposing by the action of an acid to produce an alcoholic hydroxy group.

[3] The pattern forming method according to the above [1] or [2], wherein the compound (G) is a nitrogen-containing compound.

[4] The pattern forming method according to any one of the above [1] to [3], wherein the compound (G) has a molecular weight of 500 or less.

[5] The pattern forming method according to the above [3] or [4], wherein the compound (G) is a compound represented by the following formula (1):

(1)

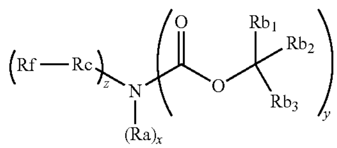

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and x+y+z=3, when x=z=1, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

[6] The pattern forming method according to any one of the above [1] to [3], wherein the compound (G) is a resin.

[7] The pattern forming method according to the above [6], wherein the resin (G) contains a repeating unit having at least either one of a fluorine atom and a silicon atom and a repeating unit having a basic group or a group capable of increasing the basicity by the action of an acid.

[8] The pattern forming method according to any one of the above [1] to [7], wherein the composition further contains a crosslinking agent (C).

[9] The pattern forming method according to any one of the above [1] to [8], wherein the developer contains at least one kind of an organic solvent selected from a ketone-based solvent, an ester-based solvent, an alcohol-based solvent, an amide-based solvent and an ether-based solvent.

[10] The pattern forming method according to any one of the above [1] to [9], which further comprises (iv) a step of rinsing the film with a rinsing solution.

[11] The pattern forming method according to the above [10], wherein the rinsing solution is preferably a rinsing solution containing at least one kind of an organic solvent selected from a hydrocarbon-based solvent, a ketone-based solvent, an ester-based solvent, an alcohol-based solvent, an amide-based solvent and an ether-based solvent.

[12] The pattern forming method according to any one of the above [1] to [11], wherein an exposure in the step of exposing the film is an immersion exposure.

[13] An actinic ray-sensitive or radiation-sensitive resin composition comprising:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid.

[14] The actinic ray-sensitive or radiation-sensitive resin composition according to the above [13], wherein the resin (A) contains a first repeating unit having a group capable of decomposing by the action of an acid to produce an alcoholic hydroxy group.

[15] The actinic ray-sensitive or radiation-sensitive resin composition according to the above [13] or [14], wherein the compound (G) is a nitrogen-containing compound.

[16] The actinic ray-sensitive or radiation-sensitive resin composition according to any one of the above [13] to [15], wherein the compound (G) has a molecular weight of 500 or less.

[17] The actinic ray-sensitive or radiation-sensitive resin composition according to the above [15] or [16], wherein the compound (G) is a compound represented by the following formula (1):

(1)

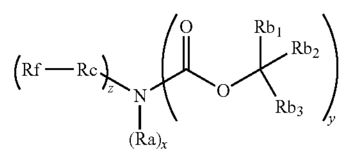

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and x+y+z=3, when x=z=1, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

[18] The actinic ray-sensitive or radiation-sensitive resin composition according to any one of the above [13] to [15], wherein the compound (G) is a resin.

[19] The actinic ray-sensitive or radiation-sensitive resin composition according to the above [18], wherein the resin (G) contains a repeating unit having at least either one of a fluorine atom and a silicon atom and a repeating unit having a basic group or a group capable of increasing the basicity by the action of an acid.

[20] The actinic ray-sensitive or radiation-sensitive resin composition according to any one of the above [13] to [19], wherein the composition further contains a crosslinking agent (C).

[21] A resist film formed by the composition according to any one of the above [13] to [20].

[22] A compound represented by the following formula (1):

(1)

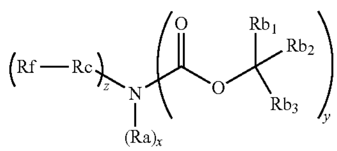

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and x+y+z=3, when x=z=1, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

[23] A resin (G) having at least either one of a fluorine atom and a silicon atom, and having a basic group or a group capable of increasing the basicity by the action of an acid.

In the present invention, the following embodiments are also preferred.

[24] The pattern forming method according to any one of the above [2] to [12], wherein said first repeating unit is represented by at least one formula selected from the group consisting of the following formulae (I-1) to (I-10):

(I-1)

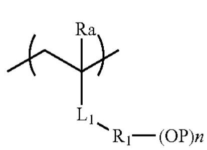

-continued (I-2)

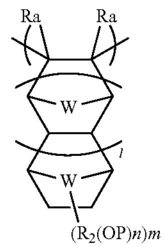

(I-3)

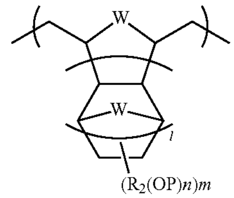

(I-4)

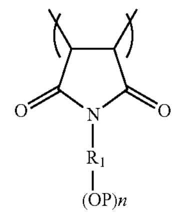

(I-5)

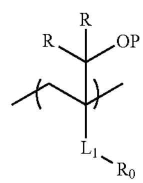

(I-6)

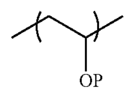

(I-7)

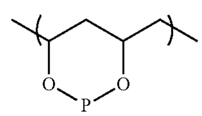

(I-8)

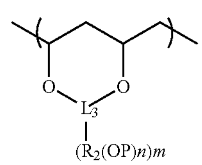

(I-9)

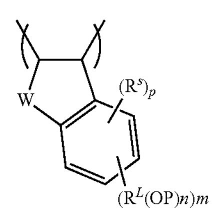

(I-10)

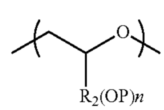

wherein each Ra independently represents a hydrogen atom, an alkyl group or a group represented by —$CH_2$—O—Ra2, wherein Ra2 represents a hydrogen atom, an alkyl group or an acyl group;

$R_1$ represents an (n+1)-valent organic group;

$R_2$ represents, when m≥2, each independently represents, a single bond or an (n+1)-valent organic group;

each OP independently represents said group capable of decomposing by the action of an acid to produce an alcoholic hydroxyl group, and when n≥2 and/or m≥2, two or more OP's may combine with each other to form a ring;

W represents a methylene group, an oxygen atom or a sulfur atom;

each of n and m represents an integer of 1 or more;

l represents an integer of 0 or more;

$L_1$ represents a linking group represented by —COO—, —OCO—, —CONH—, —O—, —Ar—, —$SO_3$— or —$SO_2$NH—, wherein Ar represents a divalent aromatic ring group;

each R independently represents a hydrogen atom or an alkyl group;

$R_0$ represents a hydrogen atom or an organic group;

$L_3$ represents an (m+2)-valent linking group;

$R^L$ represents, when m≥2, each independently represents, an (n+1)-valent linking group;

$R^S$ represents, when p≥2, each independently represents, a substituent, and when p≥2, the plurality of $R^S$'s may combine with each other to form a ring; and p represents an integer of 0 to 3.

[25] The pattern forming method according to any one of the above [2] to [12], wherein said group capable of decomposing by the action of an acid to produce an alcoholic hydroxy group is represented by at least one formula selected from the group consisting of the following formulae (II-1) to (II-9):

(II-1)

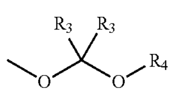

(II-2)

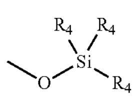

(II-3)

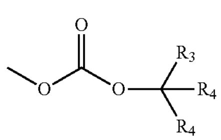

(II-4)

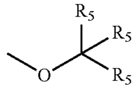

(II-5)

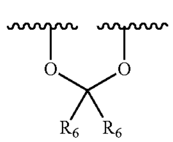

(II-6)

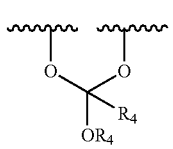

-continued (II-7)

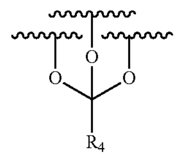

(II-8)

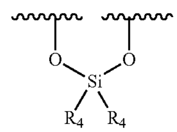

(II-9)

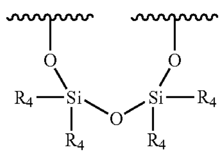

wherein each $R_3$ independently represents a hydrogen atom or a monovalent organic group, and two $R_3$'s may combine with each other to form a ring;

each $R_4$ independently represents a monovalent organic group, and at least two $R_4$'s may combine with each other to form a ring, or $R_3$ and $R_4$ may combine with each other to form a ring;

each $R_5$ independently represents a hydrogen atom, an alkyl group, a cycloalkyl group, an aryl group, an alkenyl group or an alkynyl group, and at least two $R_5$'s may combine with each other to form a ring, provided that when one or two of three $R_5$'s are a hydrogen atom, at least one of the remaining $R_5$'s represents an aryl group, an alkenyl group or an alkynyl group; and each $R_6$ independently represents a hydrogen atom or a monovalent organic group, and $R_6$'s may combine with each other to form a ring.

[26] The pattern forming method according to any one of the above [2] to [12], wherein said first repeating unit is represented by the following formula (III):

(III)

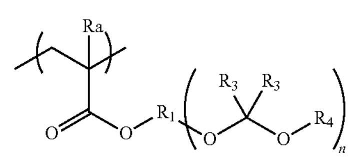

wherein $R_1$ represents an (n+1)-valent organic group;

Ra represents a hydrogen atom, an alkyl group or a group represented by —$CH_2$—O—Ra2, wherein Ra2 represents a hydrogen atom, an alkyl group or an acyl group;

each $R_3$ independently represents a hydrogen atom or a monovalent organic group, and $R_3$'s may combine with each other to form a ring;

$R_4$ represents, when each independently represents, a monovalent organic group, and $R_4$'s may combine with each other to form a ring, or $R_3$ and $R_4$ may combine with each other to form a ring; and n represents an integer of 1 or more.

[27] The pattern forming method according to the above [26], wherein $R_1$ represents a non-aromatic hydrocarbon group.

[28] The pattern forming method according to the above [27], wherein $R_1$ represents an alicyclic hydrocarbon group.

[29] The pattern forming method according to any one of the above [25] to [28], wherein said group capable of decomposing by the action of an acid to produce an alcoholic hydroxyl group is represented by said formula (II-1) and at least either one $R_3$ represents a monovalent organic group.

[30] The pattern forming method according to any one of the above [2] to [12], wherein said first repeating unit has two or more groups capable of decomposing by the action of an acid to produce an alcoholic hydroxy group.

[31] The pattern forming method according to any one of the above [1] to [12], [24] to [30], wherein the resin (A) further contains a repeating unit having an alcoholic hydroxy group.

[32] The pattern forming method according to any one of the above [1] to [12], [24] to [31], wherein the resin (A) further contains a repeating unit having a cyano group.

[33] The pattern forming method according to any one of the above [1] to [12], [24] to [32], wherein the resin (A) further contains a repeating unit having a group capable of decomposing by the action of an acid to produce a carboxy group.

[34] The actinic ray-sensitive or radiation-sensitive resin composition according to any one of the above [14] to [20], wherein said first repeating unit is represented by at least one formula selected from the group consisting of the following formulae (I-1) to (I-10):

(I-1)

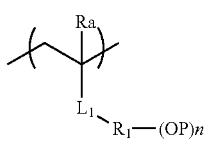

(I-2)

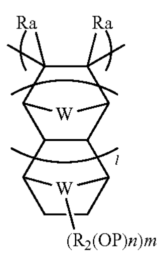

(I-3)

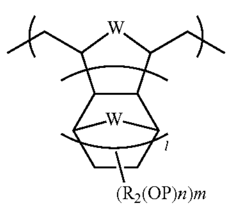

(I-4)

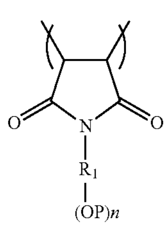

(I-5)

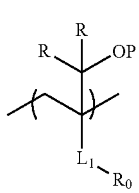

-continued (I-6)

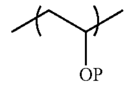

(I-7)

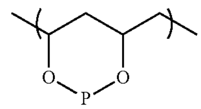

(I-8)

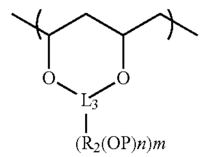

(I-9)

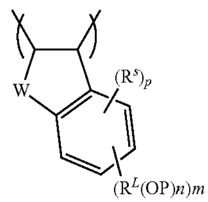

(I-10)

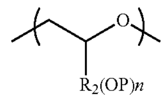

wherein each Ra independently represents a hydrogen atom, an alkyl group or a group represented by —$CH_2$—O—Ra2, wherein Ra2 represents a hydrogen atom, an alkyl group or an acyl group;

$R_1$ represents an (n+1)-valent organic group;

$R_2$ represents, when m≥2, each independently represents, a single bond or an (n+1)-valent organic group;

each OP independently represents said group capable of decomposing by the action of an acid to produce an alcoholic hydroxyl group, and when n≥2 and/or m≥2, two or more OP's may combine with each other to form a ring;

W represents a methylene group, an oxygen atom or a sulfur atom;

each of n and m represents an integer of 1 or more;

l represents an integer of 0 or more;

$L_1$ represents a linking group represented by —COO—, —OCO—, —CONH—, —O—, —Ar—, —$SO_3$— or —$SO_2$NH—, wherein Ar represents a divalent aromatic ring group;

each R independently represents a hydrogen atom or an alkyl group;

$R_0$ represents a hydrogen atom or an organic group;

$L_3$ represents an (m+2)-valent linking group;

$R^L$ represents, when m≥2, each independently represents, an (n+1)-valent linking group;

$R^S$ represents, when p≥2, each independently represents, a substituent, and when p≥2, the plurality of $R^S$'s may combine with each other to form a ring; and p represents an integer of 0 to 3.

[35] The actinic ray-sensitive or radiation-sensitive resin composition according to any one of the above [14] to [20], wherein said group capable of decomposing by the action of an acid to produce an alcoholic hydroxy group is represented by at least one formula selected from the group consisting of the following formulae (II-1) to (II-9):

(II-1)

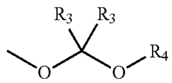

(II-2)

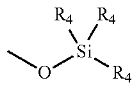

(II-3)

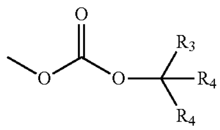

(II-4)

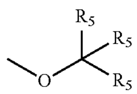

(II-5)

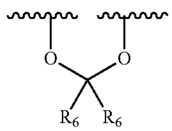

(II-6)

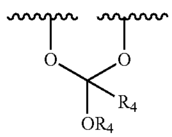

(II-7)

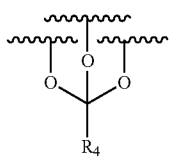

(II-8)

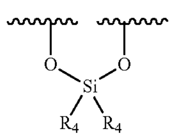

(II-9)

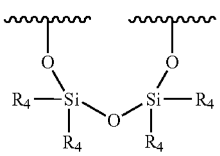

wherein each $R_3$ independently represents a hydrogen atom or a monovalent organic group, and two $R_3$'s may combine with each other to form a ring;

each $R_4$ independently represents a monovalent organic group, and at least two $R_4$'s may combine with each other to form a ring, or $R_3$ and $R_4$ may combine with each other to form a ring;

each $R_5$ independently represents a hydrogen atom, an alkyl group, a cycloalkyl group, an aryl group, an alkenyl group or an alkynyl group, and at least two $R_5$'s may combine with each other to form a ring, provided that when one or two of three $R_5$'s are a hydrogen atom, at least one of the remaining $R_5$'s represents an aryl group, an alkenyl group or an alkynyl group; and each $R_6$ independently represents a hydrogen atom or a monovalent organic group, and $R_6$'s may combine with each other to form a ring.

[36] The pattern forming method according to any one of the above [14] to [20], wherein said first repeating unit is represented by the following formula (III):

(III)

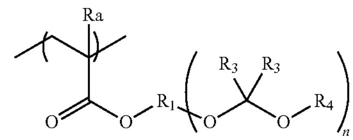

wherein $R_1$ represents an (n+1)-valent organic group;

Ra represents a hydrogen atom, an alkyl group or a group represented by —$CH_2$—O—Ra2, wherein Ra2 represents a hydrogen atom, an alkyl group or an acyl group;

each $R_3$ independently represents a hydrogen atom or a monovalent organic group, and $R_3$'s may combine with each other to form a ring;

$R_4$ represents, when $n \geq 2$, each independently represents, a monovalent organic group, and $R_4$'s may combine with each other to form a ring, or $R_3$ and $R_4$ may combine with each other to form a ring; and n represents an integer of 1 or more.

[37] The actinic ray-sensitive or radiation-sensitive resin composition according to the above [36], wherein $R_1$ represents a non-aromatic hydrocarbon group.

[38] The actinic ray-sensitive or radiation-sensitive resin composition according to the above [37], wherein $R_1$ represents an alicyclic hydrocarbon group.

[39] The actinic ray-sensitive or radiation-sensitive resin composition according to any one of the above [35] to [38], wherein said group capable of decomposing by the action of an acid to produce an alcoholic hydroxyl group is represented by said formula (II-1) and at least either one $R_3$ represents a monovalent organic group.

[40] The actinic ray-sensitive or radiation-sensitive resin composition according to any one of the above [14] to [20], wherein said first repeating unit has two or more groups capable of decomposing by the action of an acid to produce an alcoholic hydroxy group.

[41] The actinic ray-sensitive or radiation-sensitive resin composition according to any one of the above [13] to [20], [34] to [40], wherein the resin (A) further contains a repeating unit having an alcoholic hydroxy group.

[42] The actinic ray-sensitive or radiation-sensitive resin composition according to any one of the above [13] to [20], [34] to [41], wherein the resin (A) further contains a repeating unit having a cyano group.

[43] The actinic ray-sensitive or radiation-sensitive resin composition according to any one of the above [13] to [20], [34] to [42], wherein the resin (A) further contains a repeating unit having a group capable of decomposing by the action of an acid to produce a carboxy group.

According to the present invention, a pattern forming method capable of forming a pattern favored with wide focus latitude (DOF), small line width variation (LWR) and excellent pattern profile and reduced in the bridge defect, and an actinic ray-sensitive or radiation-sensitive negative resin composition, can be provided.

DESCRIPTION OF EMBODIMENTS

An embodiment for carrying out the present invention is described below.

In the present invention, when a group (atomic, group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The pattern formation process necessary for practicing the present invention includes the following steps. A pattern forming method comprising:

(i) a step of forming a film from an actinic ray-sensitive or radiation-sensitive resin composition (preferably a chemical amplification resist composition, more preferably a chemical amplification negative resist composition) (hereinafter also referred to as "composition"), (ii) a step of exposing the film, and (iii) a step of developing the exposed film by using an organic solvent-containing developer.

In the pattern forming method of the present invention, the organic solvent contained in the developer is preferably at least one kind of an organic solvent selected from a ketone-based solvent, an ester-based solvent, an alcohol-based solvent, an amide-based and an ether-based solvent.

The pattern forming method of the present invention preferably further comprises (iv) a step of rinsing the film with a rinsing solution.

The rinsing solution is preferably a rinsing solution containing at least one kind of an organic solvent selected from a hydrocarbon-based solvent, a ketone-based solvent, an ester-based solvent, an alcohol-based solvent, an amide-based solvent and an ether-based solvent.

The pattern forming method of the present invention preferably comprises (v) a heating step after the exposure step (ii).

The pattern forming method of the present invention may further comprise (vi) a step of performing development by using an aqueous alkali developer.

In practicing the present invention, an actinic ray-sensitive or radiation-sensitive resin composition (preferably a chemical amplification resist composition, more preferably a chemical amplification negative resist composition) comprising:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid, as well as an organic solvent-containing developer are necessary.

In practicing the present invention, it is preferred to further use an organic solvent-containing rinsing solution.

The film formed in the present invention is a film formed by coating an actinic ray-sensitive or radiation-sensitive resin composition comprising:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid.

The composition of the present invention is described below.

[1] (A) Resin

The actinic ray-sensitive or radiation-sensitive resin composition of the present invention is used to form a negative pattern by the pattern forming method of the present invention.

That is, in a resist film obtained from the actinic ray-sensitive or radiation-sensitive resin composition of the present invention, the exposed area is decreased in the solubility for an organic solvent-containing developer by the action of an acid and becomes insoluble or sparingly soluble, and the unexposed area remains soluble in an organic solvent-containing developer, whereby a negative pattern is formed.

The resin (A) (hereinafter also referred to as "an acid-decomposable resin") is preferably substantially alkali-insoluble.

The term "substantially alkali-insoluble" indicates that when a composition prepared by dissolving only the resin (A) in a solvent such as butyl acetate to have a solid content concentration of 3.5 mass % is coated on a silicon wafer to from a coating film (thickness: 100 nm) and when the film is dipped in an aqueous 2.38 mass % tetramethylammonium hydroxide (TMAH) solution at room temperature (25° C.) for 1,000 seconds, the average dissolution rate (the rate of decrease in the film thickness) measured using a QCM (quartz crystal oscillator microbalance) sensor or the like is 1 nm/s or less, preferably 0.1 nm/s or less. Thanks to this property, the resist film in the unexposed area exhibits good solubility for an organic solvent-containing developer.

The resin (A) may or may not contain a repeating unit having an acid group within a range keeping the resin substantially alkali-insoluble but preferably does not contain the repeating unit.

Examples of the acid group include a carboxyl group, a sulfonamide group, a sulfonylimide group, a bisulfonylimide group, and an aliphatic alcohol substituted with an electron-withdrawing group at the α-position (for example, a hexafluoroisopropanol group and —$C(CF_3)_2OH$).

In the case where the resin (A) contains an acid group, the content of the repeating unit having an acid group in the resin (A) is preferably 10 mol % or less, more preferably 5 mol % or less. In the case where the resin (A) contains a repeating unit having an acid group, the content of the acid group-containing repeating unit in the resin (A) is usually 1 mol % or more.

Here, the electron-withdrawing group is a substituent having a propensity to attract an electron, for example, a substituent having a propensity to draw an electron from an atom located in proximity to the group in a molecule.

Specific examples of the electron-withdrawing group are the same as those in $Z_{ka1}$ of formula (KA-1) described later.

The resin need not have solubility by itself for an organic solvent-containing developer as long as when a film is formed using the resist composition, the film dissolves in the developer. For example, depending on the property or content of other components contained in the resist composition, it may suffice if a film formed using the resist composition dissolves in the developer.

The resin (A) is generally synthesized by the polymerization, for example, radical polymerization, of a monomer having a partial structure to be polymerized and contains a repeating unit derived from the monomer having a partial structure to be polymerized. Examples of the partial structure to be polymerized include an ethylenically polymerizable partial structure.

Respective repeating units which the resin (A) can contain are described in detail below.

(a1) Repeating Unit Having an Acid-Decomposable Group

The resin (A) is a resin capable of being decreased in the solubility for an organic solvent-containing developer by the action of an acid and contains a repeating unit having a group capable of decomposing by the action of an acid to produce a polar group (hereinafter sometimes referred to as an "acid-decomposable group"), on either one or both of the main chain and the side chain of the resin. When a polar group is produced, the affinity for an organic solvent-containing developer is reduced and a change to a insoluble or sparingly soluble state (negative conversion) proceeds.

The acid-decomposable group preferably has a structure where the polar group is protected by a group capable of decomposing and leaving by the action of an acid.

The polar group is not particularly limited as long as it is a group capable of being insolubilized in an organic solvent-containing developer, but an acidic group (a group capable of dissociating in an aqueous 2.38 mass % tetramethylammonium hydroxide solution which is conventionally used as the developer for resist) such as carboxyl group, fluorinated alcohol group (preferably hexafluoroisopropanol) and sulfonic acid group, or an alcoholic hydroxy group (an alcoholic hydroxyl group) is preferred.

The group preferred as the acid-decomposable group is a group where a hydrogen atom of the group above is substituted for by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

In one of the preferable embodiments of the invention, the resin (A) contains a repeating unit (hereinafter also referred to as a first repeating unit, or a repeating unit (P)) having, as an acid-decomposable group, a group capable of decomposing by the action of an acid to produce an alcoholic hydroxy group. In this embodiment, a pattern forming method capable of forming a pattern favored with wide focus latitude (DOF), small line width variation (LWR) and excellent pattern profile and reduced in the bridge defect, can be also provided.

The acid-decomposable group-containing repeating unit which the resin (A) can contain is preferably a repeating unit represented by the following formula (AI):

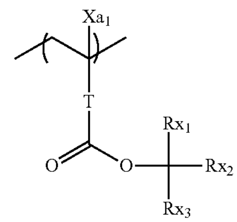

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group, more preferably a hydrogen atom, a methyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

$Rx_2$ and $Rx_3$ may combine to form a cycloalkyl group (monocyclic or polycyclic).

Examples of the divalent linking group of T include an alkylene group, a —COO-Rt- group, a —O-Rt- group, and a group formed by combining two or more thereof, and a linking group having a total carbon number of 1 to 12 is preferred. In the formulae, Rt represents an alkylene group or a cycloalkylene group.

T is preferably a single bond or a —COO-Rt- group. Rt is preferably an alkylene group having a carbon number of 1 to 5, more preferably a —$CH_2$— group, —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining $Rx_2$ and $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a cycloalkyl group (having a carbon number of 3 to 15), a halogen atom, a hydroxyl group, an alkoxy group (having a carbon number of 1 to 4), a carboxyl group and an alkoxycarbonyl group (having a carbon number of 2 to 6). The carbon number is preferably 8 or less. The carbon number of the substituent is preferably 8 or less.

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each is independent from every others. p represents 0 or a positive integer. Specific examples and preferred examples of Z are the same as specific examples and preferred examples of $R_{10}$ in formula (2-1) described later.

1

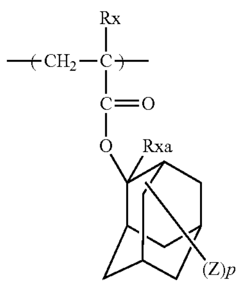

2

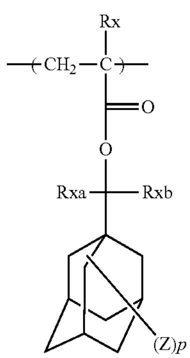

3

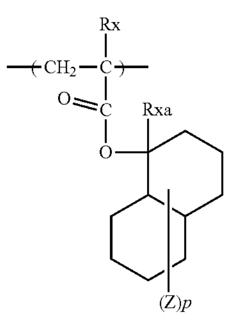

4

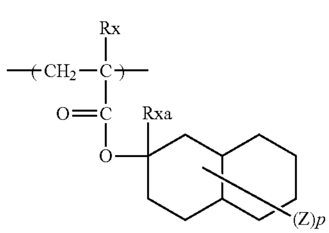

-continued

5

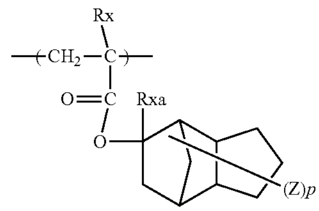

6

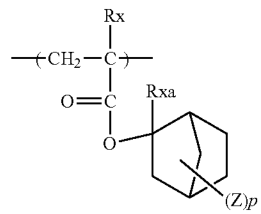

7

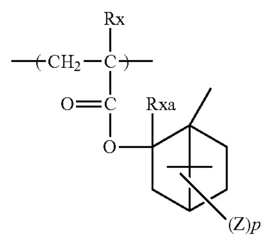

8

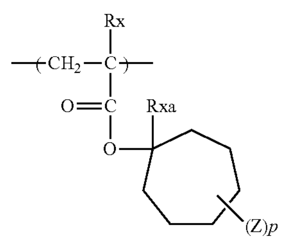

9

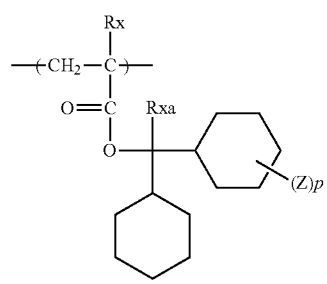

10

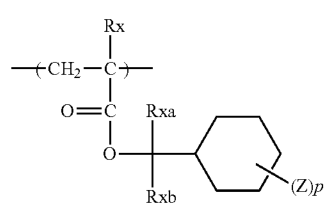

11

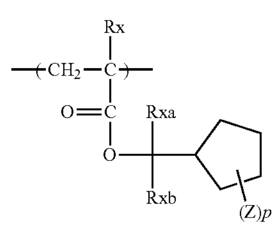

-continued
12
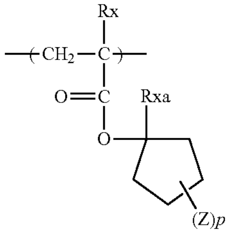
13
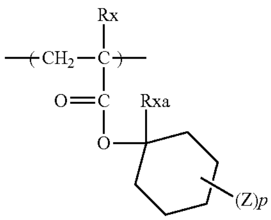
14
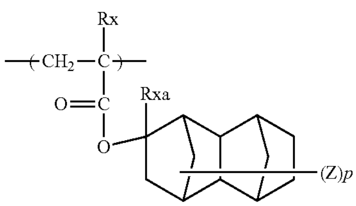
15
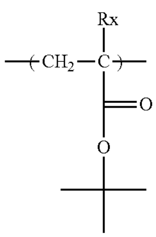
16
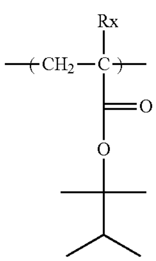
17
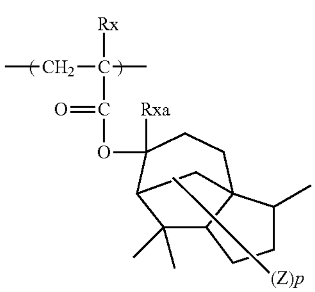
-continued
18
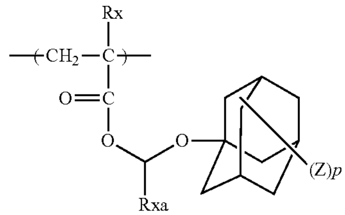
19
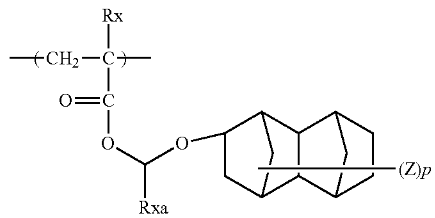
20
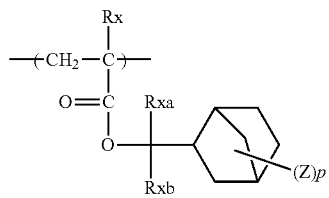
21
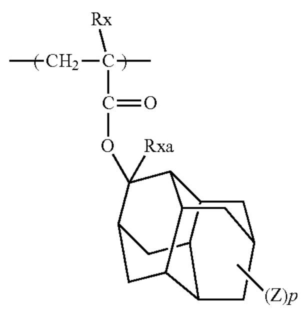
22
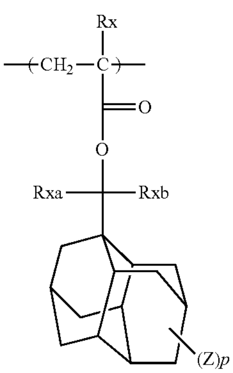
23
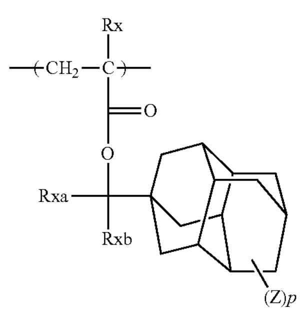

-continued
24
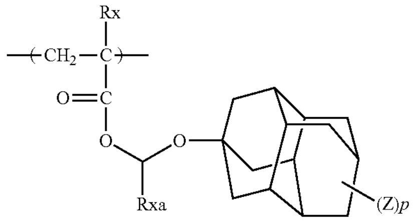
25
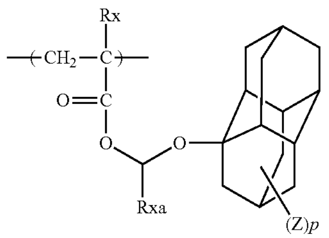
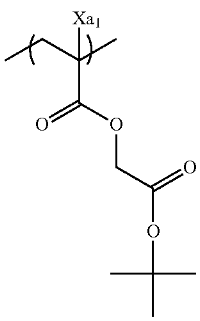
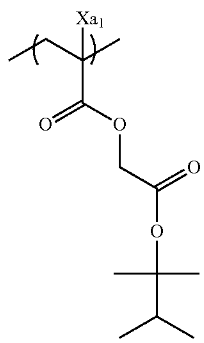
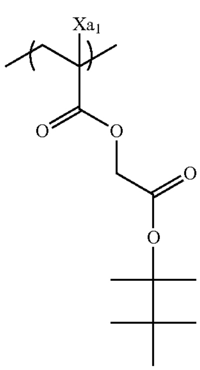
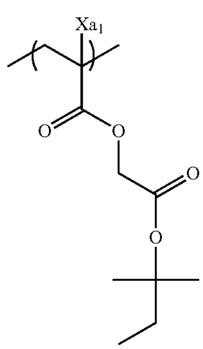
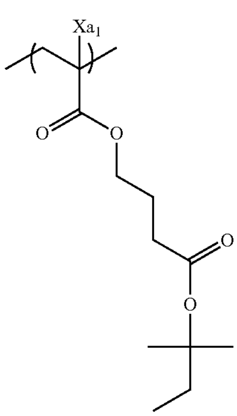
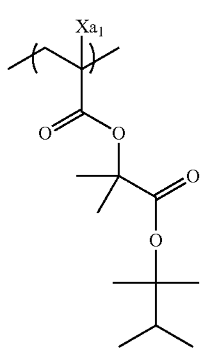
-continued
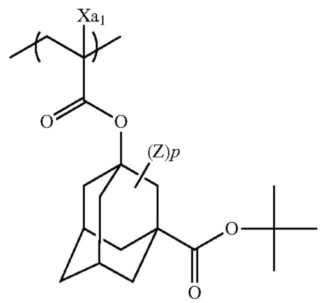
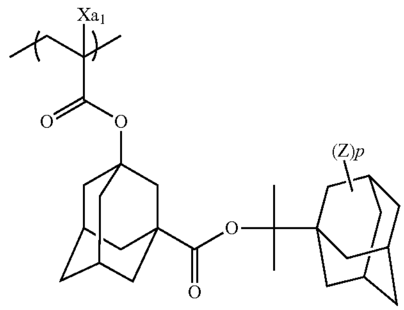
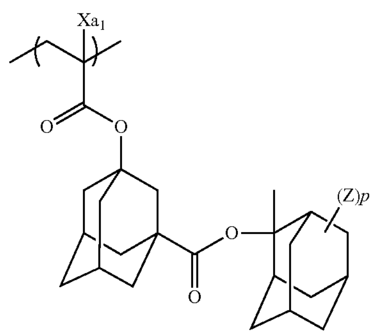
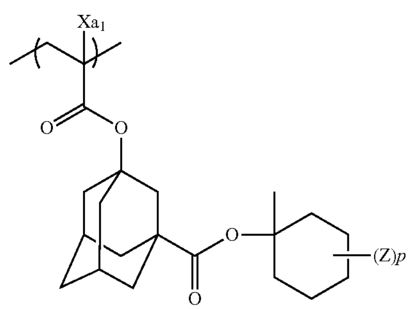
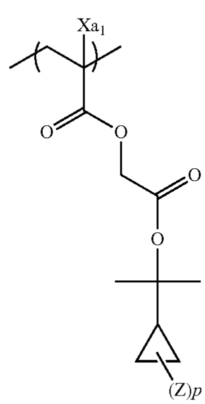
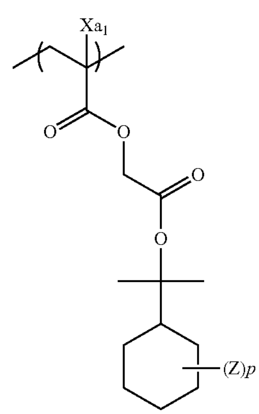

-continued
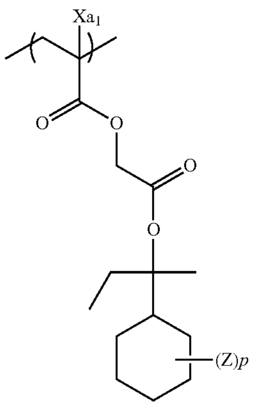
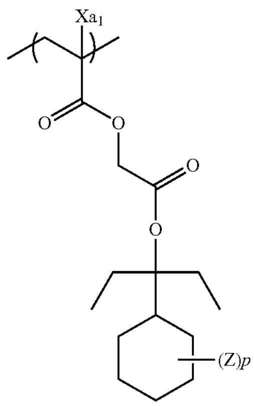
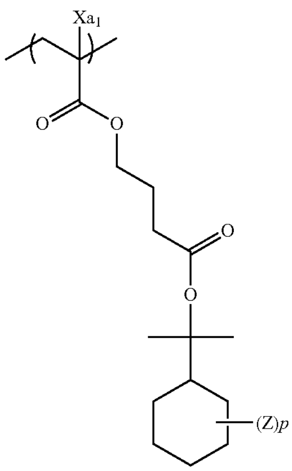
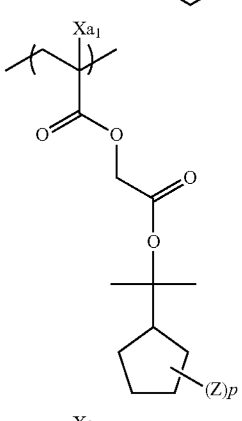
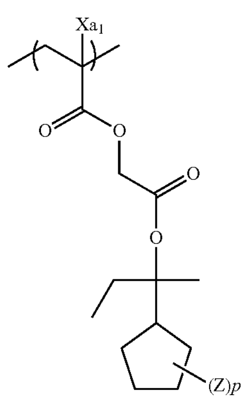
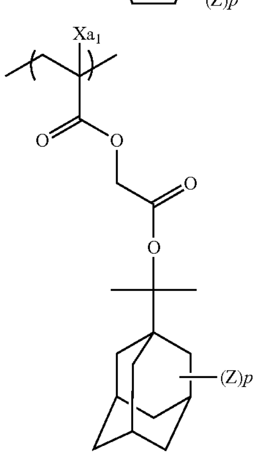
-continued
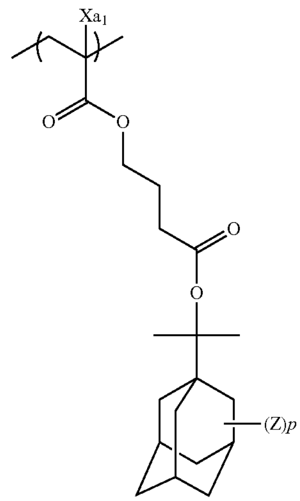
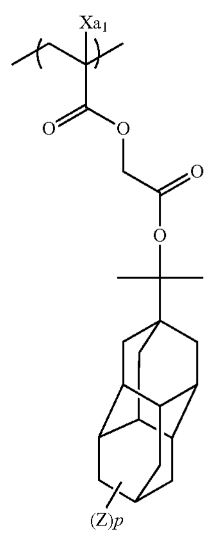
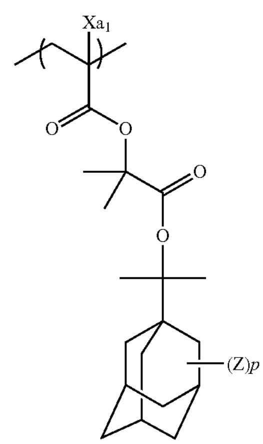
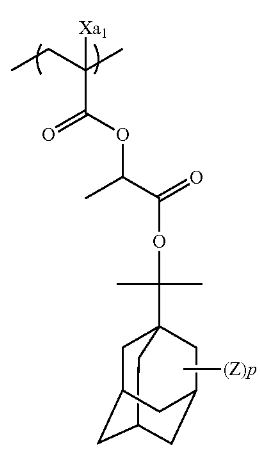
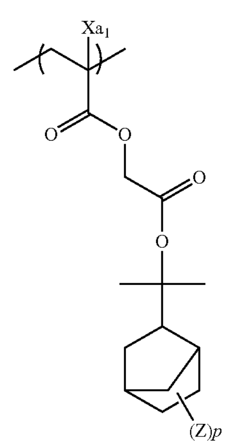

-continued
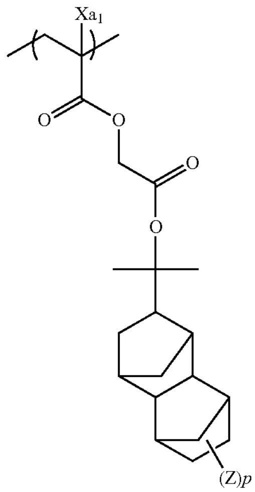
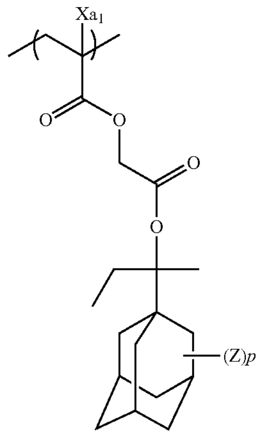
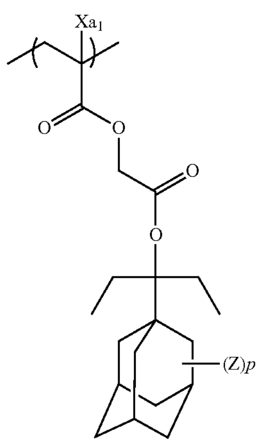
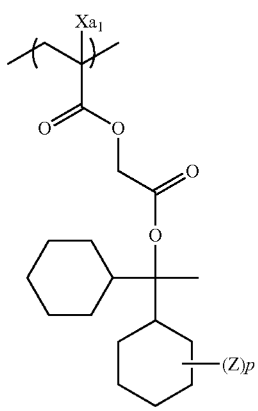
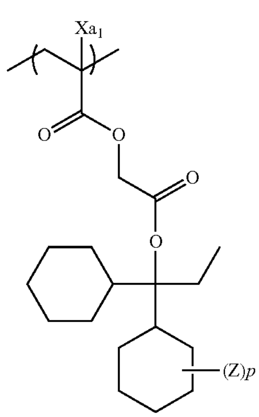
-continued
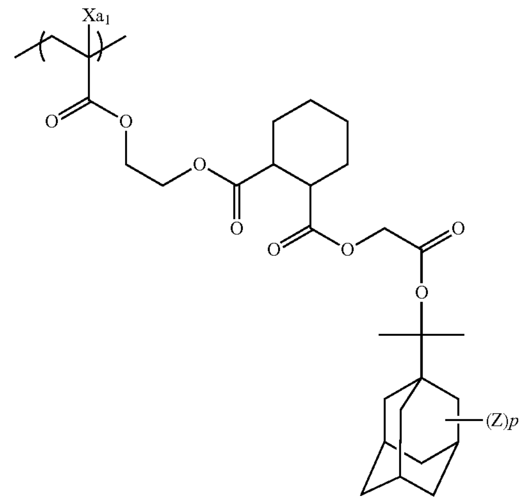
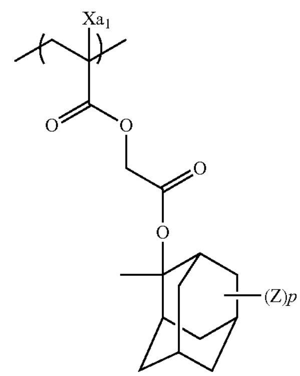
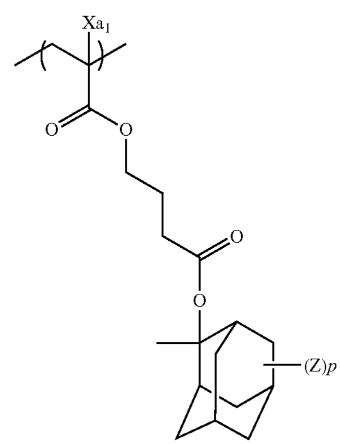
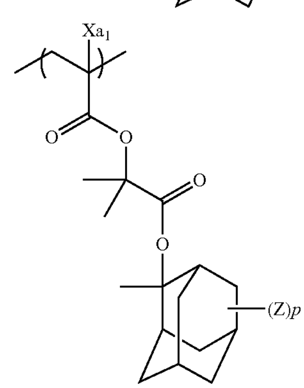

-continued
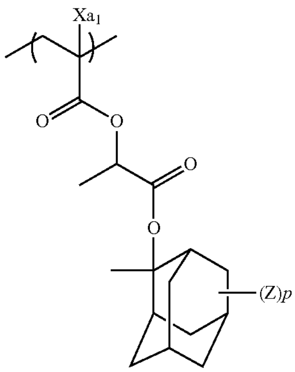
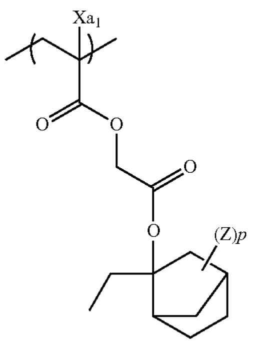
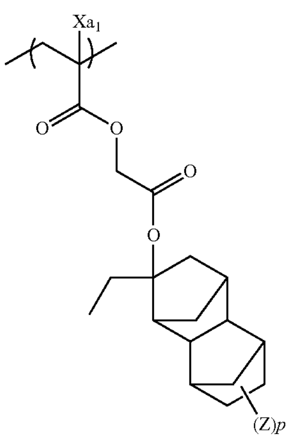
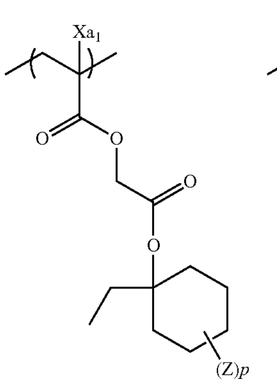
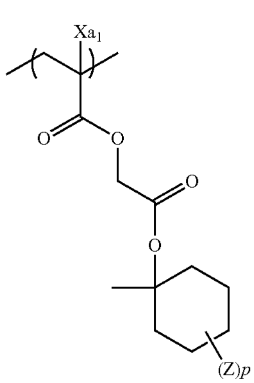
-continued
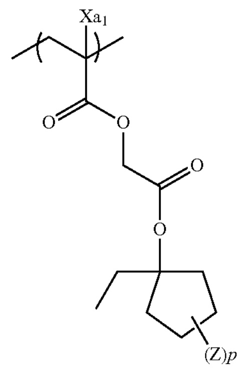
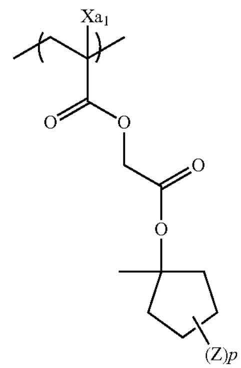
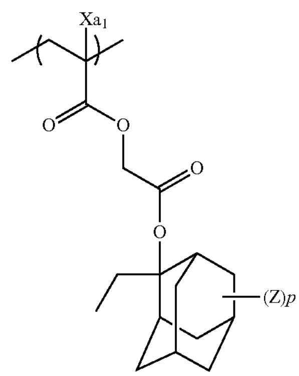
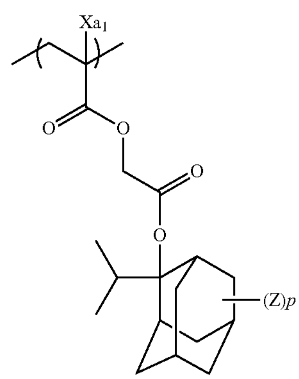
The resin (A) is more preferably a resin containing, as the repeating unit represented by formula (AI), at least either a repeating unit represented by formula (1) or a repeating unit represented by formula (2).
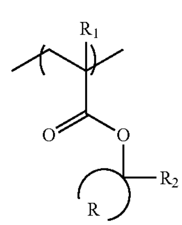
(1)

-continued (2)

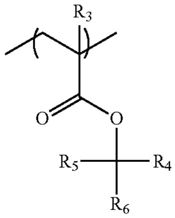

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the repeating unit represented by formula (1) include a repeating unit represented by the following formula (1-a). In the formula, $R_1$ and $R_2$ have the same meanings as those in formula (1).

(1-a)

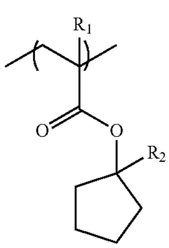

The repeating unit represented by formula (2) is preferably a repeating unit represented by the following formula (2-1):

(2-1)

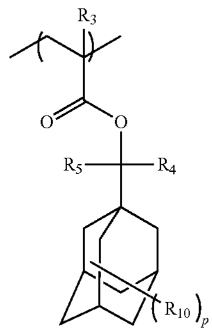

In formula (2-1), $R_3$ to $R_5$ have the same meanings as those in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) may contain a plurality of repeating units having an acid-decomposable group.

The resin (A) is preferably a resin containing, as the repeating unit represented by formula (AI), a repeating unit represented by formula (1) and a repeating unit represented by formula (2). In another embodiment, the resin is preferably a resin containing, as the repeating unit represented by formula (AI), at least two kinds of repeating units represented by formula (1).

It is also possible that the resist composition of the present invention contains a plurality of kinds of resins (A) and the acid-decomposable group-containing repeating units in the plurality of resins (A) differ from each other. For example, a resin (A) containing a repeating unit represented by formula (1) and a resin (A) containing a repeating unit represented by formula (2) may be used in combination.

In the case where the resin (A) contains a plurality of acid-decomposable group-containing repeating units or where a plurality of resins (A) have different acid-decomposable group-containing repeating units, preferred examples of the combination are illustrated below. In the formulae below, each R independently represents a hydrogen atom or a methyl group.

-continued
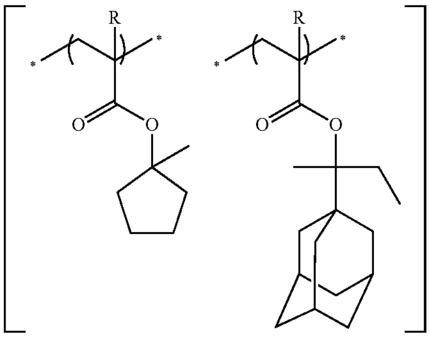
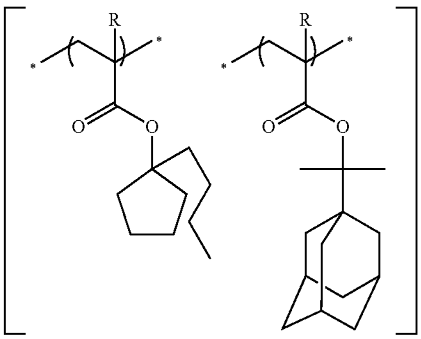
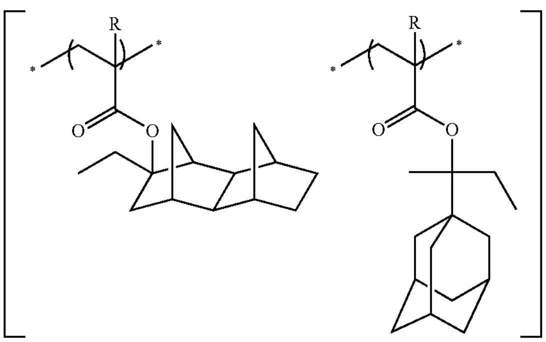
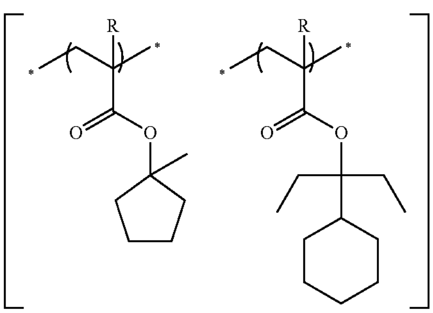
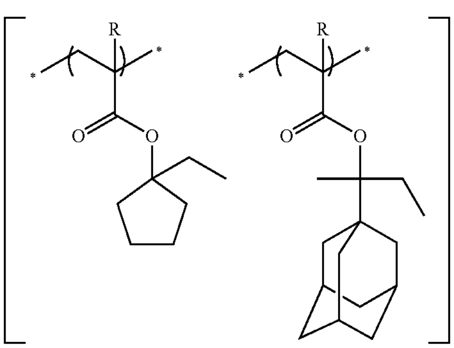
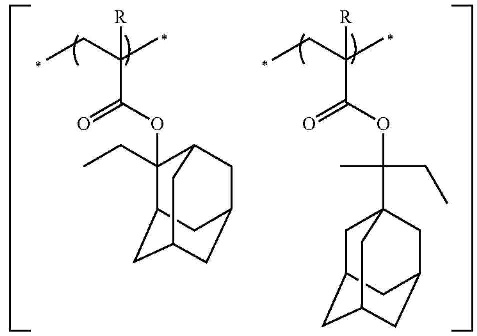
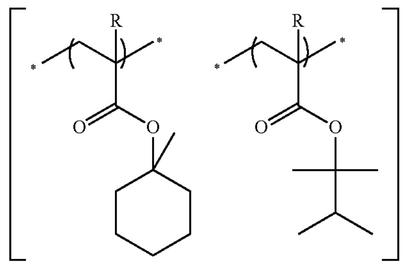
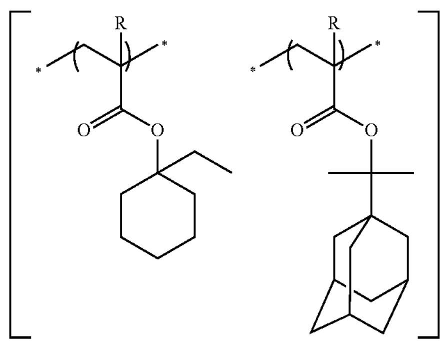
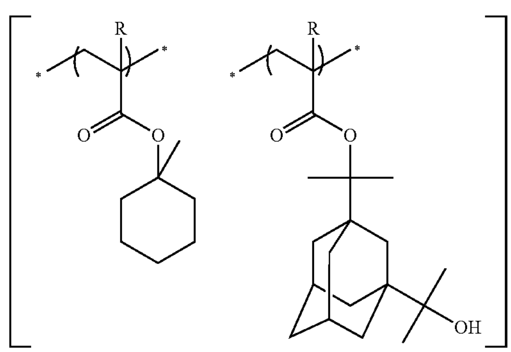
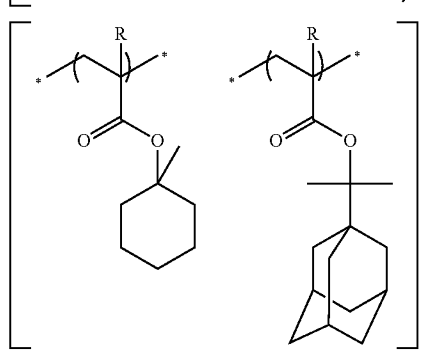

-continued
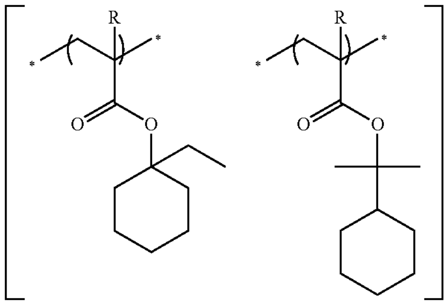
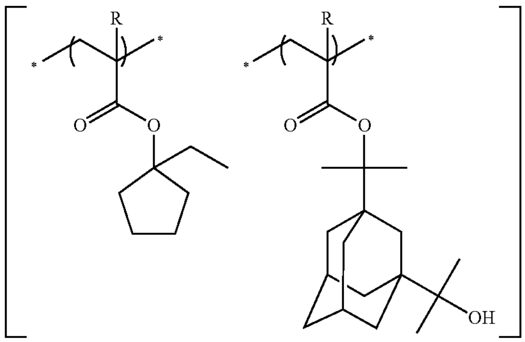
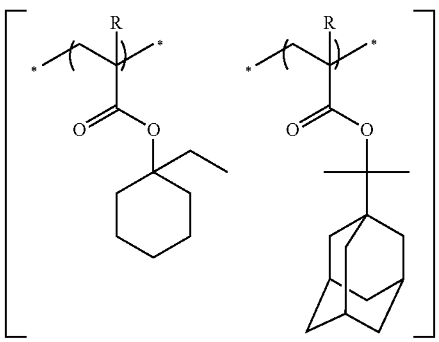
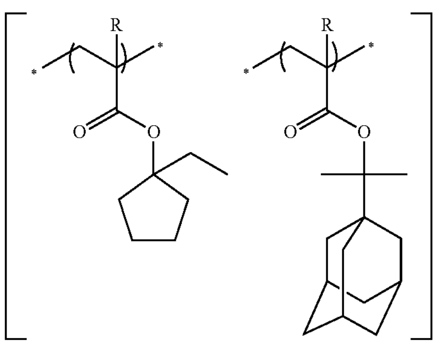
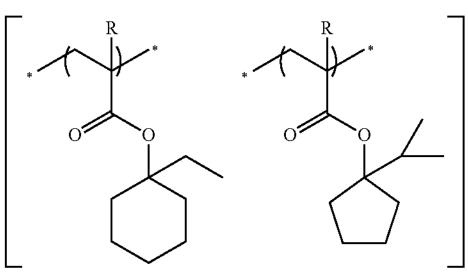
-continued
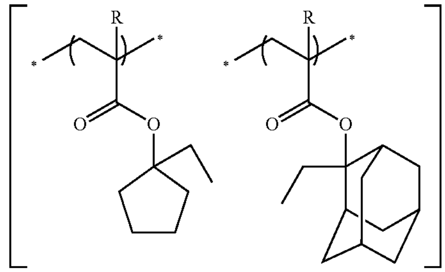
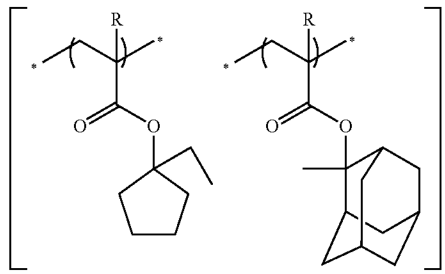
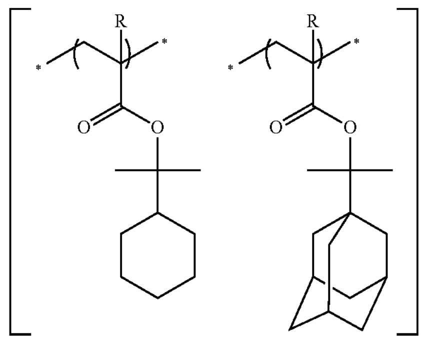
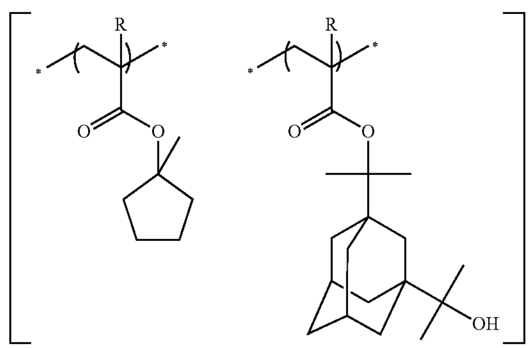
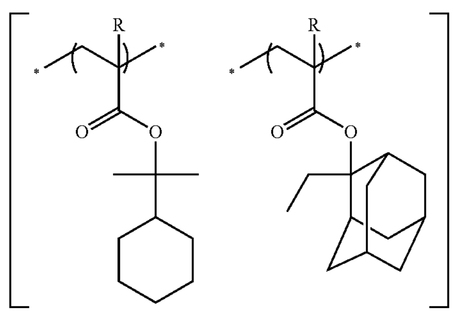

-continued

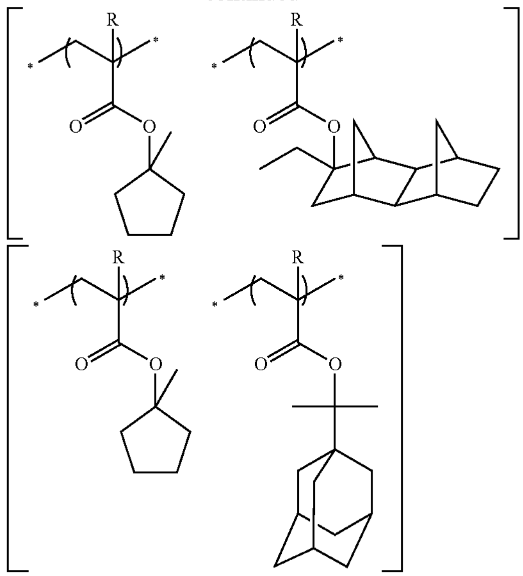

As stated above, in one of the preferred embodiments of the invention, the resin (A) contains (P) a repeating unit having, as an acid-decomposable group, a group capable of decomposing by the action of an acid to produce an alcoholic hydroxy group.

In this embodiment, the present inventors have found that when at least a part of the acid-decomposable group is a group capable of decomposing by the action of an acid to produce an alcoholic hydroxy group, the sensitivity, limiting resolution, roughness characteristics, exposure latitude (EL), post-exposure baking (PEB) temperature dependency, focus latitude (DOF), and the like are enhanced, compared with the case, for example, where the acid-decomposable group is composed of only a group capable of decomposing by the action of an acid to produce a carboxy group. The reasons therefor are not clearly known, but the present inventors presume as follows. That is, the present inventors consider that when a group capable of decomposing by the action of an acid to produce an alcoholic hydroxy group is used at least as a part of the acid-decomposable group, the reactivity of the acid-decomposable resin is enhanced and at the same time, the polarity of the resin is greatly changed due to the decomposition of the acid-decomposable group, as a result, the dissolution contrast for an organic solvent-containing developer is increased.

Also, the present inventors have found that when at least a part of the acid-decomposable group is a group capable of decomposing by the action of an acid to produce an alcoholic hydroxy group, for example, reduction in the film thickness at the post-exposure baking (PEB) can be suppressed, compared with the case where the acid-decomposable group is composed of only a group capable of decomposing by the action of an acid to produce a carboxy group. The present inventors presume that this suppression is achieved because the change in polarity of the resin between before and after the decomposition by the action of an acid is larger in the former than in the latter. Incidentally, the difference in the magnitude of polarity change is noticeable particularly when the molecular weight of the protective group that leaves by the action of an acid is small.

The pKa of the alcoholic hydroxy group produced due to decomposition of the group above by the action of an acid is, for example, 12 or more, typically from 12 to 20. If this pKa is excessively small, the stability of the composition containing the acid-decomposable resin may be decreased to cause large fluctuation of the performance with aging. The "pKa" as used herein is a value computed using "ACD/pKa DB" produced by Fujitsu Ltd. by default without customization.

The repeating unit (P) preferably has two or more groups capable of decomposing by the action of an acid to produce an alcoholic hydroxy group. When this is satisfied, the composition of the acid-decomposable resin can be more enhanced in the limiting resolution and roughness characteristics.

The repeating unit (P) is preferably represented by at least one formula selected from the group consisting of the following formulae (I-1) to (I-10). This repeating unit is more preferably represented by at least one formula selected from the group consisting of the following formulae (I-1) to (I-3), still more preferably represented by the following formula (I-1).

(I-1)

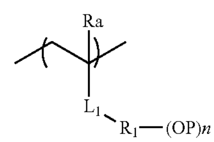

(I-2)

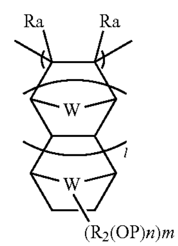

(I-3)

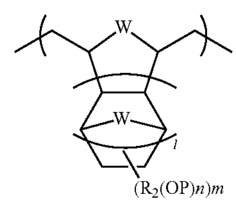

(I-4)

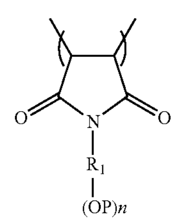

(I-5)

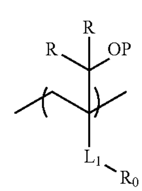

(I-6)

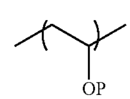

-continued

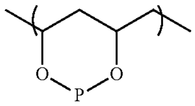

(I-7)

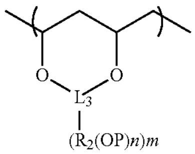

(I-8)

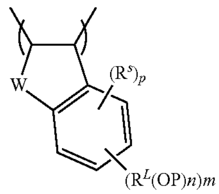

(I-9)

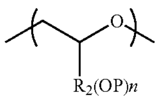

(I-10)

In the formulae, each Ra independently represents a hydrogen atom, an alkyl group or a group represented by —$CH_2$—O—Ra2, wherein Ra2 represents a hydrogen atom, an alkyl group or an acyl group.

$R_1$ represents an (n+1)-valent organic group.

$R_2$ represents, when m≥2, each independently represents, a single bond or an (n+1)-valent organic group.

Each OP independently represents the group capable of decomposing by the action of an acid to produce an alcoholic hydroxyl group, and when n≥2 and/or m≥2, two or more OP's may combine with each other to form a ring.

W represents a methylene group, an oxygen atom or a sulfur atom.

Each of n and m represents an integer of 1 or more. Here, in formula (I-2), (I-3) or (I-8), when $R_2$ represents a single bond, n is 1.

l represents an integer of 0 or more.

$L_1$ represents a linking group represented by —COO—, —OCO—, —CONH—, —O—, —Ar—, —$SO_3$— or —$SO_2$NH—, wherein Ar represents a divalent aromatic ring group.

Each R independently represents a hydrogen atom or an alkyl group.

$R_0$ represents a hydrogen atom or an organic group.

$L_3$ represents an (m+2)-valent linking group.

$R^L$ represents, when m≥2, each independently represents, an (n+1)-valent linking group.

$R^S$ represents, when p≥2, each independently represents, a substituent, and when p≥2, the plurality of $R^S$'s may combine with each other to form a ring.

p represents an integer of 0 to 3.

Ra represents a hydrogen atom, an alkyl group or a group represented by —$CH_2$—O—Ra2. Ra is preferably a hydrogen atom or an alkyl group having a carbon number of 1 to 10, more preferably a hydrogen atom or a methyl group.

W represents a methylene group, an oxygen atom or a sulfur atom. W is preferably a methylene group or an oxygen atom.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

$R_2$ represents a single bond or an (n+1)-valent organic group. $R_2$ is preferably a single bond or a non-aromatic hydrocarbon group. In this case, $R_2$ may be a chain hydrocarbon group or an alicyclic hydrocarbon group.

In the case where $R_1$ and/or $R_2$ are a chain hydrocarbon group, this chain hydrocarbon group may be linear or branched. The carbon number of the chain hydrocarbon group is preferably from 1 to 8. For example, when $R_1$ and/or $R_2$ are an alkylene group, $R_1$ and/or $R_2$ are preferably a methylene group, an ethylene group, an n-propylene group, an isopropylene group, an n-butylene group, an isobutylene group or a sec-butylene group.

In the case where $R_1$ and/or $R_2$ are an alicyclic hydrocarbon group, this alicyclic hydrocarbon group may be monocyclic or polycyclic. The alicyclic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(═O)—], a sulfonyl group [—$S(═O)_2$—], a sulfinyl group [—S(═O)—] or an imino group [—N(R)—] (wherein R is a hydrogen atom or an alkyl group).

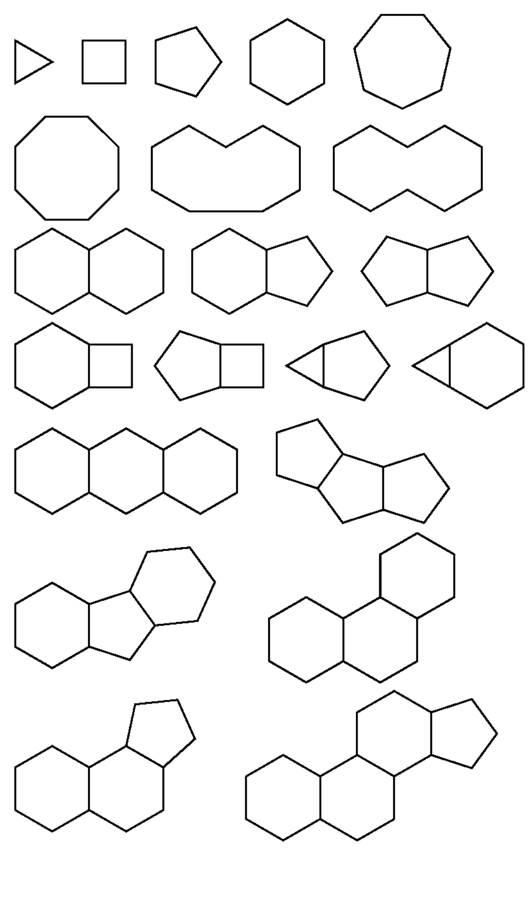

-continued

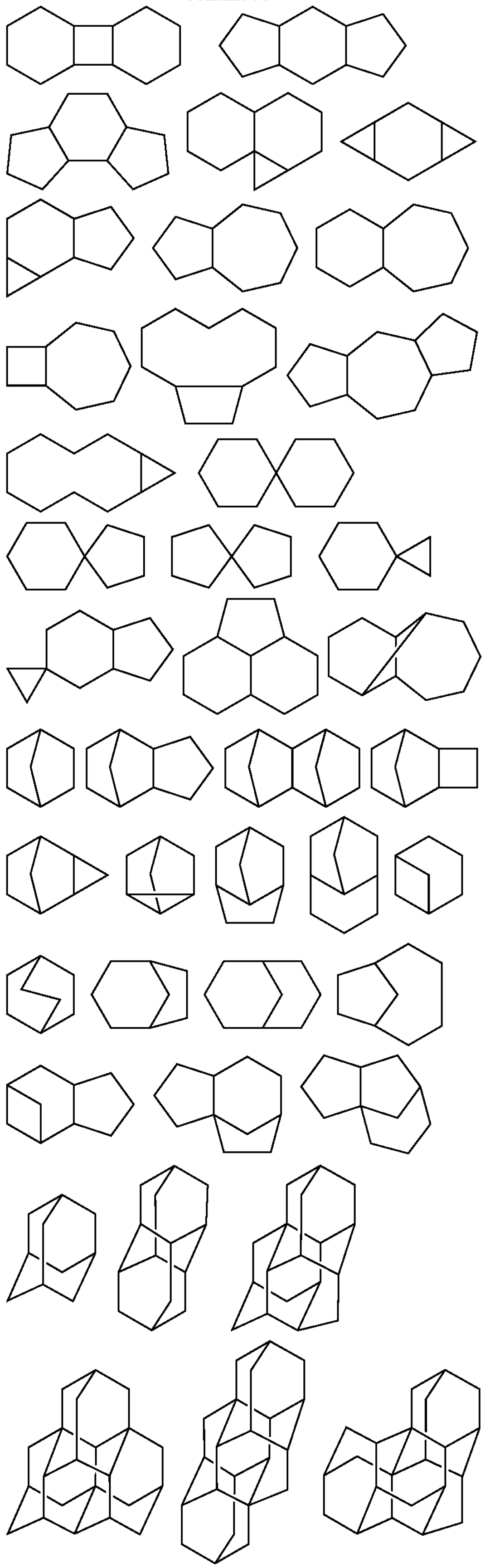

-continued

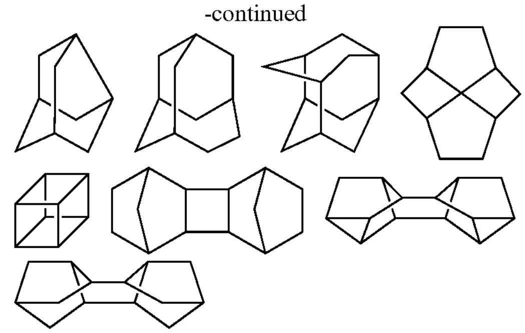

For example, when $R_1$ and/or $R_2$ are a cycloalkylene group, $R_1$ and/or $R_2$ are preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ and/or $R_2$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

$L_1$ represents a linking group represented by —COO—, —OCO—, —CONH—, —O—, —Ar—, —$SO_3$— or —$SO_2$NH—, wherein Ar represents a divalent aromatic ring group. $L_1$ is preferably a linking group represented by —COO—, —CONH— or —Ar—, more preferably a linking group represented by —COO— or —CONH—.

R represents a hydrogen atom or an alkyl group. The alkyl group may be linear or branched. The carbon number of this alkyl group is preferably from 1 to 6, more preferably from 1 to 3. R is preferably a hydrogen atom or a methyl group, more preferably a hydrogen atom.

$R_0$ represents a hydrogen atom or an organic group. The organic group includes, for example, an alkyl group, a cycloalkyl group, an aryl group, an alkynyl group and an alkenyl group. $R_0$ is preferably a hydrogen atom or an alkyl group, more preferably a hydrogen atom or a methyl group.

$L_3$ represents an (m+2)-valent linking group. That is, $L_3$ represents a trivalent or higher valent linking group. Examples of such a linking group include corresponding groups in specific examples illustrated later.

$R^L$ represents an (n+1)-valent linking group. That is, $R^L$ represents a divalent or higher valent linking group. Examples of such a linking group include an alkylene group, a cycloalkylene group, and corresponding groups in specific examples illustrated later. $R^L$ may combine with another $R^L$ or $R^S$ to form a ring structure.

$R^S$ represents a substituent. The substituent includes, for example, an alkyl group, an alkenyl group, an alkynyl group, an aryl group, an alkoxy group, an acyloxy group, an alkoxycarbonyl group and a halogen atom.

n is an integer of 1 or more. n is preferably an integer of 1 to 3, more preferably 1 or 2. Also, when n is an integer of 2 or more, the dissolution contrast for an organic solvent-containing developer can be more increased and in turn, the limiting resolution and roughness characteristics can be more enhanced.

m is an integer of 1 or more. m is preferably an integer of 1 to 3, more preferably 1 or 2.

l an integer of 0 or more. l is preferably 0 or 1.

p is an integer of 0 to 3.

Specific examples of the repeating unit having a group capable of decomposing by the action of an acid to produce an alcoholic hydroxy group are illustrated below. In specific examples, Ra and OP have the same meanings as in formulae (I-1) to (I-3). In the case where a plurality of OP's are combined to form a ring, the corresponding ring group is conveniently denoted by "O—P—O".

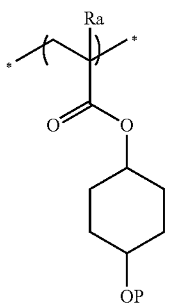

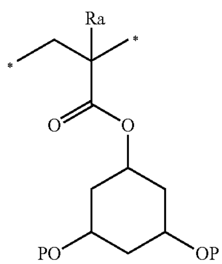

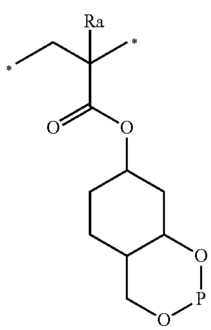

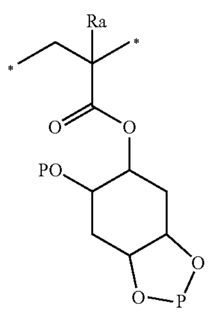

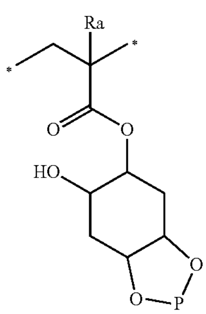

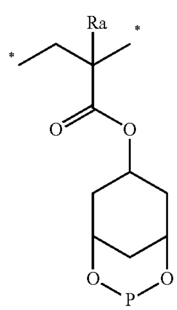

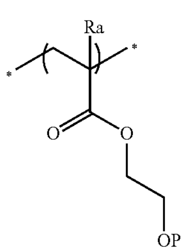

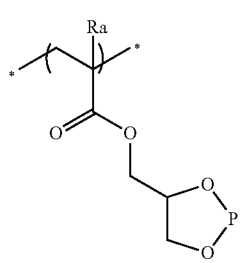

-continued

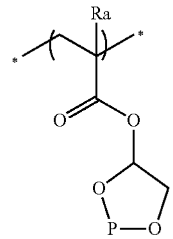

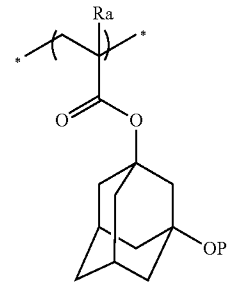

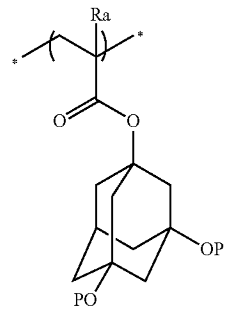

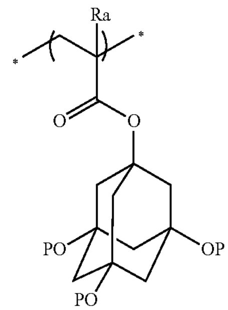

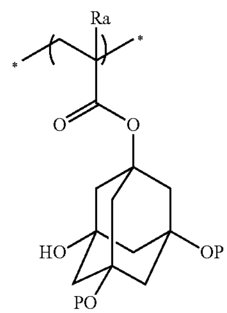

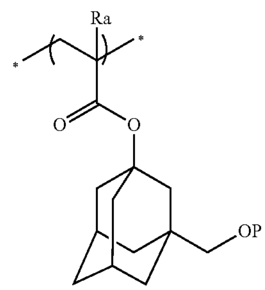

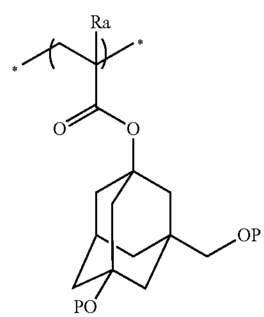

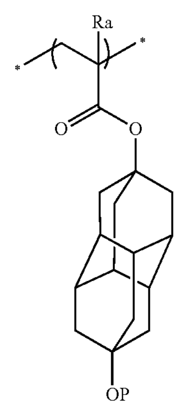

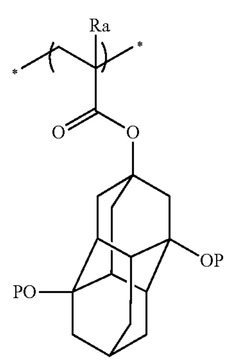

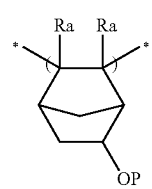

-continued

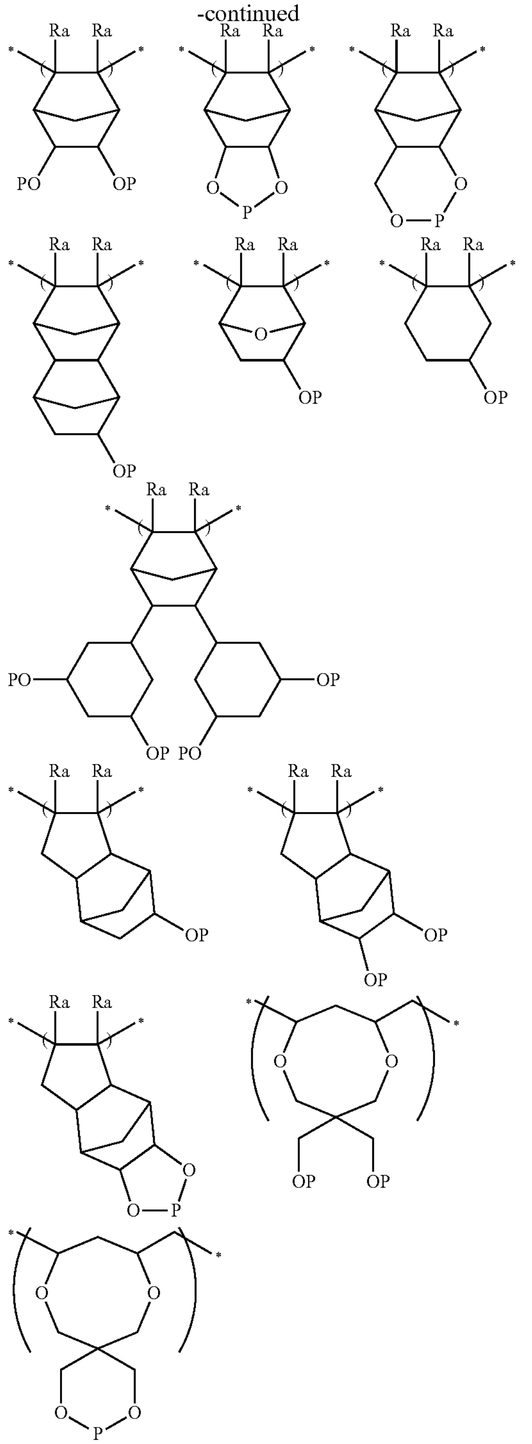

The group capable of decomposing by the action of an acid to produce an alcoholic hydroxy group is preferably represented by at least one formula selected from the group consisting of the following formulae (II-1) to (II-4):

(II-1)

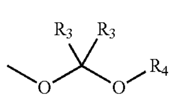

-continued (II-2)

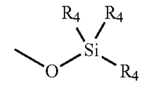

(II-3)

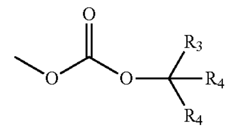

(II-4)

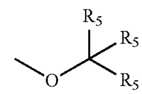

In the formulae, each $R_3$ independently represents a hydrogen atom or a monovalent organic group. $R_3$'s may combine with each other to form a ring.

Each $R_4$ independently represents a monovalent organic group. $R_4$'s may combine with each other to form a ring. $R_3$ and $R_4$ may combine with each other to form a ring.

Each $R_5$ independently represents a hydrogen atom, an alkyl group, a cycloalkyl group, an aryl group, an alkenyl group or an alkynyl group. At least two $R_5$'s may combine with each other to form a ring. However, when one or two of three $R_5$'s are a hydrogen atom, at least one of the remaining $R_5$'s represents an aryl group, an alkenyl group or an alkynyl group.

Also, the group capable of decomposing by the action of an acid to produce an alcoholic hydroxy group is preferably represented by at least one formula selected from the group consisting of the following formulae (II-5) to (II-9):

(II-5)

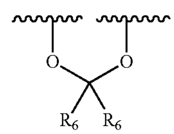

(II-6)

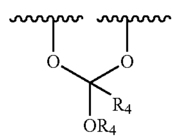

(II-7)

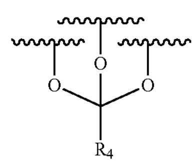

(II-8)

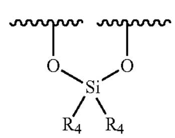

(II-9)

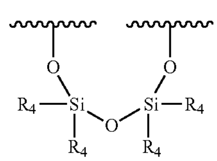

In the formulae, $R_4$ has the same meaning as in formulae (II-1) to (II-3).

Each $R_6$ independently represents a hydrogen atom or a monovalent organic group. $R_6$'s may combine with each other to form a ring.

The group capable of decomposing by the action of an acid to produce an alcoholic hydroxy group is more preferably represented by at least one formula selected from formulae (II-1) to (II-3), still more preferably represented by formula (II-1) or (II-3), yet still more preferably represented by formula (II-1).

$R_3$ represents a hydrogen atom or a monovalent organic group as described above. $R_3$ is preferably a hydrogen atom, an alkyl group or a cycloalkyl group, more preferably a hydrogen atom or an alkyl group.

The alkyl group of $R_3$ may be linear or branched. The carbon number of the alkyl group of $R_3$ is preferably from 1 to 10, more preferably from 1 to 3. Examples of the alkyl group of $R_3$ include a methyl group, an ethyl group, an n-propyl group, an isopropyl group and an n-butyl group.

The cycloalkyl group of $R_3$ may be monocyclic or polycyclic. The carbon number of the cycloalkyl group of $R_3$ is preferably 3 to 10, more preferably 4 to 8. Examples of the cycloalkyl group of $R_3$ include a cyclopropyl group, a cyclobutyl group, a cyclopentyl group, a cyclohexyl group, a norbornyl group and an adamantyl group.

In formula (II-1), at least either one $R_3$ is preferably a monovalent organic group. When such a configuration is employed, particularly high sensitivity can be achieved.

$R_4$ represents a monovalent organic group. $R_4$ is preferably an alkyl group or a cycloalkyl group, more preferably an alkyl group. These alkyl group and cycloalkyl group may have a substituent.

The alkyl group of $R_4$ preferably has no substituent or has one or more aryl groups and/or one or more silyl groups as the substituent. The carbon number of the unsubstituted alkyl group is preferably from 1 to 20. The carbon number of the alkyl group moiety in the alkyl group substituted with one or more aryl groups is preferably from 1 to 25. The carbon number of the alkyl group moiety in the alkyl group substituted with one or more silyl groups is preferably from 1 to 30. Also, in the case where the cycloalkyl group of $R_4$ does not have a substituent, the carbon number thereof is preferably from 3 to 20.

$R_5$ represents a hydrogen atom, an alkyl group, a cycloalkyl group, an aryl group, an alkenyl group or an alkynyl group. However, when one or two of three $R_5$'s are a hydrogen atom, at least one of the remaining $R_5$'s represents an aryl group, an alkenyl group or an alkynyl group. $R_5$ is preferably a hydrogen atom or an alkyl group. The alkyl group may or may not have a substituent. When the alkyl group does not have a substituent, the carbon number thereof is preferably from 1 to 6, more preferably from 1 to 3.

$R_6$ represents a hydrogen atom or a monovalent organic group as described above. $R_6$ is preferably a hydrogen atom, an alkyl group or a cycloalkyl group, more preferably a hydrogen atom or an alkyl group, still more preferably a hydrogen atom or an alkyl group having no substituent. $R_6$ is preferably a hydrogen atom or an alkyl group having a carbon number of 1 to 10, more preferably a hydrogen atom or an alkyl group having a carbon number of 1 to 10 and having no substituent.

Examples of the alkyl group and cycloalkyl group of $R_4$, $R_5$ and $R_6$ are the same as those described for $R_3$ above.

Specific examples of the group capable of decomposing by the action of an acid to produce an alcoholic hydroxyl group are illustrated below.

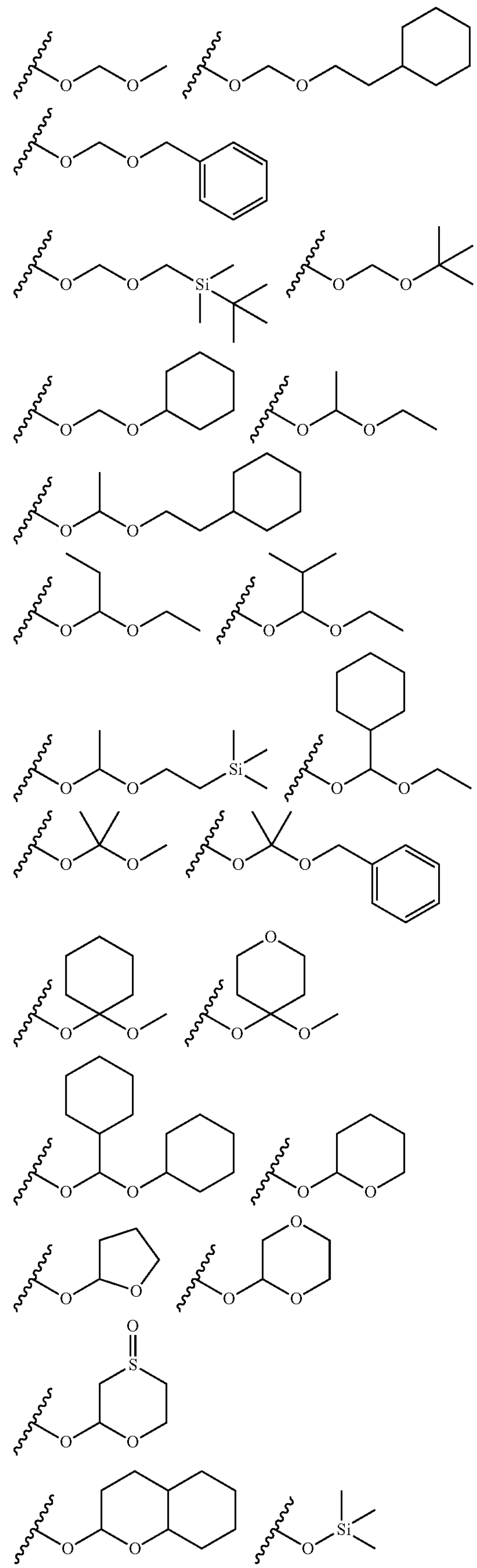

-continued
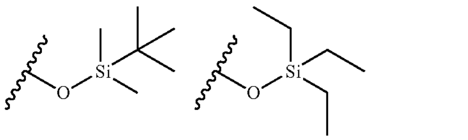
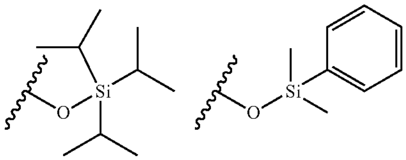
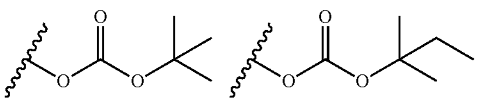
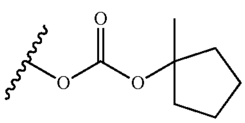
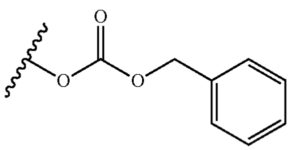
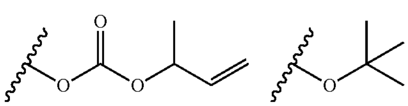
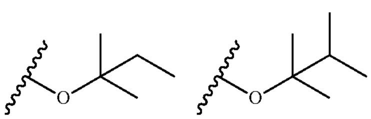
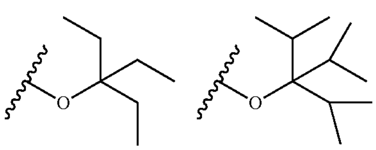
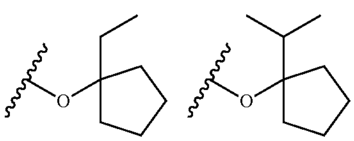
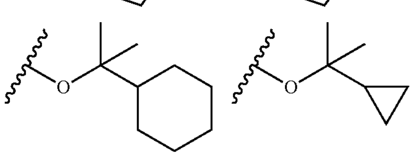
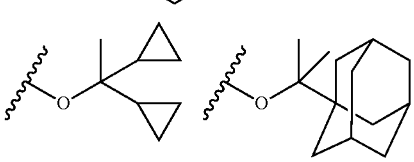
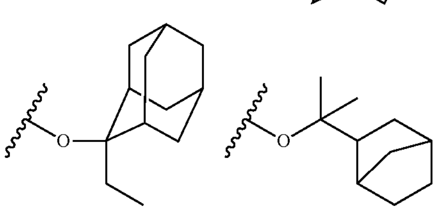
-continued
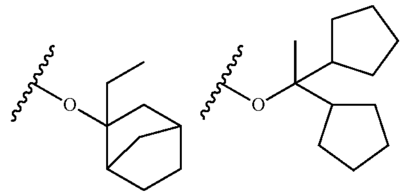
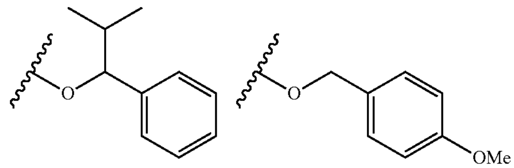
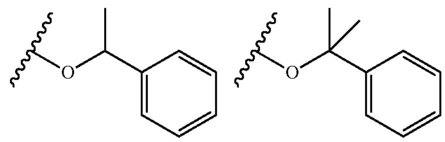
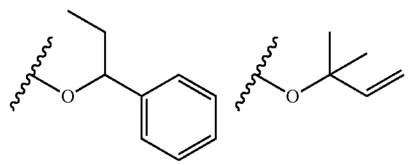
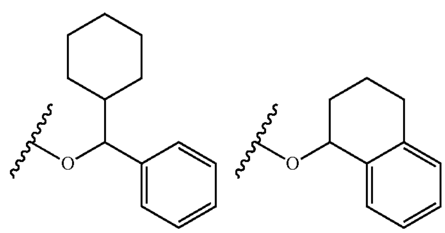
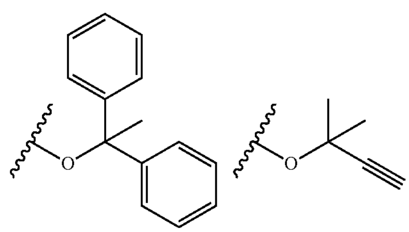
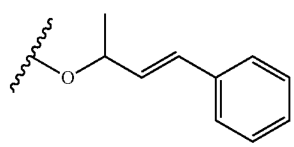
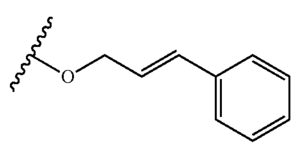
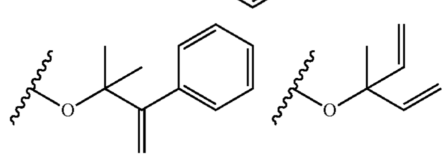
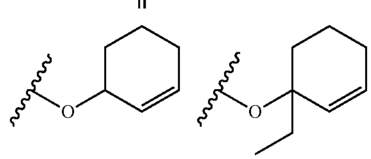

-continued

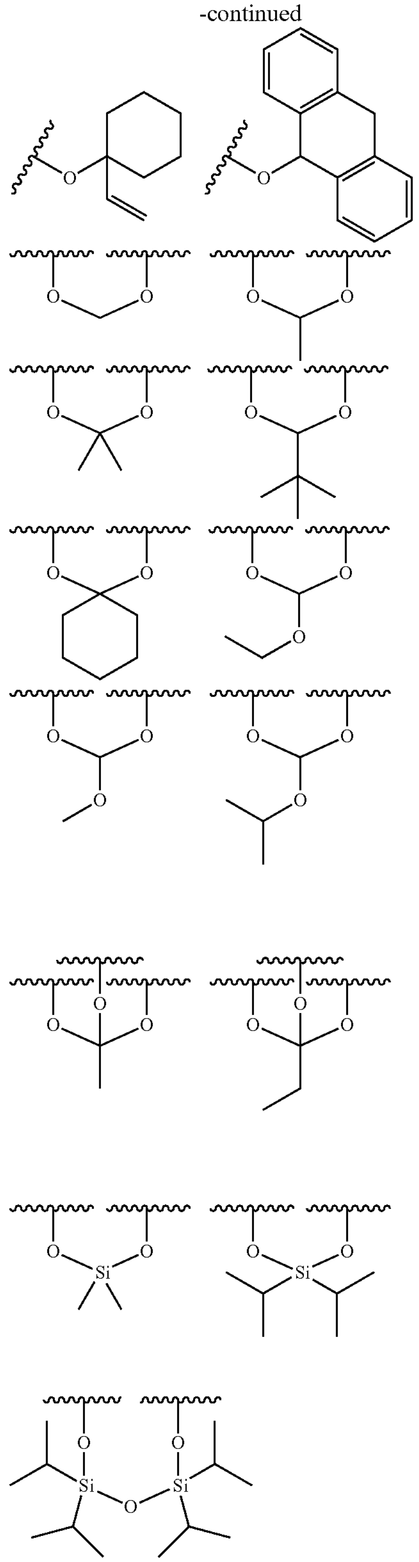

As described above, the repeating unit (P) is preferably represented by formula (I-1). Also, the group capable of decomposing by the action of an acid to produce an alcoholic hydroxyl group is preferably represented by formula (II-1). That is, the repeating unit (P) is preferably represented by the following formula (III):

(III)

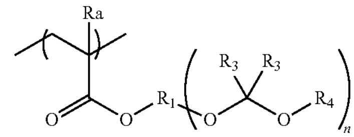

In the formula, $R_1$, Ra, $R_3$, $R_4$ and n have the same meanings as in formulae (I-1) and (II-1).

The preferred embodiment of the repeating unit (P) includes, for example, those having a partial structure represented by the following formula (D-1):

(D-1)

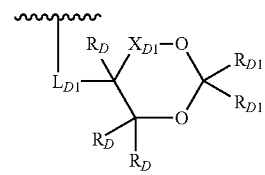

In the formula, $L_{D1}$ represents a single bond or a divalent or higher valent linking group.

Each $R_D$ independently represents a hydrogen atom, an alkyl group or a cycloalkyl group. At least two out of three $R_D$'s may combine with each other to form a ring.

$X_{D1}$ represents a single bond or a linking group having a carbon number of 1 or more.

$L_{D1}$, $R_D$ and $X_{D1}$ may combine with each other to form a ring. Also, at least one of $L_{D1}$, $R_D$ and $X_{D1}$ may combine with a carbon atom constituting the main chain of the polymer to form a ring.

Each $R_{D1}$ independently represents a hydrogen atom, an alkyl group or a cycloalkyl group. Two $R_{D1}$'s may combine with each other to form a ring.

Examples of the divalent or higher valent linking group represented by $L_{D1}$ include —COO—, —OCO—, —CONH—, —O—, —Ar—, —$SO_3$—, —$SO_2$NH—, an alkylene group, a cycloalkylene group and a linking group represented by a combination of two or more thereof. Here, Ar represents a divalent aromatic group.

In the case where $L_{D1}$ contains an alkylene group, this alkylene group may be linear or branched. The carbon number of the alkylene group is preferably from 1 to 6, more preferably from 1 to 3, still more preferably 1. Examples of the alkylene group include a methylene group, an ethylene group and a propylene group.

In the case where $L_{D1}$ contains a cycloalkylene group, the carbon number of this cycloalkylene group is preferably from 3 to 10, more preferably from 5 to 7. Examples of the cycloalkylene group include a cyclopropylene group, a cyclobutylene group, a cyclopentylene group and a cyclohexylene group.

Each of these alkylene group and cycloalkylene group may have a substituent. Examples of the substituent include a halogen atom such as fluorine atom, chlorine atom and bromine atom; a mercapto group; a hydroxy group, an alkoxy group such as methoxy group, ethoxy group, isopropoxy group, tert-butoxy group and benzyloxy group; a cycloalkyl group such as cyclopropyl group, cyclobutyl group, cyclopentyl group, cyclohexyl group and cycloheptyl group; a cyano group; a nitro group; a sulfonyl group; a silyl group; an ester group; an acyl group; a vinyl group; and an aryl group.

$L_{D1}$ preferably contains —COO—, more preferably a linking group represented by the combination of —COO— and an alkylene group, still more preferably a linking group represented by —COO—$(CH_2)_n$—. Here, n represents a natural number and is preferably from 1 to 6, more preferably from 1 to 3, still more preferably 1.

When $L_{D1}$ is a linking group represented by the combination of —COO— and an alkylene group, an embodiment where the alkylene group and $R_D$ combine with each other to form a ring is also preferred.

The alkyl group represented by $R_D$ may be linear or branched. The carbon number of this alkyl group is preferably from 1 to 6, more preferably 1 to 3.

The cycloalkyl group represented by $R_D$ may be monocyclic or polycyclic. Examples of this cycloalkyl group include a cyclopentyl group, a cyclohexyl group, a cycloheptyl group, a norbornyl group and an adamantyl group.

The ring formed by combining at least two members out of three $R_D$'s with each other is preferably a 5- to 7-membered ring, more preferably a 6-membered ring.

The linking group having a carbon number of 1 or more represented by $X_{D1}$ includes, for example, an alkylene group. This alkylene group may be linear or branched. The carbon number of the alkylene group is preferably from 1 to 6, more preferably from 1 to 3, still more preferably 1. Examples of the alkylene group include a methylene group, an ethylene group and a propylene group.

The alkyl group represented by $R_{D1}$ may be linear or branched. The carbon number of this alkyl group is preferably from 1 to 6, more preferably 1 to 3.

The cycloalkyl group represented by $R_{D1}$ may be monocyclic or polycyclic. Examples of this cycloalkyl group are the same as those of the cycloalkyl group represented by $R_D$ above.

The ring which can be formed by combining two $R_{D1}$'s with each other may be monocyclic or polycyclic, but in view of the solubility in a solvent, the ring is preferably monocyclic. Also, this ring is preferably a 5- to 7-membered ring; more preferably a 6-membered ring.

The repeating unit (P) represented by formula (D-1) typically has a structure represented by the following formula (D-2):

(D-2)

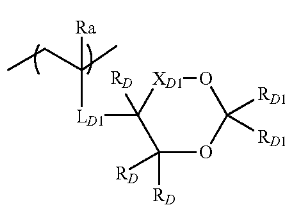

In the formula, Ra has the same meaning as in formula (I-1). Ra is preferably a methyl group.

$L_{D1}$, $R_D$, $X_{D1}$ and $R_{D1}$ have the same meanings as in formula (D-1).

Specific examples of the repeating unit (P) represented by formula (D-1) are illustrated below.

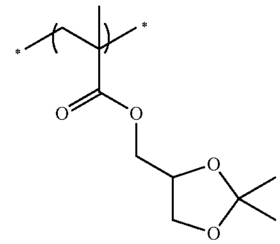

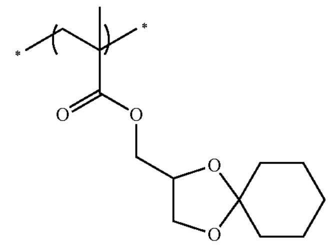

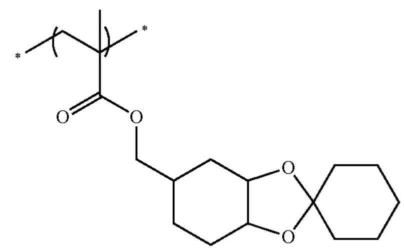

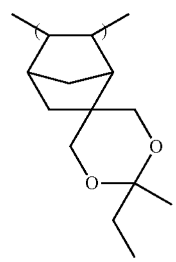

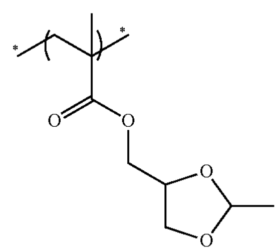

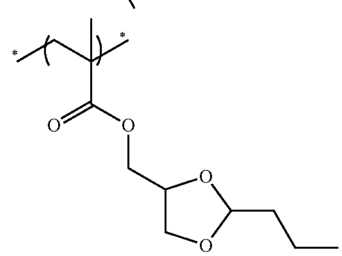

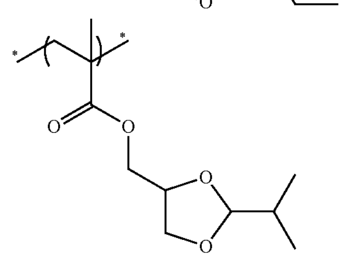

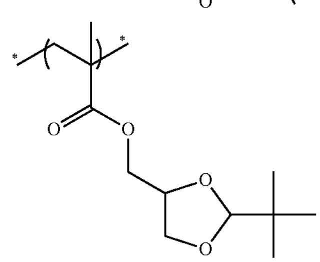

-continued
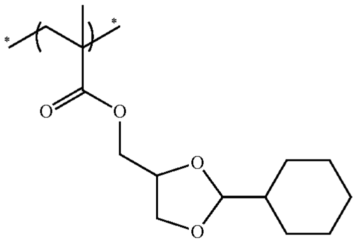
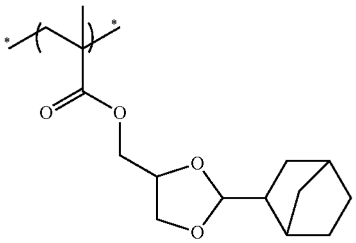
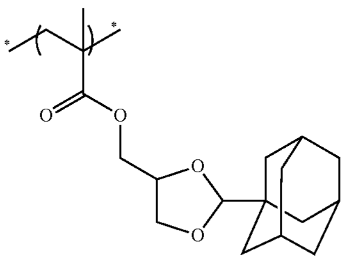
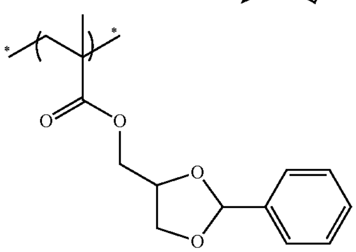
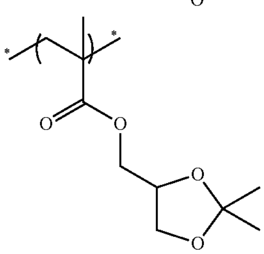
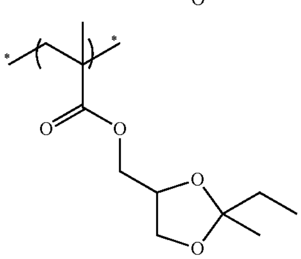
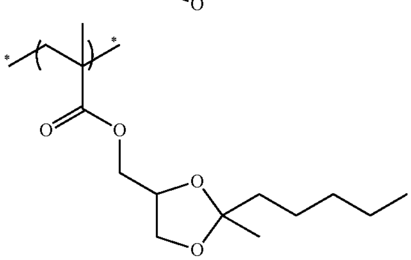
-continued
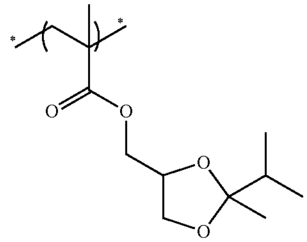
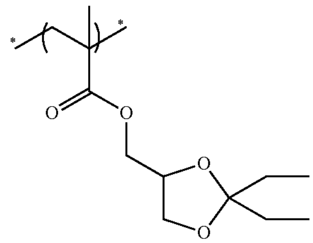
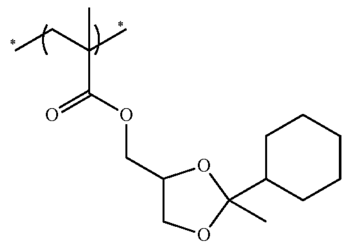
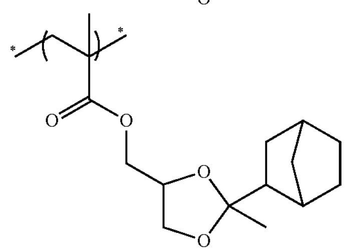
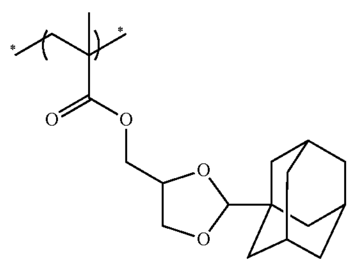
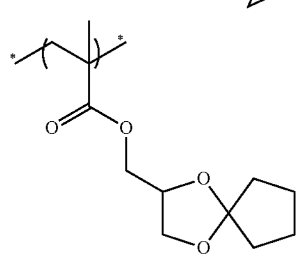
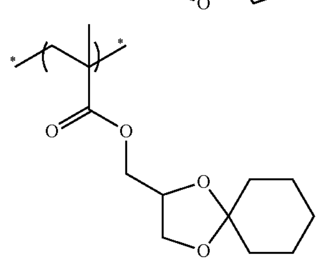

-continued
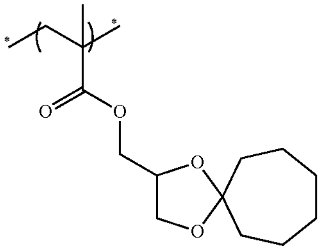
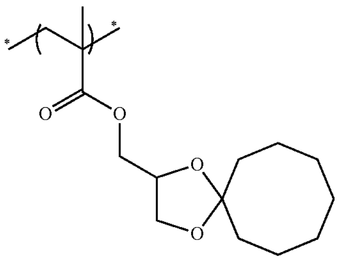
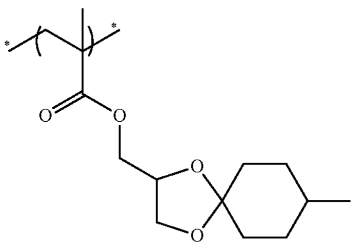
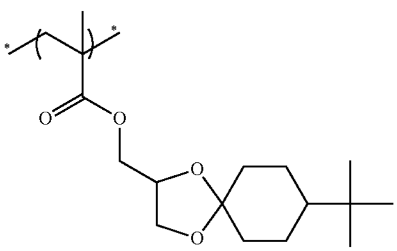
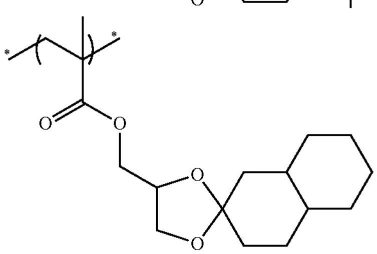
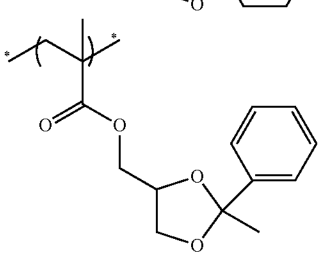
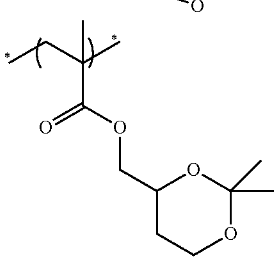
-continued
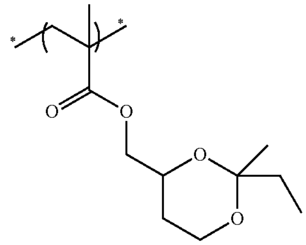
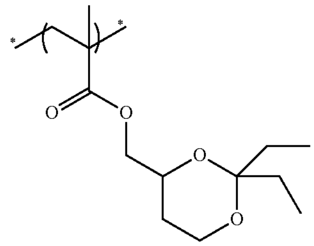
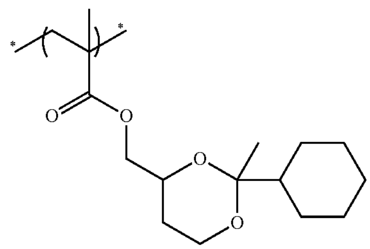
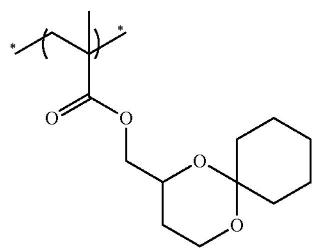
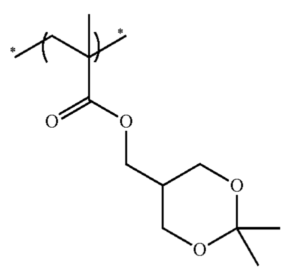
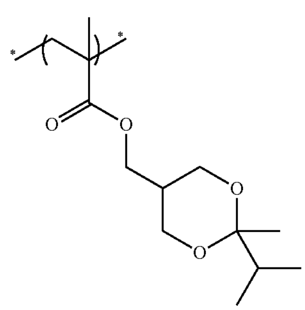

-continued
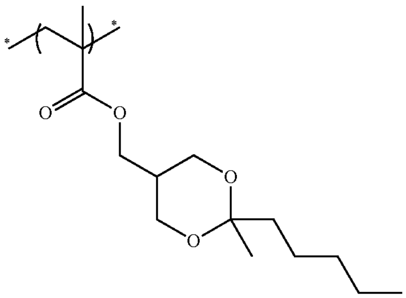
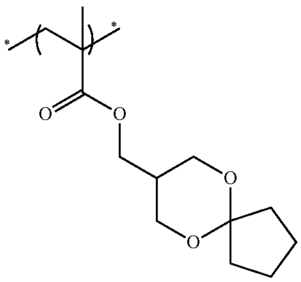
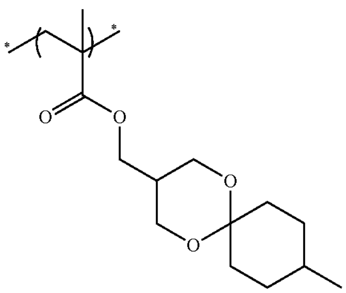
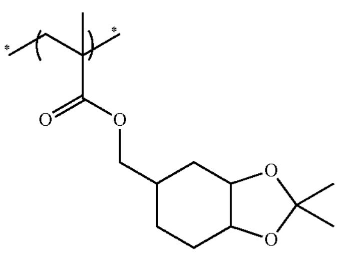
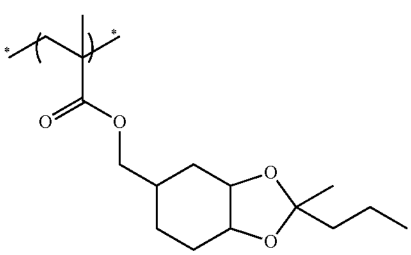
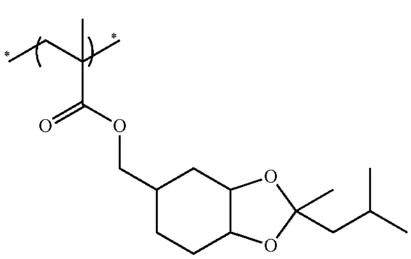
-continued
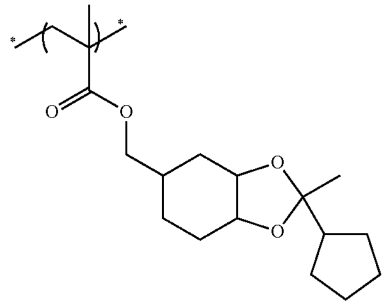
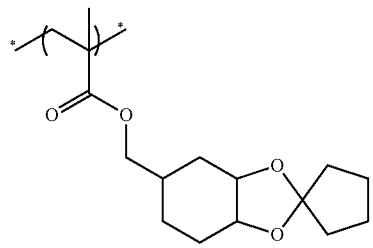
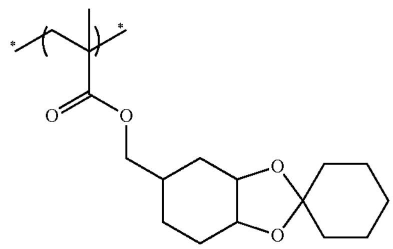
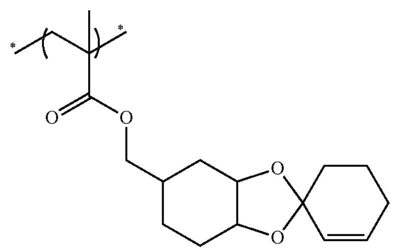
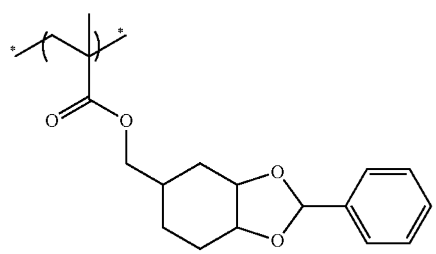
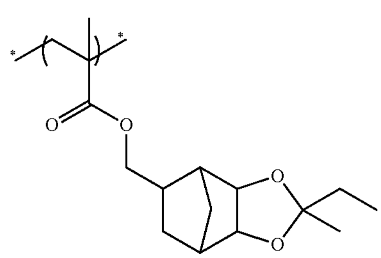

-continued
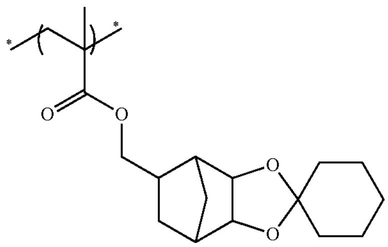
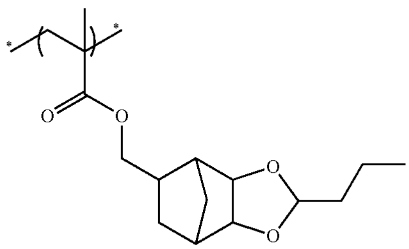
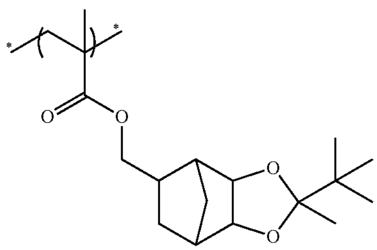
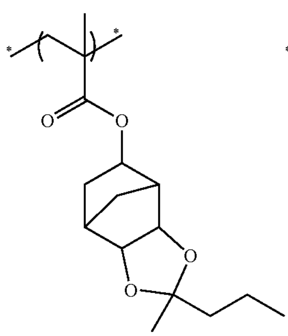
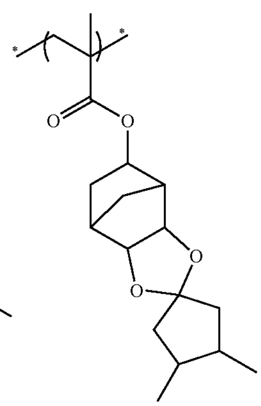
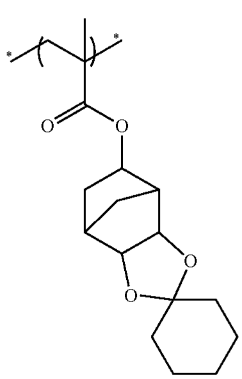
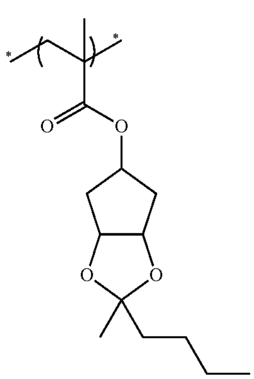
-continued
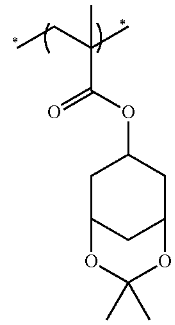
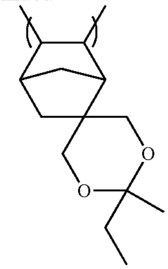
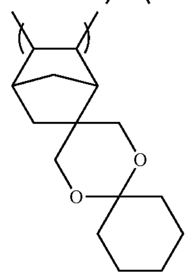
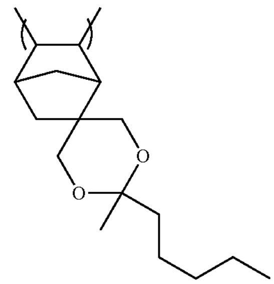
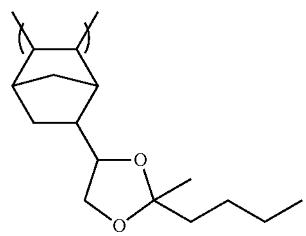
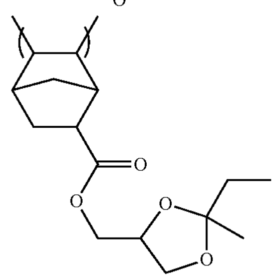
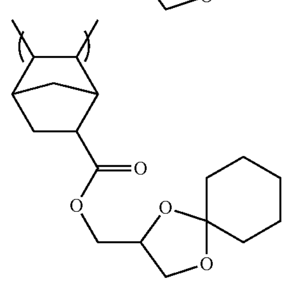
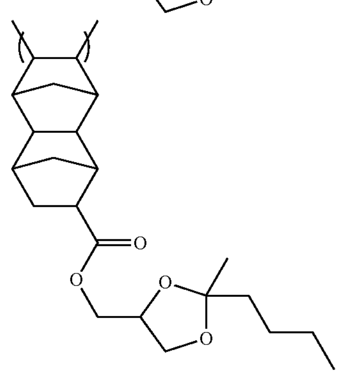

-continued
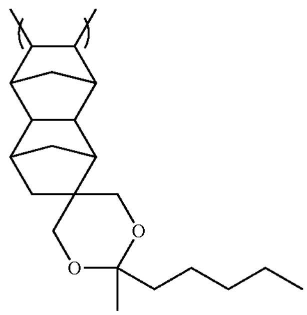
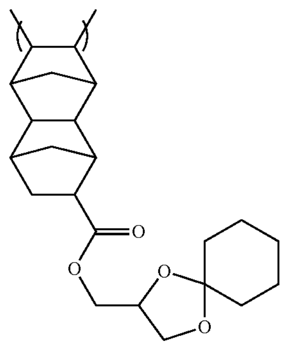
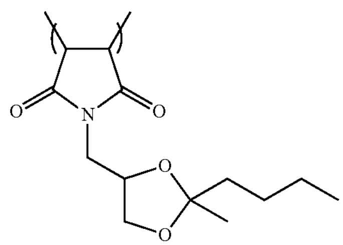
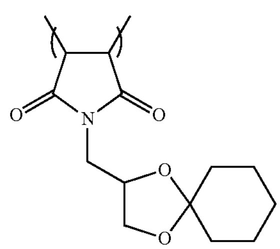
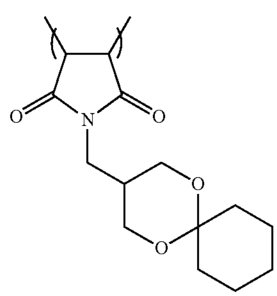
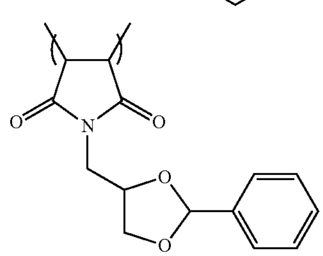
-continued
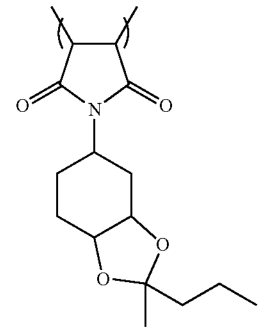
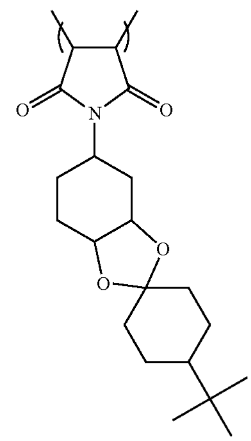
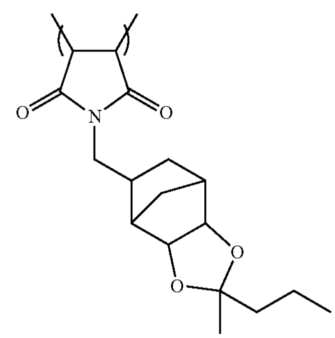
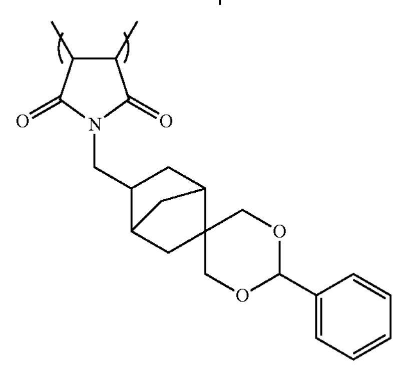
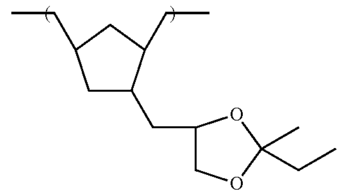

-continued

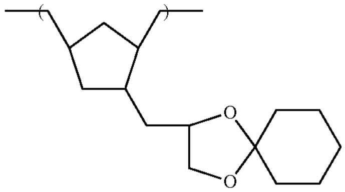

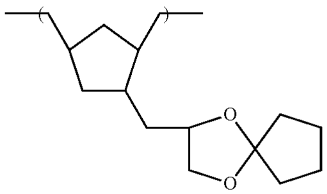

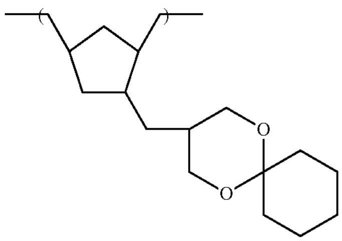

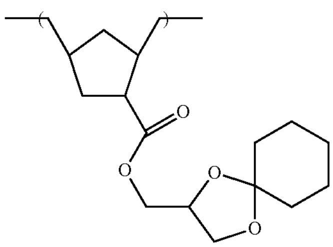

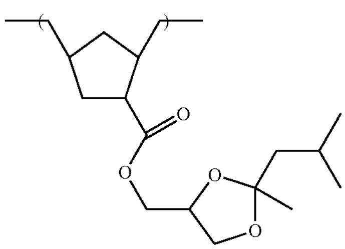

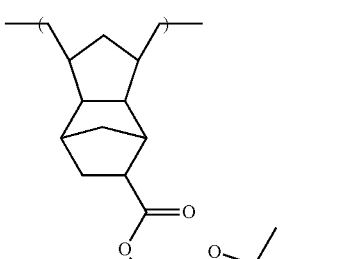

-continued

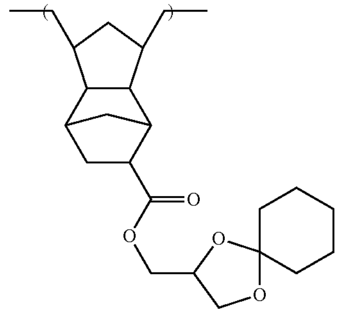

The acid-decomposable resin may contain two or more kinds of repeating units (P) having a group capable of decomposing by the action of an acid to produce an alcoholic hydroxy group. When such a configuration is employed, the reactivity and/or the developability can be subtly adjusted to facilitate optimization of various performances.

The acid-decomposable resin may contain a repeating unit having a group capable of decomposing by the action of an acid to produce an alcoholic group and further contain a repeating unit (hereinafter referred to as a repeating unit (B)) having a group capable of decomposing by the action of an acid to produce a polar group except for an alcoholic hydroxy group. In particular, the acid-decomposable resin preferably further contains a repeating unit having a group capable of decomposing by the action of an acid to produce a carboxy group. In this case, the focus latitude (DOF) of a composition containing the acid-decomposable resin can be more enhanced.

The repeating unit (B) preferably has a structure where the polar group is protected by a group capable of decomposing and leaving by the action of an acid. Examples of the polar group include a phenolic hydroxy group, a carboxy group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group. Preferred polar groups are a carboxy group and a sulfonic acid group.

The group preferred as the acid-decomposable group is a group where a hydrogen atom of such a polar group is substituted for by a group capable of leaving by the action of an acid.

When the resin of the invention contains the repeating unit (P) and the repeating unit (B), its content as its total is, for total repeating units in the resin, preferably 3 to 50 mol %, more preferably 5 to 40 mol %, further preferably 7 to 30 mol %.

Moreover, in this case, a molar ratio of the repeating unit (B) to the repeating unit (P) is preferably 5:95 to 70:30, more preferably 7:93 to 50:50, further preferably 10:90 to 30:70.

The content of the (a1) repeating unit having an acid-decomposable group is preferably 10 to 100 mol %, more preferably from 20 to 70 mol %, further more preferably from 30 to 60 mol %, based on all repeating units constituting the resin (A).

In the case that the resin (A) contains a repeating unit having a group capable of decomposing by the action of an acid to produce an alcoholic group, the content of the repeating unit having a group capable of decomposing by the action of an acid to produce an alcoholic hydroxy group is preferably from 10 to 100 mol %, more preferably from 30 to 90 mol %, still more preferably from 50 to 80 mol %, based on all repeating units of the resin (A).

(a2) Repeating Unit Having an Alcoholic Hydroxyl Group

The resin (A) may contain (a2) a repeating unit having an alcoholic hydroxyl group, at least either in the main chain or on the side chain. By containing such a unit, enhancement of the adherence to substrate can be expected. Also, when the resist composition of the present invention contains the later-described crosslinking agent, the resin (A) preferably contains (a2) a repeating unit having an alcoholic hydroxyl group, because the alcoholic hydroxyl group functions as a crosslinking group and therefore, the hydroxyl group reacts with the crosslinking agent by the action of an acid, which produces an effect of more promoting the resist film to become insoluble or sparingly insoluble in an organic solvent-containing developer and further improving the line width roughness (LWR) performance.

The alcoholic hydroxyl group as used in the present invention is a hydroxyl group bonded to a hydrocarbon group and is not particularly limited as long as it is not a hydroxyl group (phenolic hydroxyl group) directly bonded on an aromatic ring, but in the present invention, a hydroxyl group except for the hydroxyl group in the aliphatic alcohol substituted with an electron-withdrawing group at the α-position, described above as the acid group, is preferred. The hydroxyl group is preferably a primary alcoholic hydroxyl group (a group where the carbon atom on which a hydroxyl group is substituted has two hydrogen atoms separately from the hydroxyl group) or a secondary alcoholic hydroxyl group where another electron-withdrawing group is not bonded to the carbon atom on which a hydroxyl group is substituted, because the reaction efficiency with the crosslinking agent (C) is enhanced.

The repeating unit (a2) preferably has from one to three, more preferably one or two, alcoholic hydroxyl groups per the repeating unit.

Such a repeating unit includes a repeating unit represented by formula (2) or (3).

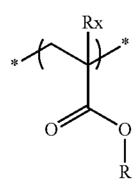

(2)

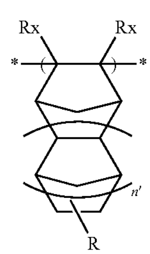

(3)

In formula (2), at least either one of Rx and R represents an alcoholic hydroxyl group-containing structure.

In formula (3), at least one of two Rx's and R represents an alcoholic hydroxyl group-containing structure. Two Rx's may be the same or different.

Examples of the alcoholic hydroxyl group-containing structure include a hydroxyalkyl group (preferably having a carbon number of 2 to 8, more preferably from 2 to 4), a hydroxycycloalkyl group (preferably having a carbon number of 4 to 14), a hydroxyalkyl group-substituted cycloalkyl group (preferably having a total carbon number of 5 to 20), a hydroxyalkoxy group-substituted alkyl group (preferably having a total carbon number of 3 to 15), and a hydroxyalkoxy group-substituted cycloalkyl group (preferably having a total carbon number of 5 to 20). As described above, a residue structure of a primary alcohol is preferred, and a structure represented by —$(CH_2)_n$—OH (n is an integer of 1 or more, preferably an integer of 2 to 4) is more preferred.

Rx represents a hydrogen atom, a halogen atom, a hydroxyl group, an alkyl group (preferably having a carbon number of 1 to 4) which may have a substituent, or a cycloalkyl group (preferably having a carbon number of 5 to 12) which may have a substituent. Preferred substituents which the alkyl group and cycloalkyl group of Rx may have include a hydroxyl group and a halogen atom. The halogen atom of Rx includes a fluorine atom, a chlorine atom, a bromine atom and an iodine atom. Rx is preferably a hydrogen atom, a methyl group, a hydroxymethyl group, a hydroxyl group or a trifluoromethyl group, more preferably a hydrogen atom or methyl group.

R represents a hydrocarbon group which may have a hydroxyl group. The hydrocarbon group of R is preferably a saturated hydrocarbon group and includes an alkyl group (preferably having a carbon number of 1 to 8, more preferably from 2 to 4) and a monocyclic or polycyclic, cyclic hydrocarbon group (preferably having a carbon number of 3 to 20, for example, the later-described alicyclic group). n' represents an integer of 0 to 2.

The repeating unit (a2) is preferably a repeating unit derived from an ester of an acrylic acid, in which the α-position (for example, Rx in formula (2)) of the main chain may be substituted, and is more preferably derived from a monomer having a structure corresponding to formula (2). Also, it is preferred to contain an alicyclic group in the unit. The alicyclic group includes monocyclic and polycyclic structures but in view of etching resistance, a polycyclic structure is preferred.

Specific examples of the alicyclic structure include, as a monocyclic structure, cyclobutyl, cyclopentyl, cyclohexyl, cycloheptyl and cyclooctyl; and as a polycyclic structure, norbornyl, isobornyl, tricyclodecanyl, tetracyclododecanyl, hexacycloheptadecanyl, adamantyl, diamantyl, spirodecanyl and spiroundecanyl. Among these structures, adamantyl, diamantyl and norbornyl are preferred.

Examples of the repeating unit (a2) are illustrated below, but the present invention is not limited thereto. In specific examples, $R^x$ represents a hydrogen atom or a methyl group.

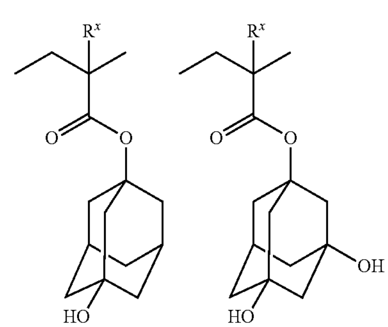

-continued
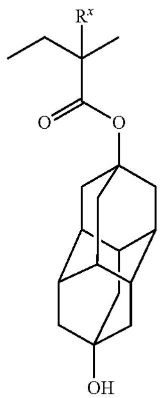
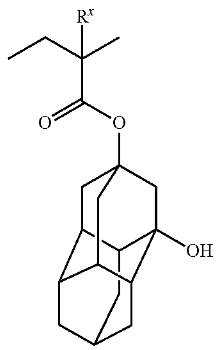
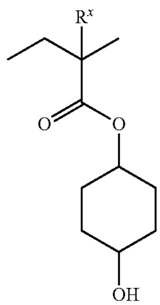
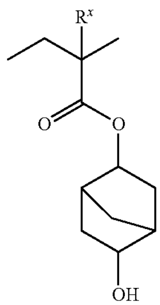
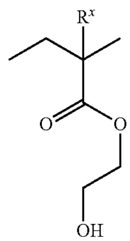
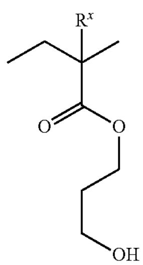
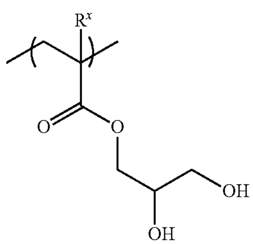
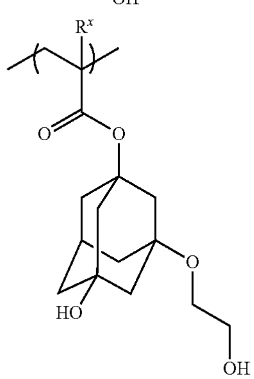
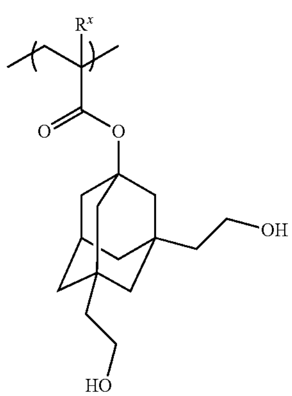
-continued
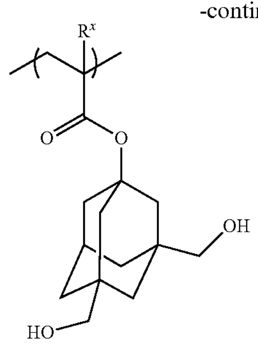
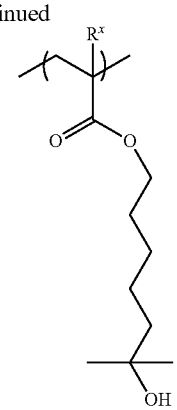
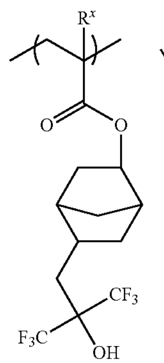
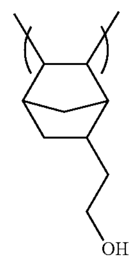
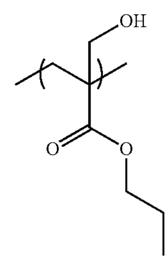
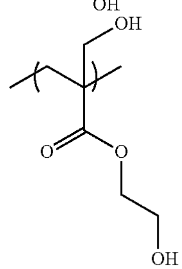
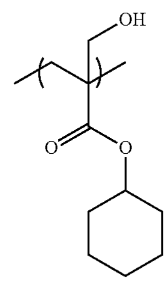
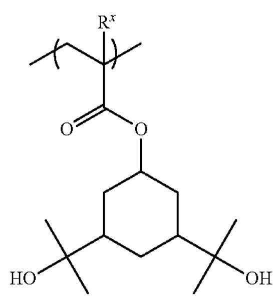
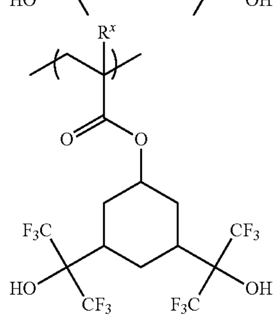
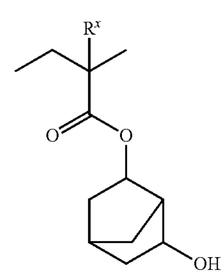
The repeating unit (a2) may have a structure where at least one of the repeating unit (a1) and the later-described repeating units (a3) and (a4) has an alcoholic hydroxyl group. For example, in the (a1) repeating unit having an acid-decomposable group, the moiety capable of leaving by the action of an acid may have an alcoholic hydroxyl group. It is considered that the crosslinking efficiency can be optimized by containing such a repeating unit. Specific examples of such a structure include a structure where in formula (AI), the moiety of atomic group —C($Rx_1$)($Rx_2$)($Rx_3$) has a hydroxyl group, more specifically, a structure where in the repeating unit represented by formula (2-1), $R_{10}$ is a hydroxyl group, a hydroxyl group-containing linear or branched alkyl group, or a hydroxyl group-containing cycloalkyl group.

In the case where the resin (A) contains (a2) a repeating unit having an alcoholic hydroxyl group, the content thereof is generally from 10 to 80 mol %, preferably from 10 to 60 mol %, based on all repeating units constituting the resin (A).

(a3) Repeating Unit Having a Nonpolar Group

The resin (A) preferably further contains (a3) a repeating unit having a nonpolar group. Thanks to this repeating unit, not only dissolving out of low molecular components from the resist film into the immersion liquid at the immersion exposure can be reduced but also the solubility of the resin at the development using an organic solvent-containing developer can be appropriately adjusted. The (a3) repeating unit having a nonpolar group is preferably a repeating unit not containing a polar group (for example, the above-described acid group, a hydroxyl group or a cyano group) in the repeating unit and is preferably a repeating unit not having the above-described acid-decomposable group and the later-described lactone structure. Such a repeating unit includes a repeating unit represented by formula (4) or (5):

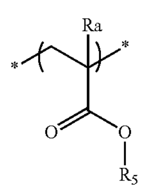

(4)

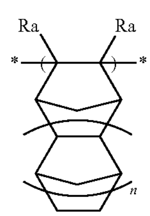

(5)

In the formulae, $R_5$ represents a hydrocarbon group having neither a hydroxyl group nor a cyano group.

Ra represents, when a plurality of Ra's are present, each independently represents, a hydrogen atom, a hydroxyl group, a halogen atom or an alkyl group (preferably having a carbon number of 1 to 4) or —$CH_2$—O—$Ra_2$ group. In the formulae, $Ra_2$ represents a hydrogen atom, an alkyl group or an acyl group. The alkyl group of Ra may have a substituent, and the substituent includes a hydroxyl group and a halogen atom. The halogen atom of Ra includes a fluorine atom, a chlorine atom, a bromine atom and an iodine atom. Ra is preferably a hydrogen atom, a methyl group, a trifluoromethyl group or a hydroxymethyl group, more preferably a hydrogen atom or a methyl group.

n represents an integer of 0 to 2.

$R_5$ preferably contains at least one cyclic structure.

The hydrocarbon group in $R_5$ includes, for example, a chain or branched hydrocarbon group, a monocyclic hydrocarbon group and a polycyclic hydrocarbon group. In view of dry etching resistance, $R_5$ preferably contains a monocyclic hydrocarbon group or a polycyclic hydrocarbon group, more preferably a polycyclic hydrocarbon group.

$R_5$ is preferably a group represented by $-L_4-A_4-(R_4)_{n4}$. $L_4$ represents a single bond or a divalent hydrocarbon group and is preferably a single bond, an alkylene group (preferably having a carbon number of 1 to 3) or a cycloalkylene group (preferably having a carbon number of 5 to 7), more preferably a single bond. $A_4$ represents an (n4+1)-valent hydrocarbon group (preferably having a carbon number of 3 to 30, more preferably a carbon number of 3 to 14, still more preferably a carbon number of 6 to 12), preferably a monocyclic or polycyclic alicyclic hydrocarbon group. n4 represents an integer of 0 to 5, preferably an integer of 0 to 3. $R_4$ represents a hydrocarbon group, preferably an alkyl group (preferably having a carbon number of 1 to 3) or a cycloalkyl group (preferably having a carbon number of 5 to 7).

The chain or branched hydrocarbon group includes, for example, an alkyl group having a carbon number of 3 to 12, and the monocyclic hydrocarbon group includes, for example, a cycloalkyl group having a carbon number of 3 to 12 (for example, cyclopentyl group, cyclohexyl group, cycloheptyl group, cyclooctyl group), a cycloalkenyl group having a carbon number of 3 to 12 (for example, cyclohexenyl group), and a phenyl group. The monocyclic hydrocarbon group is preferably a monocyclic saturated hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[$5.2.1.0^{2,6}$]decane ring and tricyclo[$4.3.1.1^{2,5}$]undecane ring, and a tetracyclic hydrocarbon ring such as tetracyclo[$4.4.0.1^{2,5}.1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[$5,2,1,0^{2,6}$]decanyl group. Of these crosslinked cyclic hydrocarbon rings, a norbornyl group and an adamantyl group are more preferred.

These groups may further have a substituent, and preferred examples of the substituent include a halogen atom and an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom and an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

In the case of containing (a3) a repeating unit having a nonpolar group, the content thereof is generally from 20 to 80 mol %, preferably from 30 to 60 mol %, based on all repeating units constituting the resin (A).

In the case that the resin (A) contains the repeating unit (P) and the repeating unit (a3), the content of the repeating unit (a3) is preferably from 0 to 40 mol %, more preferably from 1 to 20 mol %, based on all repeating units in the resin (A).

Specific examples of the repeating unit having a nonpolar group are illustrated below, but the present invention is not limited thereto. In the formulae, Ra represents a hydrogen atom, a hydroxyl group, a halogen atom, or an alkyl group having a carbon number of 1 to 4 which may have a substituent. The substituent which the alkyl group of Ra may have includes a hydroxyl group and a halogen atom. The halogen atom of Ra includes a fluorine atom, a chlorine atom, a bromine atom and an iodine atom. Ra is preferably a hydrogen atom, a methyl group, a hydroxymethyl group or a trifluoromethyl group, more preferably a hydrogen atom or a methyl group.

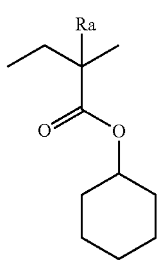
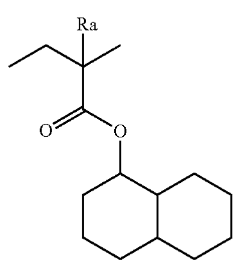
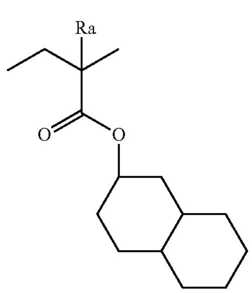
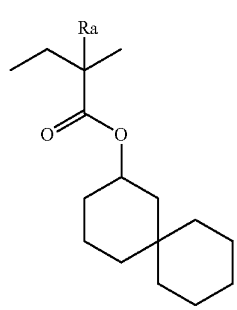

-continued

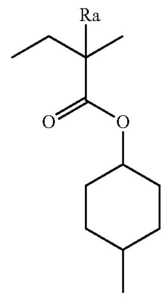
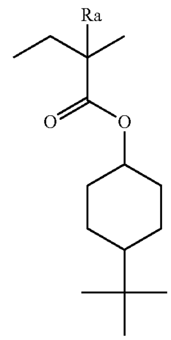
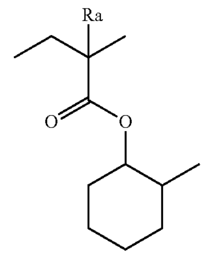
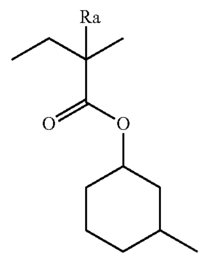
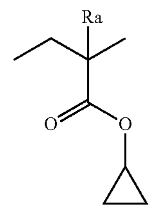
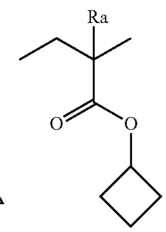
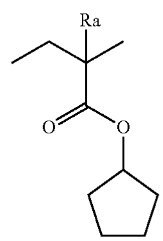
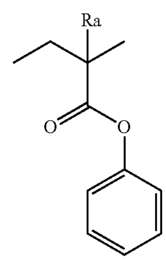
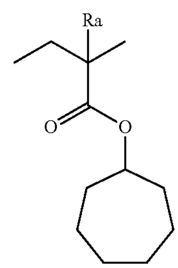
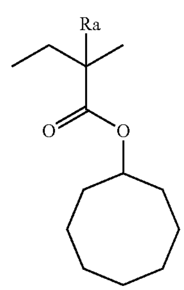
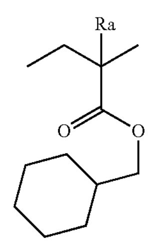
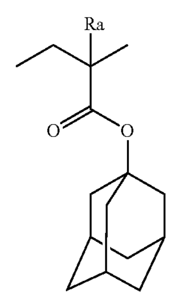
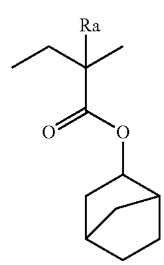
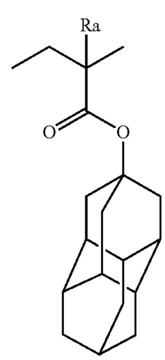
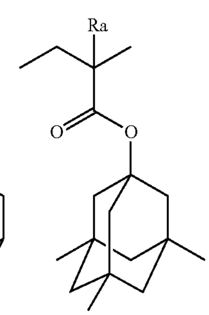

-continued

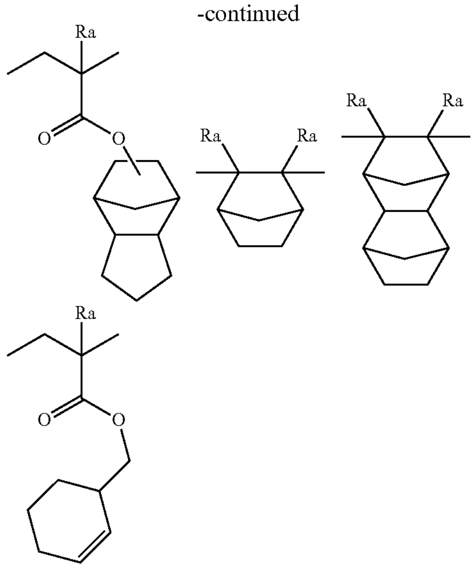

(a4) Repeating Unit Having a Polar Group

The resin (A) preferably further contain (a4) a repeating unit having a polar group. Thanks to this repeating unit, for example, the sensitivity of the composition containing the acid-decomposable resin can be more enhanced.

The "polar group" which the repeating unit (a4) can contain include, for example, the following (1) to (4). In the following, the "electronegativity" means a Pauling's value.

(1) Functional group containing a structure where an oxygen atom and an atom with an electronegativity difference from oxygen atom being 1.1 or more are bonded through a single bond Examples of this polar group include a group containing a structure represented by O—H, such as hydroxy group.

(2) Functional group containing a structure where a nitrogen atom and an atom with an electronegativity difference from nitrogen atom being 0.6 or more are bonded through a single bond Examples of this polar group include a group containing a structure represented by N—H, such as amino group.

(3) Functional group containing a structure where two atoms differing in the electronegativity by 0.5 or more are bonded through a double bond or a triple bond Examples of this polar group include a group containing a structure represented by C≡N, C═O, N═O, S═O or C═N.

(4) Functional group having an ionic moiety

Examples of this polar group include a group having a moiety represented by $N^+$ or $S^+$.

The "polar group" which the repeating unit (a4) can contain is, for example, at least one selected from the group consisting of (I) a hydroxy group, (II) a cyano group, (III) a lactone group, (IV) a carboxylic acid group or a sulfonic acid group, (V) an amide group, a sulfonamide group or a group corresponding to the derivative thereof, (VI) an ammonium salt or a sulfonium salt, and a group formed by combining two or more thereof.

The polar group is preferably an alcoholic hydroxy group, a cyano group, a lactone group, or a cyanolactone structure-containing group.

When a repeating unit having an alcoholic hydroxy group is further contained in the acid-decomposable resin, the exposure latitude (EL) of a composition containing the acid-decomposable resin can be more enhanced.

When a repeating unit having a cyano group is further contained in the acid-decomposable resin, the sensitivity of a composition containing the acid-decomposable resin can be more enhanced.

When a repeating unit having a lactone group is further contained in the acid-decomposable resin, the dissolution contrast for an organic solvent-containing developer can be more enhanced. Also, a composition containing the acid-decomposable resin can be more enhanced in the dry etching resistance, coatability and adherence to substrate.

When a repeating unit containing a lactone structure having a cyano group is further contained in the acid-decomposable resin, the dissolution contrast for an organic solvent-containing developer can be more enhanced. Also, a composition containing the acid-decomposable resin can be more enhanced in the sensitivity, dry etching resistance, coatability and adherence to substrate. In addition, a single repeating unit can play functions attributable to a cyano group and a lactone group, respectively, and the freedom in designing the acid-decomposable resin can be more increased.

Specific examples of the structure which the "polar group" can contain are illustrated below.

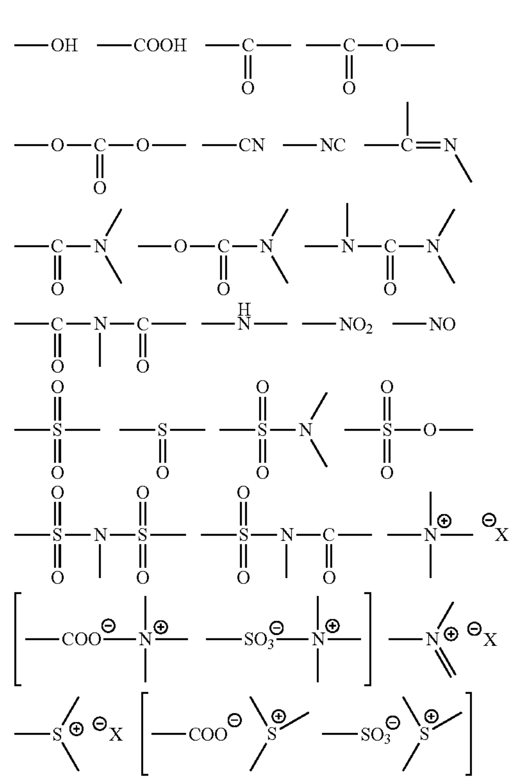

The preferred repeating unit (a4) includes, for example, the repeating unit (P) where "a group capable of decomposing by the action of an acid to produce an alcoholic hydroxy group" is replaced by "an alcoholic hydroxy group".

This repeating unit (a4) preferably has a structure where in each of formulae (I-1) to (I-10), "OP" is replaced by "OH". That is, the repeating unit is preferably represented by at least one formula selected from the group consisting of the following formulae (I-1H) to (I-10H). The repeating unit (A) is more preferably represented by at least one formula selected from the following formulae (I-1H) to (I-3H), still more preferably represented by the following formula (I-1H).

(I-1H)

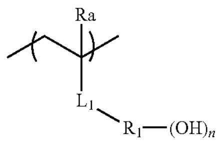

(I-2H)

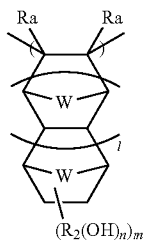

(I-3H)

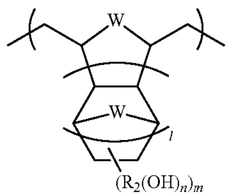

(I-4H)

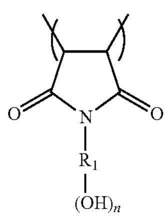

(I-5H)

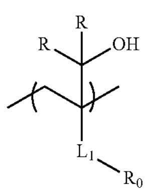

(I-6H)

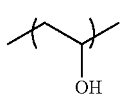

(I-7H)

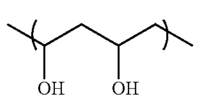

(I-8H)

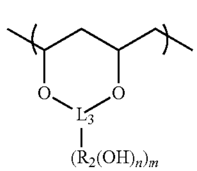

(I-9H)

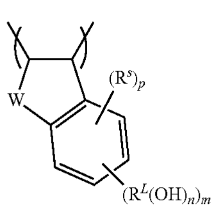

-continued (I-10H)

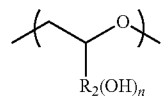

In the formulae, Ra, $R_1$, $R_2$, OP, W, n, m, l, $L_1$, R, $R_0$, $L_3$, $R^L$, $R^S$ and p have the same meanings as in formulae (I-1) to (I-10).

In one of the preferable embodiments of the invention, when a repeating unit having a group capable of decomposing by the action of an acid to produce an alcoholic hydroxy group and a repeating unit represented by at least one formula selected from the group consisting of formulae (I-1H) to (I-10H) are used in combination, for example, thanks to suppression of acid diffusion by the alcoholic hydroxy group and increase in the sensitivity by the group capable of decomposing by the action of an acid to produce an alcoholic hydroxy group, the exposure latitude (EL) can be improved without deteriorating other performances.

In the case that the resin (A) contains the repeating unit (P), the content of the repeating unit (a4) where in the repeating unit (P), "a group capable of decomposing by the action of an acid to produce an alcoholic hydroxy group" is replaced by "an alcoholic hydroxy group", is preferably from 5 to 100 mol %, more preferably from 10 to 90 mol %, still more preferably from 20 to 80 mol %, based on all repeating units in the acid-decomposable resin.

Specific examples of the repeating unit represented by any one of (I-1H) to (I-10H) are illustrated below. In specific examples, Ra has the same meaning as in formulae (I-1H) to (I-10H).

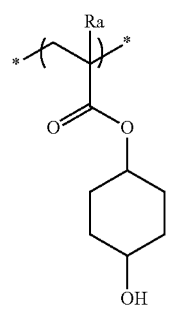

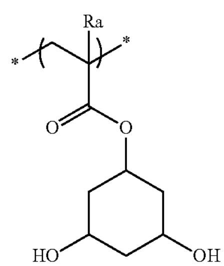

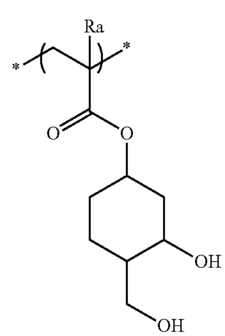

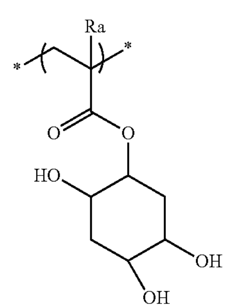

-continued

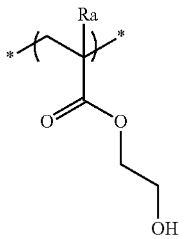

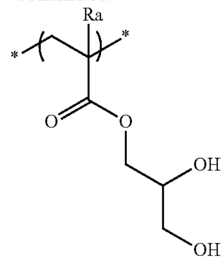

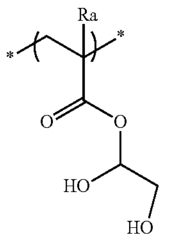

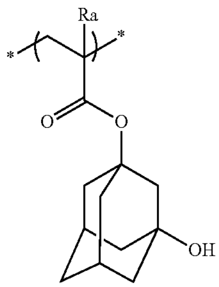

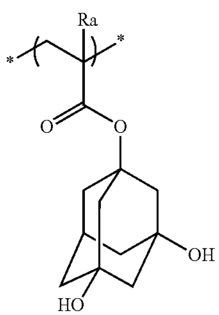

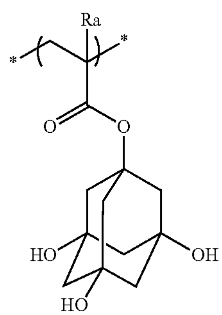

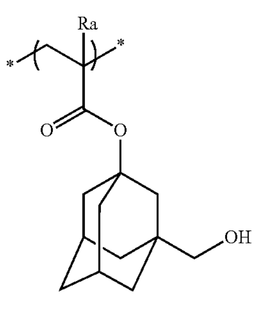

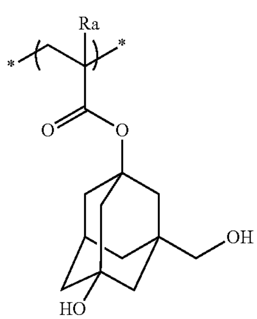

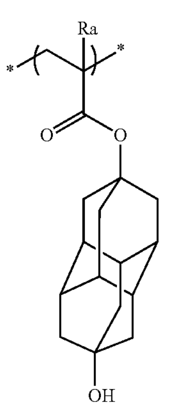

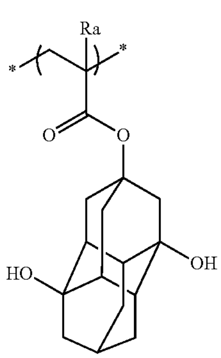

-continued

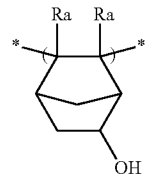

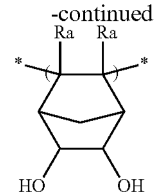

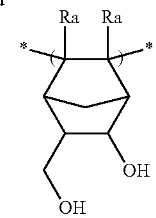

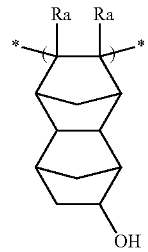

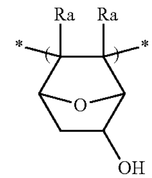

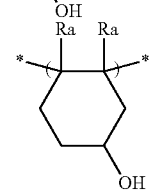

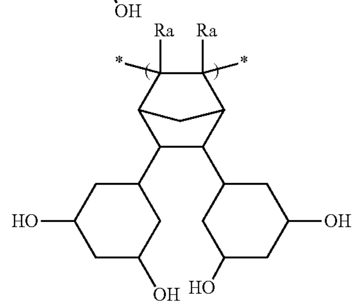

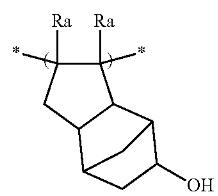

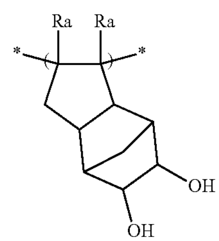

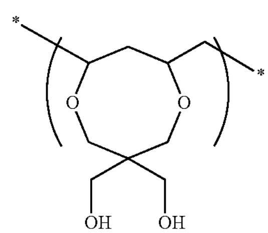

Other preferred examples of the repeating unit (a4) include a repeating unit having a hydroxy group or a cyano group.

The repeating unit having a hydroxy group or a cyano group is preferably a repeating unit having an alicyclic hydrocarbon structure substituted with a hydroxy group or a cyano group and preferably has no acid-decomposable group. The alicyclic hydrocarbon structure in the alicyclic hydrocarbon structure substituted with a hydroxy group or a cyano group is preferably an adamantyl group, a diamantyl group or a norbornane group. The alicyclic hydrocarbon structure substituted with a hydroxy group or a cyano group is preferably a partial structure represented by the following formulae (VIIa) to (VIId):

(VIIa)

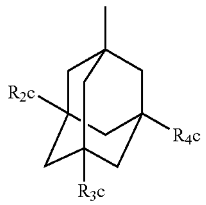

(VIIb)

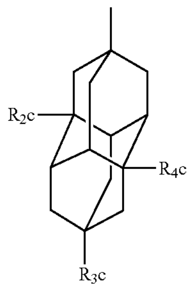

(VIIc)

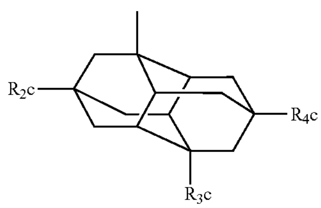

(VIId)

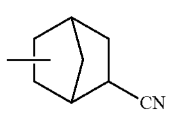

In formulae (VIIa) to (VIIc), each of $R_2c$ to $R_4c$ independently represents a hydrogen atom, a hydroxyl group or a cyano group. However, at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

(AIIa)

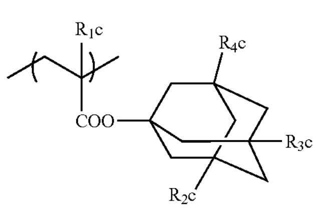

-continued (AIIb)

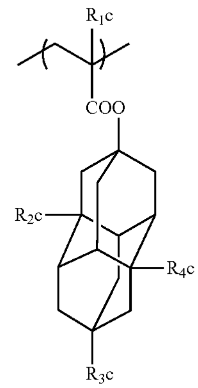

(AIIc)

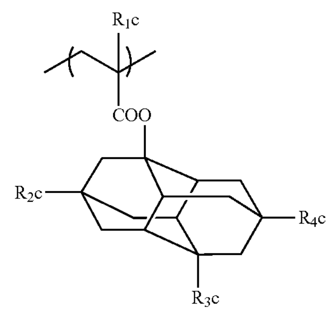

(AIId)

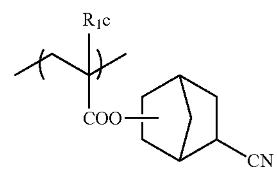

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxy group or a cyano group is preferably from 5 to 70 mol %, more preferably from 5 to 60 mol %, still more preferably from 10 to 50 mol %, based on all repeating units in the acid-decomposable resin.

Specific examples of the repeating unit having a hydroxy group or a cyano group are illustrated below, but the present invention is not limited thereto.

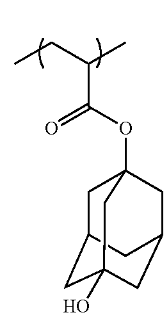

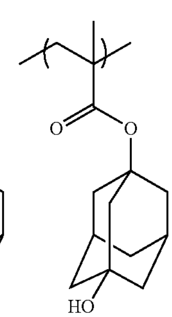

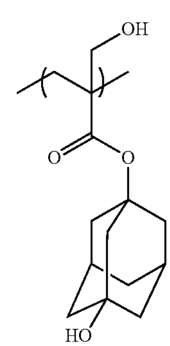

-continued

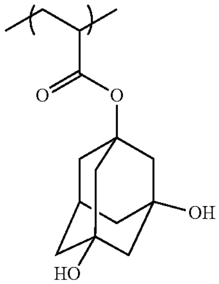

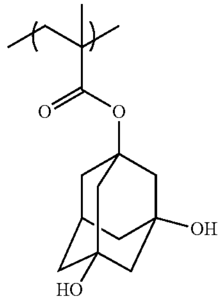

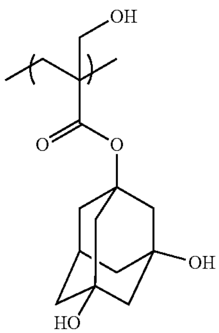

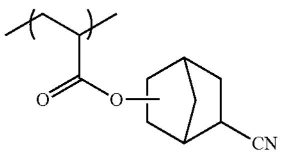

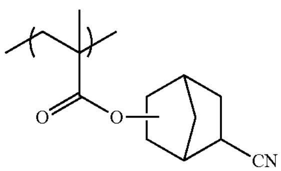

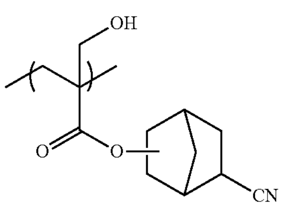

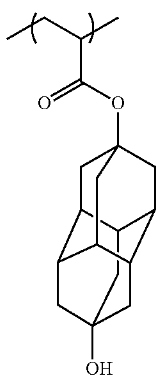

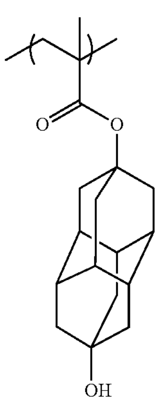

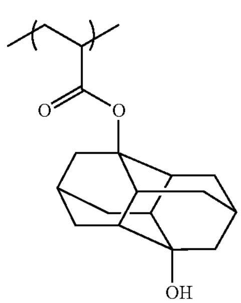

-continued

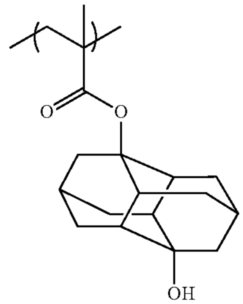

Other preferred examples of the repeating unit (a4) include a repeating unit having a lactone structure.

Any lactone structure may be used, but a 5- to 7-membered ring lactone structure is preferred, and a 5- to 7-membered ring lactone structure to which another ring structure is fused to form a bicyclo structure or a spiro structure is preferred. It is more preferred to contain a repeating unit having a lactone structure represented by any of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred. By virtue of using a specific lactone structure, LWR and development defect are improved.

LC1-1

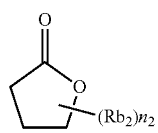

LC1-2

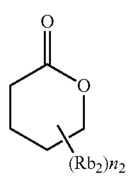

LC1-3

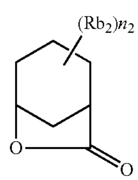

LC1-4

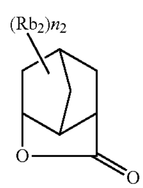

LC1-5

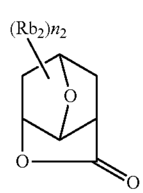

-continued

LC1-6

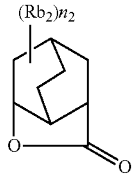

LC1-7

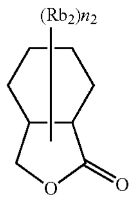

LC1-8

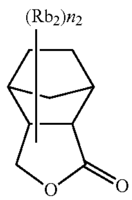

LC1-9

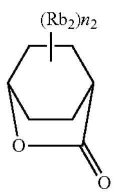

LC1-10

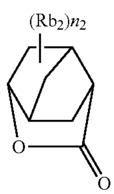

LC1-11

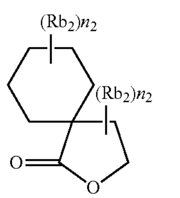

LC1-12

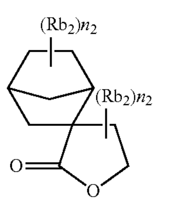

LC1-13

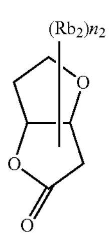

-continued

LC1-14

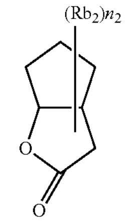

LC1-15

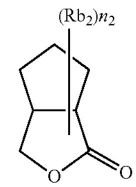

LC1-16

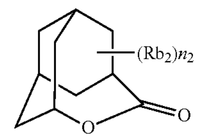

LC1-17

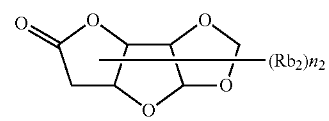

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituents ($Rb_2$), and also, the plurality of substituents ($Rb_2$) may combine together to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

As for the repeating unit having a lactone structure, a repeating unit represented by the following formula (AII') is preferred.

(AIII')

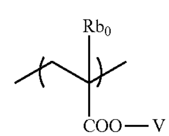

In formula (AII'), $Rb_0$ represents a hydrogen atom, a halogen atom or an alkyl group (preferably having a carbon number of 1 to 4). Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

V represents a group having a structure indicated by any one of formulae (LC1-1) to (LC1-17).

Specific examples of the repeating unit having a lactone structure are illustrated below, but the present invention is not limited thereto.

(In the formulae, Rx represents H, $CH_3$, $CH_2OH$ or $CF_3$.)

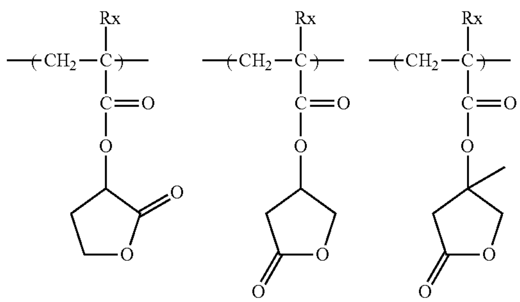

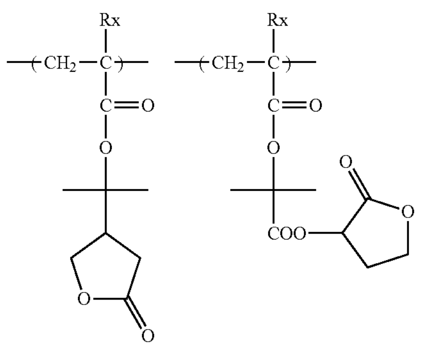

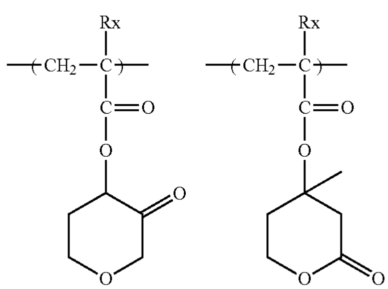

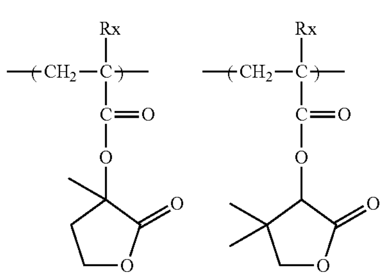

-continued

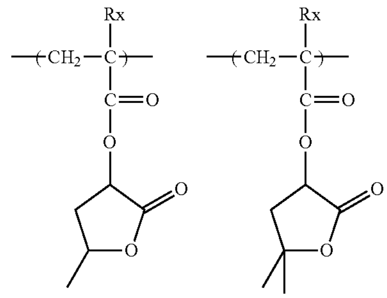

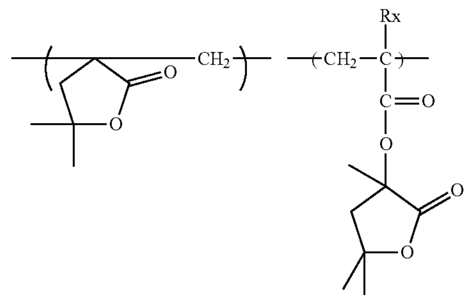

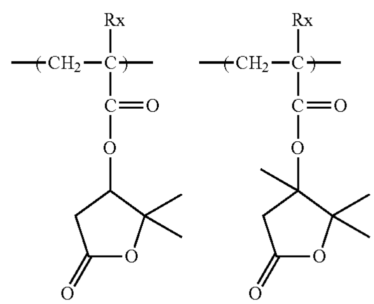

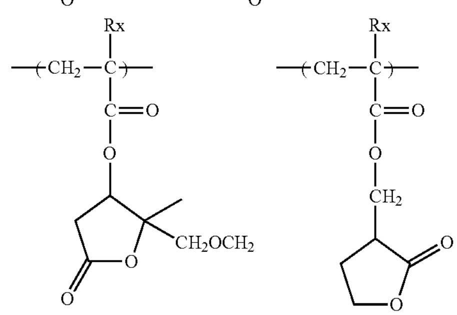

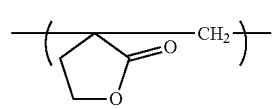

(In the formulae, Rx represents H, $CH_3$, $CH_2OH$ or $CF_3$.)

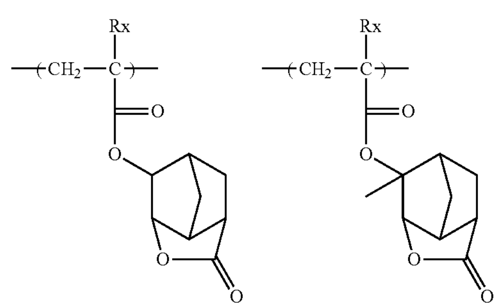

-continued
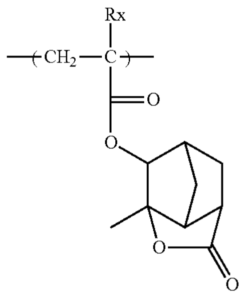
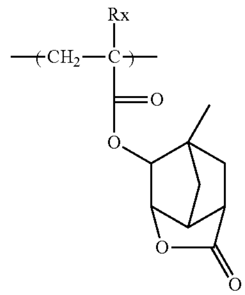
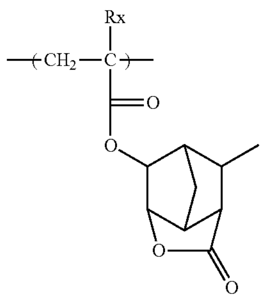
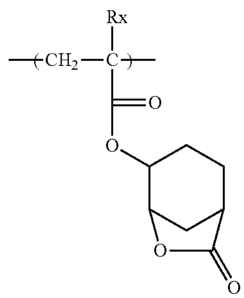
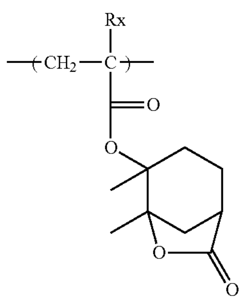
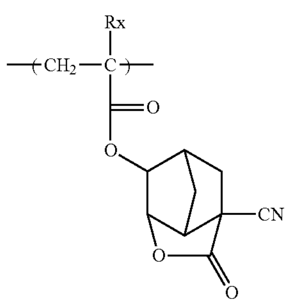
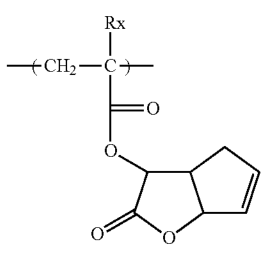
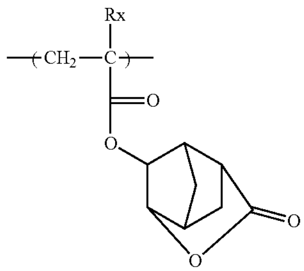
-continued
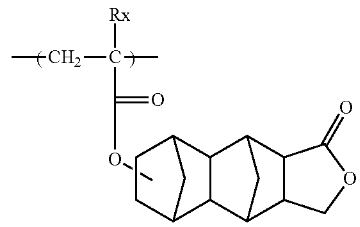
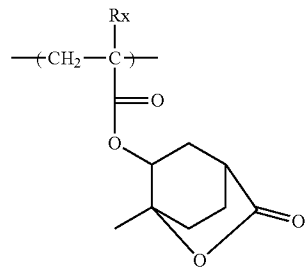
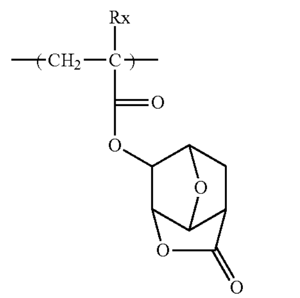
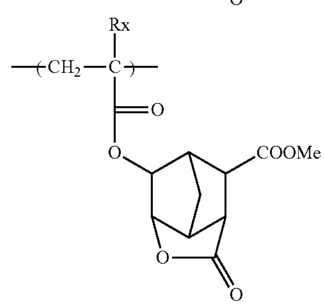
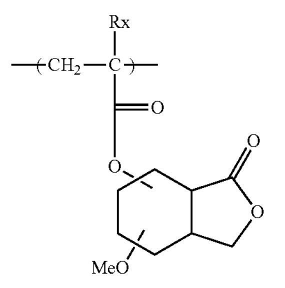
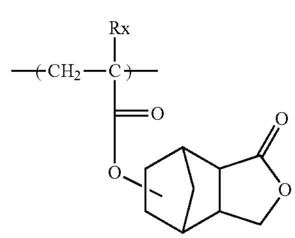

-continued
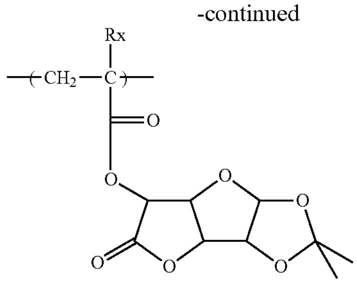
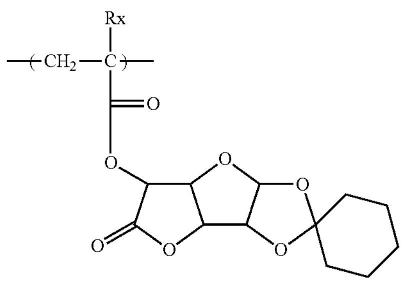
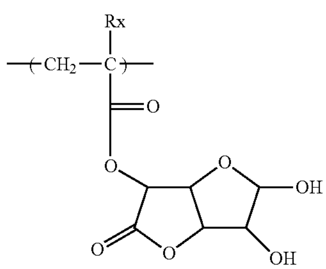
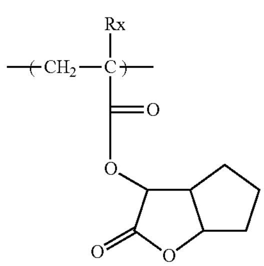
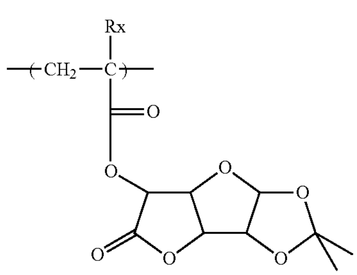
(In the formulae, Rx represents H, $CH_3$, $CH_2OH$ or $CF_3$.)
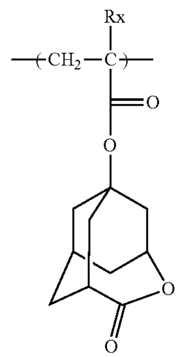
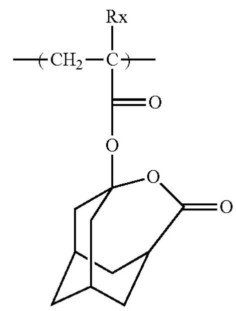
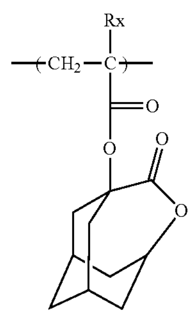
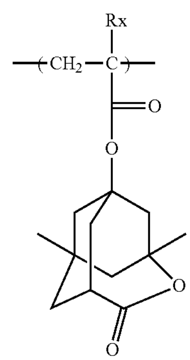
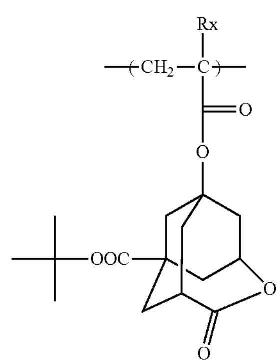
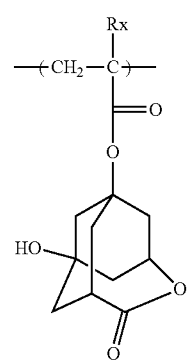
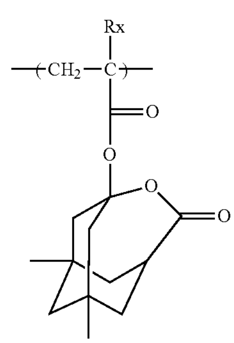
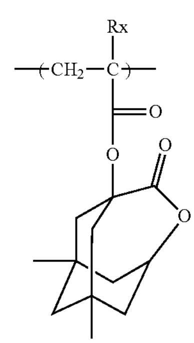

-continued

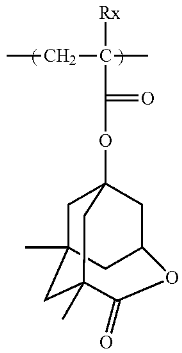

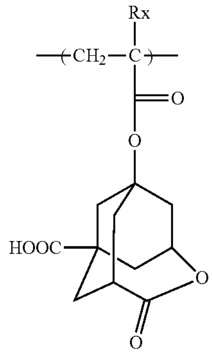

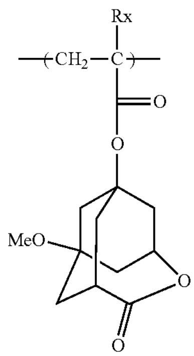

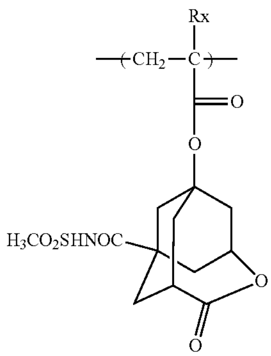

Particularly preferred repeating units having a lactone structure include the following repeating units. By selecting an optimal lactone structure, the pattern profile and the iso/dense bias are improved.

(In the formulae, Rx represents H, $CH_3$, $CH_2OH$ or $CF_3$.)

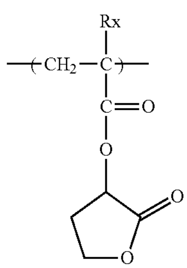

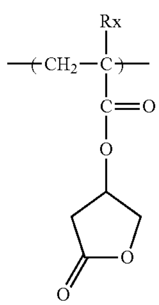

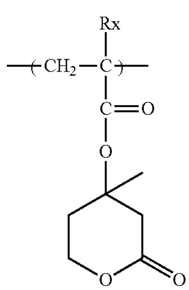

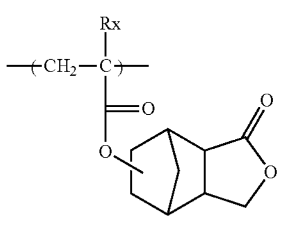

-continued

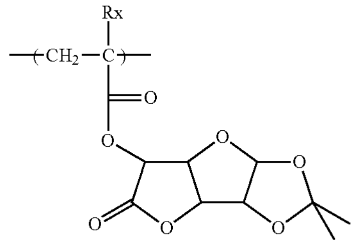

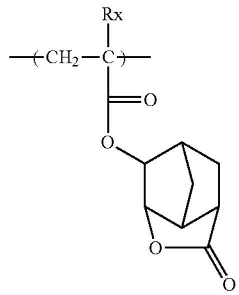

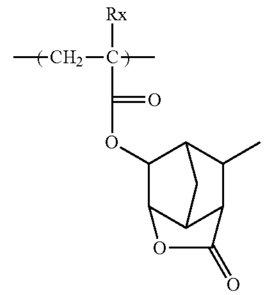

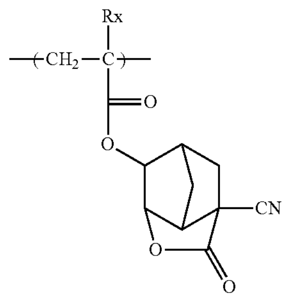

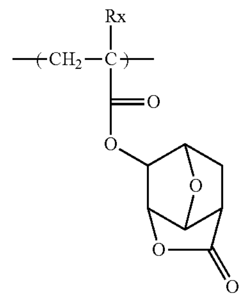

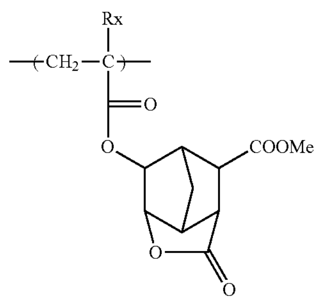

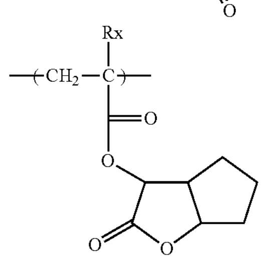

It is preferred to contain a unit represented by the following formula (MA) as the lactone structure-containing repeating unit.

(IIIA)

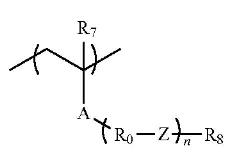

In formula (IIIA), A represents an ester bond (a group represented by —COO—) or an amide bond (a group represented by —CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, an amide bond, a urethane bond
(a group represented by

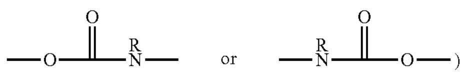

or a urea bond
(a group represented by

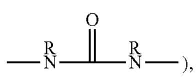

wherein R represents a hydrogen atom, an alkyl group, a cycloalkyl group or an aryl group.

$R_8$ represents a monovalent organic group having a lactone structure.

n is a repetition number of the structure represented by —$R_0$—Z— and represents an integer of 1 to 5, preferably 1.

$R_7$ represents a hydrogen atom, a halogen atom or an alkyl group. This alkyl group may have a substituent.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group, an cycloalkyl group such as cyclopropyl group, cyclobutyl group, cyclopentyl group, cyclohexyl group and cycloheptyl group, a cyano group, a nitro group, a sulfonyl group, a silyl group, an ester group, an acyl group, a vinyl group and an aryl group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a carbon number of 1 to 6, more preferably a carbon number of 1 to 5, more preferably a carbon number of 1 to 3 and examples thereof include a methylene group, an ethylene group and a propylene group. The cycloalkylene is preferably a cycloalkylene having a carbon number of 3 to 20 and examples thereof include a cyclopropylene group, a cyclobutylene group, a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, a structure represented by (LC1-4) is preferred. Also, structures where n2 in (LC1-1) to (LC1-17) is an integer of 2 or less are more preferred.

$R_8$ is preferably a monovalent organic group having an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

Specific examples of the repeating unit having a lactone structure-containing group, represented by formula (IIIA), are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

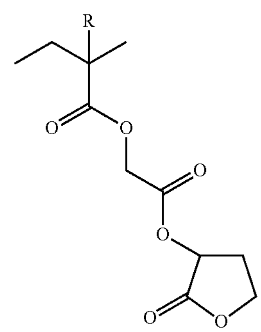

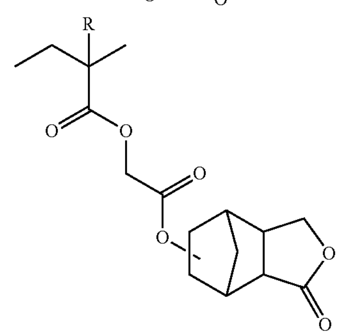

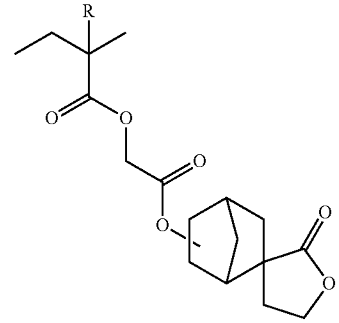

-continued

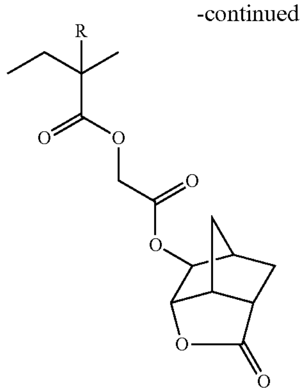

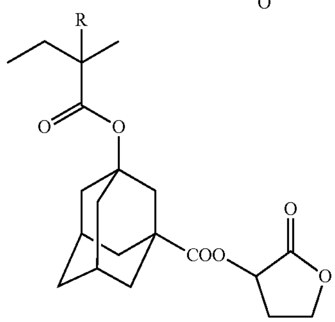

The lactone structure-containing repeating unit is more preferably a repeating unit represented by the following formula (IIIA-1):

(IIIA-1)

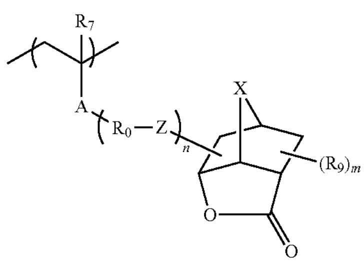

In formula (IIIA-1), $R_7$, A, $R_0$, Z and n have the same meanings as in formula (IIIA).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a n-butoxy group, and a tert-butoxy group. These groups may have a substituent, and the substituent includes a hydroxy group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted at the α-position or β-position, more preferably at the α-position, of the carbonyl group of lactone.

Specific examples of the repeating unit having a lactone structure-containing group, represented by formula (IIIA-1), are illustrated below, but the present invention is not limited thereto. In specific examples, R represents a hydrogen atom, an alkyl group which may have a substituent, or a halogen atom, preferably a hydrogen atom, a methyl group, a hydroxymethyl group or an acetyloxymethyl group.

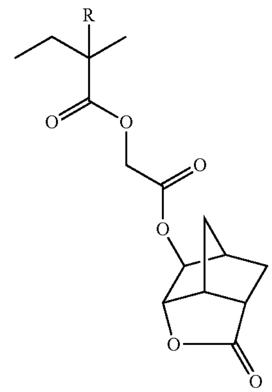

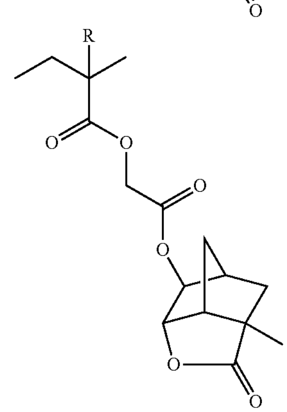

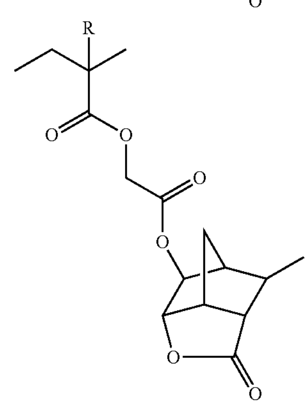

-continued
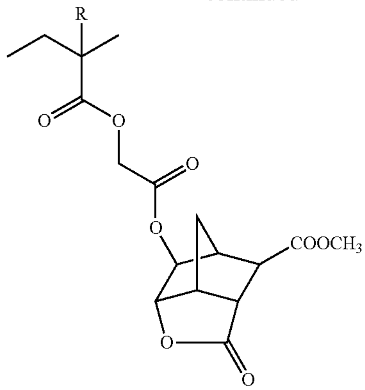
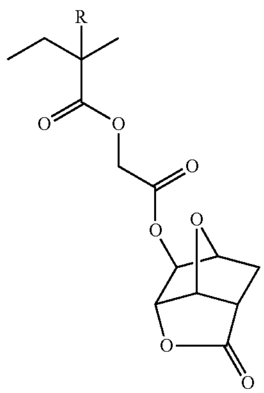
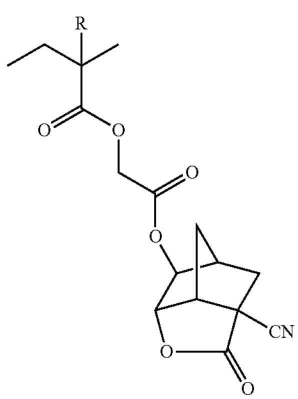
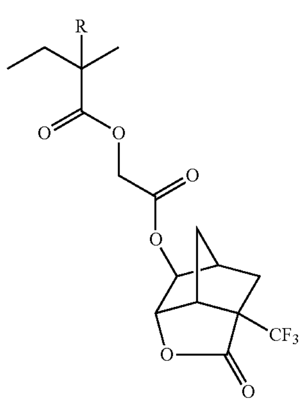
-continued
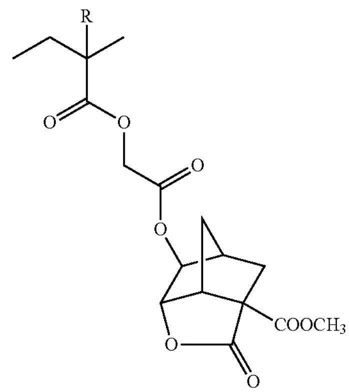
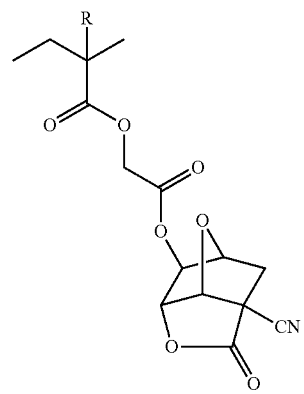
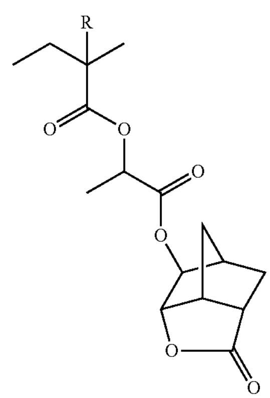
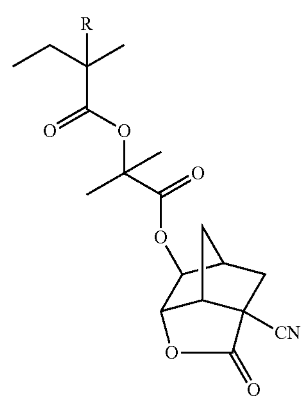

-continued
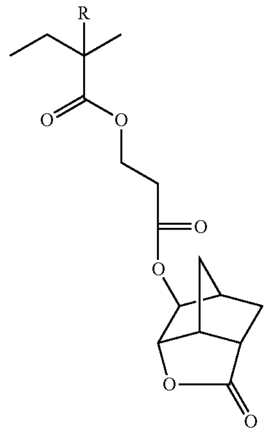
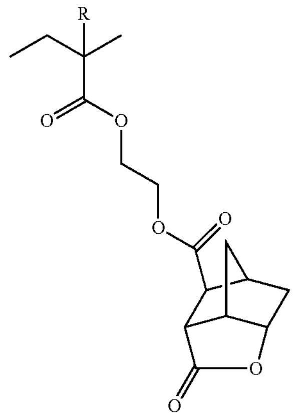
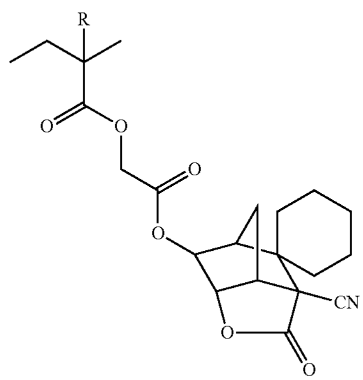
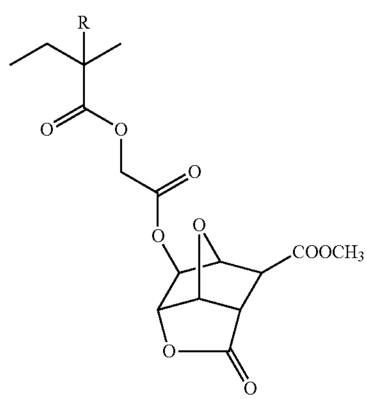
-continued
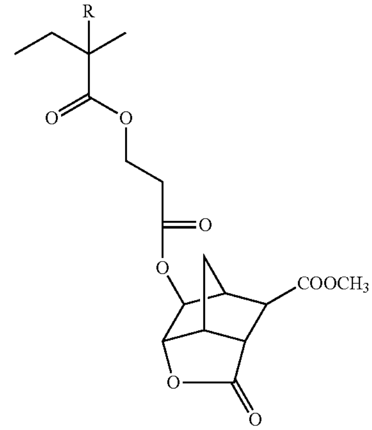
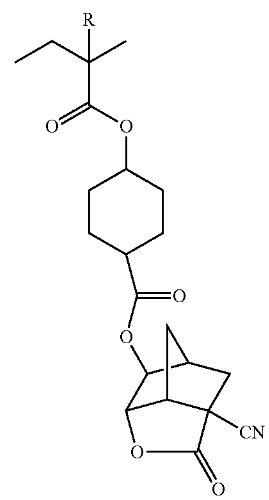
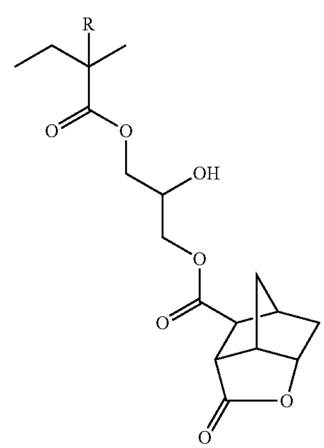

-continued
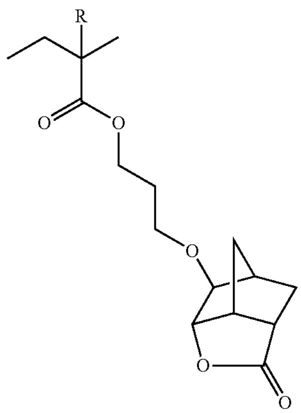
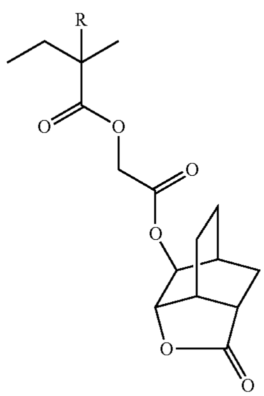
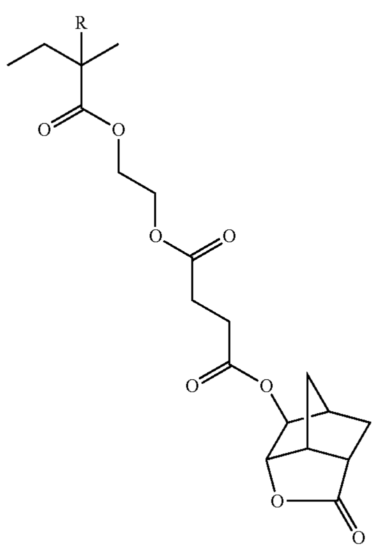
-continued
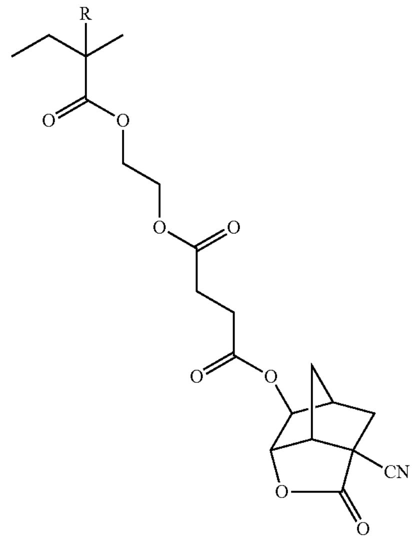
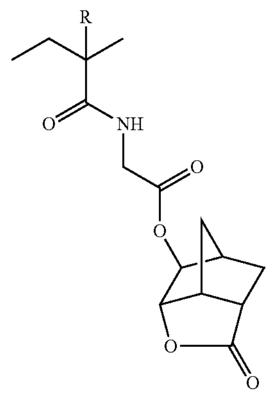
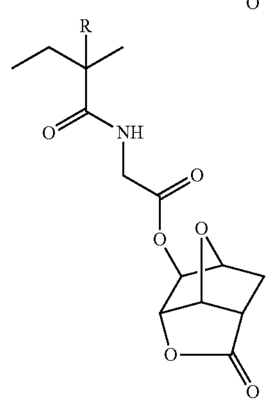
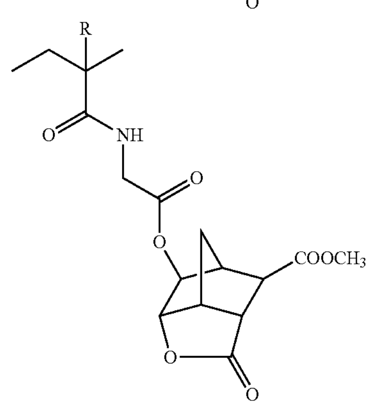

Two or more kinds of lactone repeating units may also be used in combination so as to raise the effects of the present invention. In the case of a combination use, it is also preferred that out of formula (IIIA), two or more kinds of lactone repeating units where n is 1 are selected and used in combination.

In the case of containing a repeating unit having lactone, the content thereof is preferably from 10 to 80 mol %, more preferably from 15 to 70 mol %, more preferably from 15 to 60 mol %, more preferably from 20 to 60 mol %, more preferably from 20 to 50 mol %, still more preferably from 30 to 50 mol %, based on all repeating units in the resin.

Other preferred examples of the repeating unit (a4) include those having a carboxyl group, a sulfonamide group, a sulfonylimide group, a bisulfonylimide group, or an aliphatic alcohol group substituted with an electron-withdrawing group at the α-position (e.g., hexafluoroisopropanol). This repeating unit (a4) is more preferably a repeating unit having a carboxy group.

By virtue of containing a repeating unit having the above-described group, the resolution increases in the usage of forming contact holes. As for such a repeating unit (a4), a repeating unit where the above-described group is directly bonded to the main chain of the resin, such as repeating unit by an acrylic acid or a methacrylic acid, a repeating unit where the above-described group is bonded to the main chain of the resin through a linking group, and a repeating unit where the group is introduced into the terminal of the polymer chain by using a polymerization initiator or chain transfer agent having the above-described group at the polymerization, all are preferred. The linking group may have a monocyclic or polycyclic, cyclic hydrocarbon structure. A repeating unit by an acrylic acid or a methacrylic acid is more preferred.

The content of the repeating unit (a4) having the above-described group is preferably from 0 to 20 mol %, more preferably from 3 to 15 mol %, still more preferably from 5 to 10 mol %, based on all repeating units in the acid-decomposable resin.

Specific examples of the repeating unit having the above-described group are illustrated below, but the present invention is not limited thereto.

In specific examples, Rx represents H, $CH_3$, $CH_2OH$ or $CF_3$.

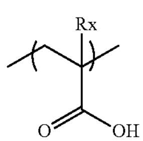

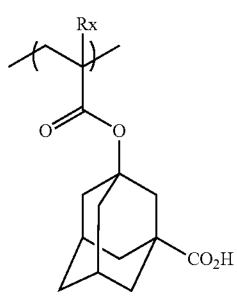

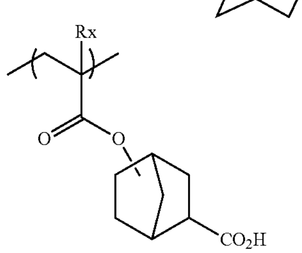

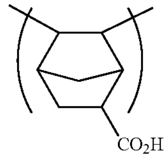

-continued

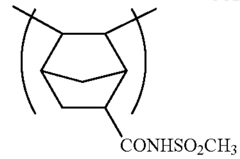

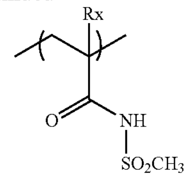

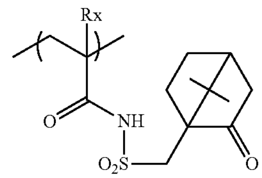

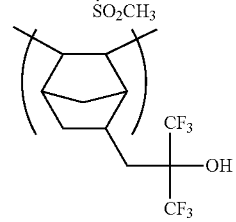

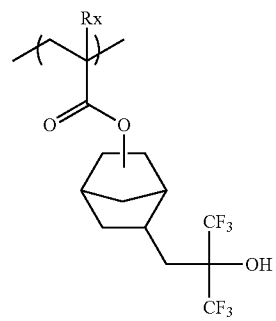

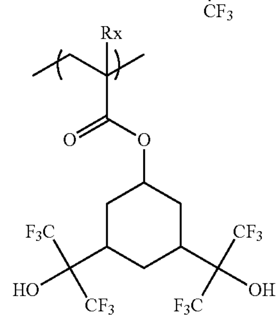

The resin (A) may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

The resin (A) may be a resin obtained by mixing two or more kinds of resins and, for example, a resin obtained by mixing a resin containing the repeating unit (a2) and a resin containing the repeating unit (a3) may be used for the purpose of controlling the dry etching resistance, suitability for standard developer, adherence to substrate, resist profile and properties generally required of a resist, such as resolution, heat resistance and sensitivity.

It is also preferred to use a resin containing the repeating unit (a1) and a resin not containing the repeating unit (a1) by mixing these resins.

A repeating unit other than the above repeating units includes, but is not limited to, repeating structural units corresponding to the monomers described below.

Thanks to this repeating unit, the performance required of the resin for use in the composition of the present invention, particularly (1) solubility in the coating solvent, (2) film-forming property (glass transition point), (3) developability for an organic solvent, (4) film loss (selection of hydrophilic, hydrophobic or polar group), (5) adherence of unexposed area to substrate, (6) dry etching resistance and the like can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the acid-decomposable resin, the molar ratio of respective repeating units contained is appropriately set to control the dry etching resistance or standard developer suitability of the actinic ray-sensitive or radiation-sensitive resin composition, the adherence to substrate, the resist profile and the performances generally required of the composition above, such as resolution, heat resistance and sensitivity.

In the case where the composition of the present invention is used for ArF exposure, in view of transparency to ArF light, the resin (A) for use in the composition of the present invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

Incidentally, the resin (A) preferably contains no fluorine atom and no silicon atom in view of compatibility with the later-described hydrophobic resin.

The acid-decomposable resin is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units.

In the case where the composition of the present invention is irradiated with KrF excimer laser light, electron beam, X-ray or high-energy beam at a wavelength of 50 nm or less (e.g., EUV), the acid-decomposable resin preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include a repeating unit composed of a tert-butoxycarbonyloxystyrene, a 1-alkoxyethoxystyrene or a tertiary alkyl (meth)acrylate. A repeating unit composed of a 2-alkyl-2-adamantyl (meth) acrylate or a dialkyl(1-adamantyl)methyl (meth)acrylate is more preferred.

In the present invention, the content of each repeating unit is as above. As for each repeating unit, a plurality of kinds of units may be contained and in the case of containing a plurality of kinds of repeating units, the content below is their total amount.

In the resin (A), the molar ratio of respective repeating structural units contained can be appropriately set to control the dry etching resistance of resist, suitability for standard developer, adherence to substrate, resist profile and performances generally required of a resist, such as resolution, heat resistance and sensitivity.

The resin (A) can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. For details of the synthesis method, purification method and the like, the methods described, for example, in "Kobunshi Gosei (Polymer Synthesis)" of *Dai 5-Han Jikken Kagaku Koza* 26, *Kobunshi Kagaku* (*Experimental Chemistry Course* 26, *Polymer Chemistry, 5th Edition*), Chapter 2, Maruzen can be used.

The acid-decomposable resin for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is collected by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight of the resin (A) is preferably from 1,000 to 200,000, more preferably from 2,000 to 20,000, still more preferably from 3,000 to 15,000, yet still more preferably from 3,000 to 10,000, in terms of polystyrene as measured by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1 to 3, preferably from 1 to 2.6, more preferably from 1 to 2, still more preferably from 1.4 to 1.7. As the molecular weight distribution is narrower, the resolution and resist profile are better, the side wall of the resist pattern is smoother, and the roughness property is more improved.

In the actinic ray-sensitive or radiation-sensitive resin composition of the present invention, the blending amount of the resin (A) in the entire composition is preferably from 30 to 99 mass %, more preferably from 65 to 97 mass %, more preferably from 75 to 95 mass %, based on the entire solid content.

In the actinic ray-sensitive or radiation-sensitive resin composition of the present invention, in the case that the resin (A) contains the repeating unit (P), the blending amount of the resin (A) in the entire composition is preferably from 30 to 99 mass %, more preferably from 60 to 95 mass %, more preferably from 75 to 95 mass %, based on the entire solid content.

Also, in the present invention, as for the resin (A), one kind of a resin may be used or a plurality of kinds of resins may be used in combination.

Specific examples of the resin (A) are illustrated below. Also, the weight average molecular weight (Mw), polydispersity (Mw/Mn) and compositional ratio of repeating units (corresponding to repeating units starting from the left), of each of these resins are shown in Table 1 later.

A-1

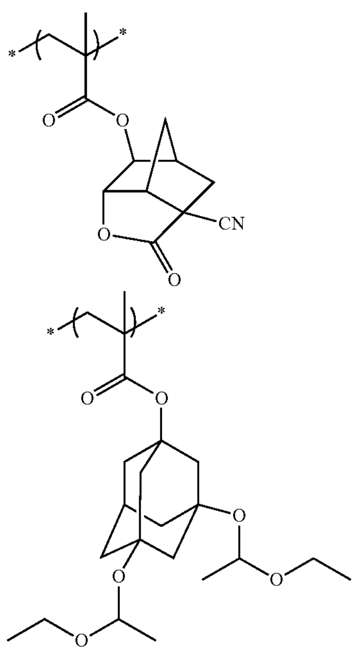

A-2

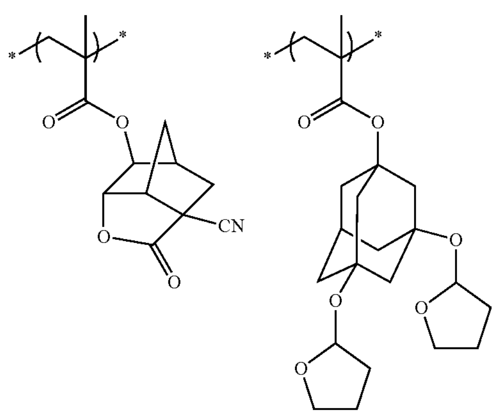

-continued

A-3

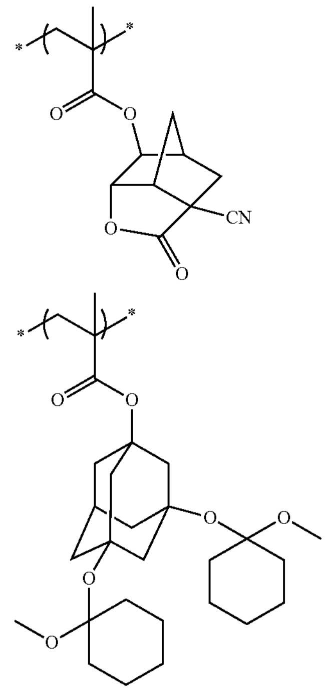

A-4

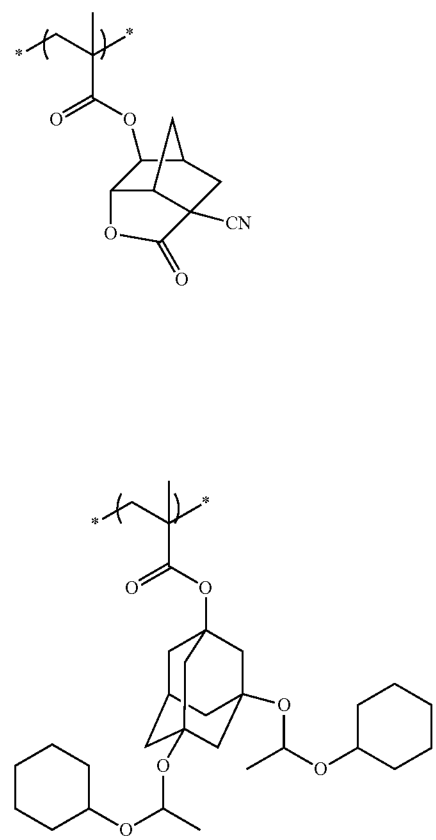

-continued
A-5
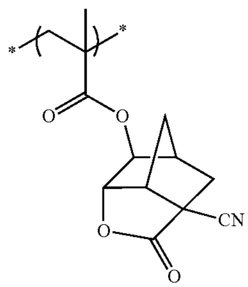
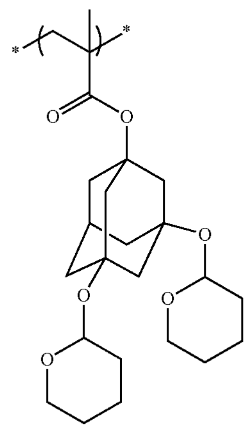
A-6
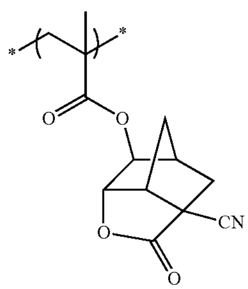
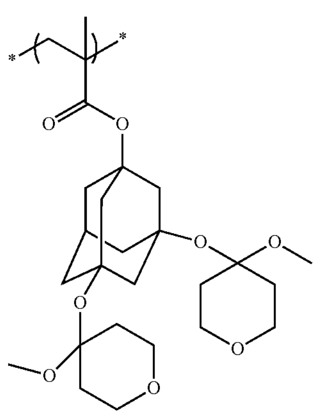
A-7
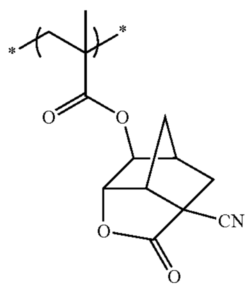
-continued
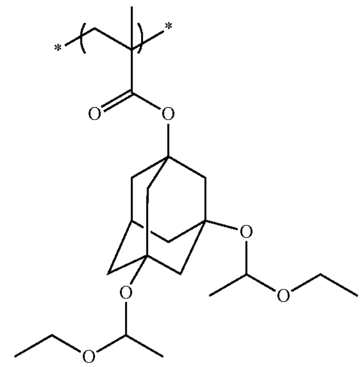
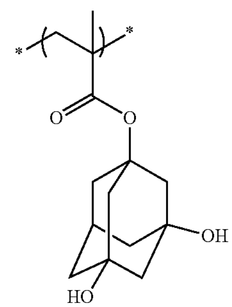
A-8
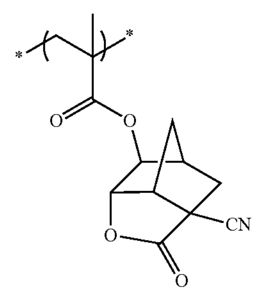
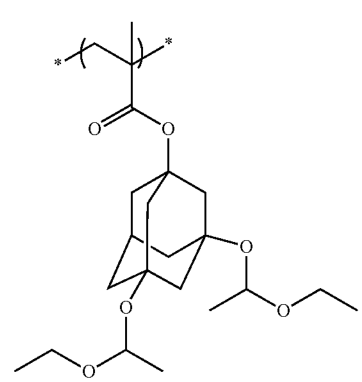

-continued
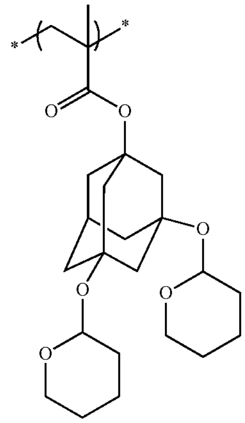
A-9
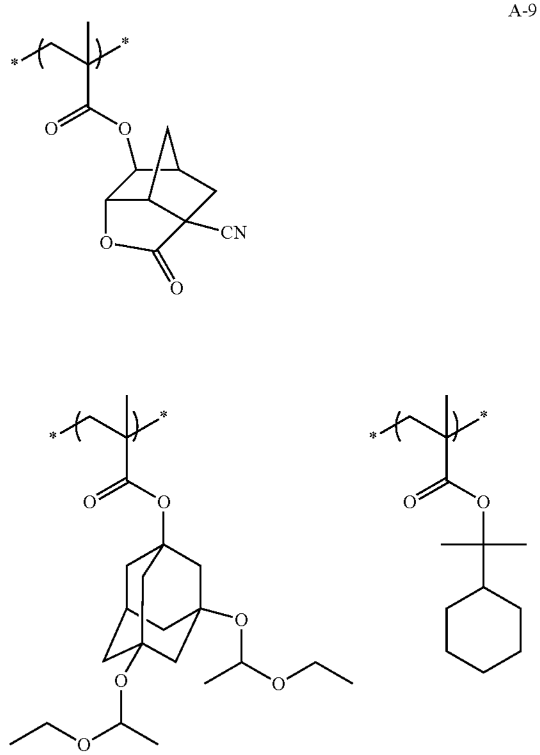
A-10
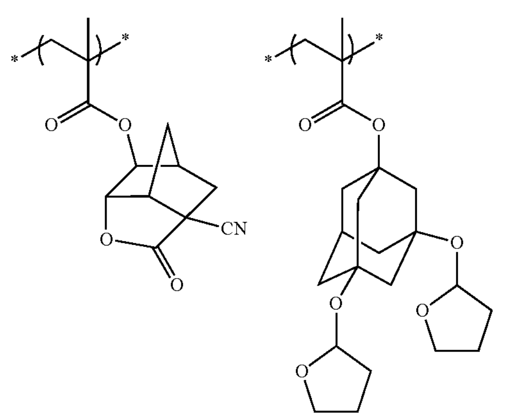
-continued
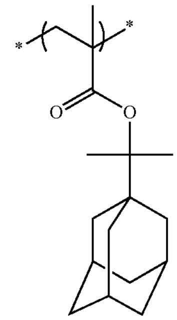
A-11
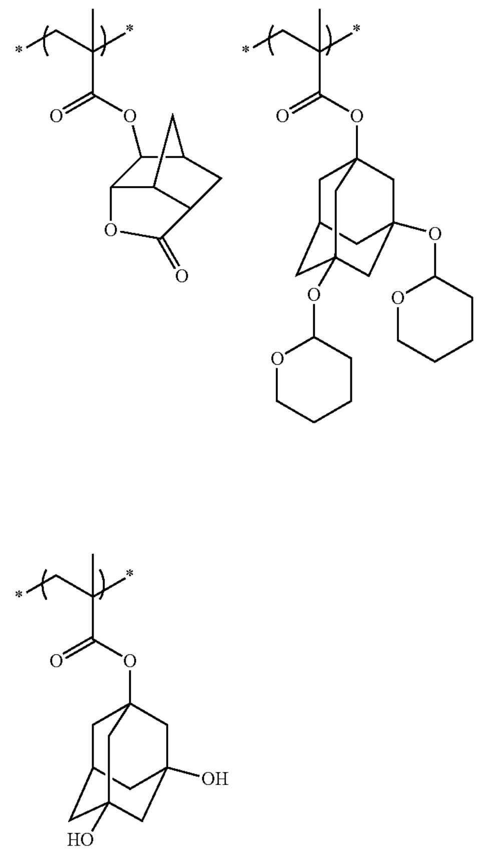
A-12
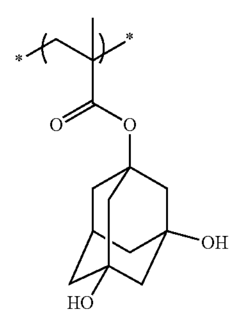

-continued
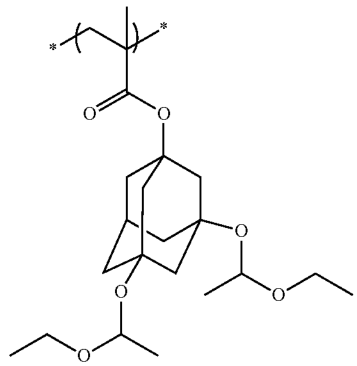
A-13
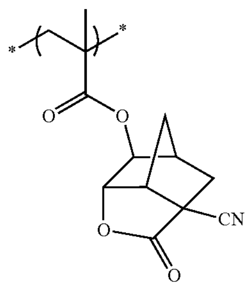
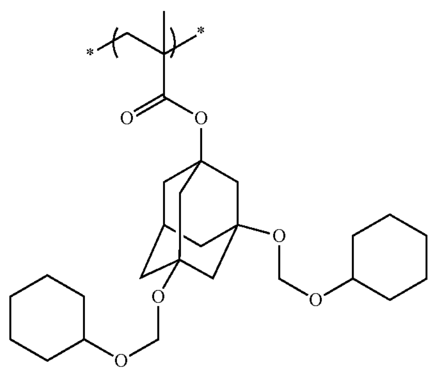
A-14
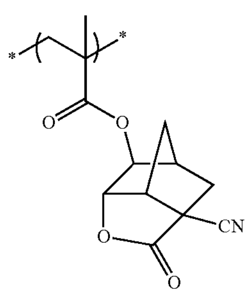
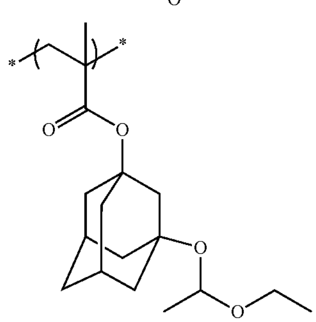
-continued
A-15
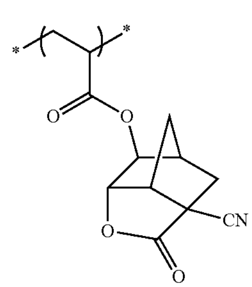
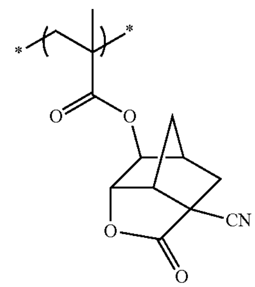
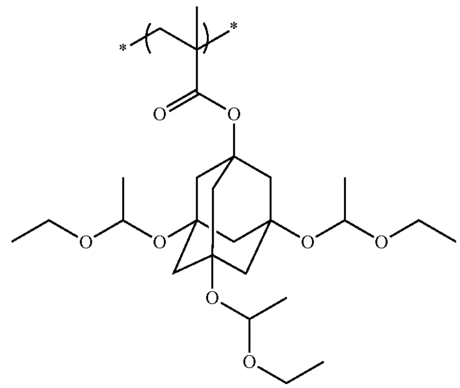
A-16
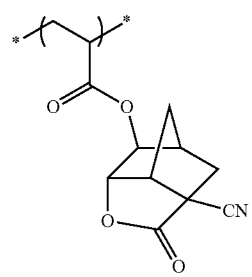
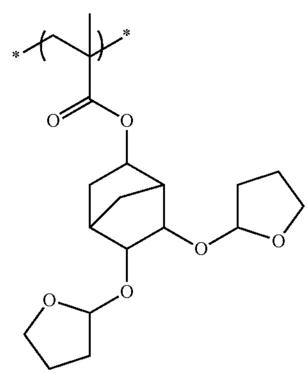
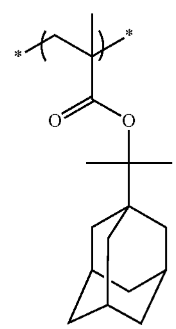
A-17
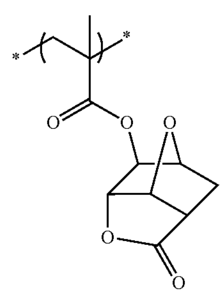
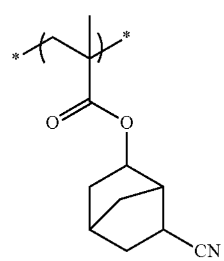

-continued
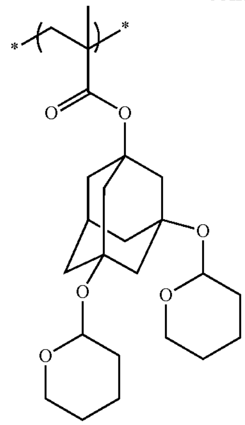
A-18
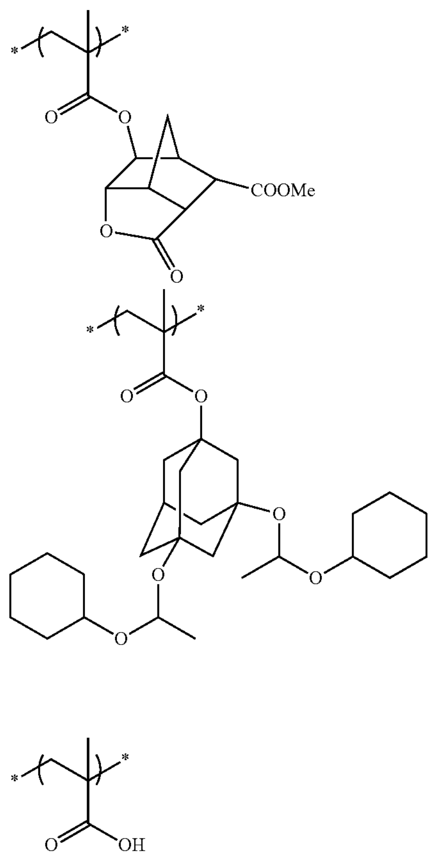
A-19
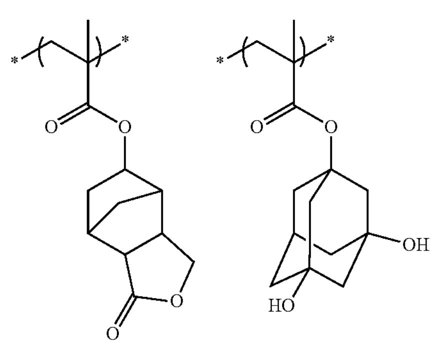
-continued
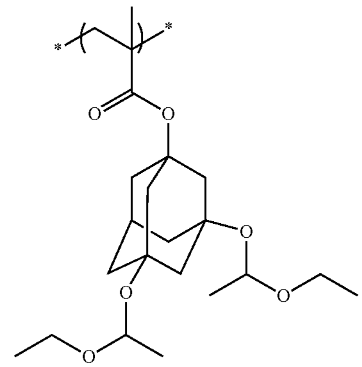
A-20
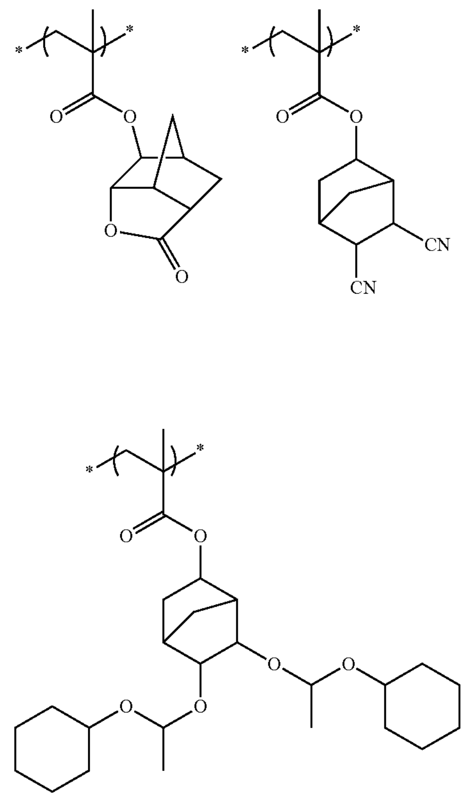
A-21
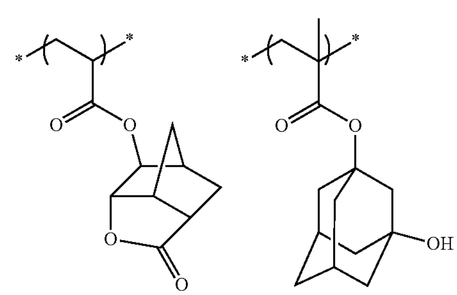

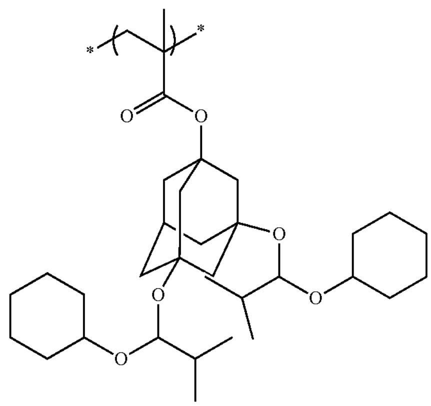
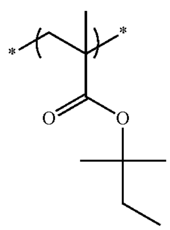
A-22
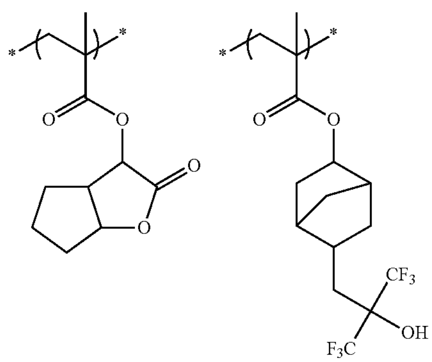
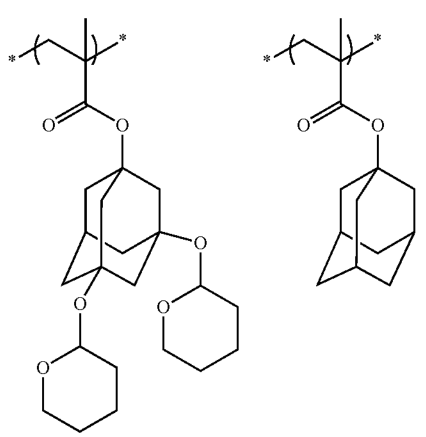
A-23
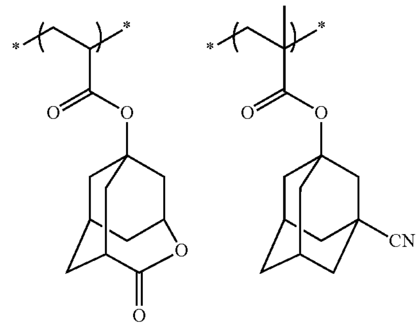
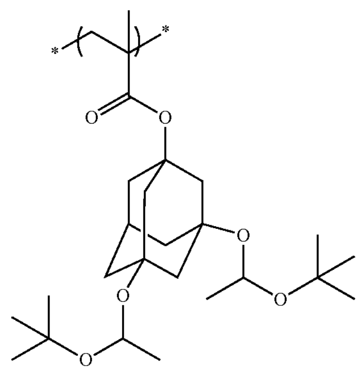
A-24
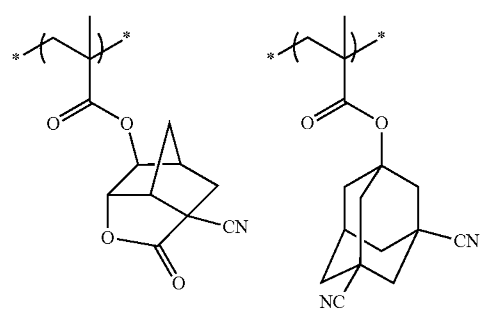
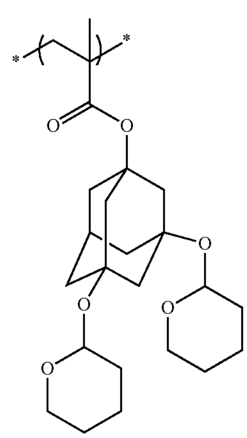

-continued
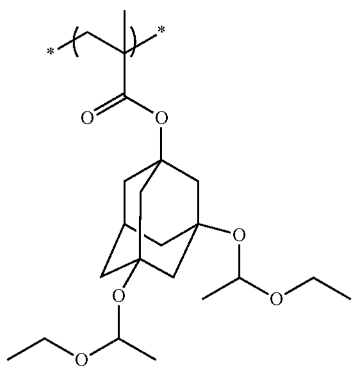
A-25
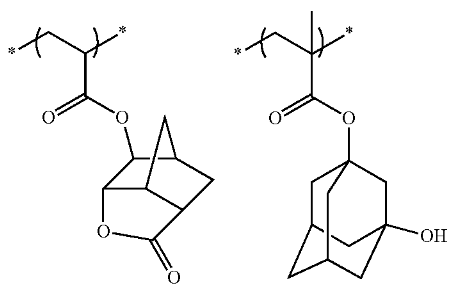
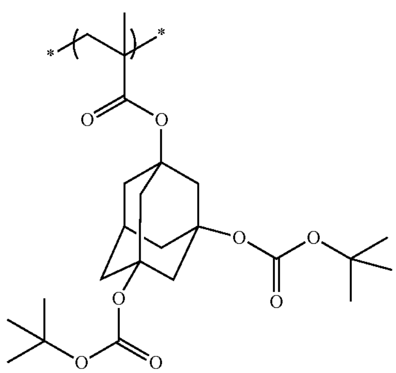
A-26
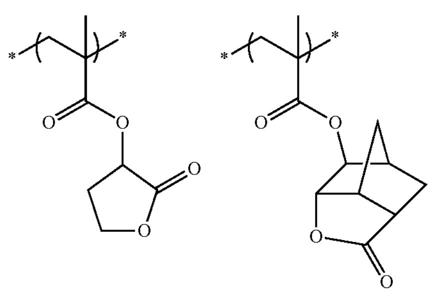
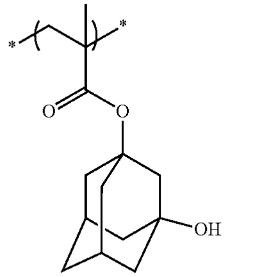
-continued
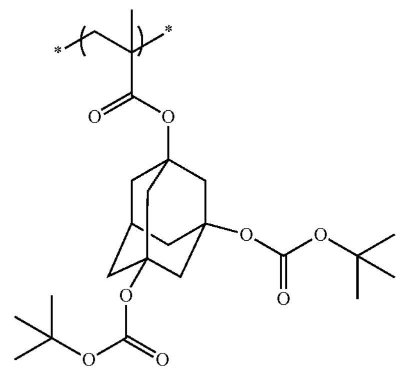
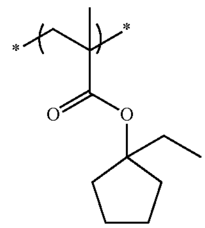
A-27
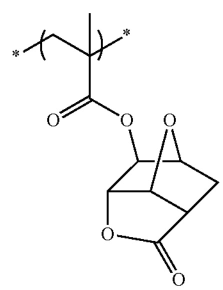
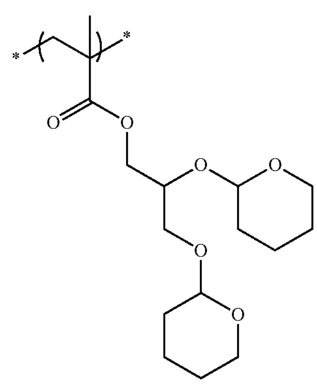
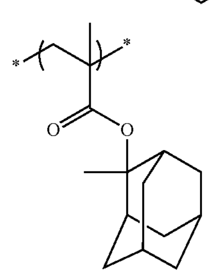

-continued
A-28
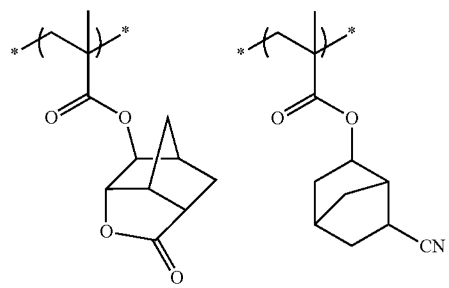
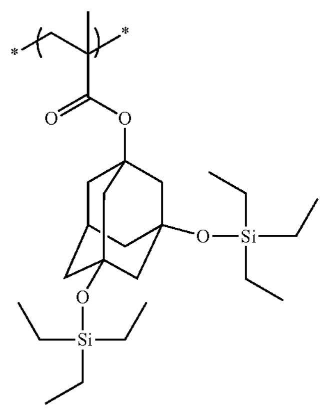
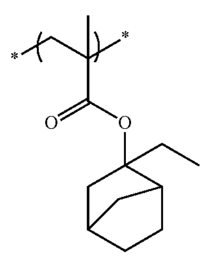
A-29
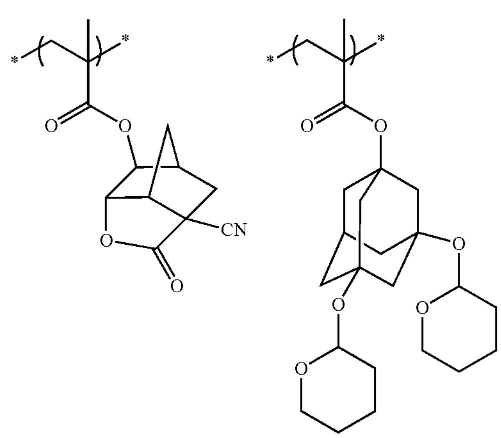
-continued
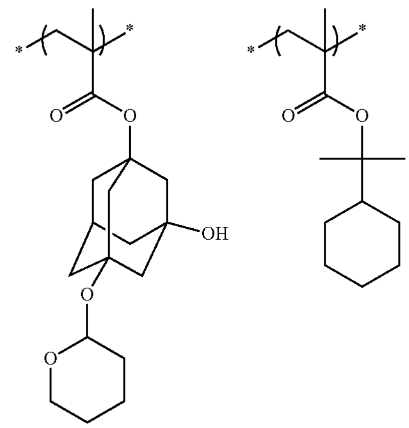
A-30
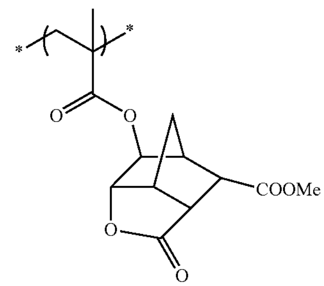
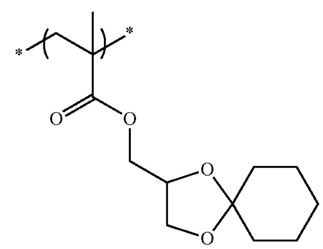
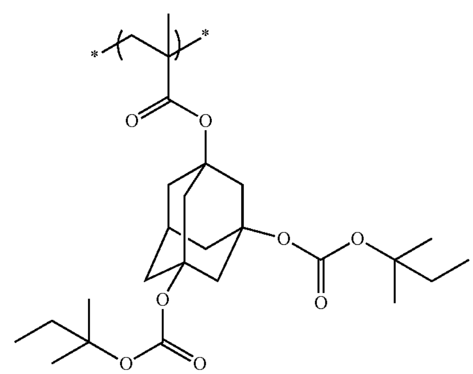
A-31
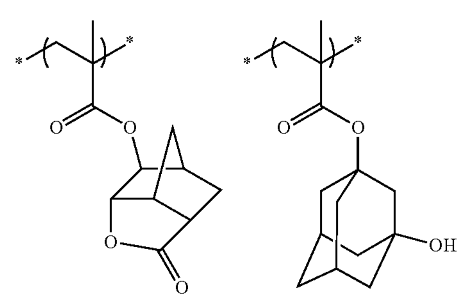

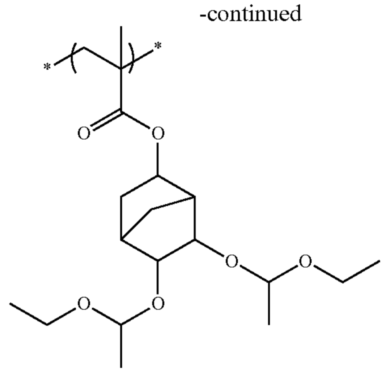
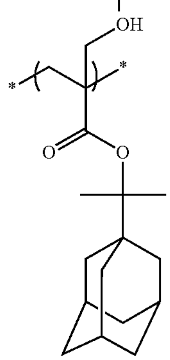
A-32
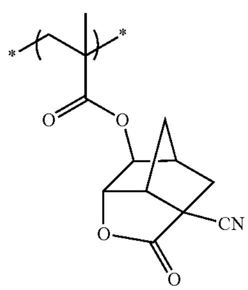
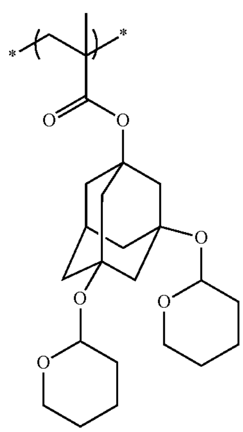
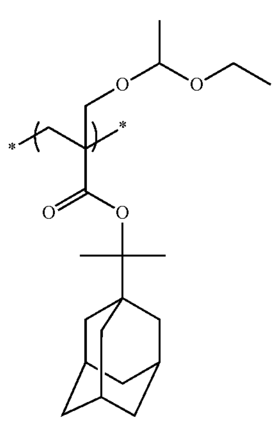
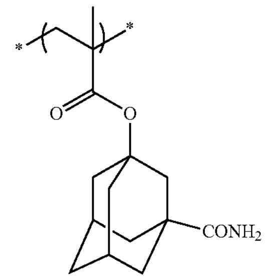
A-33
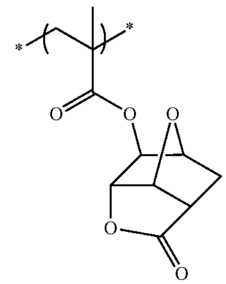
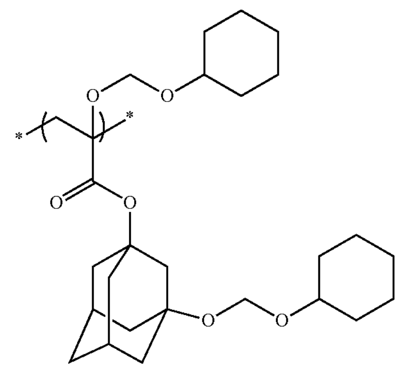
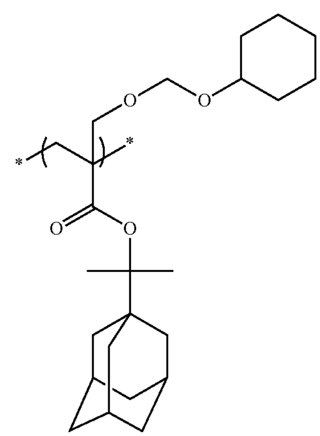
A-34
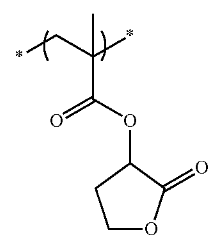
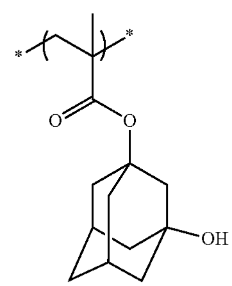

-continued
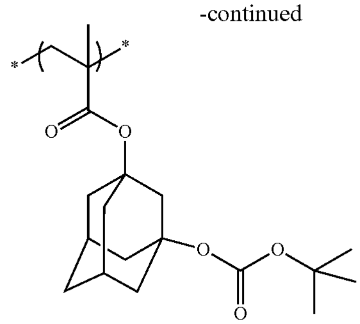
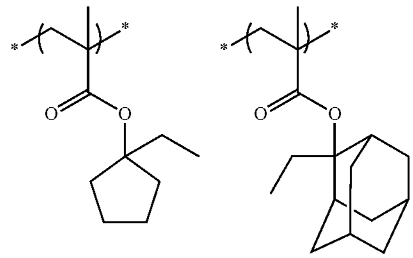
A-35
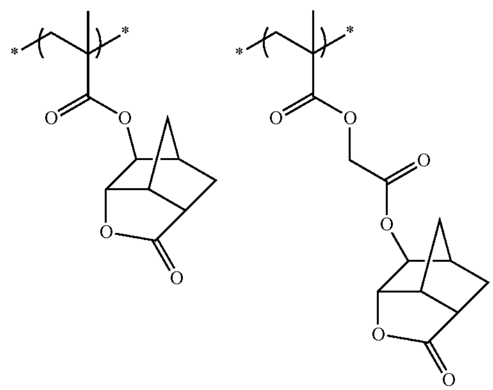
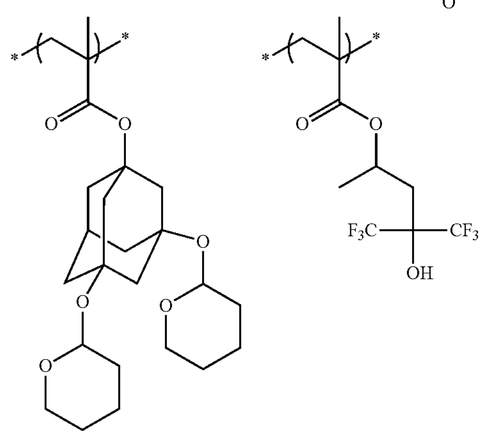
A-36
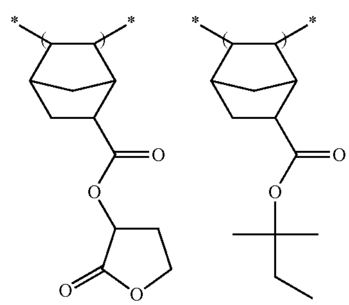
-continued
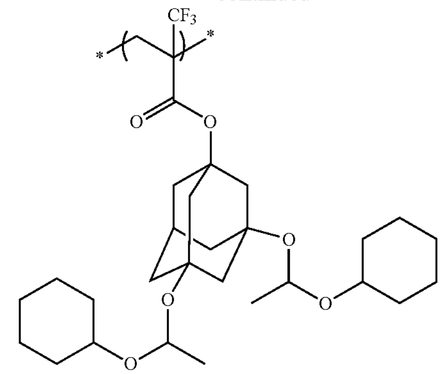
A-37
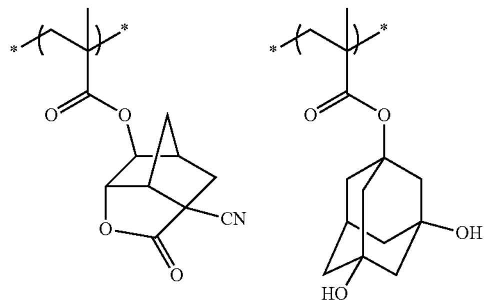
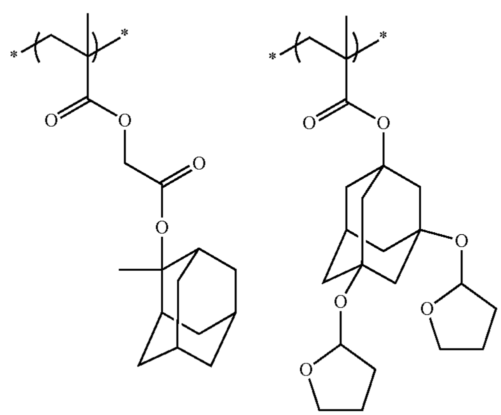
A-38
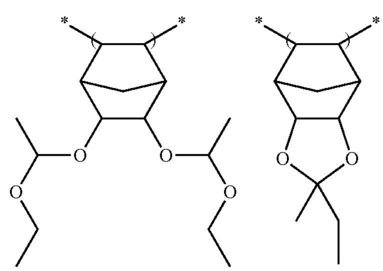
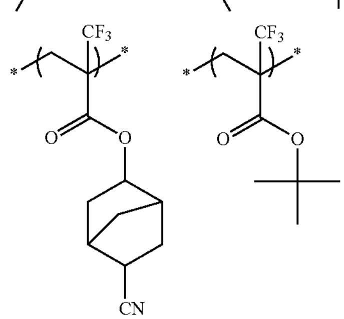

A-39
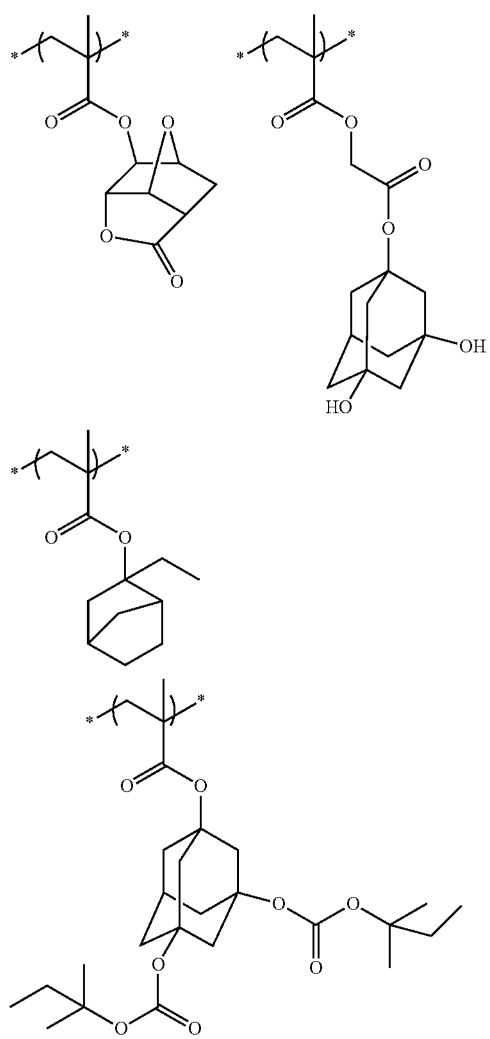
A-40
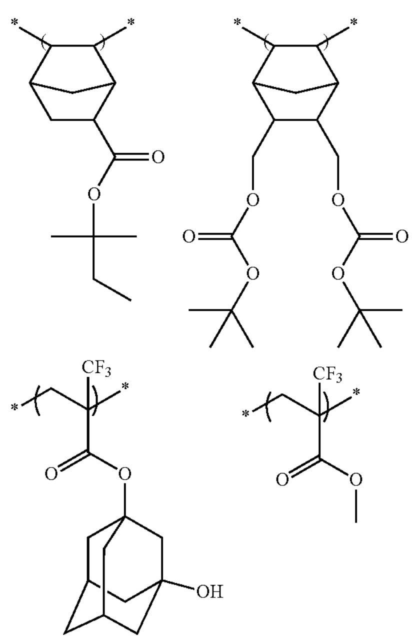
A-41
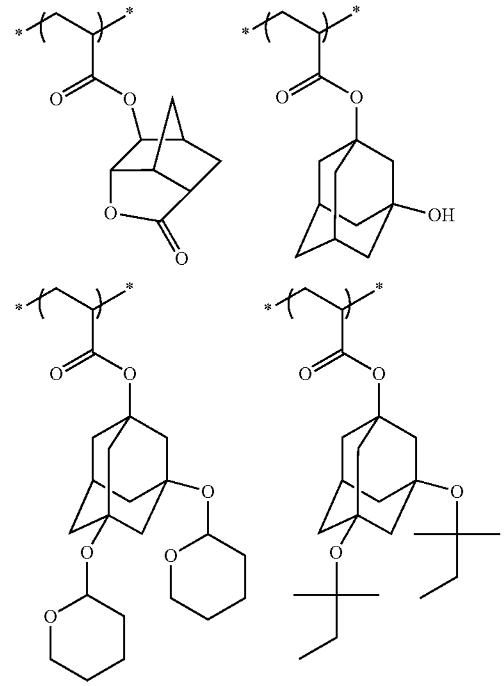
A-42
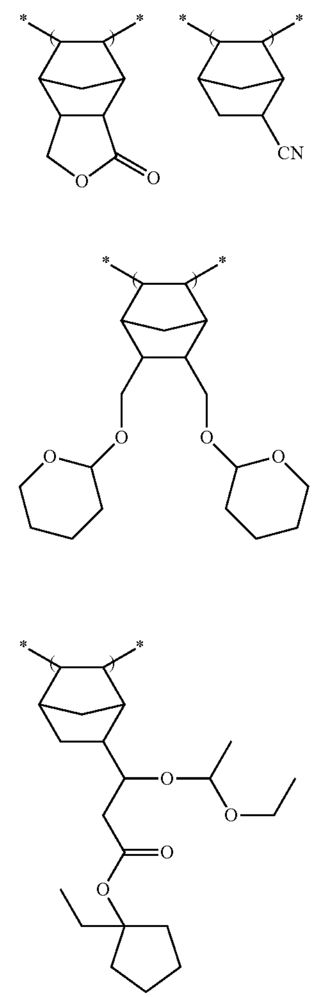

-continued
A-43
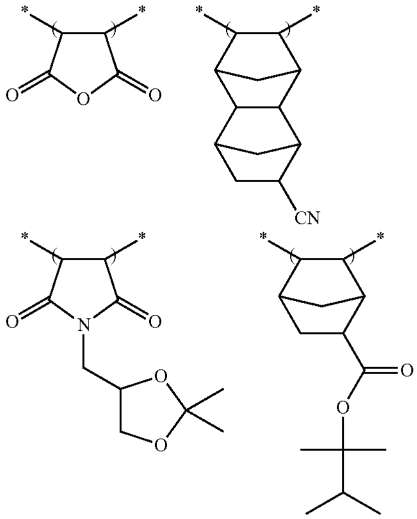
A-44
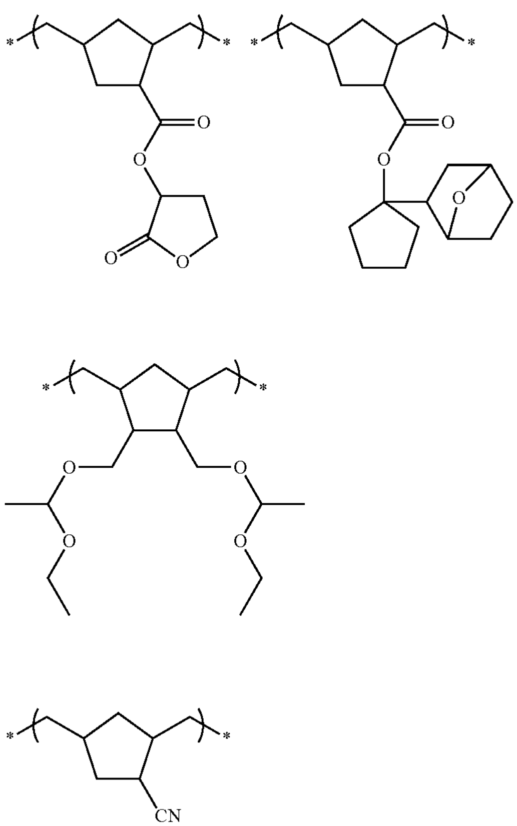
A-45
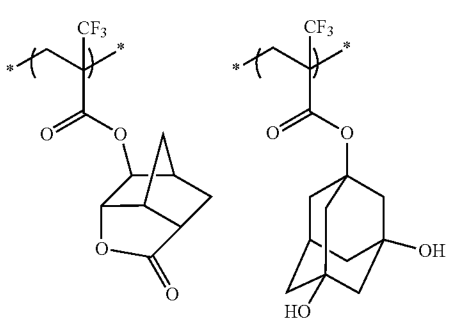
-continued
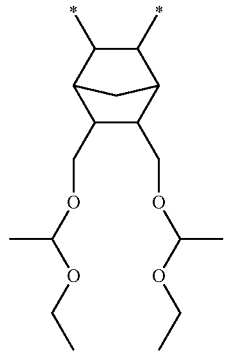
A-46
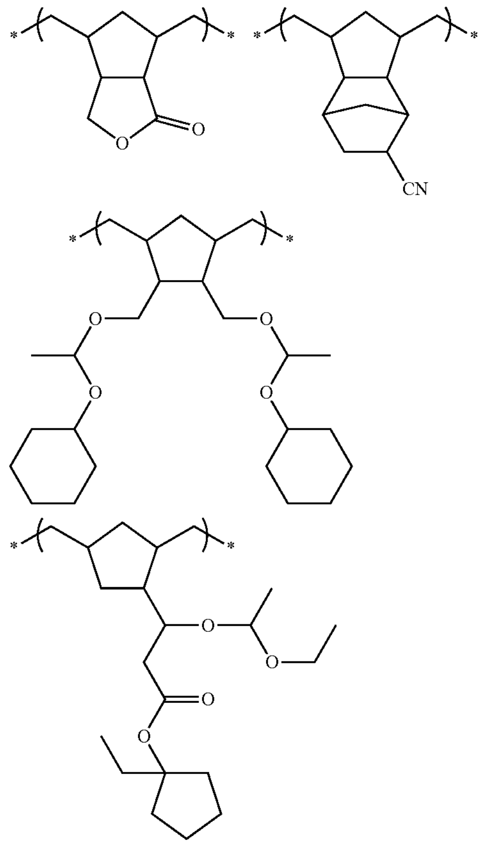
A-47
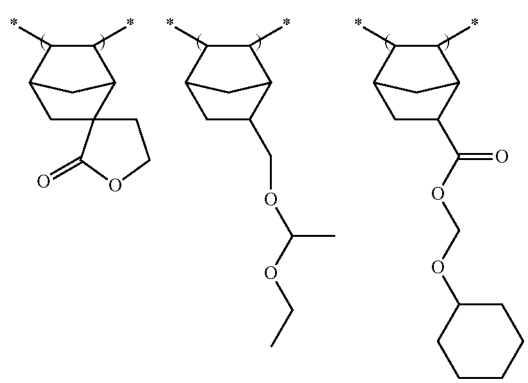

-continued
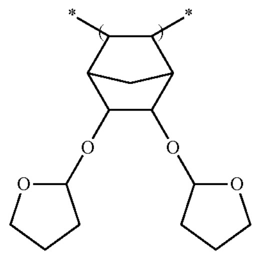
A-48
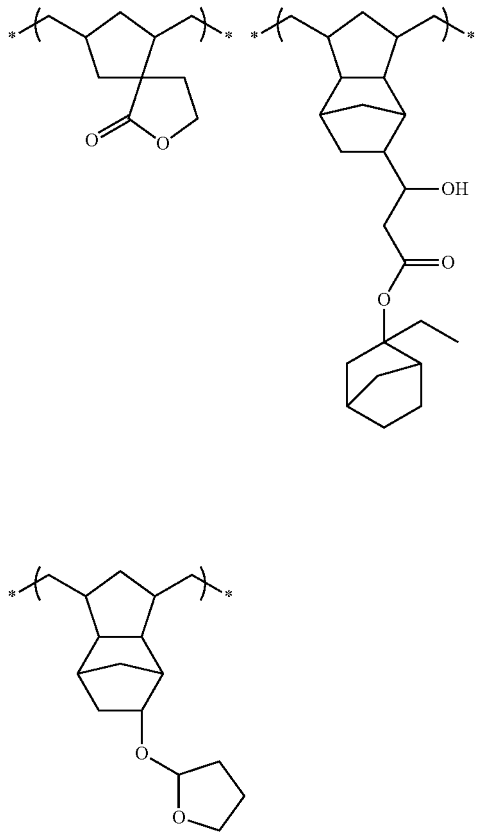
A-49
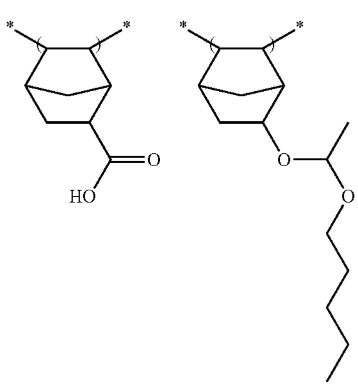
-continued
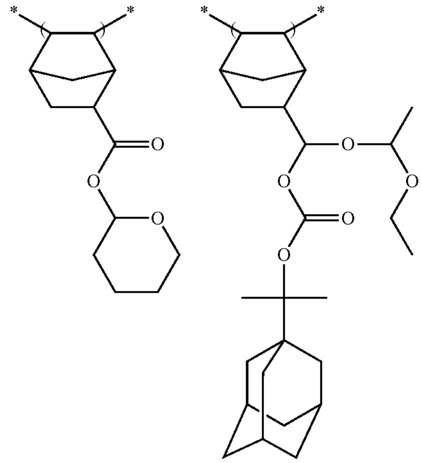
A-50
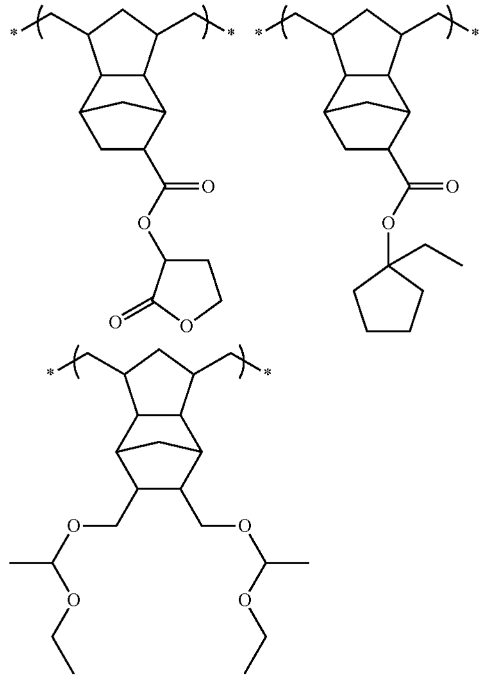
TABLE 1
| Compound No. | Mw | Mw/Mn | Compositional Ratio | | |
|---|---|---|---|---|---|
| A-1 | 9800 | 1.76 | 40 | 60 | |
| A-2 | 7700 | 1.80 | 45 | 55 | |
| A-3 | 7900 | 1.81 | 50 | 50 | |
| A-4 | 8400 | 1.79 | 50 | 50 | |
| A-5 | 9000 | 1.84 | 30 | 70 | |
| A-6 | 10500 | 1.77 | 50 | 50 | |
| A-7 | 9400 | 1.83 | 40 | 50 | 10 |
| A-8 | 9500 | 1.86 | 50 | 20 | 30 |
| A-9 | 7300 | 1.79 | 50 | 40 | 10 |
| A-10 | 9900 | 1.82 | 40 | 40 | 20 |
| A-11 | 10400 | 1.81 | 30 | 50 | 20 |
| A-12 | 7900 | 1.76 | 20 | 80 | |
| A-13 | 7900 | 1.76 | 40 | 60 | |
| A-14 | 7900 | 1.76 | 25 | 75 | |
| A-15 | 12000 | 1.81 | 25 | 25 | 50 |
| A-16 | 8100 | 1.66 | 40 | 50 | 10 |
| A-17 | 10500 | 1.71 | 30 | 20 | 50 |
| A-18 | 14200 | 1.81 | 55 | 40 | 5 |

TABLE 1-continued

| Compound No. | Mw | Mw/Mn | Compositional Ratio | | | | |
|---|---|---|---|---|---|---|---|
| A-19 | 11000 | 1.88 | 35 | 10 | 55 | | |
| A-20 | 8500 | 1.68 | 40 | 10 | 50 | | |
| A-21 | 10200 | 1.69 | 30 | 15 | 40 | 15 | |
| A-22 | 6900 | 1.85 | 30 | 10 | 50 | 10 | |
| A-23 | 10000 | 1.71 | 30 | 10 | 60 | | |
| A-24 | 9500 | 1.61 | 30 | 10 | 30 | 30 | |
| A-25 | 15000 | 1.81 | 40 | 10 | 50 | | |
| A-26 | 12000 | 1.63 | 15 | 30 | 5 | 40 | 10 |
| A-27 | 12500 | 1.88 | 40 | 30 | 30 | | |
| A-28 | 8100 | 1.55 | 35 | 15 | 40 | 10 | |
| A-29 | 11000 | 1.61 | 40 | 40 | 5 | 15 | |
| A-30 | 9000 | 1.72 | 40 | 20 | 40 | | |
| A-31 | 12500 | 1.72 | 30 | 10 | 40 | 20 | |
| A-32 | 7200 | 1.66 | 40 | 40 | 5 | 15 | |
| A-33 | 5500 | 1.58 | 60 | 20 | 20 | | |
| A-34 | 10000 | 1.65 | 10 | 15 | 25 | 25 | 25 |
| A-35 | 16000 | 1.81 | 30 | 10 | 50 | 10 | |
| A-36 | 5100 | 1.54 | 15 | 20 | 65 | | |
| A-37 | 12000 | 1.65 | 40 | 10 | 20 | 30 | |
| A-38 | 6000 | 1.55 | 15 | 15 | 60 | 10 | |
| A-39 | 8000 | 1.77 | 40 | 10 | 30 | 20 | |
| A-40 | 4200 | 1.61 | 35 | 15 | 20 | 30 | |
| A-41 | 11500 | 1.66 | 30 | 20 | 40 | 10 | |
| A-42 | 4000 | 1.91 | 30 | 10 | 30 | 30 | |
| A-43 | 6000 | 1.71 | 10 | 10 | 40 | 40 | |
| A-44 | 12000 | 1.24 | 20 | 20 | 50 | 10 | |
| A-45 | 5500 | 1.55 | 50 | 10 | 40 | | |
| A-46 | 24000 | 3.68 | 30 | 10 | 40 | 20 | |
| A-47 | 8000 | 2.05 | 30 | 10 | 50 | 10 | |
| A-48 | 15000 | 1.25 | 30 | 20 | 50 | | |
| A-49 | 14500 | 1.95 | 3 | 30 | 27 | 40 | |
| A-50 | 11000 | 1.21 | 33 | 33 | 34 | | |

[2] (B) Compound Capable of Generating an Acid Upon Irradiation with an Actinic Ray or Radiation The actinic ray-sensitive or radiation-sensitive resin composition of the present invention contains a compound capable of generating an acid upon irradiation with an actinic ray or radiation (hereinafter, sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a known compound that generates an acid upon irradiation with an actinic ray or radiation and is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the action of light described, for example, in U.S. Pat. No. 3,779,778 and European Patent 126,712 may also be used.

Out of the acid generators, preferred compounds are compounds represented by the following formulae (ZI), (ZII) and (ZIII):

ZI

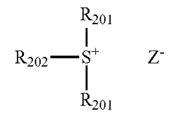

ZII

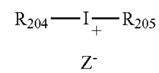

ZIII

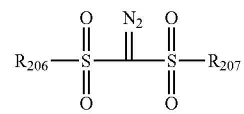

In formula (ZI), each of $R_{201}$, $R_{202}$ and $R_{203}$ independently represents an organic group. The carbon number of the organic group as $R_{201}$, $R_{202}$ and $R_{203}$ is generally from 1 to 30, preferably from 1 to 20. Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene, pentylene). $Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methide anion.

The non-nucleophilic anion is an anion having an extremely low ability of causing a nucleophilic reaction, and this anion can suppress the decomposition with aging due to an intramolecular nucleophilic reaction. Thanks to this anion, the stability of the resist with aging is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further includes an alkyl group (preferably having a carbon number of 1 to 15) and a cycloalkyl group (preferably having a carbon number of 3 to 15).

An anion capable of producing an arylsulfonic acid represented by the following formula (BI) is also preferred as the aromatic sulfonate anion.

(BI)

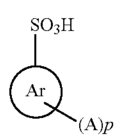

In formula (BI), Ar represents an aromatic ring and may have a substituent in addition to the sulfonic acid group and the A group.

p represents an integer of 0 or more.

A represents a group containing a hydrocarbon group (preferably having a carbon number of 3 or more).

When p is 2 or more, each A group may be the same as or different from every other A groups.

Formula (BI) is described in detail below.

The aromatic ring represented by Ar is preferably an aromatic ring having a carbon number of 6 to 30.

Specific examples thereof include a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a pentacene ring, a chrysene ring, a triphenylene ring, an indene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. A benzene ring, a naphthalene ring and an anthracene ring are preferred, and a benzene ring is more preferred.

Examples of the substituent which the aromatic ring may have in addition to the sulfonic acid group and the A group include a halogen atom (e.g., fluorine, chlorine, bromine, iodine), a hydroxyl group, a cyano group, a nitro group and a carboxyl group. In the case of having two or more substituents, at least two substituents may combine with each other to form a ring.

Examples of the group having a hydrocarbon group, represented by A, include an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear or branched alkyl group such as methyl group, ethyl group, propyl group, butyl group, heptyl group, hexyl group, dodecyl group and 2-ethylhexyl group; an alkenyl group such as vinyl group, propenyl group and hexenyl group; an acetylene group; an alkynyl group such as propynyl group and hexynyl group; an aryl group such as phenyl group and tolyl group; and an acyl group such as benzoyl group, acetyl group and tolyl group.

The hydrocarbon group in the group containing a hydrocarbon group, represented by A, includes an acyclic hydrocarbon group and a cyclic aliphatic group. The carbon number of the hydrocarbon group is preferably 3 or more.

As for the A group, the carbon atom adjacent to Ar is preferably a tertiary or quaternary carbon atom.

Examples of the acyclic hydrocarbon group in the A group include an isopropyl group, a tert-butyl group, a tert-pentyl group, a neopentyl group, an s-butyl group, an isobutyl group, an isohexyl group, a 3,3-dimethylpentyl group and a 2-ethylhexyl group. The upper limit of the carbon number of the acyclic hydrocarbon group is preferably 12 or less, more preferably 10 or less.

Examples of the cyclic aliphatic group in the A group include a cycloalkyl group such as cyclobutyl group, cyclopentyl group, cyclohexyl group, cycloheptyl group and cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group and a pinenyl group. These groups may have a substituent. The upper limit of the carbon number of the cyclic aliphatic group is preferably 15 or less, more preferably 12 or less.

In the case where the acyclic hydrocarbon group or cyclic aliphatic group has a substituent, examples of the substituent include a halogen atom such as fluorine atom, chlorine atom, bromine atom and iodine atom, an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, a cyclic alkyl group such as cyclohexyl group, an alkenyl group such as vinyl group, propenyl group and hexenyl group, an acetylene group, an alkynyl group such as propynyl group and hexynyl group, an aryl group such as phenyl group and tolyl group, a hydroxy group, a carboxy group, a sulfonic acid group, a carbonyl group and a cyano group.

Specific examples of the group containing the cyclic aliphatic group or acyclic hydrocarbon group as A are illustrated below.

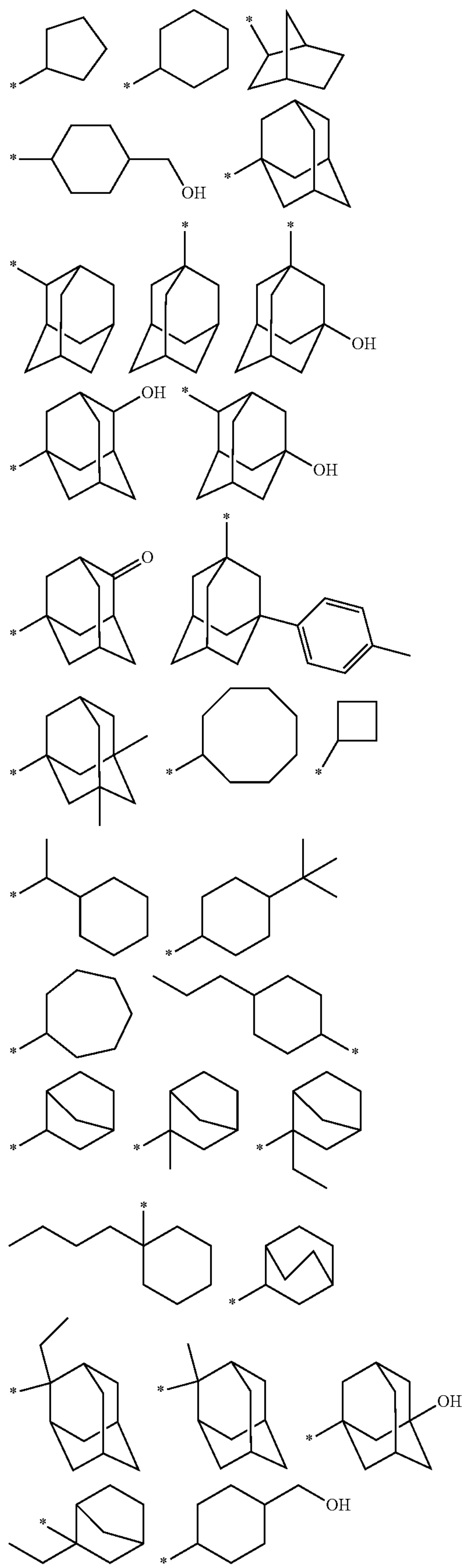
-continued
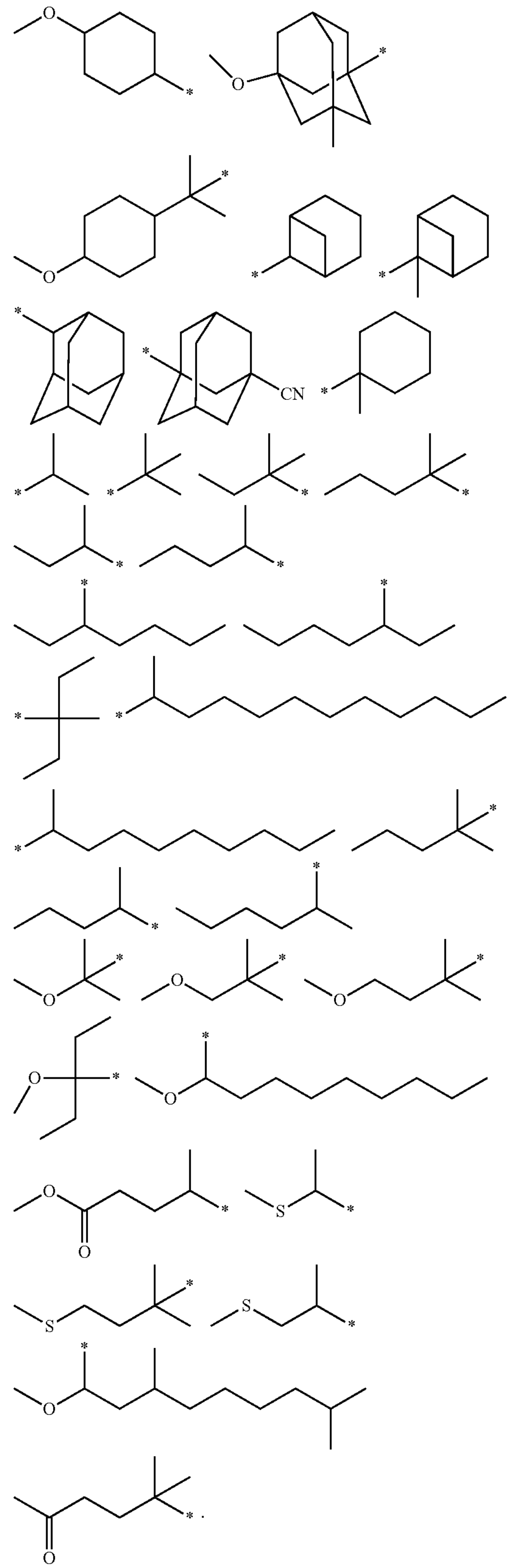
Among these, the following structures are more preferred in view of suppressing acid diffusion.

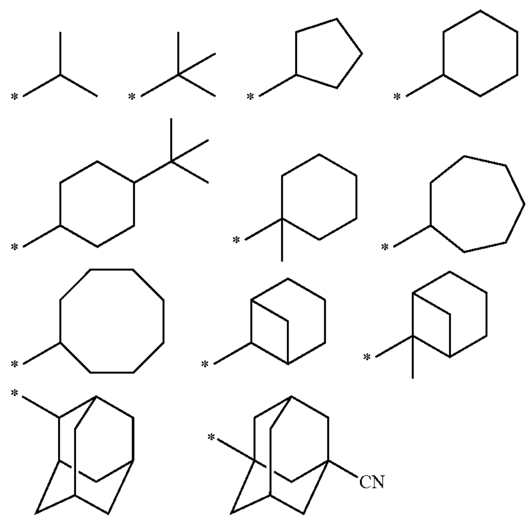

p represents an integer of 0 or more, and the upper limit thereof is not particularly limited as long as it is a chemically possible number. From the standpoint of suppressing the acid diffusion, p is an integer of usually from 0 to 5, preferably from 1 to 4, more preferably 2 or 3, and most preferably 3.

In view of suppressing the acid diffusion, the A group is preferably substituted on at least one o-position, more preferably on two o-positions, with respect to the sulfonic acid group.

In one embodiment, the acid generator (B) for use in the present invention is a compound capable of generating an acid represented by the following formula (BII):

(BII)

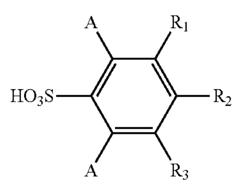

In the formula, A has the same meaning as A in formula (BI), and two A's may be the same or different. Each of $R_1$ to $R_3$ independently represents a hydrogen atom, a hydrocarbon group-containing group, a halogen atom, a hydroxyl group, a cyano group or a nitro group. Specific examples of the hydrocarbon group-containing group are the same as the groups exemplified above.

Furthermore, an anion capable of producing an acid represented by the following formula (1) is also preferred as the sulfonate anion.

(I)

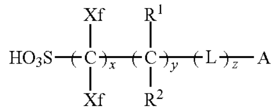

In the formula, each Xf independently represents a fluorine atom or an alkyl group substituted with at least one fluorine atom. Each of $R^1$ and $R^2$ independently represents a group selected from a hydrogen atom, a fluorine atom and an alkyl group, and when a plurality of $R^1$'s or $R^2$'s are present, each $R^1$ or $R^2$ may be the same as or different from every other $R^1$ or $R^2$. L represents a single bond or a divalent linking group, and when a plurality of L's are present, each L may be the same as or different from every other L. A represents a cyclic organic group. x represents an integer of 1 to 20, y represents an integer of 0 to 10, and z represents an integer of 0 to 10.

Formula (I) is described in more detail below.

The alkyl group in the fluorine atom-substituted alkyl group of Xf is preferably an alkyl group having a carbon number of 1 to 10, more preferably a carbon number of 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xf's are a fluorine atom.

The alkyl group of $R^1$ and $R^2$ may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R_1$ and $R_2$ is preferably a fluorine atom or $CF_3$.

y is preferably from 0 to 4, more preferably 0. x is preferably from 1 to 8, more preferably from 1 to 4. z is preferably from 0 to 8, more preferably from 0 to 4. The divalent linking group of L is not particularly limited and includes —COO—, —OCO—, —CO—, —O—, —S—, —SO—, —$SO_2$—, an alkylene group, a cycloalkylene group, an alkenylene group, and a linking group formed by connecting a plurality of these members, and a linking group having a total carbon number of 12 or less is preferred. Above all, —COO—, —OCO—, —CO—, —O— and —$SO_2$— are preferred, and —COO—, —OCO— and —$SO_2$— are more preferred.

The cyclic organic group of A is not particularly limited, and examples thereof include an alicyclic group, an aryl group and a heterocyclic group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film at the PEB (post-exposure baking) step can be suppressed and MEEF (mask error enhancement factor) can be improved.

The aryl group includes a benzene ring, a naphthalene ring, a phenanthrene ring and an anthracene ring. Among these, naphthalene having low absorbance is preferred in view of absorbance for light at 193 nm.

The heterocyclic group includes those derived from a furan ring, a thiophene ring, a benzofuran ring, a benzothiophene ring, a dibenzofuran ring, a dibenzothiophene ring, a pyridine ring and a piperidine ring. In particular, those derived from a furan ring, a thiophene ring, a pyridine ring and a piperidine ring are preferred.

The cyclic organic group also includes a lactone structure, and specific examples thereof include lactone structures represented by formulae (LC1-1) to (LC1-17), which the resin (A) may have.

The above-described cyclic organic group may have a substituent, and examples of the substituent include an alkyl group (may be either linear or branched, preferably having a carbon number of 1 to 12), a cycloalkyl group (may be any of monocyclic, polycyclic or spirocyclic, preferably having a carbon number of 3 to 20), an aryl group (preferably having a carbon number of 6 to 14), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (the carbon contributing to ring formation) may be carbonyl carbon.

The aliphatic moiety in the aliphatic carboxylate anion includes the same alkyl groups and cycloalkyl groups as those in the aliphatic sulfonate anion.

The aromatic group in the aromatic carboxylate anion includes the same aryl groups as those in the aromatic sulfonate anion.

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atoms, alkyl groups, cycloalkyl groups, alkoxy groups and alkylthio groups as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Incidentally, two alkyl groups in the bis(alkylsulfonyl)imide anion may be the same or different. Similarly, each alkyl group in the tris(alkylsulfonyl)methide anion may be the same as or different from every other alkyl groups.

In particular, the bis(alkylsulfonyl)imide anion and tris (alkylsulfonyl)methyl anion include anions represented by the following formulae (A3) and (A4):

(A3)

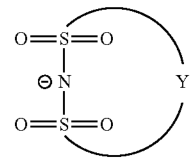

(A4)

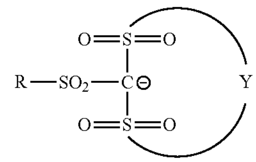

In formulae (A3) and (A4), Y is an alkylene group substituted with at least one fluorine atom, preferably an alkylene group having a carbon number of 2 to 4. The alkylene chain may contain an oxygen atom. Y is more preferably a perfluoroalkylene group having a carbon number of 2 to 4, and most preferably a tetrafluoroethylene group, a hexafluoropropylene group or an octafluorobutylene group.

In formula (A4), R represents an alkyl group or a cycloalkyl group. The alkylene chain in the alkyl or cycloalkyl group may contain an oxygen atom.

Examples of the compound having an anion represented by formula (A3) or (A4) include those described as specific examples in JP-A-2005-221721.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8, or a fluorine atom-containing benzenesulfonate anion, still more preferably nonafluorobutanesulfonate anion, perfluorooctanesulfonate anion, pentafluorobenzenesulfonate anion, or 3,5-bis(trifluoromethyl) benzenesulfonate anion.

Examples of the organic group as $R_{201}$, $R_{202}$ and $R_{203}$ in formula (ZI) include corresponding groups in the compounds (ZI-1) to (ZI-4) described later.

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI).

Compounds (ZI-1) to (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group), and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

(ZI-3)

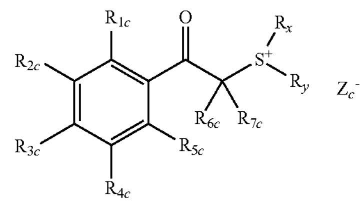

In formula (ZI-3), each of $R_{1c}$ to $R_{5c}$ independently represents a hydrogen atom, an alkyl group, a cycloalkyl group, an alkoxy group, a phenyl group, a phenylthio group or a halogen atom. Each of $R_{6c}$ and $R_{7c}$ independently represents a hydrogen atom, an alkyl group, a cycloalkyl group, a halogen atom, a cyano group or an aryl group. Each of $R_x$ and $R_y$ independently represents an alkyl group, a cycloalkyl group, an allyl group, a 2-oxoalkyl group, a 2-oxocycloalkyl group, an alkoxycarbonylalkyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amide bond.

Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The ring structure includes an aromatic or non-aromatic hydrocarbon ring, an aromatic or non-aromatic heterocyclic ring, and a polycyclic condensed ring formed by combining two or more of these rings. The ring structure is a 3- to 10-membered ring, preferably a 4- to 8-membered ring, more preferably a 5- or 6-membered ring.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl group, ethyl group, linear or branched propyl group, linear or branched butyl group, linear or branched pentyl group). The cycloalkyl group is, for example, a cycloalkyl group having a carbon number of 3 to 8 (e.g., cyclopentyl group, cyclohexyl group).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy group, ethoxy group, linear or branched propoxy group, linear or branched butoxy group, linear or branched pentoxy group), or a cyclic alkoxy group having a carbon number of 3 to 8 (e.g., cyclopentyloxy group, cyclohexyloxy group). The aryl group as $R_{6c}$ and $R_{7c}$ is preferably an aryl group having a carbon number of 5 to 15, and examples thereof include a phenyl group and a naphthyl group.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C═O at the 2-position of the alkyl group or cycloalkyl group as $R_{1c}$ to $R_{7c}$.

Examples of the alkoxy group in the alkoxycarbonylalkyl group are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (e.g., methyl group, ethyl group).

The allyl group is not particularly limited but is preferably an unsubstituted allyl group or an allyl group substituted with a monocyclic or polycyclic cycloalkyl group.

The vinyl group is not particularly limited but is preferably an unsubstituted vinyl group or a vinyl group substituted with a monocyclic or polycyclic cycloalkyl group.

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-3), and a 5-membered ring (that is, a tetrahydrothiophene ring) is particularly preferred.

Each of $R_x$ and $R_y$ is an alkyl or cycloalkyl group having a carbon number of preferably 4 or more, more preferably 6 or more, still more preferably 8 or more.

Specific examples of the cation moiety of the compound (ZI-3) are illustrated below.

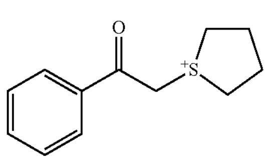

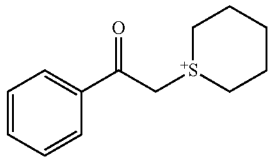

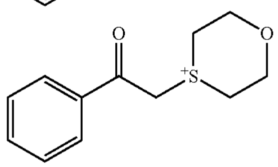

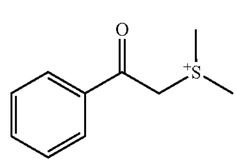

-continued

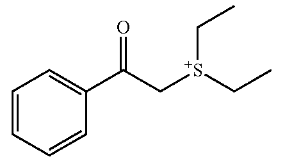

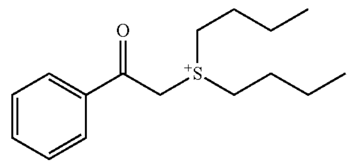

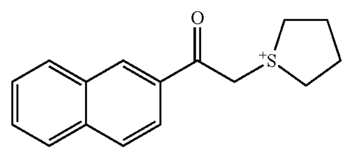

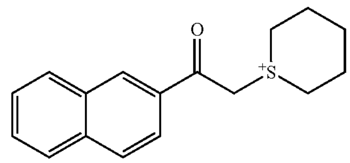

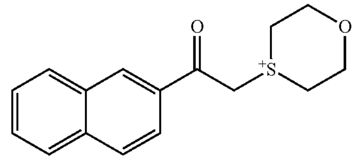

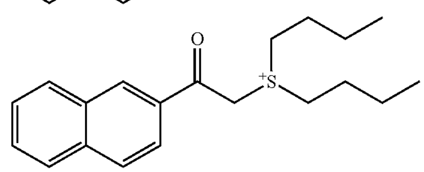

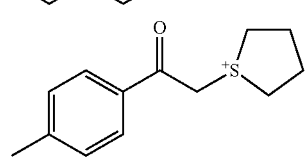

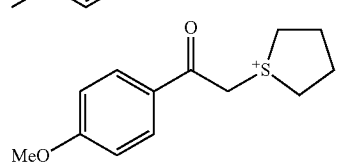

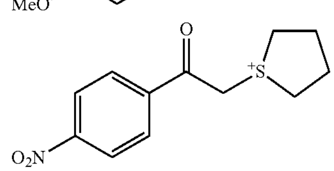

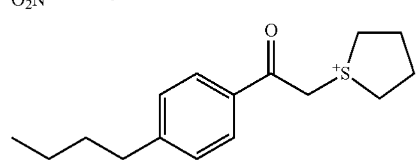

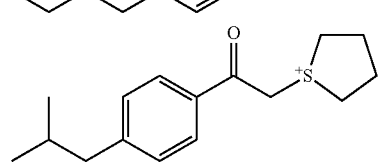

-continued
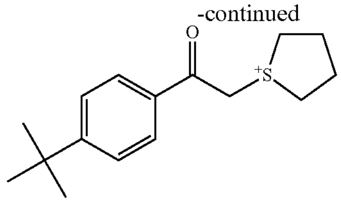
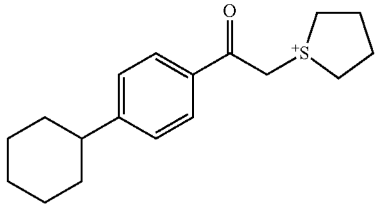
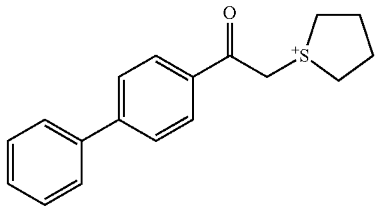
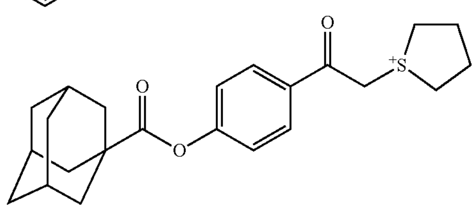
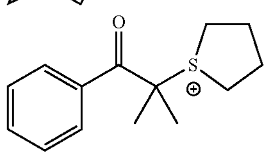
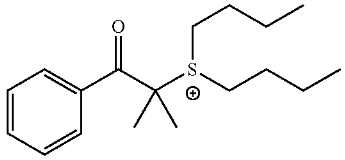
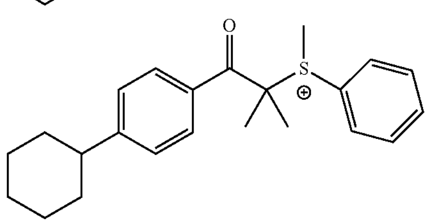
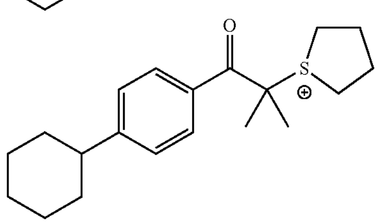
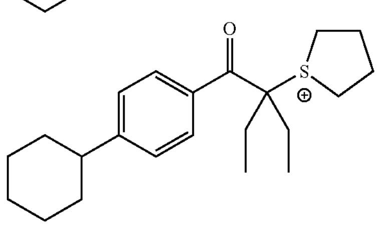
-continued
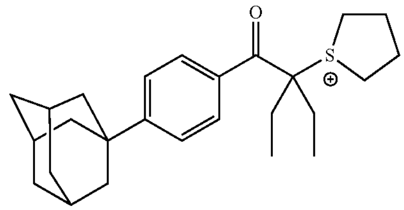
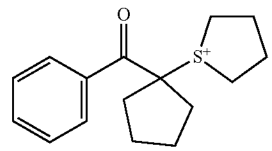
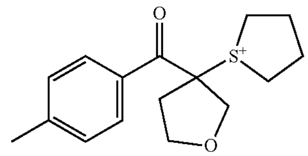
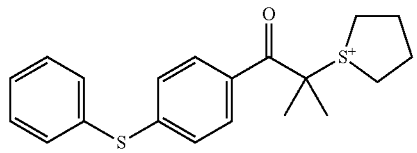
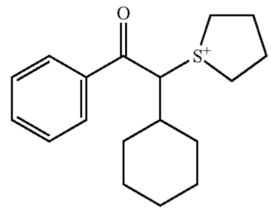
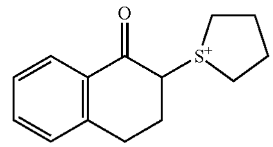
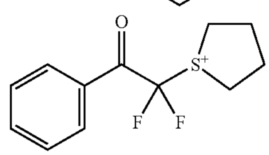
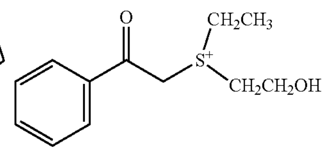
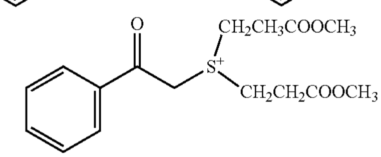
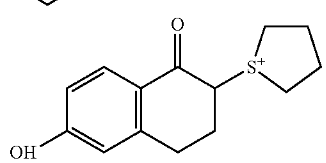
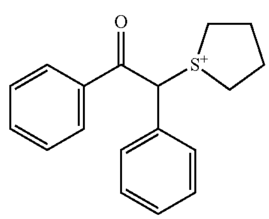
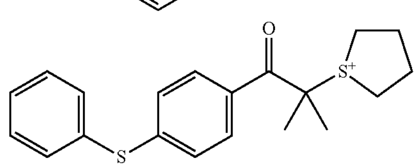
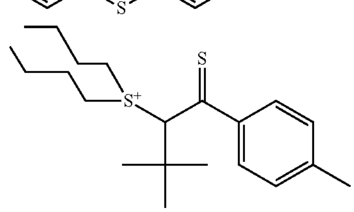

-continued

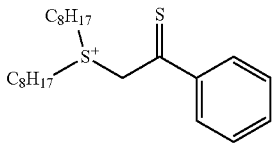

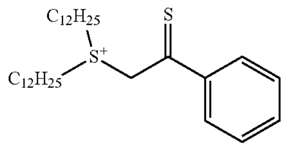

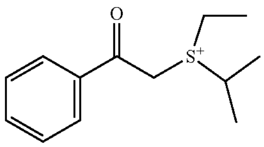

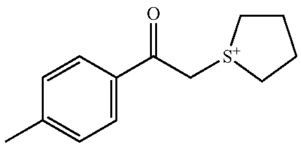

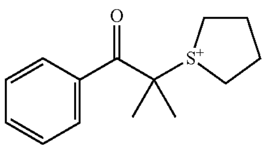

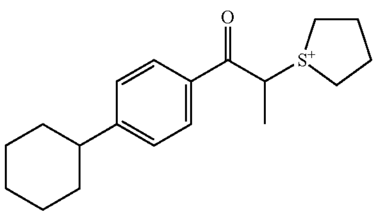

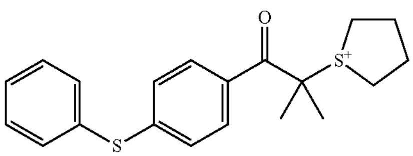

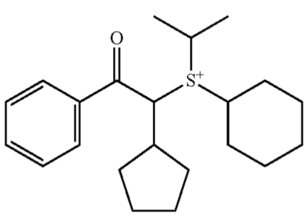

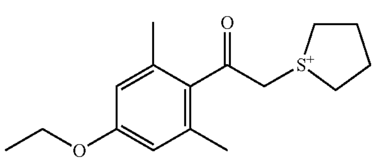

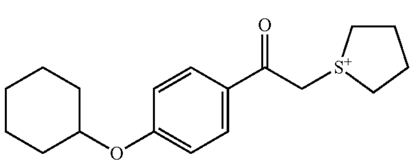

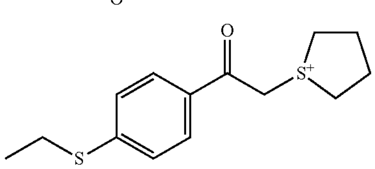

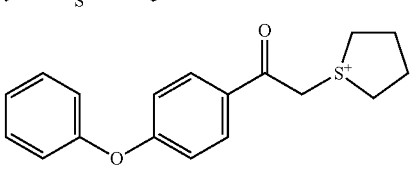

-continued

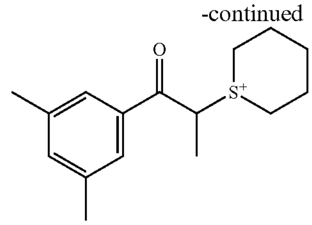

The compound (ZI-4) is a compound represented by the following formula (ZI-4):

(ZI-4)

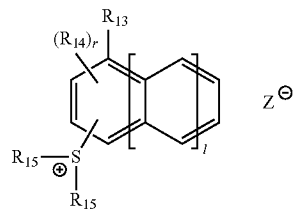

In formula (ZI-4), $R_{13}$ represents a hydrogen atom, a fluorine atom, a hydroxyl group, an alkyl group, a cycloalkyl group, an alkoxy group, an alkoxycarbonyl group, or a cycloalkyl group-containing group. These groups may have a substituent.

$R_{14}$ represents, when a plurality of $R_{14}$'s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group-containing group. These groups may have a substituent.

Each $R_{15}$ independently represents an alkyl group, a cycloalkyl group or a naphthyl group. Two $R_{15}$'s may combine with each other to form a ring.

l represents an integer of 0 to 2.

r represents an integer of 0 to 10.

$Z^-$ represents a non-nucleophilic anion, and examples thereof are the same as those of the non-nucleophilic anion of $Z^-$ in formula (ZI).

In formula (ZI-4), the alkyl group of $R_{13}$, $R_{14}$ and $R_{15}$ is preferably a linear or branched alkyl group having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20), and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl and adamantyl. Above all, cyclopropyl, cyclopentyl, cyclohexyl and cyclooctyl are preferred.

The alkoxy group of $R_{13}$ and $R_{14}$ is preferably a linear or branched alkoxy group having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group and an n-decyloxy group. Among these alkoxy groups, a methoxy group, an ethoxy group, an n-propoxy group and an n-butoxy group are preferred.

The alkoxycarbonyl group of $R_{13}$ and $R_{14}$ is preferably a linear or branched alkoxycarbonyl group having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group and an n-decyloxycarbonyl group. Among these alkoxycarbonyl groups, a methoxycarbonyl group, an ethoxycarbonyl group and an n-butoxycarbonyl group are preferred.

The cycloalkyl group-containing group of $R_{13}$ and $R_{14}$ includes a group having a monocyclic or polycyclic cycloalkyl group (preferably a cycloalkyl group having a carbon number of 3 to 20), and examples thereof include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and is preferably a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl, ethyl, propyl, butyl, pentyl, hexyl, heptyl, octyl, dodecyl, 2-ethylhexyl, isopropyl, sec-butyl, tert-butyl, isoamyl), hydroxyl group, halogen atom (e.g., fluorine, chlorine, bromine, iodine), nitro group, cyano group, amido group, sulfonamido group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl and cycloalkylsulfonyl group of $R_{14}$ are preferably a linear, branched or cyclic alkylsulfonyl group having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

l is preferably 0 or 1, more preferably 1.

r is preferably an integer of 0 to 8, more preferably from 0 to 2.

Examples of the substituent which each of the groups of $R_{13}$, $R_{14}$ and $R_{15}$ may have include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

As for the ring structure which may be formed by combining two $R_{15}$'s with each other, a group capable of forming a 5- or 6-membered ring together with the sulfur atom in formula (ZI-4) is preferred, and a group capable of forming a 5-membered ring (that is, a tetrahydrothiophene ring) is more preferred. Examples of the substituent on the divalent group include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. A plurality of substituents may be substituted on the ring structure, and these substituents may combine to form a ring (for example, an aromatic or non-aromatic hydrocarbon ring, an aromatic or non-aromatic heterocyclic ring, or a polycyclic condensed ring formed by combining two or more of such rings). In formula (ZI-4), $R_{15}$ is preferably, for example, a methyl group, an ethyl group, a naphthyl group or a divalent group of forming a tetrahydrothiophene ring structure together with the sulfur atom when two $R_{15}$'s are combined.

Each of the alkyl group, cycloalkyl group, alkoxy group and alkoxycarbonyl group of $R_{13}$ and the alkyl group, cycloalkyl group, alkoxy group, alkylsulfonyl group and cycloalkylsulfonyl group of $R_{14}$ may be substituted, as described above, and the substituent is preferably a hydroxyl group, an alkoxy group, an alkoxycarbonyl group or a halogen atom (particularly fluorine atom).

Specific preferred examples of the cation in the compound represented by formula (ZI-4) are illustrated below.

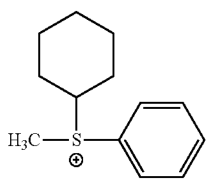

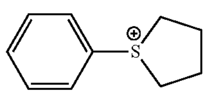

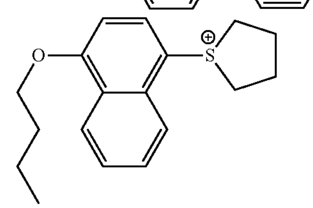

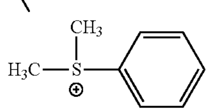

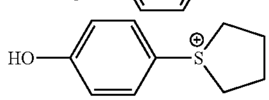

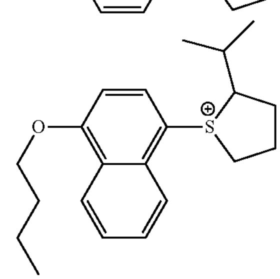

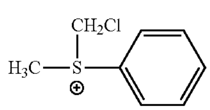

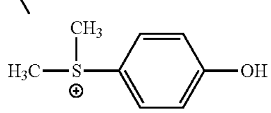

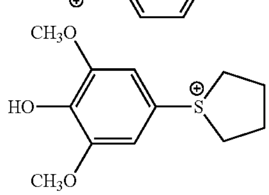

-continued

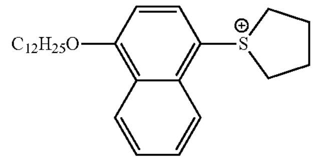

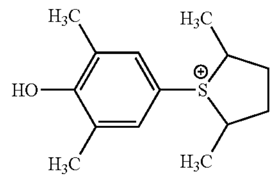

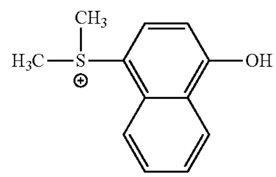

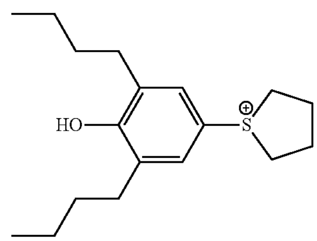

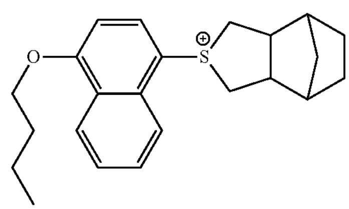

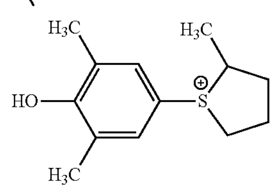

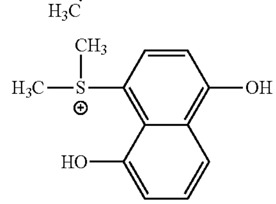

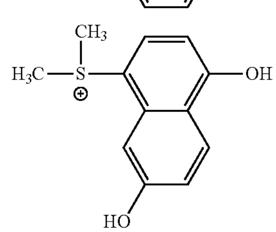

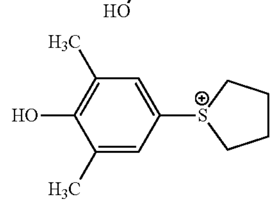

-continued
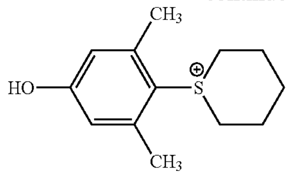
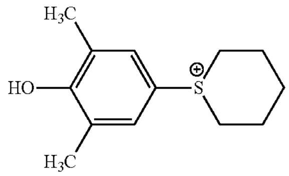
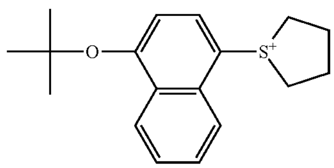
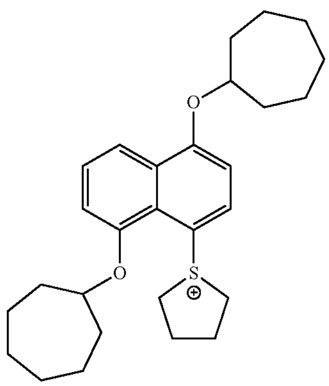
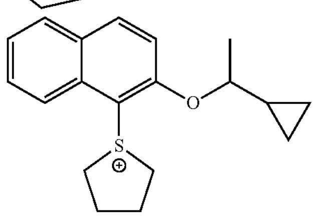
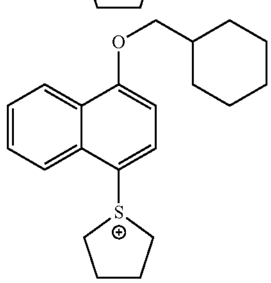
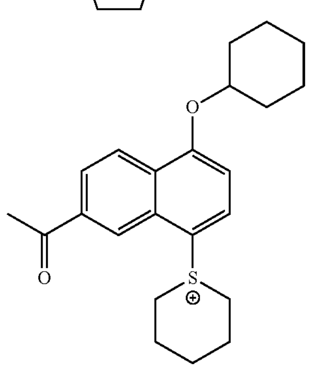
-continued
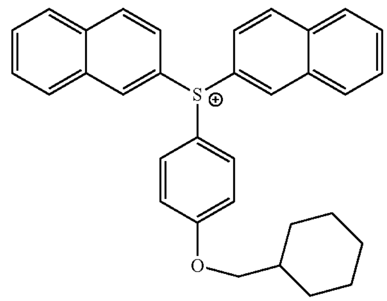
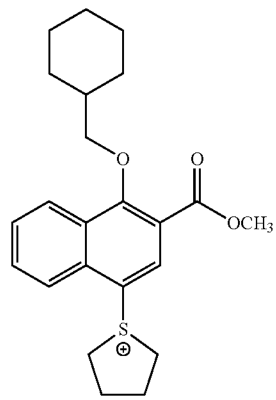
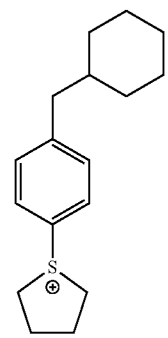
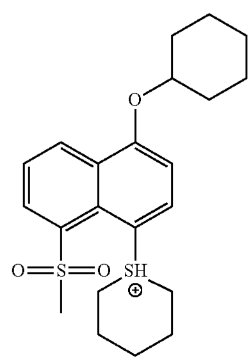
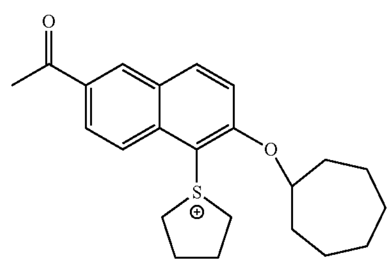
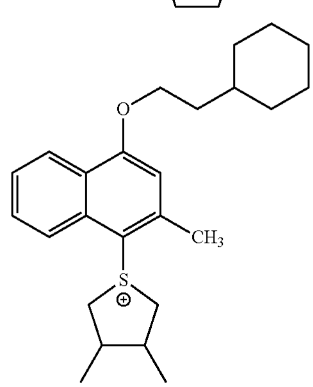

-continued
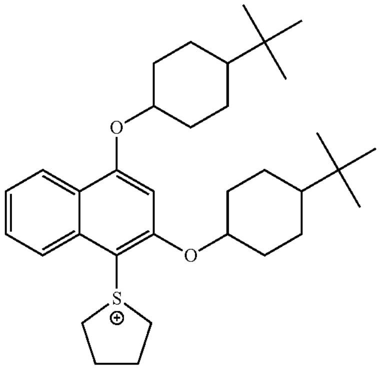
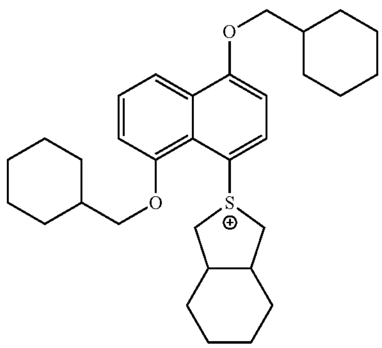
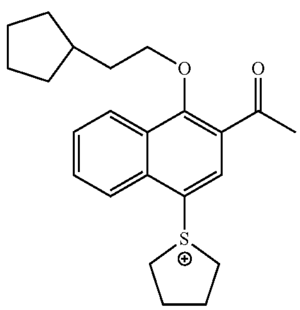
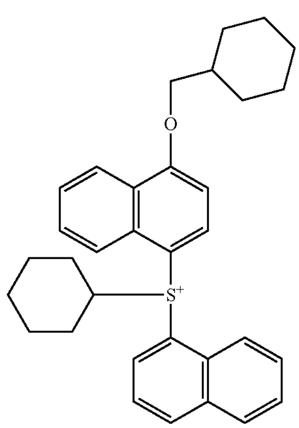
-continued
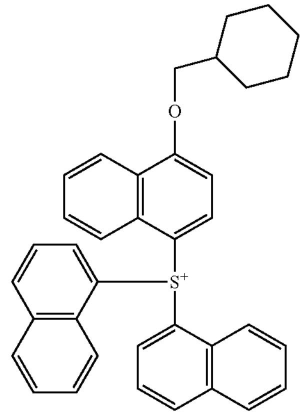
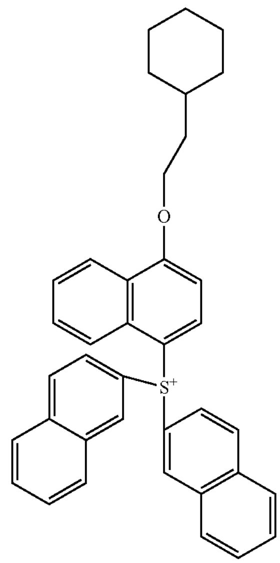
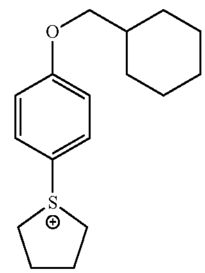
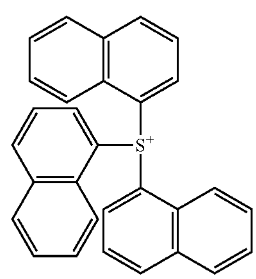
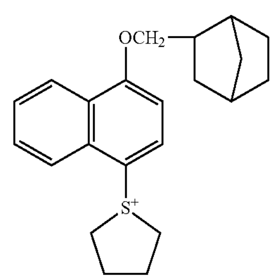
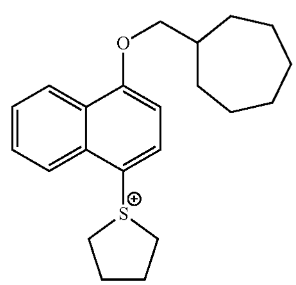

-continued

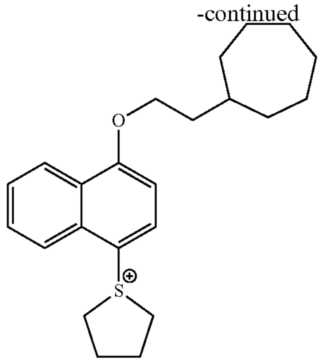

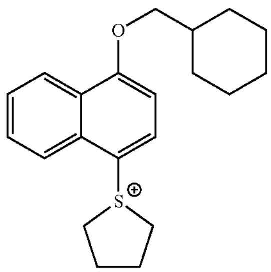

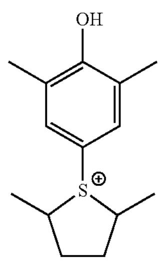

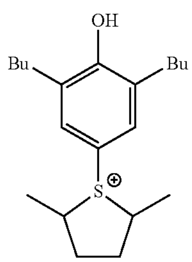

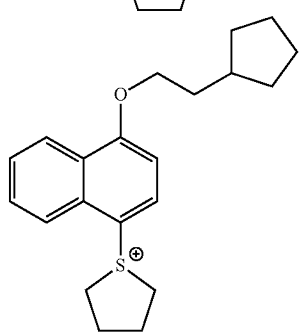

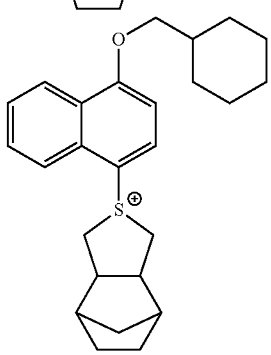

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the heterocyclic structure include pyrrole, furan, thiophene, indole, benzofuran and benzothiophene.

Examples of the aryl group having a heterocyclic structure include a pyrrole residue structure (a group formed by removing one hydrogen atom from a pyrrole), a furan residue structure (a group formed by removing one hydrogen atom from a furan), a thiophene residue structure (a group formed by removing one hydrogen atom from a thiophene), an indole residue structure (a group formed by removing one hydrogen atom from an indole), a benzofuran residue structure (a group formed by removing one hydrogen atom from a benzofuran), and a benzothiophene residue structure (a group formed by removing one hydrogen atom from a benzothiophene).

The alkyl group and cycloalkyl group of $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3—SO_2—SO_2—Ar_4 \quad \text{(ZIV)}$$

(ZV)

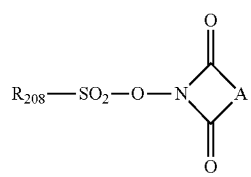

(ZVI)

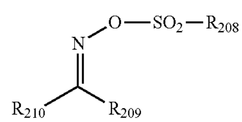

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group. Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene, ethylene, propylene, isopropylene, butylene, isobutylene); the alkenylene group of A includes an alkenylene group having a carbon number of 2 to 12 (e.g., ethynylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII). The acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

As the acid generator, an onium carboxylate may be used. When an onium carboxylate is incorporated, the transparency to light at a wavelength of 220 nm or less is ensured, the sensitivity and resolution are further enhanced, and the iso/dense bias and exposure margin are more improved.

The onium carboxylate is preferably an iodonium salt or a sulfonium salt. As, the anion, for example, a linear, branched alkyl or monocyclic or polycyclic cycloalkyl carboxylate anion having a carbon number of 1 to 30 is preferably used. In particular, a carboxylate anion in which hydrogen atoms of the alkyl group or cycloalkyl group are partially or entirely substituted for by a fluorine atom (hereinafter, sometimes referred to as a fluorine-substituted carboxylate anion) is preferred. Incidentally, the alkyl or cycloalkyl chain may contain an oxygen atom.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

In the case where the composition according to the present invention contains an onium carboxylate, the content thereof is generally from 0.1 to 20 mass %, preferably from 0.5 to 10 mass %, more preferably from 1 to 7 mass %, based on the entire solid content of the composition.

In the case where the composition according to the present invention contains an acid generator, the acid which the acid generator can generate may or may not have a fluorine atom. For example, when the acid generator has an anion, this anion may or may not have a fluorine atom.

The composition according to the present invention contains, as described above, a resin containing a repeating unit having a group capable of decomposing by the action of an acid to produce an alcoholic hydroxy group. Such a resin is lower in the activation energy of a reaction between the resin and the acid than a resin containing, as a repeating unit having an acid-decomposable group, only a repeating unit having a group capable of decomposing by the action of an acid to produce a carboxy group. Accordingly, even when an acid generator that generates an acid having relatively low acid strength, for example, an acid having no fluorine atom, is used, the effects of the present invention can be sufficiently obtained.

Among the acid generators, particularly preferred examples are illustrated below.

(z1)

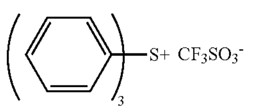

(z2)

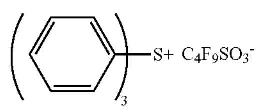

(z3)

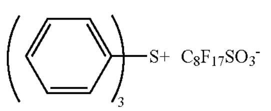

(z4)

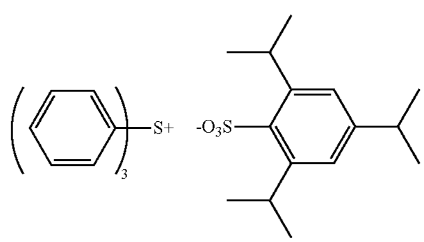

(z5)

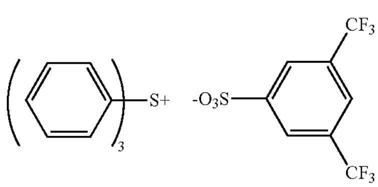

(z6)

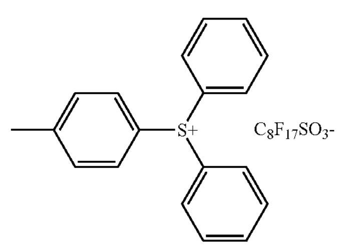

(z7)

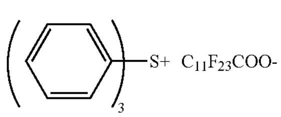

(z8)

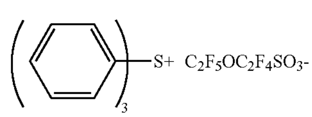

-continued
(z9)
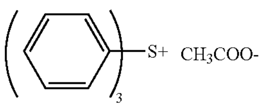
(z10)
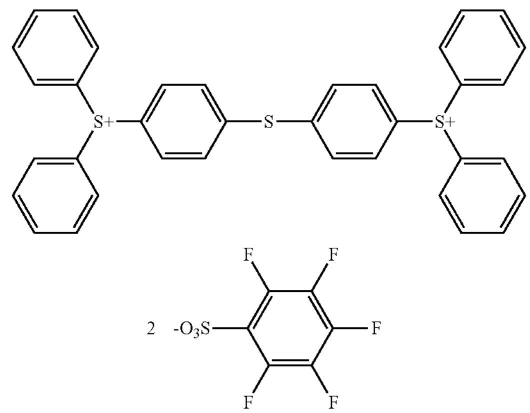
(z11)
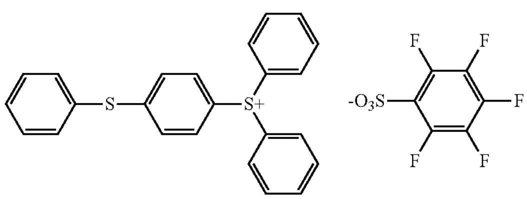
(z12)
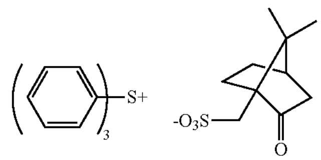
(z13)
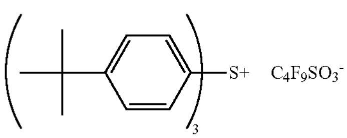
(z14)
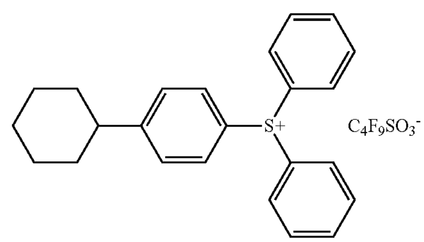
(z15)
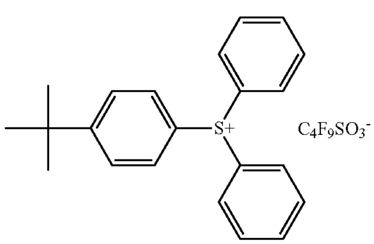
(z16)
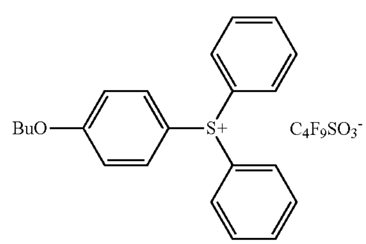
(z17)
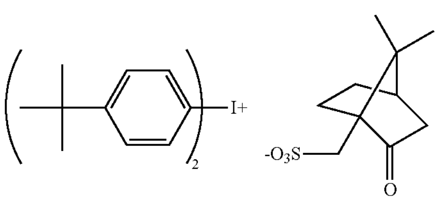
(z18)
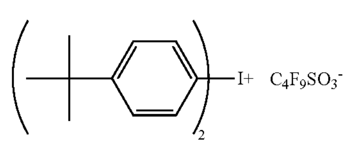
(z19)
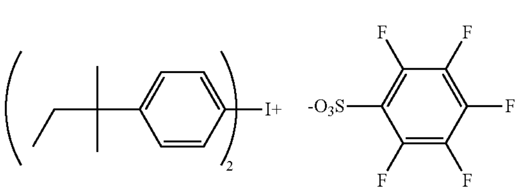
(z20)
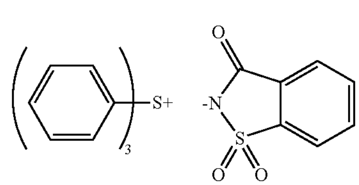

-continued
(z21)
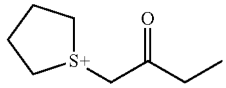
$CF_3SO_3$-
(z22)
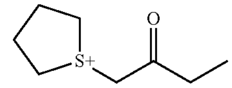
$C_4F_9SO_3$-
(z23)
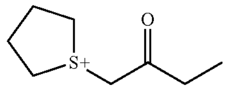
$C_8F_{17}SO_3$-
(z24)
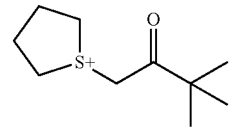
$CF_3SO_3$-
(z25)
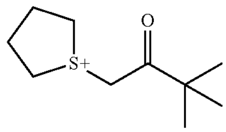
$C_4F_8SO_3$-
(z26)
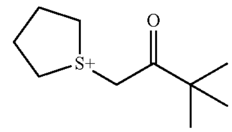
$C_8F_{17}SO_3$-
(z27)
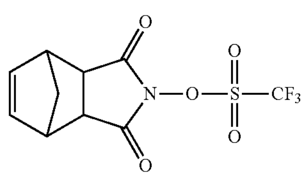
(z28)
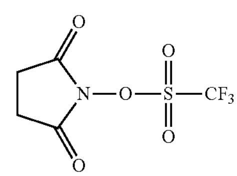
(z29)
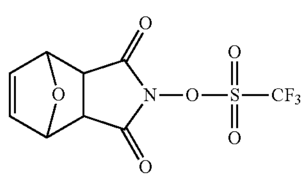
(z30)
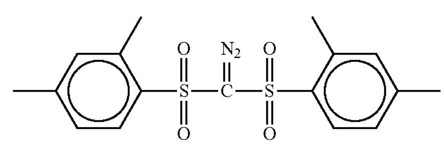
(z31)
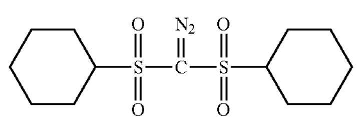
(z32)
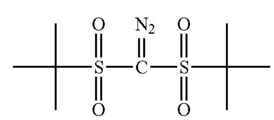
(z33)
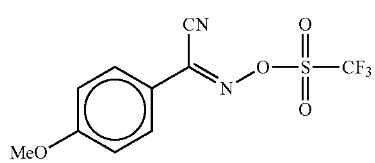
(z34)
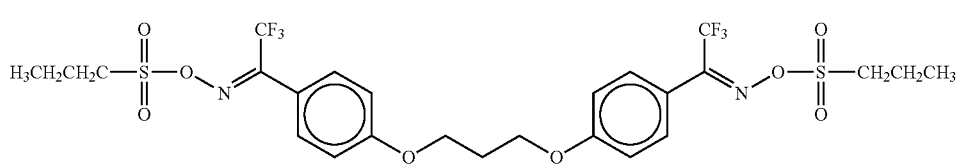
(z35)
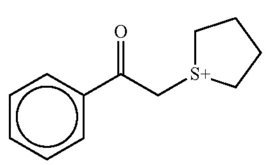
$CF_3SO_3$-
(z36)
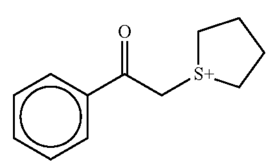
$C_4F_9SO_3$-

-continued
(z37)
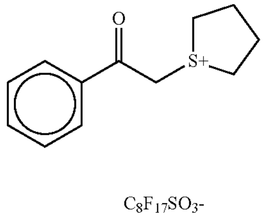
(z38)
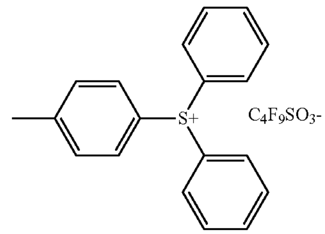
(z39)
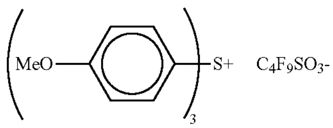
(z40)
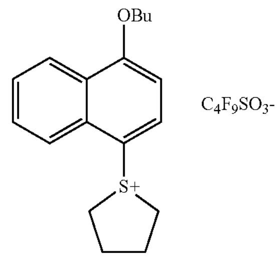
(z41)
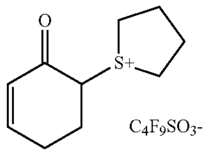
(z42)
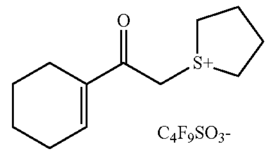
(z43)
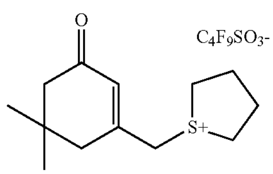
(z44)
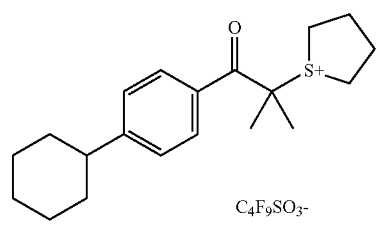
(z45)
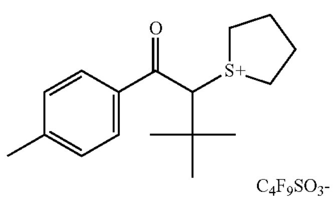
(z46)
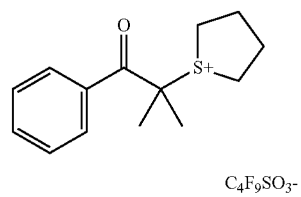
(z47)
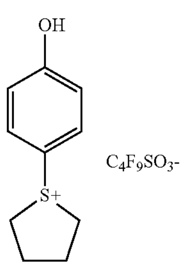
(z48)
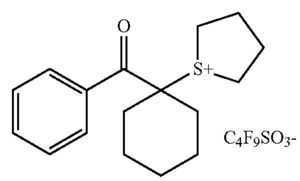
(z49)
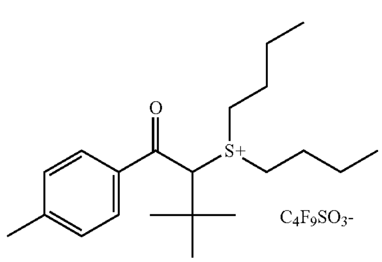
(z50)
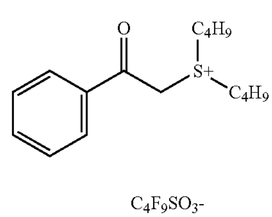

-continued
(z51)
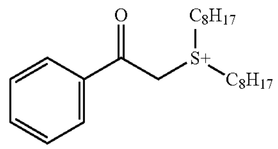
$C_4F_9SO_3^-$
(z52)
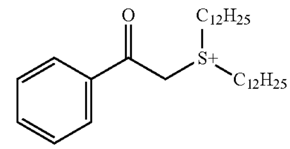
$C_4F_9SO_3^-$
(z53)
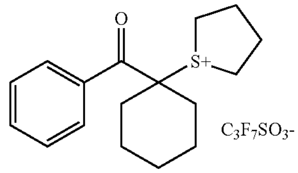
$C_3F_7SO_3^-$
(z54)
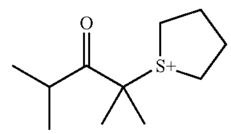
$C_4F_9SO_3^-$
(z55)
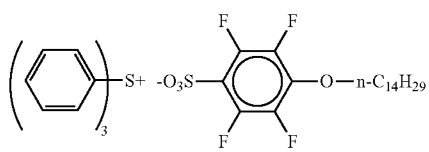
(z56)
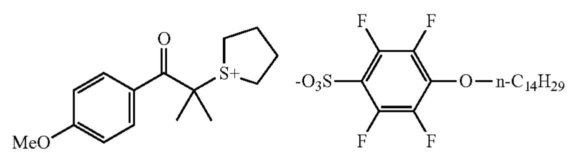
(z57)
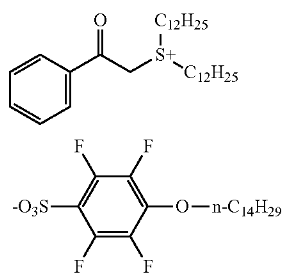
(z58)
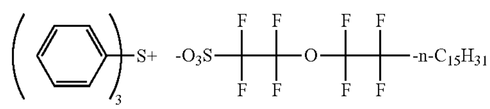
(z59)
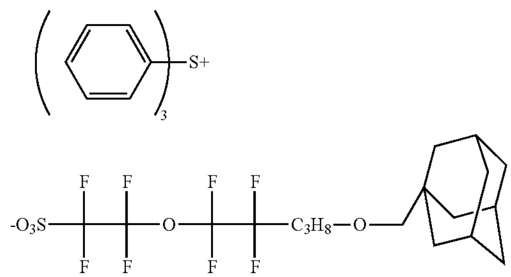
(z60)
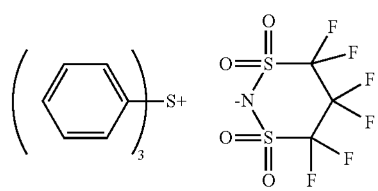
(z61)
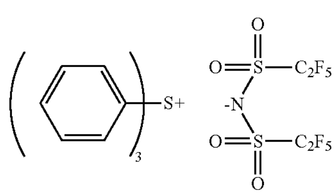
(z62)
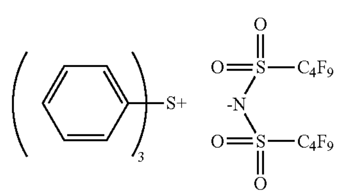
(z63)
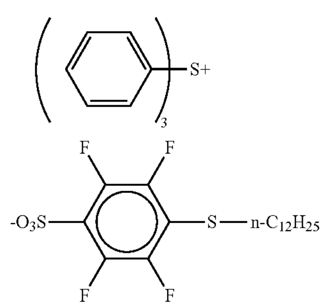
(z64)
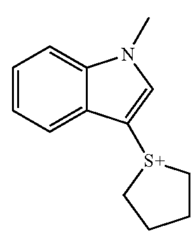
$C_4F_9SO_3^-$ -continued
(z65)
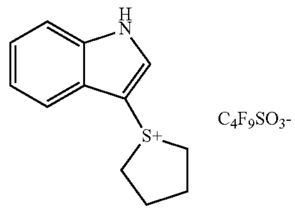
(z66)
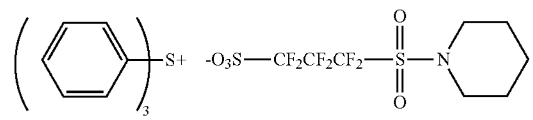
(z67)
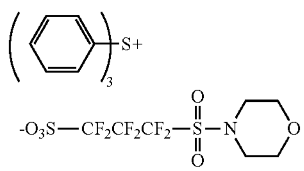
(z68)
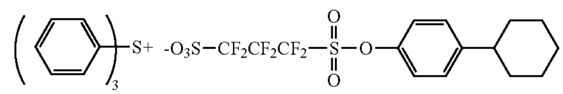
(z69)
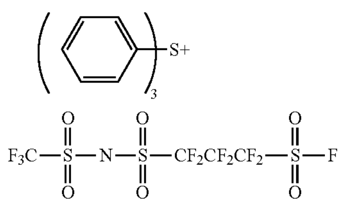
(z70)
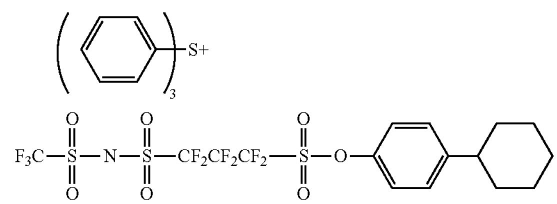
(z71)
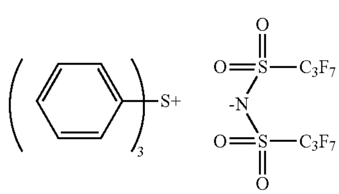
(z72)
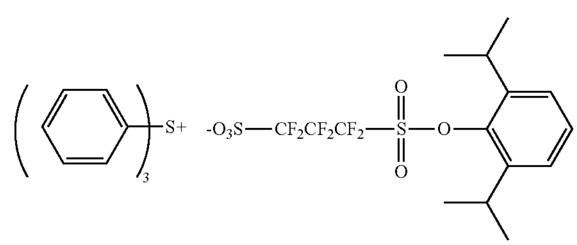
(z73)
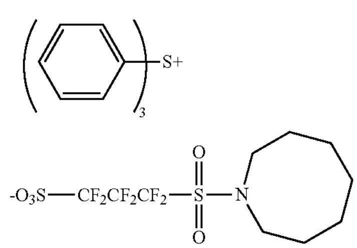
(z74)
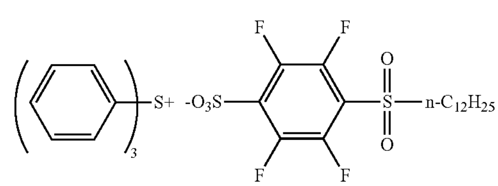
(z75)
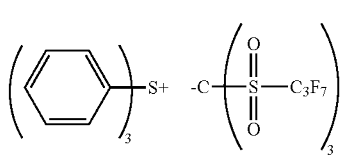
(z76)
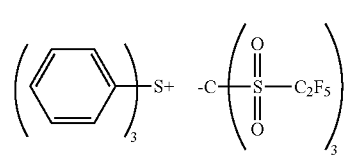

-continued
(z77)
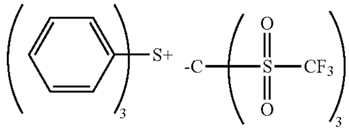
(z78)
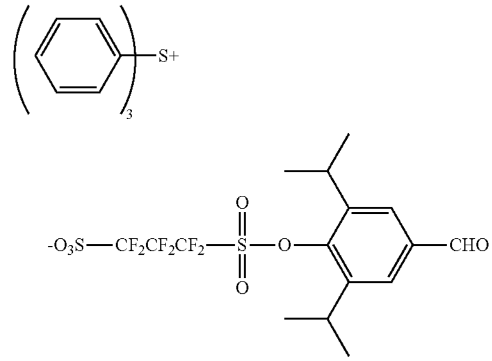
(z79)
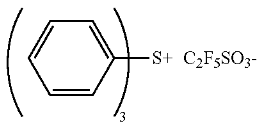
(z80)
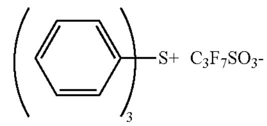
(z81)
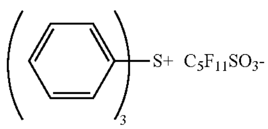
(z82)
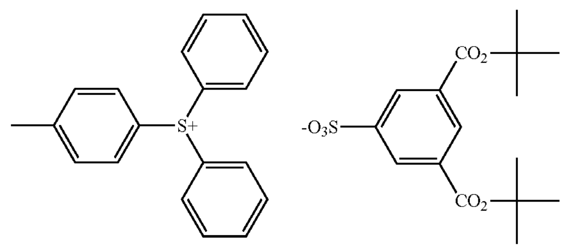
(z83)
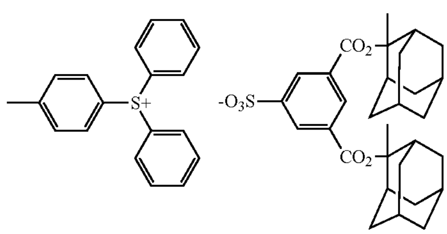
(z84)
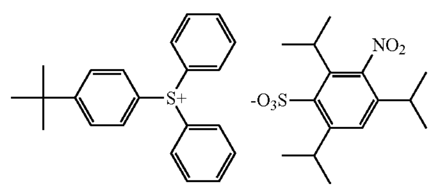
(z85)
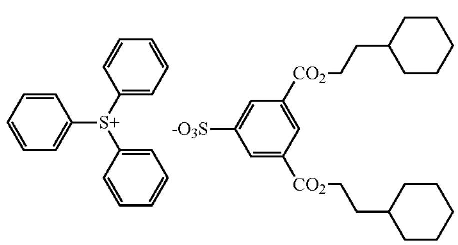
(z86)
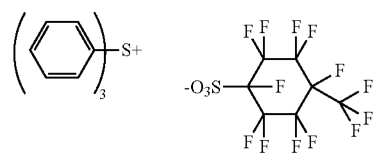
(z87)
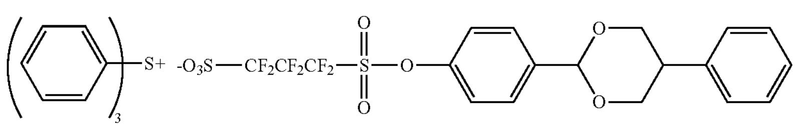
(z88)
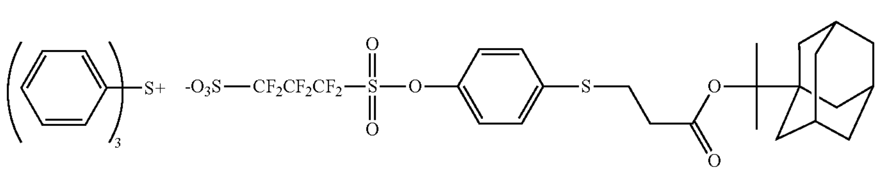

-continued
(z89)
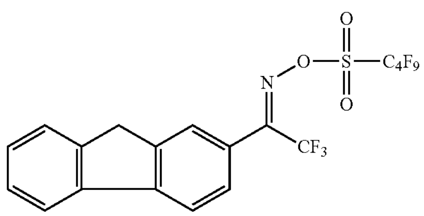
(z90)
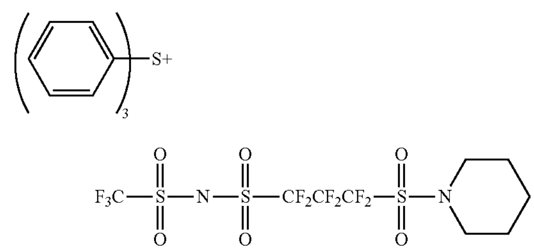
(z91)
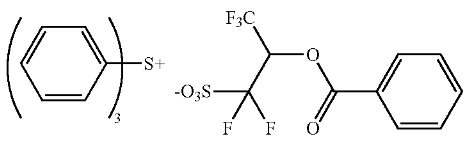
(z92)
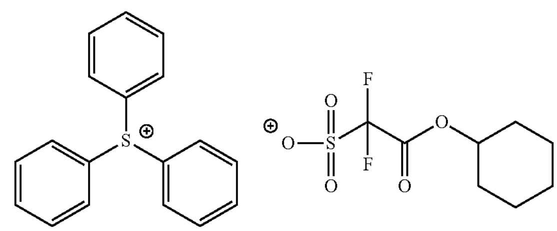
(z93)
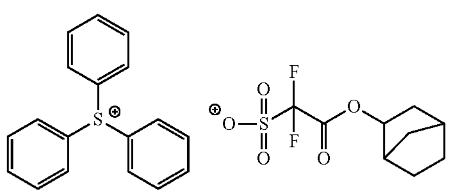
(z94)
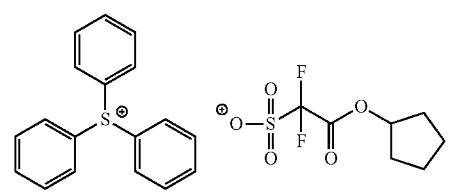
(z95)
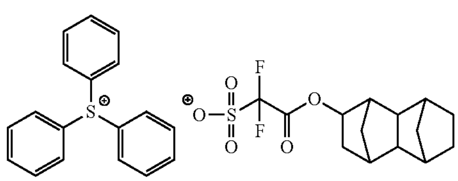
(z96)
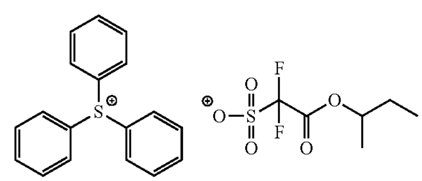
(z97)
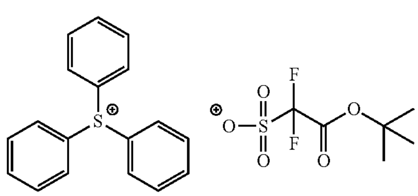
(z98)
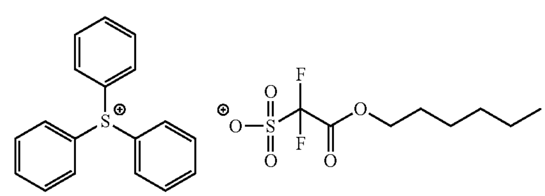
(z99)
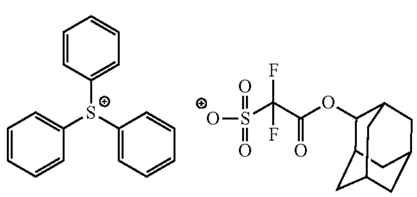
(z100)
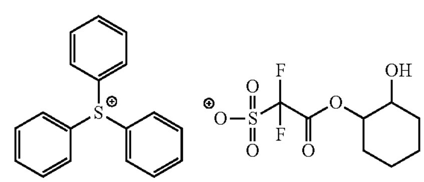
(z101)
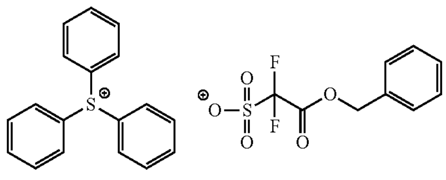
(z102)
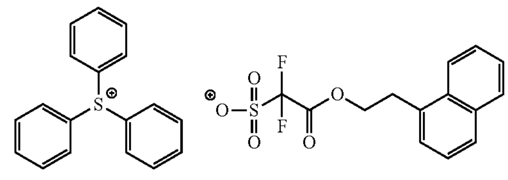

-continued
(z103)
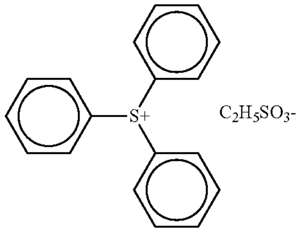
(z104)
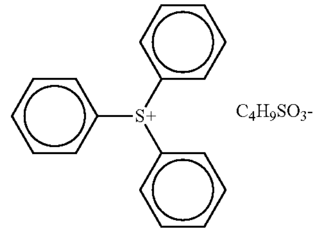
(z105)
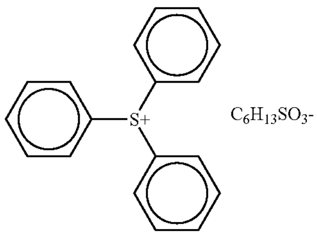
(z106)
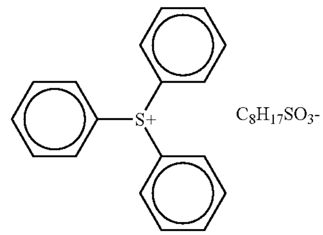
(z107)
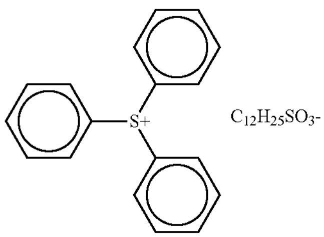
(z108)
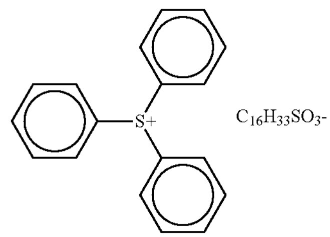
(z109)
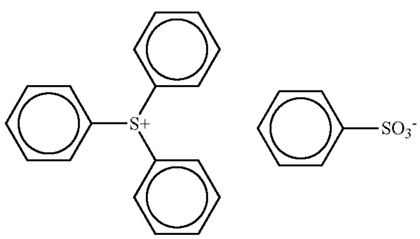
(z110)
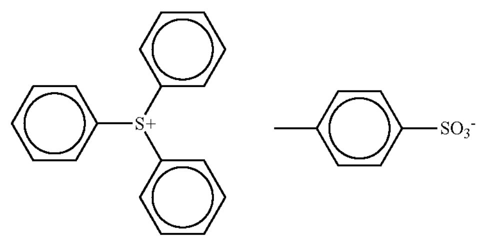
(z111)
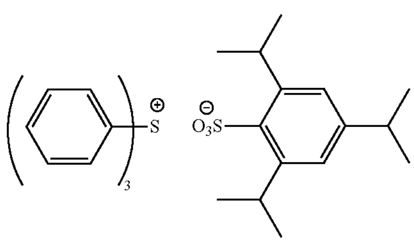
(z112)
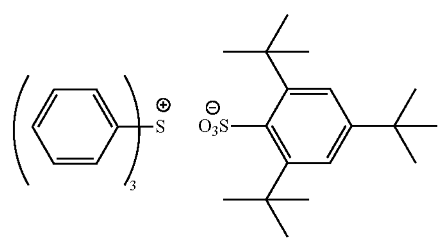
(z113)
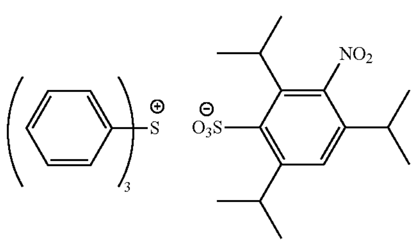
(z114)
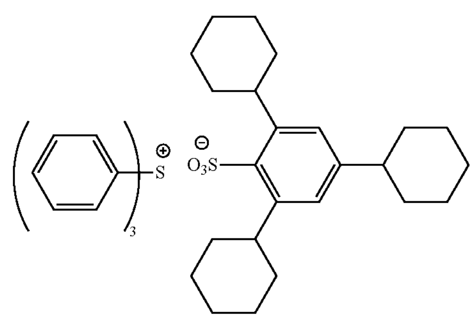

-continued
(z115)
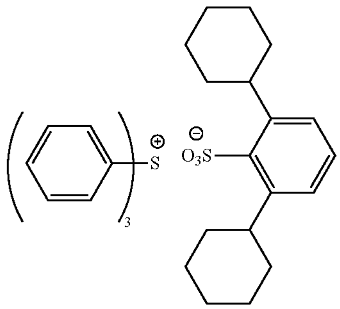
(z116)
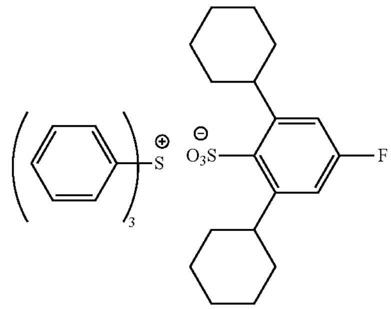
(z117)
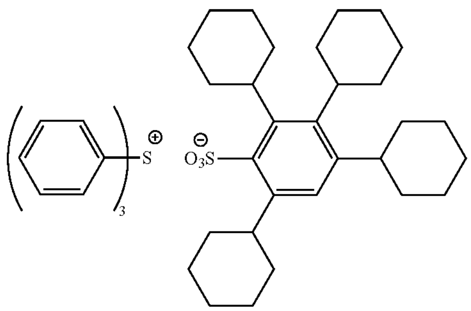
(z118)
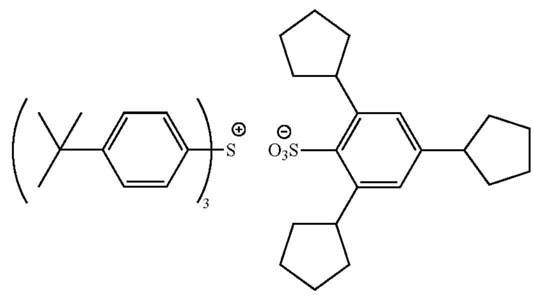
(z119)
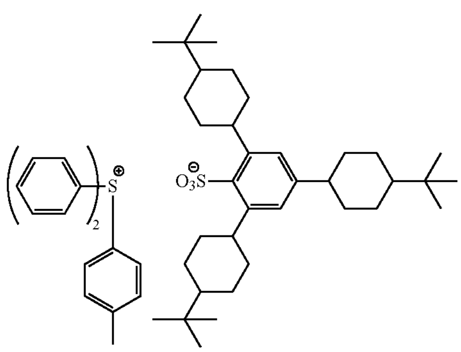
(z120)
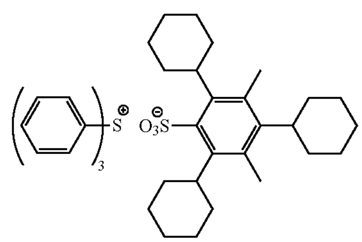
(z121)
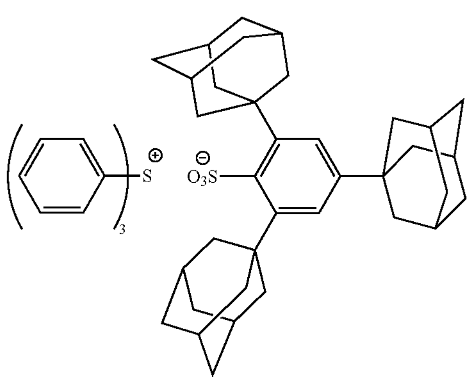
(z122)
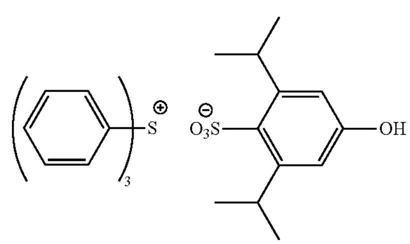

-continued
(z123)
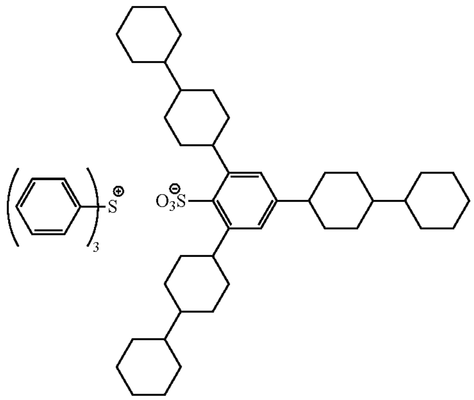
(z124)
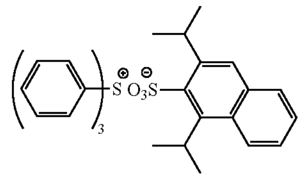
(z125)
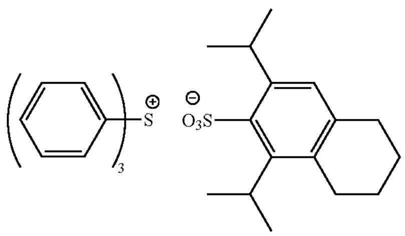
(z126)
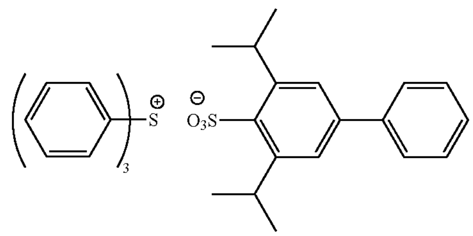
(z127)
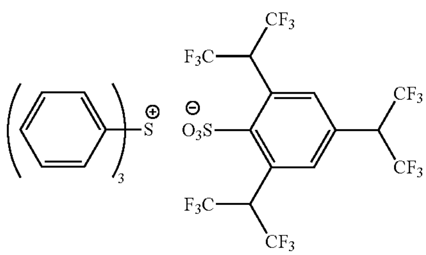
(z128)
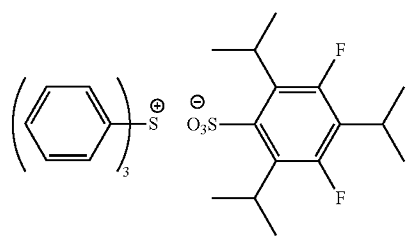
(z129)
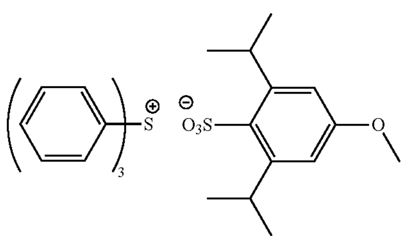
(ZL-1)
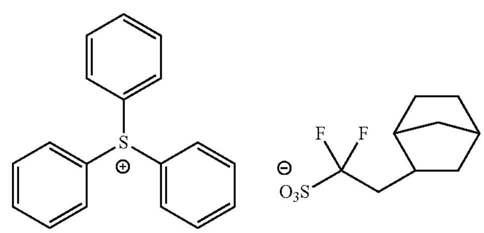
(ZL-2)
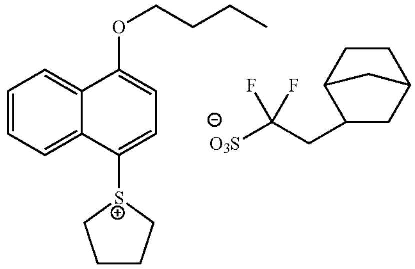
(ZL-3)
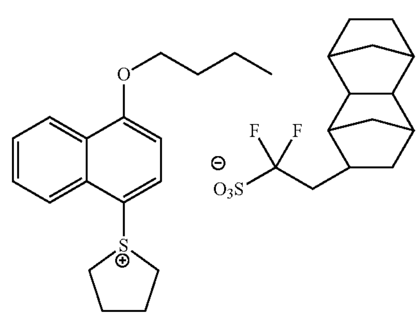

-continued
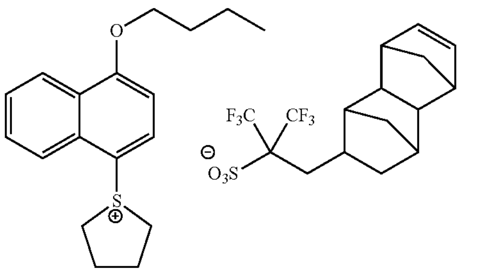
(ZL-4)
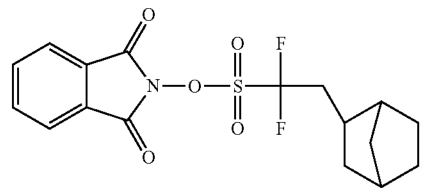
(ZL-5)
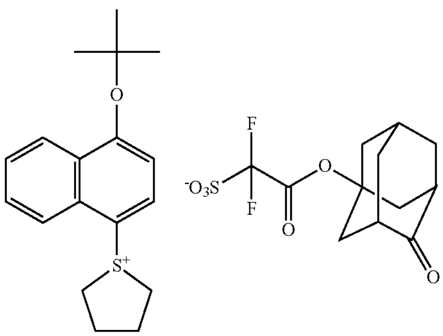
(ZL-6)
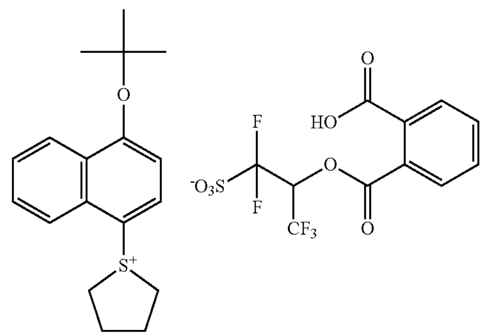
(ZL-7)
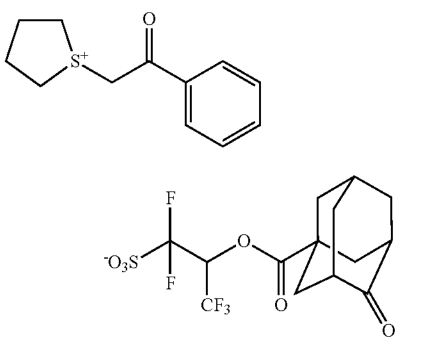
(ZL-8)
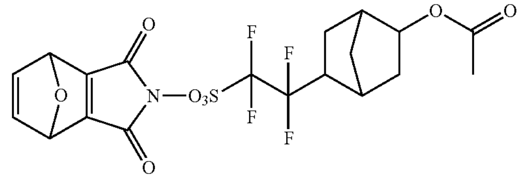
(ZL-9)
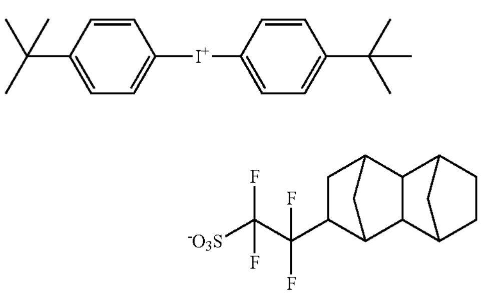
(ZL-10)
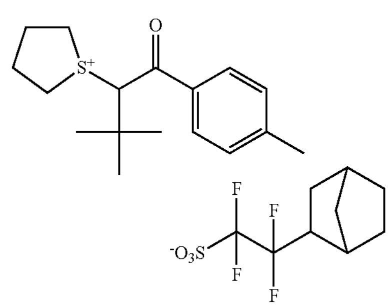
(ZL-11)
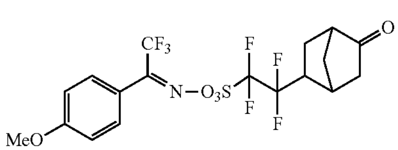
(ZL-12)
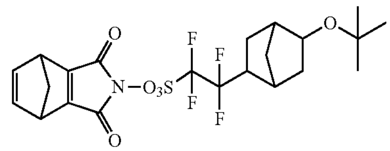
(ZL-13)

-continued
(Zl-14)
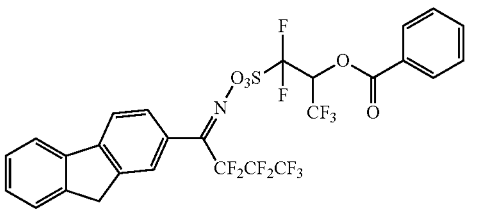
(ZL-15)
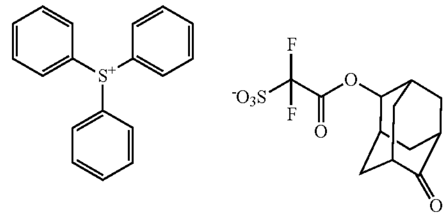
(ZL-16)
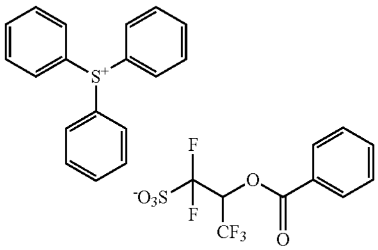
(ZL-17)
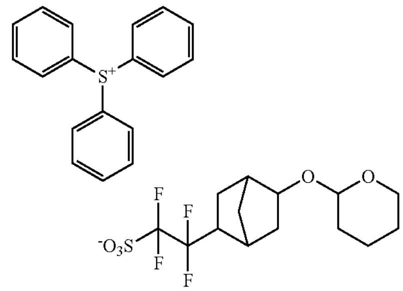
(ZL-18)
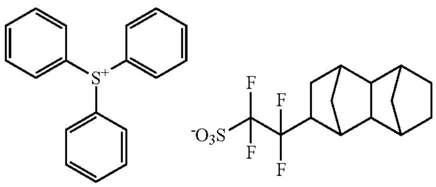
(ZL-19)
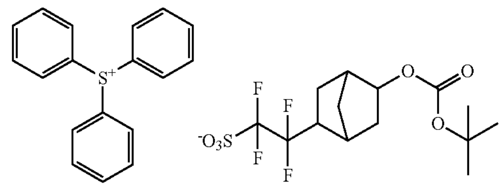
(ZL-20)
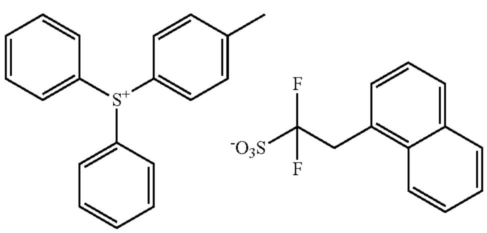
(ZL-21)
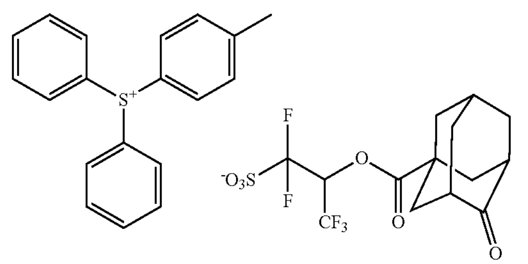
(ZL-22)
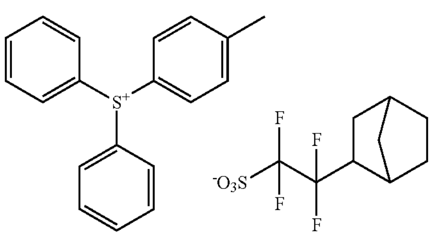
(ZL-23)
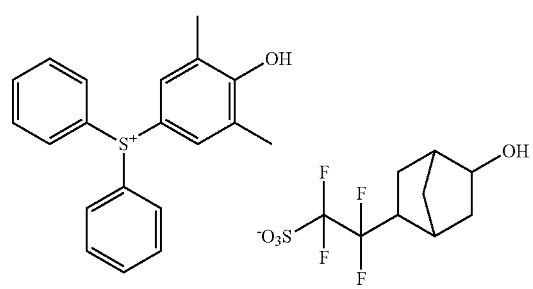
(ZL-24)
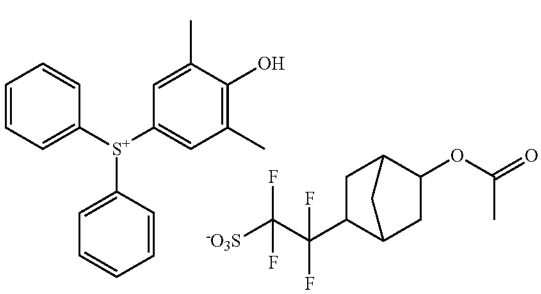
(ZL-25)
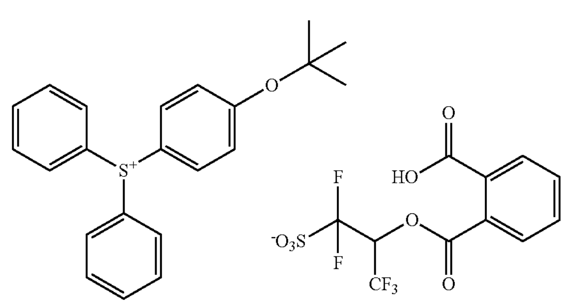

-continued
(ZL-26)
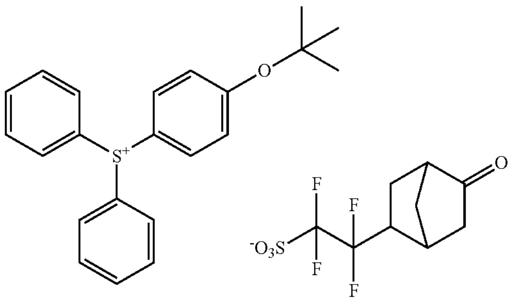
(ZL-27)
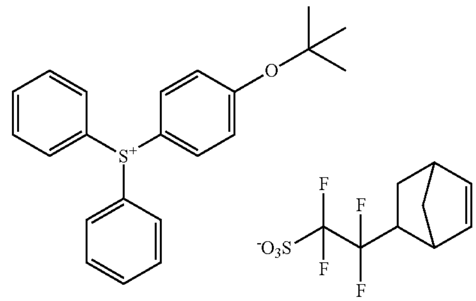
(ZL-28)
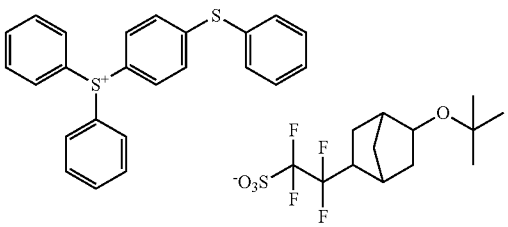
(ZL-29)
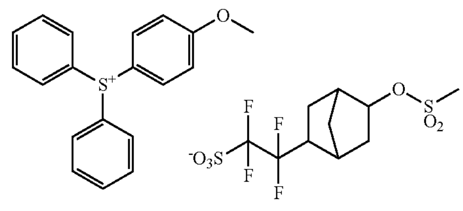
(ZL-35)
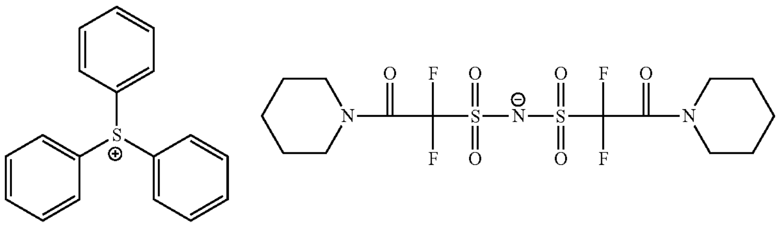
(ZL-36)
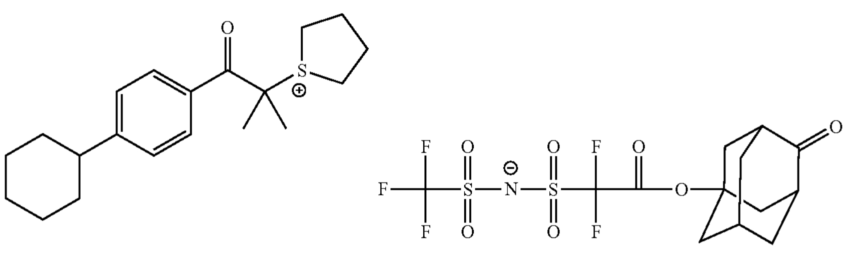
(ZL-37)
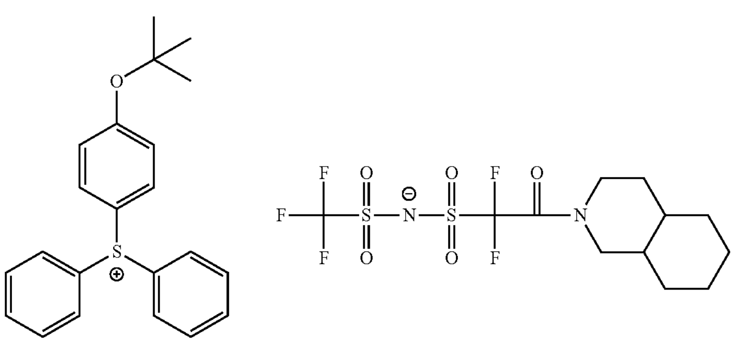

-continued
(ZL-38)
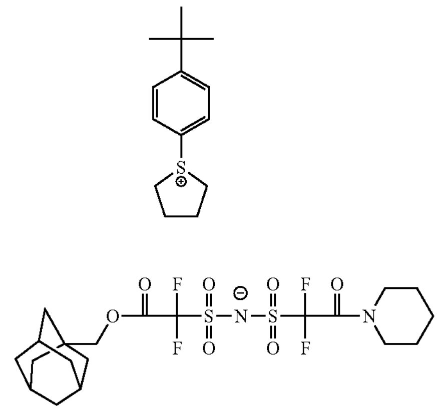
(ZL-39)
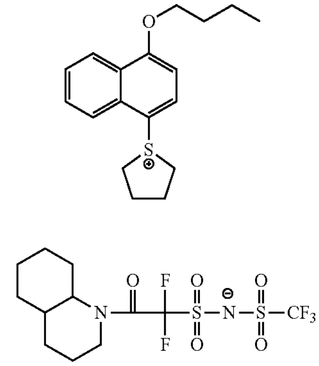
(ZL-40)
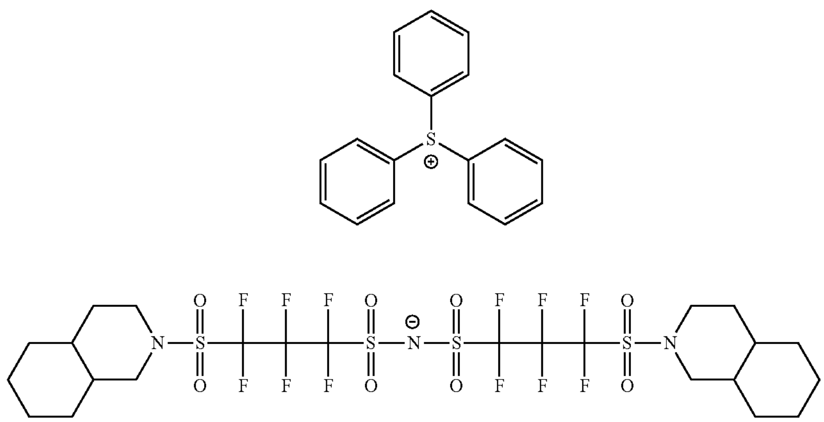
(ZL-41)
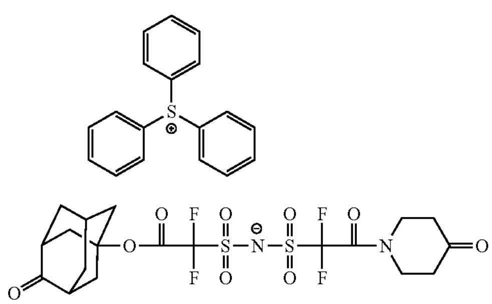
(ZL-42)
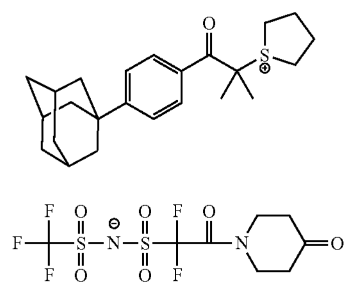
(ZL-43)
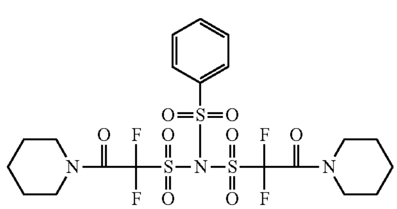
(ZL-44)
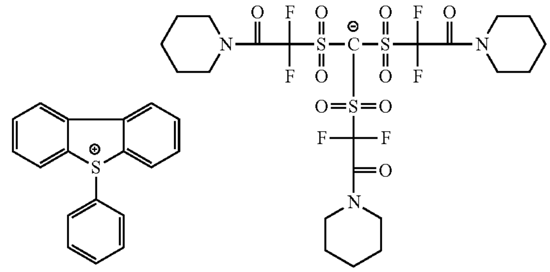

-continued (ZL-45)

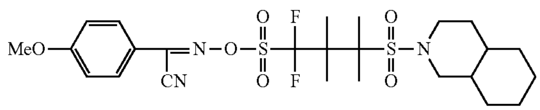

(ZL-46)

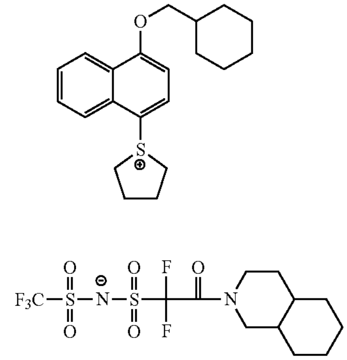

As for the acid generator, one kind of an acid generator may be used alone; or two or more kinds of acid generators may be used in combination. The content of the acid generator in the composition is preferably from 0.1 to 20 mass %, more preferably 0.5 to 17.5 mass %, more preferably from 0.5 to 10 mass %, still more preferably from 1 to 7 mass %, based on the entire solid content of the composition.

In the composition of the invention, in the case that the resin (A) of the invention contains the repeating unit (P), the content of the acid generator in the composition is preferably from 0.1 to 20 mass %, more preferably 0.5 to 17.5 mass %, still more preferably from 1 to 15 mass %, based on the entire solid content of the composition.

[3] (G) Compound Having at Least Either One of a Fluorine Atom and a Silicon Atom and Having Basicity or being Capable of Increasing the Basicity by the Action of an Acid (Hereinafter Also Referred to as a Second Compound)

In general, when a resist film formed using an actinic ray-sensitive or radiation-sensitive resin composition containing a compound capable of generating an acid by the action of light (photoacid generator) is exposed, the surface layer part of the resist film is exposed to a higher extent than the inside and the concentration of an acid generated becomes high, as a result, a reaction tends to more proceed. If such an exposed film is subjected to negative development, this is liable to cause a problem such that the cross-section of the obtained pattern is T-topped or a bridge defect is generated.

The actinic ray-sensitive or radiation-sensitive resin composition of the present invention contains (G) a compound having at least either one of a fluorine atom and a silicon atom and having basicity or being capable of increasing the basicity by the action of an acid.

By virtue of having at least either one of a fluorine atom and a silicon atom, the compound (G) is low in the surface free energy and likely to be unevenly distributed to the surface layer of the resist film, compared with the case of not having such an atom.

Accordingly, when a resist film containing the compound (G) is exposed, a compound having basicity or a compound increased in the basicity by the action of an acid comes to be present in a high concentration in the surface part of the resist film and therefore, excess acid generated in the surface layer of the exposed area can be trapped. That is, the acid concentration distribution in the thickness direction in the exposed area of the resist film can be made uniform. In turn, the reaction for changing the resist film to be insoluble or sparingly soluble in an organic solvent-containing developer by using the acid as a catalyst can be more uniformly performed with respect to the thickness direction of the resist film, so that the above-described problem such as T-top profile or bridge defect can be prevented.

Moreover, in the embodiment containing the resin (A) containing the repeating unit (P), the present inventors have found that when the compound (G) is used in combination with the acid-decomposable resin containing the repeating unit (P), the roughness characteristics, focus latitude, bridge defect performance and post-exposure baking (PEB) temperature dependency of sensitivity can be more improved. The reasons therefor are not clearly known, but the present inventors presume as follows. That is, the acid-decomposable resin containing the repeating unit (P) undergoes a great change in polarity due to acid decomposition and therefore, the deprotection amount necessary for the resin to become insoluble in an organic solvent-containing developer is relatively small. In such a system, the portion that becomes insoluble in the developer above is liable to distribute non-uniformly in the composition film. However, when the compound (G) is applied, the amount of a base inside the film can be made small compared with the surface layer of the film and deprotection of the resin inside the latent pattern is accelerated, so that the deprotection reaction is allowed to proceed uniformly. As a result, the roughness characteristics, focus latitude, bridge defect performance and post-exposure baking (PEB) temperature dependency of sensitivity can be more improved.

Considering the compound (G) by classifying it into "(G-1) a compound having at least either one of a fluorine atom and a silicon atom and having basicity" and "(G-2) a compound having at least either one of a fluorine atom and a silicon atom and being capable of increasing the basicity by the action of an acid", when the compound (G-2) is used, as the concentration of an acid generated in the exposed area is higher, a larger amount of a basic substance is generated in that region and an acid-base neutralization reaction is more accelerated. Accordingly, the acid concentration distribution in the thickness direction in the exposed area of the resist film can be made more uniform when using the compound (G-2) than in the case of using the compound (G-1). In this light, the compound (G-2) is more preferred as the compound (G).

The compound (G) is preferably a nitrogen-containing compound.

Here, in the case where the compound (G) is a compound having at least either one of a fluorine atom and a silicon atom and having basicity, in order to let the compound (G) have sufficient basicity, an electron-withdrawing functional group (such as carbonyl group, sulfonyl group, cyano group and halogen atom (particularly fluorine atom)) is preferably not bonded directly to the nitrogen atom, and it is more preferred that all atoms adjacent to the nitrogen atom are a hydrogen atom or a carbon atom.

Also, in the case where the compound (G) is a compound having at least either one of a fluorine atom and a silicon atom and being capable of increasing the basicity by the action of an acid, in order to let the compound increased in the basicity by the action of an acid have sufficient basicity, an electron-withdrawing functional group (such as carbonyl group, sulfonyl group, cyano group and halogen atom (particularly fluorine atom)) is preferably not bonded directly to the nitrogen atom of the compound increased in the basicity by the action of an acid, and it is more preferred that all atoms adjacent to the nitrogen atom are a hydrogen atom or a carbon atom.

Incidentally, in order to unfailingly bring out the above-described action, the compound (G) preferably accompanies no unintended change in the chemical structure upon irradiation with an actinic ray or radiation. In other words, the compound (G) preferably has no photosensitivity (is nonphotosensitive).

The compound (G) is described below by dividing it into "(G-1) a compound having at least either one of a fluorine atom and a silicon atom and having basicity" and "(G-2) a compound having at least either one of a fluorine atom and a silicon atom and being capable of increasing the basicity by the action of an acid".

[3-1] (G-1) Compound Having at Least Either One of a Fluorine Atom and a Silicon Atom and Having Basicity The compound (G-1) is not particularly limited as long as it is a compound having at least either one of a fluorine atom and a silicon atom and having basicity, but examples thereof include a basic compound having at least either one of a fluorine atom and a silicon atom and having any of the structures represented by the following formulae (A) to (E):

(A)

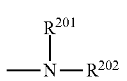

(B)

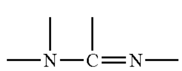

(C)

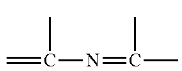

(D)

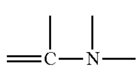

(E)

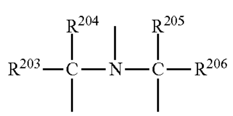

In formula (A), each of $R^{201}$ and $R^{202}$ independently represents a hydrogen atom, an alkyl group (preferably having a carbon number of 1 to 20), a cycloalkyl group (preferably having a carbon number of 3 to 20), an aryl group (preferably having a carbon number of 6 to 20), or a heteroaryl group.

In formula (E), each of $R^{203}$, $R^{204}$, $R^{205}$ and $R^{206}$ independently represents an alkyl group or a cycloalkyl group.

In the structure represented by formula (A), $R^{201}$ and $R^{202}$ may combine with each other to form a ring.

In the structures represented by formulae (B) to (D), two or more out of the bonds from the carbon atom and the bonds from the nitrogen atom may combine with each other to form a ring.

In the structure represented by formula (E), two or more out of $R^{203}$, $R^{204}$, $R^{205}$, $R^{206}$, the bonds from the carbon atom and the bonds from the nitrogen atom may combine with each other to form a ring.

The alkyl group of $R^{201}$ and $R^{202}$ in formula (A) is preferably a linear or branched alkyl group having a carbon number of 1 to 20, and examples thereof include a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group; an n-heptadecyl group, an n-octadecyl group, an n-nonadecyl group, an n-eicosyl group, an i-propyl group, an i-butyl group, a sec-butyl group, a tert-butyl group and a tert-dodecyl group.

The cycloalkyl group of $R^{201}$ and $R^{202}$ is preferably a cycloalkyl group having a carbon number of 3 to 20, and examples thereof include a cyclobutyl group, a cyclopentyl group and a cyclohexyl group.

Among the alkyl groups and cycloalkyl groups of $R^{201}$ and $R^{202}$, a linear alkyl group having a carbon number of 1 to 10 and a cycloalkyl group having a carbon number of 4 to 8 are preferred.

The aryl group of $R^{201}$ and $R^{202}$ is preferably an aryl group having a carbon number of 6 to 20, and examples thereof include a phenyl group, a toluoyl group, a benzyl group, a methylbenzyl group, a xylyl group, a mesityl group, a naphthyl group and an anthryl group.

The heteroaryl group of $R^{201}$ and $R^{202}$ is a group containing one or more heteroatoms such as sulfur atom, oxygen atom and nitrogen atom, in the above-described aryl group, which includes, for example, a pyridyl group, an imidazolyl group, a morpholinyl group, a piperidinyl group, and a pyrrolidinyl group.

The alkyl group, cycloalkyl group, aryl group and heteroaryl group of $R^{201}$ and $R^{202}$ may further have a substituent, and examples of the substituent include a halogen atom, a hydroxyl group, an amino group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkylcarbonyloxy group, an arylcarbonyloxy group, an alkoxycarbonyl group, an aryloxycarbonyl group, an alkoxycarbonyloxy group, and an aryloxycarbonyloxy group.

Examples of the alkyl group as the substituent which $R^{201}$ and $R^{202}$ may further have include a linear or branched alkyl group having a carbon number of 1 to 12, such as methyl group, ethyl group, n-propyl group, i-propyl group, n-butyl group, 2-methylpropyl group, 1-methylpropyl group and tert-butyl group.

Examples of the cycloalkyl group as the substituent which $R^{201}$ and $R^{202}$ may further have include a cycloalkyl group having a carbon number of 3 to 10, such as cyclopentyl group and cyclohexyl group.

Examples of the aryl group as the substituent which $R^{201}$ and $R^{202}$ may further have include an aryl group having a carbon number of 6 to 15, such as phenyl group and naphthyl group.

Examples of the alkoxy group as the substituent which $R^{201}$ and $R^{202}$ may further have include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the aryloxy group as the substituent which $R^{201}$ and $R^{202}$ may further have include an aryloxy group having a carbon number of 6 to 10, such as phenyloxy group and naphthyloxy group.

Examples of the acyl group as the substituent which $R^{201}$ and $R^{202}$ may further have include a linear or branched acyl group having a carbon number of 2 to 12, such as acetyl group, propionyl group, n-butanoyl group, i-butanoyl group, n-heptanoyl group, 2-methylbutanoyl group, 1-methylbutanoyl group and tert-heptanoyl group.

Examples of the arylcarbonyl group as the substituent which $R^{201}$ and $R^{202}$ may further have include an arylcarbonyl group having a carbon number of 6 to 10, such as phenylcarbonyl group and naphthylcarbonyl group.

Examples of the alkoxyalkyl group as the substituent which $R^{201}$ and $R^{202}$ may further have include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the aryloxyalkyl group as the substituent which $R^{201}$ and $R^{202}$ may further have include an aryloxyalkyl group having a carbon number of 7 to 12, such as phenyloxymethyl group, phenyloxyethyl group, naphthyloxymethyl group and naphthyloxyethyl group.

Examples of the alkylcarbonyloxy group as the substituent which $R^{201}$ and $R^{202}$ may further have include a linear, branched or cyclic alkylcarbonyloxy group having a carbon number of 2 to 21, such as methylcarbonyloxy group, ethylcarbonyloxy group, n-propylcarbonyloxy group, i-propylcarbonyloxy group, n-butylcarbonyloxy group, 2-methylpropylcarbonyloxy group, 1-methylpropylcarbonyloxy group, tert-butylcarbonyloxy group, cyclopentylcarbonyloxy group and cyclohexylcarbonyloxy group.

Examples of the arylcarbonyloxy group as the substituent which $R^{201}$ and $R^{202}$ may further have include an arylcarbonyloxy group having a carbon number of 7 to 11, such as phenylcarbonyloxy group and naphthylcarbonyloxy group.

Examples of the alkoxycarbonyl group as the substituent which $R^{201}$ and $R^{202}$ may further have include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the aryloxycarbonyl group as the substituent which $R^{201}$ and $R^{202}$ may further have include an aryloxycarbonyl group having a carbon number of 7 to 11, such as phenyloxycarbonyl group and naphthyloxycarbonyl group.

Examples of the alkoxycarbonyloxy group as the substituent which $R^{201}$ and $R^{202}$ may further have include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

Examples of the aryloxycarbonyloxy group as the substituent which $R^{201}$ and $R^{202}$ may further have include an aryloxycarbonyloxy group having a carbon number of 7 to 11, such as phenyloxycarbonyloxy group and naphthyloxycarbonyloxy group.

The compound (G-1) containing a structure represented by formula (A) includes:

(A1) a compound containing a structure represented by formula (A) (provided that each of $R^{201}$ and $R^{202}$ contains neither a fluorine atom nor a silicon atom) and "a group having at least either one of a fluorine atom and a silicon atom", which is located outside the structure represented by formula (A);

(A2) a compound containing a structure represented by formula (A) (provided that at least one of $R^{201}$ and $R^{202}$ is a group where one or more hydrogen atoms in an alkyl group, a cycloalkyl group, an aryl group or a heteroaryl group, which may have a substituent, is replaced by a fluorine atom or a group having a silicon atom); and (A3) a compound containing a structure represented by formula (A) (provided that at least one of $R^{201}$ and $R^{202}$ is a group where one or more hydrogen atoms in an alkyl group, a cycloalkyl group, an aryl group or a heteroaryl group, which may have a substituent, is replaced by a fluorine atom or a group having a silicon atom) and "a group having at least either one of a fluorine atom and a silicon atom", which is located outside the structure represented by formula (A).

In (A1) and (A3), preferred examples of the "group having at least either one of a fluorine atom and a silicon atom", which is located outside the structure represented by formula (A), include a group where in specific examples (excluding a halogen atom and a hydroxyl group) described above as the substituent which $R^{201}$ and $R^{202}$ may further have, one or more hydrogen atoms are replaced by a fluorine atom or a group having a silicon atom.

Here, the group having a silicon atom is not particularly limited as long as it is a group containing at least one or more silicon atoms, but examples thereof include a silyl group, a silyloxy group, and a group having a siloxane bond. Also, the group having a silicon atom may be an alkylsilyl structure or a cyclic siloxane structure (for example, a group represented by formulae (CS-1) to (CS-3) described later), which the later-described resin (G) may have. These groups may further have a substituent, and specific examples of the substituent are the same as specific examples of the substituent which $R^{201}$ and $R^{202}$ may further have.

Specific examples of the group having a silicon atom include a trimethylsilyl group, a triethylsilyl group, a tert-butyldimethylsilyl group and a triisopropylsilyl group.

The compound (G-1) containing a structure represented by formulae (B) to (D) includes a compound containing a structure represented by formulae (B) to (D) and a group having at least either one of a fluorine atom and a silicon atom (for example, a group where in specific examples (excluding a halogen atom and a hydroxyl group) described above as the substituent which $R^{201}$ and $R^{202}$ may further have, one or more hydrogen atoms are replaced by a fluorine atom or a group having a silicon atom).

Specific examples of the group having a silicon atom are the same as those described above.

In formula (E), specific examples of the alkyl group and cycloalkyl group or $R^{203}$, $R^{204}$, $R^{205}$ and $R^{206}$ are the same as specific examples of the alkyl group and cycloalkyl group of $R^{201}$ and $R^{202}$.

The alkyl group and cycloalkyl group or $R^{203}$, $R^{204}$, $R^{205}$ and $R^{206}$ may further have a substituent, and specific examples of the substituent are the same as specific examples of the substituent which $R^{201}$ and $R^{202}$ may further have.

The compound (G-1) containing a structure represented by formula (E) includes:

(E1) a compound containing a structure represented by formula (E) (provided that each of $R^{203}$, $R^{204}$, $R^{205}$ and $R^{206}$ contains neither a fluorine atom nor a silicon atom) and "a group having at least either one of a fluorine atom and a silicon atom", which is located outside the structure represented by formula (E);

(E2) a compound containing a structure represented by formula (E) (provided that at least one of $R^{203}$, $R^{204}$, $R^{205}$ and $R^{206}$ is a group where one or more hydrogen atoms in an alkyl group or a cycloalkyl group, which may have a substituent, is replaced by a fluorine atom or a group having a silicon atom); and (E3) a compound containing a structure represented by formula (E) (provided that at least one of $R^{203}$, $R^{204}$, $R^{205}$ and $R^{206}$ is a group where one or more hydrogen atoms in an alkyl group or a cycloalkyl group, which may have a substituent, is replaced by a fluorine atom or a group having a silicon atom) and "a group having at least either one of a fluorine atom and a silicon atom", which is located outside the structure represented by formula (E).

In (E1) and (E3), preferred examples of the "group having at least either one of a fluorine atom and a silicon atom", which is located outside the structure represented by formula (E), include a group where in specific examples (excluding a halogen atom and a hydroxyl group) described above as the substituent which $R^{201}$ and $R^{202}$ may further have, one or more hydrogen atoms are replaced by a fluorine atom or a group having a silicon atom.

Specific examples of the group having a silicon atom are the same as those described above.

In the structures represented by formulae (A) to (E), the bond from the carbon atom and/or nitrogen atom is connected to another atom constituting the compound (G-1).

Also, as described above, in the structure represented by formula (A), $R^{201}$ and $R^{202}$ may combine with each other to form a ring; in the structures represented by formulae (B) to (D), two or more out of the bonds from the carbon atom and the bonds from the nitrogen atom may combine with each other to form a ring; and in the structure represented by formula (E), two or more out of $R^{203}$, $R^{204}$, $R^{205}$, $R^{206}$, the bonds from the carbon atom and the bonds from the nitrogen atom may combine with each other to form a ring.

The ring above includes an aromatic or non-aromatic nitrogen-containing heterocyclic ring. The nitrogen-containing heterocyclic ring includes a 3- to 10-membered ring and is preferably a 4- to 8-membered ring, more preferably a 5- or 6-membered ring. This ring may further have a substituent, and specific examples thereof are the same as specific examples of the substituent which $R^{201}$ and $R^{202}$ may further have.

In other words, a compound having a nitrogen-containing heterocyclic ring, where the heterocyclic ring is substituted with a fluorine atom or a group containing a fluorine atom or a silicon atom, is also preferred as the compound (G-1). The group containing a fluorine atom or a silicon atom includes a group where in specific examples (excluding a halogen atom and a hydroxyl group) described above as the substituent which $R^{201}$ and $R^{202}$ may further have, one or more hydrogen atoms are replaced by a fluorine atom or a group having a silicon atom.

Suitable examples of the nitrogen-containing heterocyclic ring include a pyrrole ring, a pyridine ring and a pyrimidine ring.

In the case where the compound (G-1) is a low molecular compound (described in detail below), each bond from the carbon atom and/or nitrogen atom in the structures represented by formulae (A) to (E) is preferably connected to a hydrogen atom, an alkyl group, a cycloalkyl group, an aryl group or a heteroaryl group, and specific examples of these groups are the same as those described for $R^{201}$ and $R^{202}$.

[3-2] (G-2) Compound Having at Least Either One of a Fluorine Atom and a Silicon Atom and being Capable of Increasing the Basicity by the Action of an Acid The compound (G-2) is not particularly limited as long as it is a compound having at least either one of a fluorine atom and a silicon atom and being capable of increasing the basicity by the action of an acid, but examples thereof include a compound having at least either one of a fluorine atom and a silicon atom and containing a carbamate group having a protective group.

The protective group constituting the carbamate group is preferably a group represented by the following formula (P) (the group represented by formula (P) is bonded to a nitrogen atom at the bonding site indicated by a mark *):

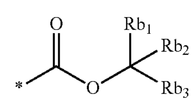

(P)

In formula (P), each of $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time.

Specific examples of the alkyl group, cycloalkyl group and aryl group of $Rb_1$, $Rb_2$ and $Rb_3$ are the same as specific examples of the alkyl group, cycloalkyl group and aryl group of $R^{201}$ and $R^{202}$ in the structure represented by formula (A).

Specific examples of the aralkyl group of $Rb_1$, $Rb_2$ and $Rb_3$ include an aralkyl group preferably having a carbon number of 6 to 12, such as benzyl group, phenethyl group, naphthylmethyl group, naphthylethyl group and naphthylbutyl group.

Each of $Rb_1$, $Rb_2$ and $Rb_3$ is preferably a linear or branched alkyl group, a cycloalkyl group or an aryl group, more preferably a linear or branched alkyl group or a cycloalkyl group.

The ring formed by combining two members out of $Rb_1$ to $Rb_3$ is preferably a cycloalkyl group (monocyclic or polycyclic, more specifically, a monocyclic cycloalkyl group such as cyclopentyl group and cyclohexyl group, or a polycyclic cycloalkyl group such as norbornyl group, tetracyclodecanyl group, tetracyclododecanyl group and adamantyl group. A monocyclic alkyl group having a carbon number of 5 to 6 is more preferred.

$Rb_1$, $Rb_2$ and $Rb_3$ may further have a substituent, and examples of the substituent include a halogen atom (e.g., fluorine atom), a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), an aminoacyl group (preferably having a carbon number of 2 to 10), and a group having a silicon atom (specific examples are the same as those described in the compound (G-1)). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10).

In the case where both two members out of $Rb_1$, $Rb_2$ and $Rb_3$ are a hydrogen atom, the remaining one member is preferably an aryl group. Examples of this aryl group include a phenyl group and a naphthyl group.

The compound (G-2) may also be configured by replacing at least one group connected to the nitrogen atom of the compound (G-1) by the group represented by formula (P).

The compound (G-2) is not particularly limited, but its especially preferred embodiment includes a compound represented by the following formula (1) having a group represented by formula (P). The compound represented by the following formula (1) has at least either one of a fluorine atom and a silicon atom in the portion except for the group represented by formula (P) (a protective group constituting the carbamate group) and therefore, a compound (a compound increased in the basicity) obtained by causing an acid to act on the compound represented by formula (1) is allowed to still contain at least either one of a fluorine atom and a silicon atom. Thanks to this configuration, the compound increased in the basicity comes to exist at the desired position without diffusing to the inside direction of the resist even at the later-described post-exposure baking step (PEB), so that "trapping of excess acid generated in the surface layer of the exposed area" can be more reliably performed and the acid concentration distribution in the thickness direction in the exposed area of the resist film can be more unfailingly made uniform.

(1)

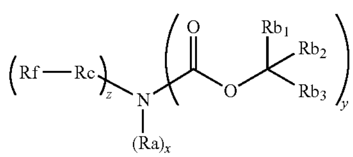

In formula (1), each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time.

Rc represents a single bond or a divalent linking group.

Rf represents an organic group.

x represents 0 or 1, y represents 1 or 2, z represents 1 or 2, and x+y+z=3.

When x=z=1, Ra and Rc may combine with each other to form a nitrogen-containing heterocyclic ring.

When z=1, the organic group as Rf contains a fluorine atom or a silicon atom.

When z=2, at least either one of two Rf's contains a fluorine atom or a silicon atom.

Also, when z=2, two Rc's may be the same or different, two Rf's may be the same or different, and two Rc's may combine with each other to form a ring.

When y=2, two $Rb_1$'s may be the same or different, two $Rb_2$'s may be the same or different, and two $Rb_3$'s may be the same or different.

Specific examples of the alkyl group, cycloalkyl group, aryl group and aralkyl group as Ra, $Rb_1$, $Rb_2$ and $Rb_3$ are the same as specific examples of the alkyl group, cycloalkyl group, aryl group and aralkyl group as $Rb_1$, $Rb_2$ and $Rb_3$ in formula (P).

Rc is preferably a divalent linking group having a carbon number of 2 to 12 (more preferably a carbon number of 2 to 6, still more preferably a carbon number of 2 to 4), and examples thereof include an alkylene group, a phenylene group, an ether group, an ester group, an amide group, and a group formed by combining two or more thereof.

The organic group as Rf is preferably an alkyl group, a cycloalkyl group, an aryl group or a heteroaryl group.

Specific examples of the alkyl group, cycloalkyl group, aryl group and heteroaryl group as Rf are the same as specific examples of the cycloalkyl group, aryl group and heteroaryl group as $R^{201}$ and $R^{202}$ in formula (A).

Each of Ra, $Rb_1$, $Rb_2$, $Rb_3$, Rc and Rf may further have a substituent, and specific examples of the substituent are the same as specific examples of the substituent which $Rb_1$, $Rb_2$ and $Rb_3$ in formula (P) may further have.

In the case where the organic group as Rf contains a fluorine atom or a silicon atom, Rf is preferably a group where one or more hydrogen atoms in the organic group are replaced by a fluorine atom or a group having a silicon atom. Here, specific examples of the group having a silicon atom are the same as specific examples of the group having a silicon atom described in the compound (G-1).

In the case where the organic group as Rf contains a fluorine atom or a silicon atom, Rf is more preferably, for example, an alkyl group in which from 30 to 100% by number of hydrogen atoms are replaced by a fluorine atom, and examples thereof include a perfluoroalkyl group such as perfluoromethyl group, perfluoroethyl group, perfluoropropyl group and perfluorobutyl group.

The nitrogen-containing heterocyclic ring formed by combining Ra and Rc or combining Rc's with each other includes an aromatic or non-aromatic nitrogen-containing heterocyclic ring (preferably having a carbon number of 3 to 20). Examples of the nitrogen-containing heterocyclic ring include rings corresponding to heterocyclic compounds such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane. These rings may further have one or more kinds of substituents or one or more substituents, and specific examples of the substituent are the same as specific examples of the substituent which $Rb_1$, $Rb_2$ and $Rb_3$ in formula (P) may further have.

The ring formed by combining two members out of $Rb_1$ to $Rb_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

The compound (G) may be either a low molecular compound or a resin (oligomer or polymer compound; more preferably polymer compound).

Compared with a resin, a low molecular compound diffuses to a certain extent in the post-exposure baking step (PEB) and therefore, trapping of an acid is considered to be performed more uniformly. Maybe for this reason, LWR can be more reliably reduced by using a low molecular compound as the compound (G).

On the other hand, compared with a low molecular compound, a resin scarcely diffuses to the inside direction of the resist film even in the post-exposure baking step (PEB), and this is considered to enable unfailingly trapping an acid in the surface layer of the exposed area, where an acid is liable to be generated in an excess amount. Maybe for this reason, a bridge defect can be more reliably reduced by using a resin as the compound (G).

In the case where the compound (G) is a low molecular compound, the molecular weight thereof is usually 1000 or less, preferably 500 or less, more preferably from 150 to 500, more preferably from 250 to 500.

The compound (G-2) can be synthesized, for example, from an amine by the method described in *Protective Groups in Organic Synthesis,* 4th edition, and the like. For example, the compound represented by formula (1) is preferably obtained by a method of, as in the scheme shown below, causing a dicarbonic acid ester or a haloformic acid ester to act on an amine. In the formulae, X represents a halogen atom, and Ra, $Rb_1$, $Rb_2$, $Rb_3$, Rc and Rf have the same meanings as Ra, $Rb_1$, $Rb_2$, $Rb_3$, Rc and Rf in formula (1).

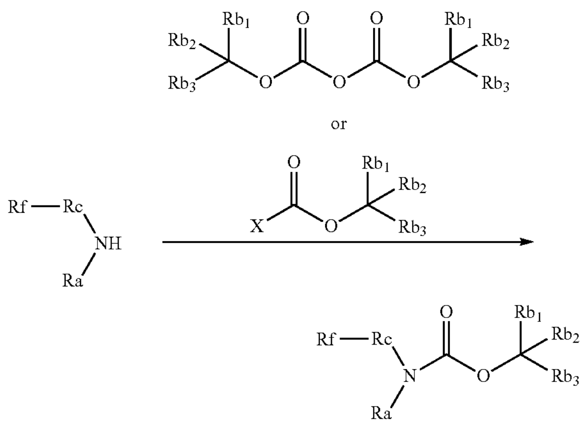

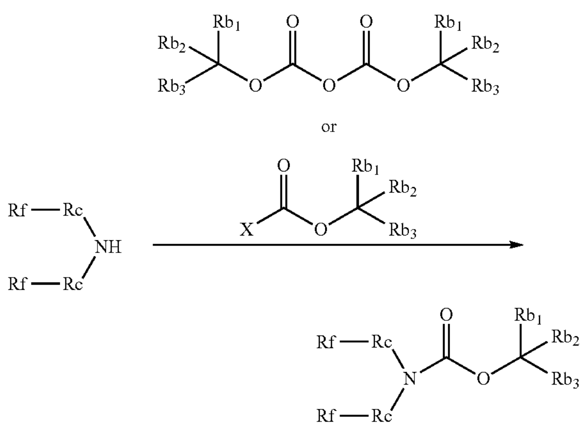

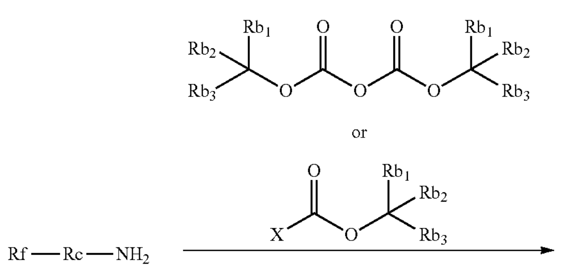

-continued

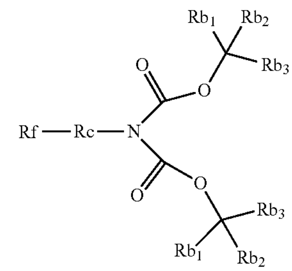

Specific examples of the compounds (G-1) and (G-2), when these are a low molecular compound, are illustrated below, but the present invention is not limited thereto.

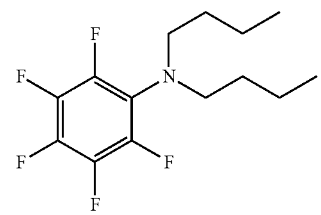

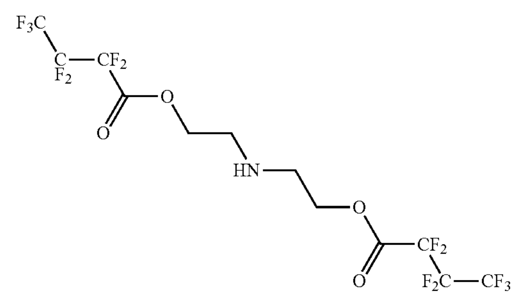

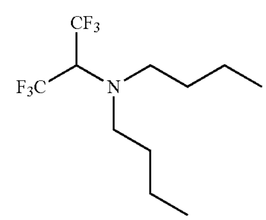

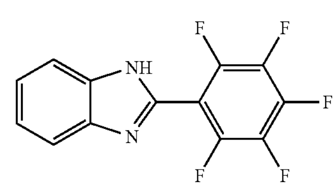

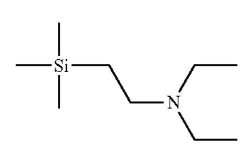

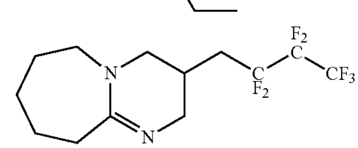

-continued

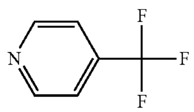
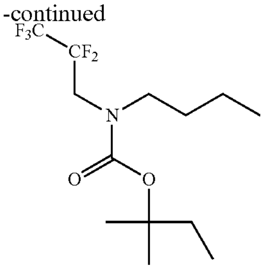
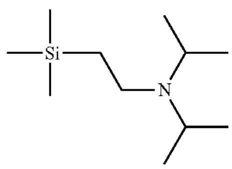
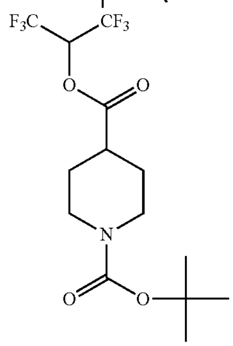
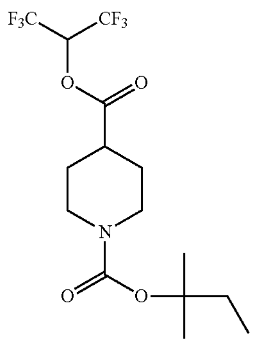
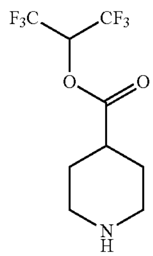
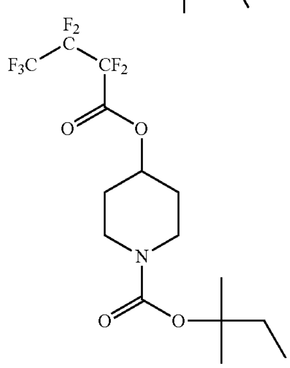
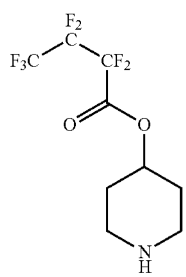

In the case where the compound (G) is a resin (hereinafter, such a resin is sometimes referred to as a "resin (G)"), at least either one of a fluorine atom and a silicon atom may be contained in the main chain of the resin or may be contained in the side chain.

The resin (G) has the same function as the later-described hydrophobic resin (E) and is considered to be effective in reducing a development defect attributable to immersion exposure.

In the case where the resin (G) contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group is a linear or branched alkyl group with at least one hydrogen atom being substituted for by a fluorine atom. This alkyl group preferably has a carbon number of 1 to 10, more preferably a carbon number of 1 to 4. The fluorine atom-containing alkyl group may further have a substituent other than fluorine atom.

The fluorine atom-containing cycloalkyl group is a monocyclic or polycyclic cycloalkyl group with at least one hydrogen atom being substituted for by a fluorine atom. This fluorine atom-containing cycloalkyl group may further have a substituent other than fluorine atom.

The fluorine atom-containing aryl group is an aryl group with at least one hydrogen atom being substituted for by a fluorine atom. Examples of this aryl group include a phenyl group and a naphthyl group. The fluorine atom-containing aryl group may further have a substituent other than fluorine atom.

Preferred examples of the fluorine atom-containing alkyl group, fluorine atom-containing cycloalkyl group and fluorine atom-containing aryl group include the groups represented by the following formulae (F2) to (F4):

(F2)

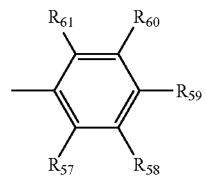

(F3)

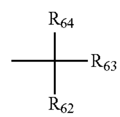

(F4)

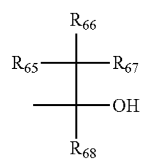

In formulae (F2) to (F4), each of $R_{57}$ to $R_{68}$ independently represents a hydrogen atom, a fluorine atom or an alkyl group. However, at least one of $R_{57}$ to $R_{61}$ represents a fluorine atom or an alkyl group with at least one hydrogen atom being substituted for by a fluorine atom, at least one of $R_{62}$ to $R_{64}$ represents a fluorine atom or an alkyl group with at least one hydrogen atom being substituted for by a fluorine atom, and at least one of $R_{65}$ to $R_{68}$ represents a fluorine atom or an alkyl group with at least one hydrogen atom being substituted for by a fluorine atom. The alkyl group preferably has a carbon number of 1 to 4.

It is preferred that all of $R_{57}$ to $R_{61}$ and $R_{65}$ to $R_{67}$ are a fluorine atom.

Each of $R_{62}$, $R_{63}$ and $R_{68}$ is preferably an alkyl group with at least one hydrogen atom being substituted for by a fluorine atom, more preferably a perfluoroalkyl group having a carbon number of 1 to 4. $R_{62}$ and $R_{63}$ may combine with each other to form a ring.

Examples of the group represented by formula (F2) include p-fluorophenyl group, pentafluorophenyl group and 3,5-di(trifluoromethyl)phenyl group.

Examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(t-rimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

Specific examples of the repeating unit containing a fluorine atom are illustrated below.

In specific examples, $X_1$ represents a hydrogen atom, —$CH_3$, —F or —$CF_3$, and $X_2$ represents —F or —$CF_3$.

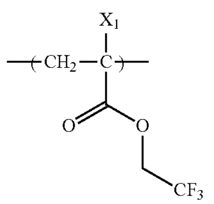
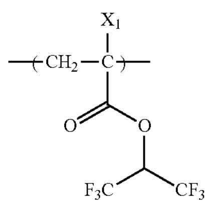
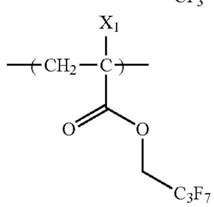
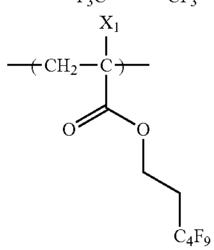
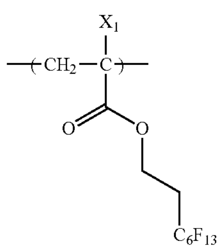
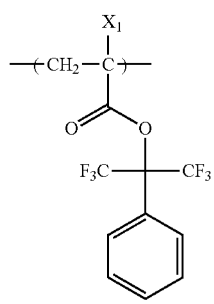
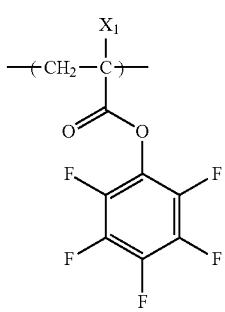
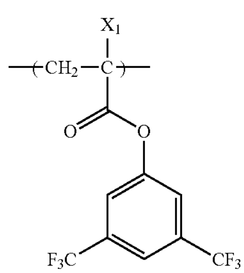

-continued

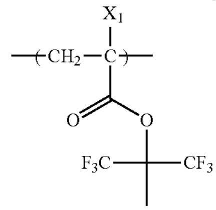
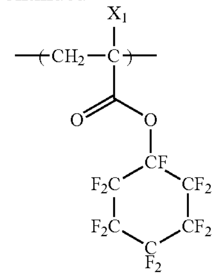
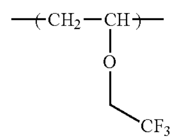
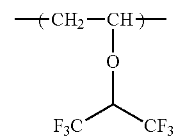
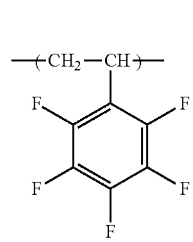
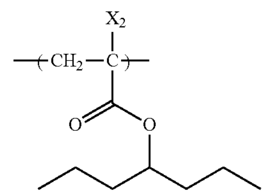
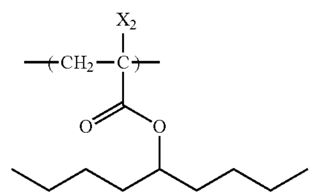
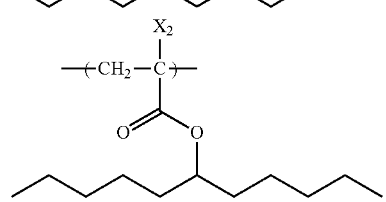
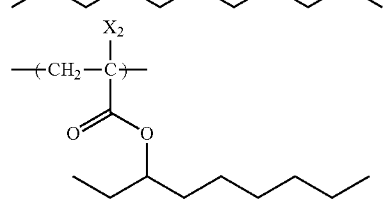
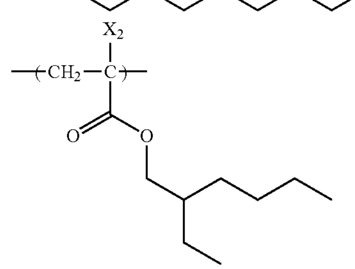
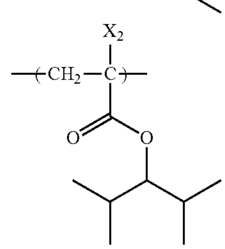
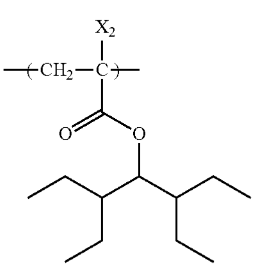

-continued

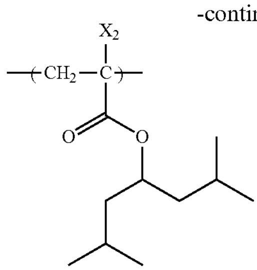

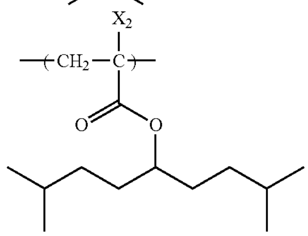

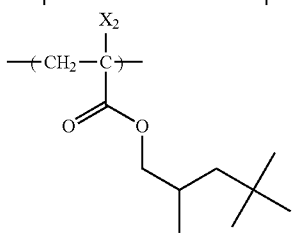

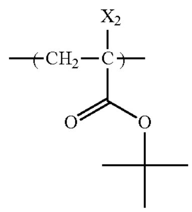

In the case where the resin (G) contains a silicon atom, the resin preferably contains an alkylsilyl structure or a cyclic siloxane structure, as the silicon atom-containing partial structure. The alkylsilyl structure is preferably a trialkylsilyl group-containing structure.

Preferred examples of the alkylsilyl structure and cyclic siloxane structure include the groups represented by the following formulae (CS-1) to (CS-3).

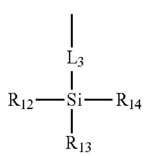

(CS-1)

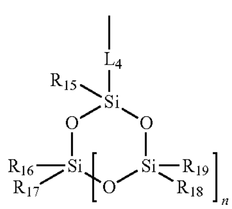

(CS-2)

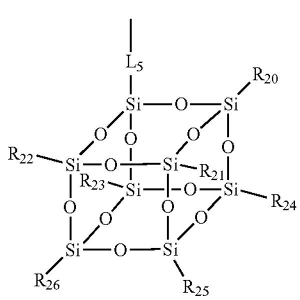

(CS-3)

In formulae (CS-1) to (CS-3), each of $R_{12}$ to $R_{26}$ independently represents a linear or branched alkyl group or a cycloalkyl group. The alkyl group preferably has a carbon number of 1 to 20. The cycloalkyl group preferably has a carbon number of 3 to 20.

Each of $L_3$ to $L_5$ represents a single bond or a divalent linking group. Examples of the divalent linking group include an alkylene group, a phenylene group; an ether bond, a thioether group, a carbonyl group, an ester bond, an amide bond, a urethane bond, a urea bond, and a combination thereof.

n represents an integer of 1 to 5. n is preferably an integer of 2 to 4.

Specific examples of the repeating unit having a group represented by formulae (CS-1) to (CS-3) are illustrated below. In specific examples, $X_1$ represents a hydrogen atom, —$CH_3$, —F or —$CF_3$.

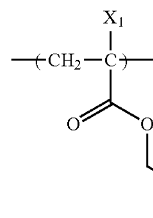

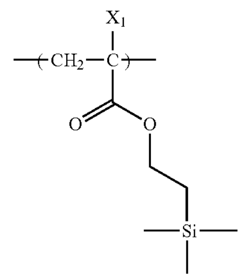

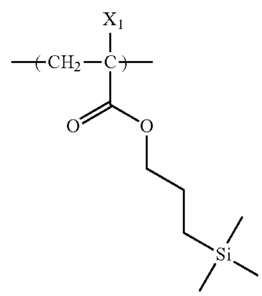

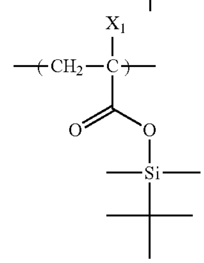

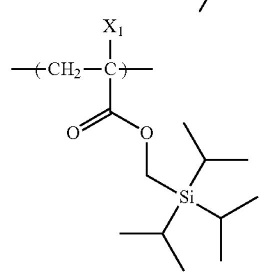

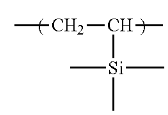

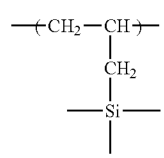

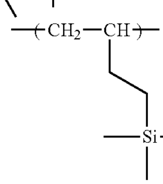

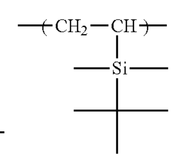

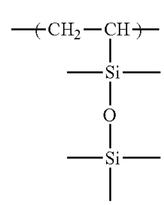

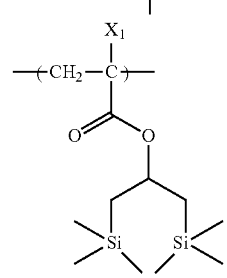

-continued

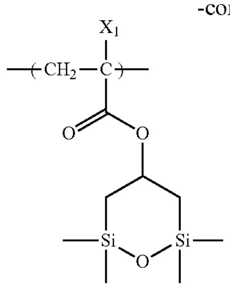

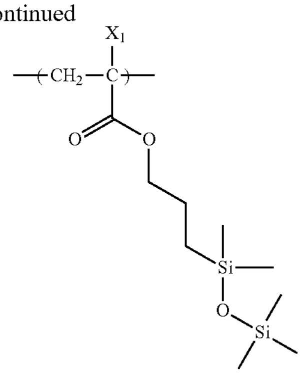

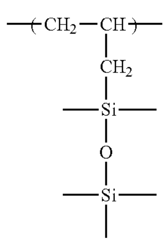

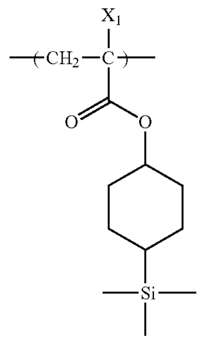

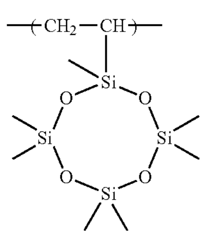

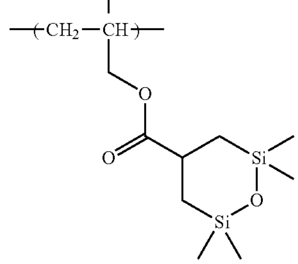

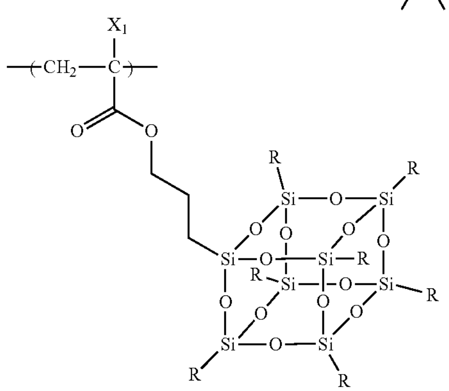

R = $CH_3$, $C_2H_5$, $C_3H_7$, $C_4H_9$

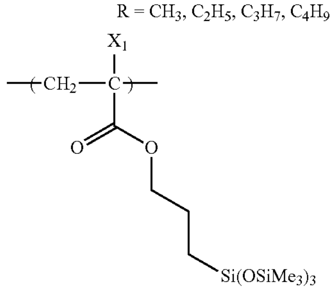

As the resin (G), preferred are:

(G-a) a resin containing a repeating unit having at least either one of a fluorine atom and a silicon atom and a repeating unit having a basic group or a group capable of increasing the basicity by the action of an acid; and (G-b) a resin containing at least either one of a fluorine atom and a silicon atom and a basic group or a group capable of increasing the basicity by the action of an acid.

In the resin (G-a), typically, an electron-attracting fluorine atom or a bulky silicon atom is not present near the basic moiety. This enables involving little reduction in basicity or little steric hindrance and allows quenching of the generated acid to proceed satisfactorily. For this reason, when the resin (G-a) is used, in particular, excellent roughness characteristics can be achieved. Also, uneven distribution to the surface layer and basicity can be separately changed and therefore, the compound design is facilitated.

On the other hand, the resin (G-b) can have a high fluorine atom or silicon atom content. Therefore, the resin (G-b) exhibits good capability particularly of unevenly distributing to the surface layer. For this reason, when the resin (G-b) is used, it is easy to prevent the pattern from being T-top shaped.

In the resin (G-a), specific examples of the repeating unit having at least either a fluorine atom or a silicon atom include those described above.

In the resin (G-a), specific examples of the repeating unit having at least either one of a fluorine atom and a silicon atom include those described above.

In the resin (G-a), the repeating unit having a basic group or a group capable of increasing the basicity by the action of an acid is preferably a repeating unit represented by the following formula (B-I):

(B-I)

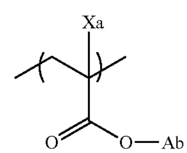

In formula (B-I), Xa represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. Xa is preferably a hydrogen atom, a methyl group, a trifluoromethyl group or a hydroxymethyl group, more preferably a hydrogen atom, a methyl group or a hydroxymethyl group.

Ab represents a group containing a basic group, or a group containing a group capable of increasing the basicity by the action of an acid.

In Ab, both the group having basicity and the group capable of increasing the basicity by the action of an acid preferably contain a nitrogen atom.

The basic group-containing group as Ab is preferably a group having any of the structures represented by formulae (A) to (E), and specific examples thereof include a monovalent group formed by removing one arbitrary hydrogen from a basic compound (low molecular compound) having any of the structures represented by formulae (A) to (E) (in this case, the basic compound may or may not have at least either one of a fluorine atom and a silicon atom).

The basic group-containing group as Ab is more preferably a group represented by the following formula (B-I'):

-L-Ac (B-I')

In formula (B-I'), L represents a single bond or a divalent linking group, and Ac represents a structure represented by formula (A) (the bond from the nitrogen atom of formula (A) is connected to L).

The divalent linking group as L includes an alkylene group, a cycloalkylene group, an ether group, a phenylene group, and a group formed by combining two or more of these groups, and is preferably an alkylene group or a cycloalkylene group, more preferably an alkylene group. The total carbon number of the divalent linking group as L is preferably from 0 to 10, more preferably from 1 to 6, still more preferably 2 or 3.

The "carbamate group having a protective group" described in the compound (G-2) is preferred as the "group capable of increasing the basicity by the action of an acid" in the group as Ab containing a group capable of increasing the basicity by the action of an acid.

The group as Ab containing a group capable of increasing the basicity by the action of an acid is preferably a group represented by the following formula (B-II):

(B-II)

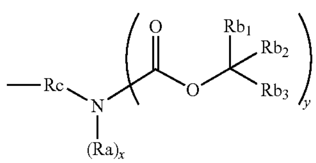

In formula (B-II), each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time.

Rc represents a single bond or a divalent linking group.

x represents 0 or 1, y represents 1 or 2, and x+y=2.

When x=1, Ra and Rc may combine with each other to form a nitrogen-containing heterocyclic ring.

When y=2, two $Rb_1$'s may be the same or different, two $Rb_2$'s may be the same or different, and two $Rb_3$'s may be the same or different.

In formula (B-II), specific examples of the groups in Ra, $Rb_1$, $Rb_2$, $Rb_3$ and Rc, the ring which may be formed by combining two members out of $Rb_1$ to $Rb_3$, and the nitrogen-containing heterocyclic ring which may be formed by combining Ra and Rc with each other, are the same as those described in formula (1).

In formula (G-b), the repeating unit containing at least either one of a fluorine atom and a silicon atom and a basic group or a group capable of increasing the basicity by the action of an acid includes a repeating unit which is a repeating unit represented by formula (B-1) and satisfies any of the following conditions:

(i) Xa is a methyl group having at least either one of a fluorine atom and a silicon atom (for example, a trifluoromethyl group), (ii) Ab is a group containing a basic group or a group capable of increasing the basicity by the action of an acid and further containing at least either one of a fluorine atom and a silicon atom, (iii) both (i) and (ii) above apply.

As regards (ii), the group Ab containing a basic group and further containing at least either one of a fluorine atom and a silicon atom includes, for example, a monovalent group formed by removing one arbitrary hydrogen from a basic compound (low molecular compound) having any of the structures represented by formulae (A) to (E) (in this case, the basic compound has at least either one of a fluorine atom and a silicon atom).

As regards (ii), the group Ab containing a group capable of increasing the basicity by the action of an acid and further containing at least either one of a fluorine atom and a silicon atom includes, for example, a monovalent group formed by removing one arbitrary hydrogen from any of Ra, Rc and Rf in the compound represented by formula (1).

Specific examples of the repeating unit containing a basic group or a group capable of increasing the basicity by the action of an acid, in the resin (G), are illustrated below, but the present invention is not limited thereto. In specific examples, X represents a hydrogen atom, —$CH_3$, —$CH_2OH$, —F or —$CF_3$.

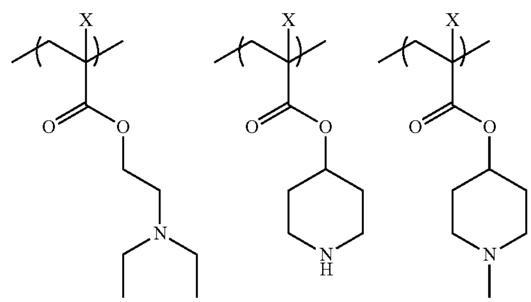

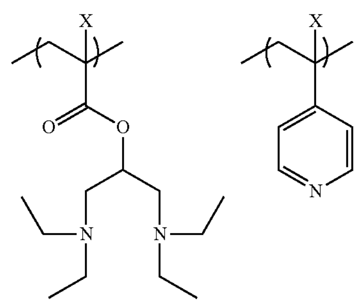

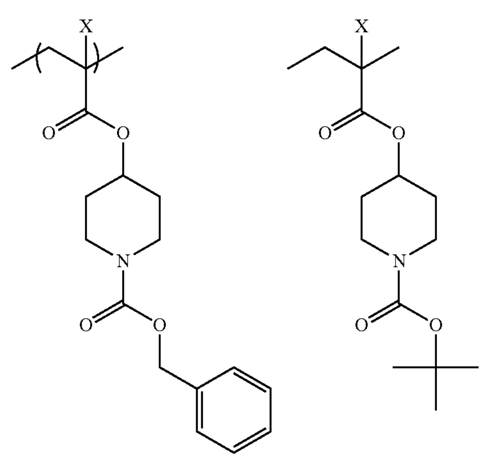

-continued

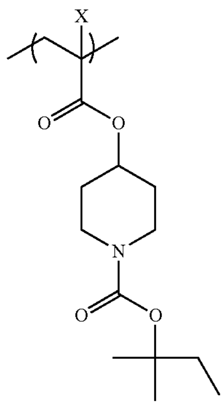

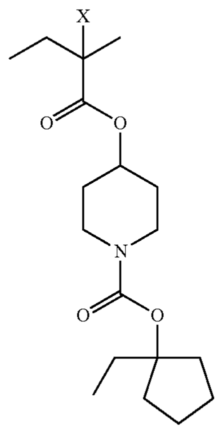

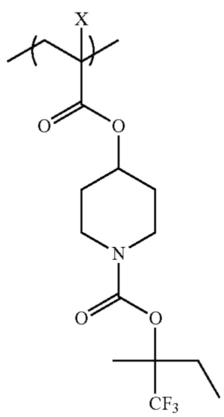

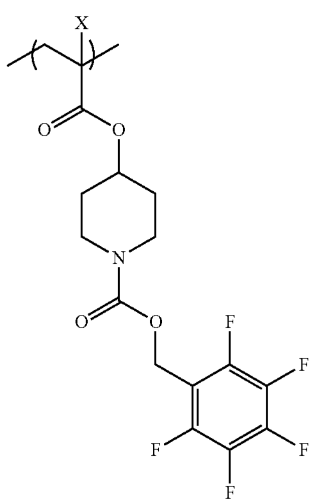

-continued

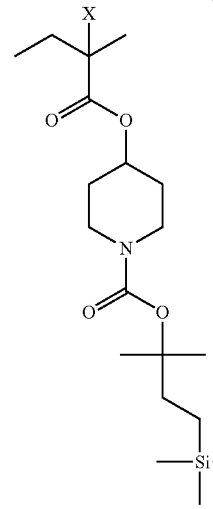

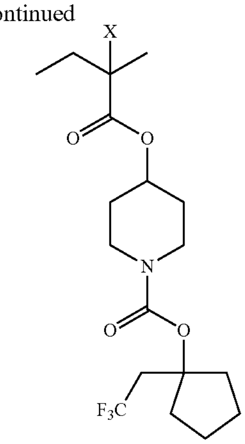

The resin (G) may further contain a repeating unit represented by the following formula (III'):

(III')

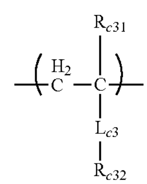

$R_{c31}$ represents a hydrogen atom, an alkyl group (which may be substituted with a fluorine atom or the like), a cyano group or a —$CH_2$—O-$Rac_2$ group, wherein $Rac_2$ represents a hydrogen atom, an alkyl group or an acyl group.

$R_{c31}$ is preferably a hydrogen atom, a methyl group or a trifluoromethyl group, more preferably a hydrogen atom or a methyl group.

$R_{c32}$ represents a group containing an alkyl group, a cycloalkyl group, an alkenyl group, a cycloalkenyl group or an aryl group. These groups may be substituted with a silicon atom-containing group, a fluorine atom or the like.

$L_{c3}$ represents a single bond or a divalent linking group.

The alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$R_{c32}$ is preferably an unsubstituted alkyl group or an alkyl group with at least one hydrogen atom being substituted for by a fluorine atom.

$L_{c3}$ represents a single bond or a divalent linking group. The divalent linking group here includes an ester bond, an alkylene group (preferably having a carbon number of 1 to 5), an oxy group, a phenylene group, an ester bond (a group represented by —COO—), or a group formed by combining two or more of these groups, and a linking group having a total carbon number of 1 to 12 is preferred.

The resin (G) may further contain a repeating unit represented by the following formula (CII-AB):

(CII-AB)

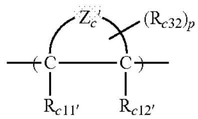

In formula (CII-AB), each of $R_{c11}$' and $R_{c12}$' independently represents a hydrogen atom, a cyano group, a halogen atom or an alkyl group. $Z_c$' represents an atomic group necessary for forming an alicyclic structure together with two carbon atoms (C—C) to which $R_{c11}$' and $R_{c12}$' are boned.

$R_{c32}$ is a substituent on the alicyclic structure, and the definition thereof is the same as $R_{c32}$ in formula (III').

p represents an integer of 0 to 3 and is preferably 0 or 1.

Specific examples of the repeating units represented by formulae (III') and (CII-AB) are illustrated below. In specific examples, Ra represents H, $CH_3$, $CH_2OH$, $CF_3$ or CN.

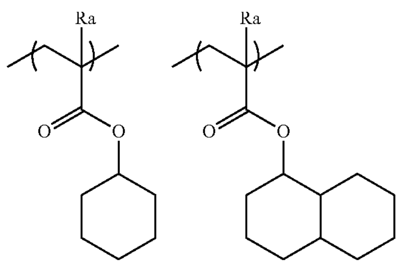

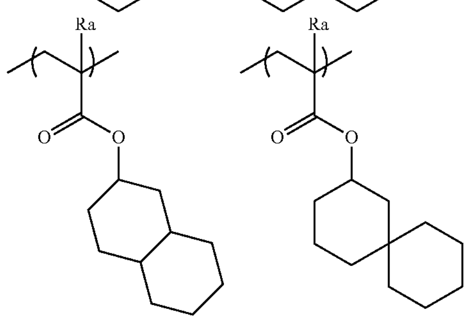

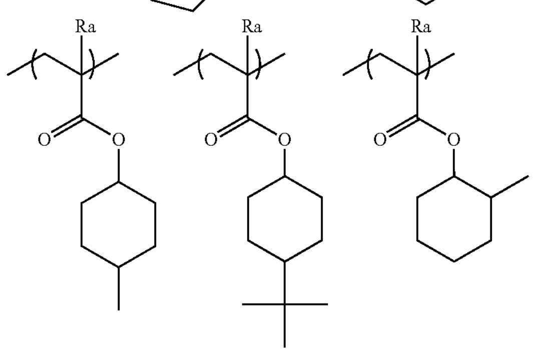

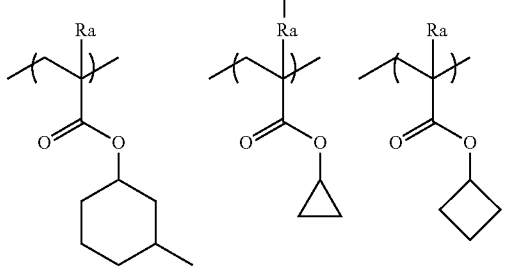

-continued

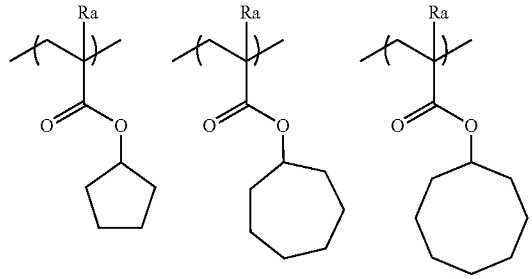

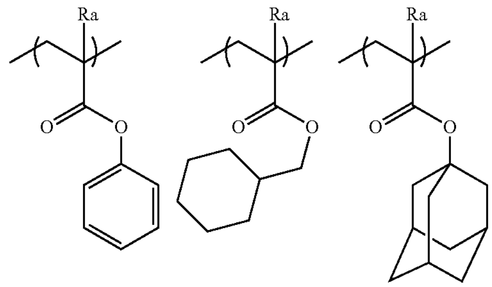

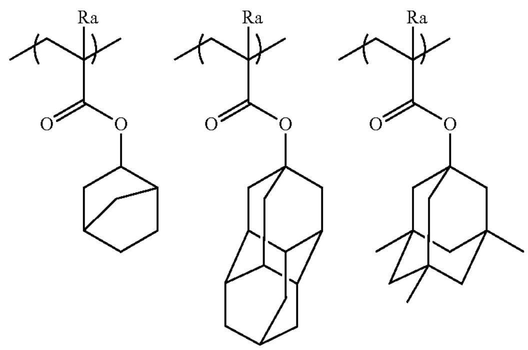

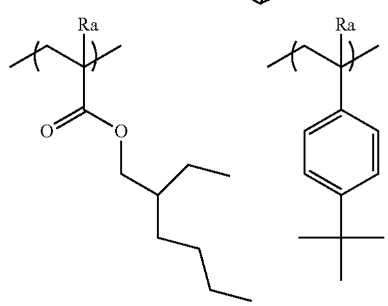

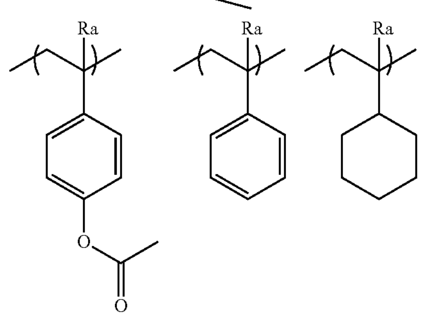

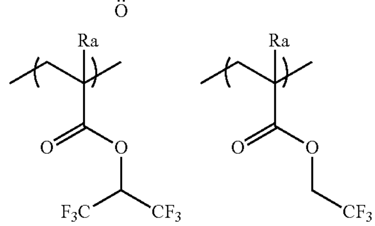

-continued
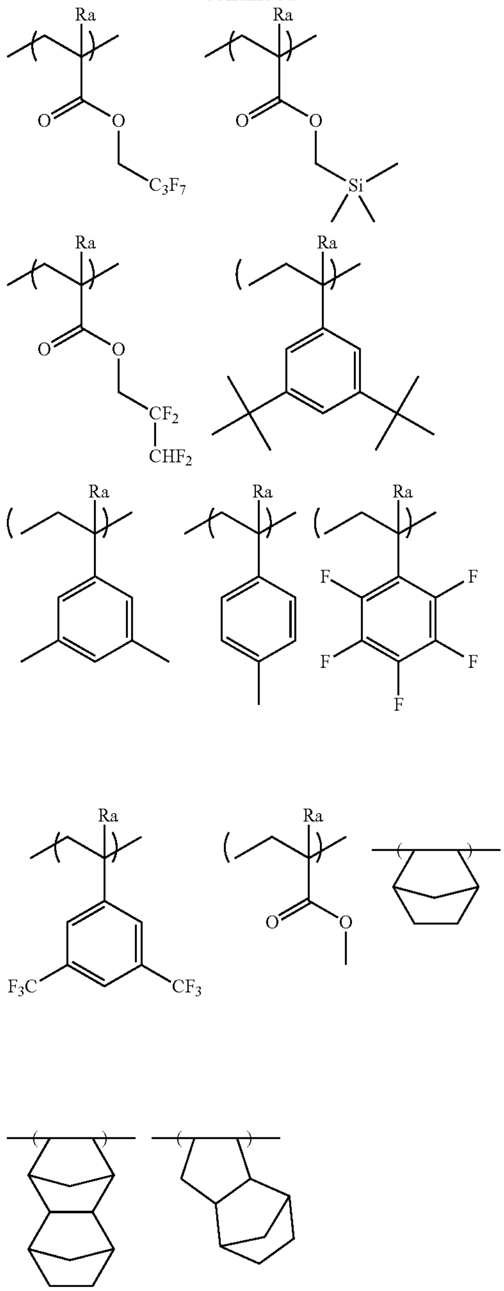
Specific examples of the resin (G) are illustrated below, but the present invention is not limited thereto.
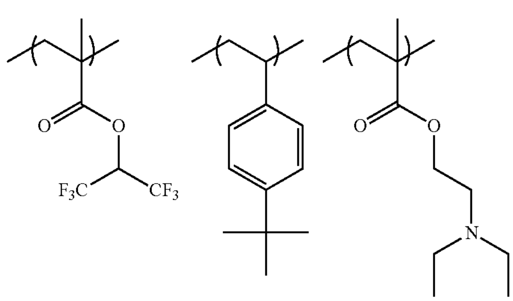
-continued
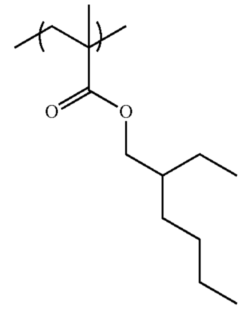
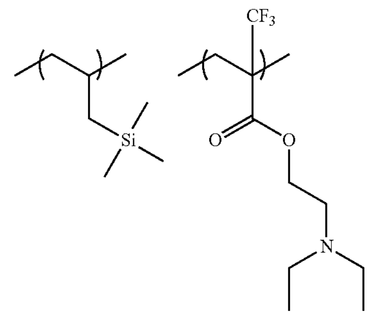
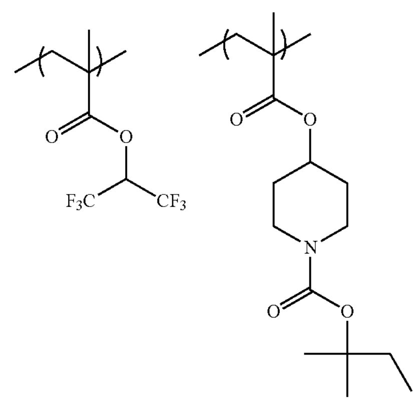
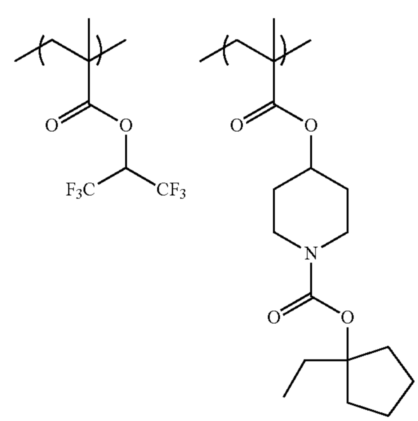

-continued

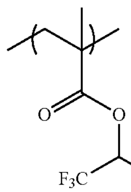

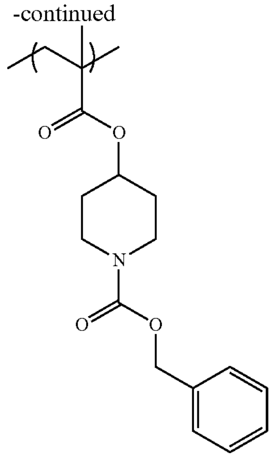

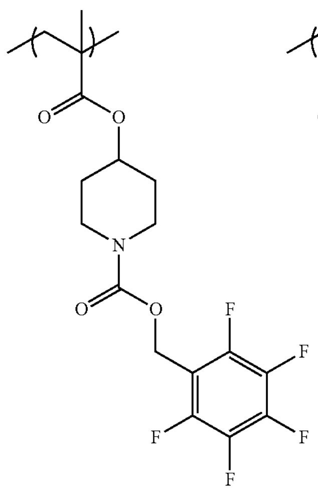

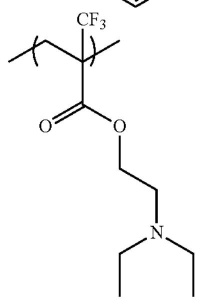

In the case where the compound (G) (including the resin (G)) contains a fluorine atom, the fluorine atom content is preferably from 5 to 80 mass %, more preferably from 10 to 80 mass %, based on the molecular weight of the compound (G). In the case where the compound (G) is the resin (G), the content of the fluorine atom-containing repeating unit is preferably from 10 to 100 mass %, more preferably from 30 to 100 mass %, based on all repeating units in the resin (G).

In the case where the resin (G) (including the resin (G)) contains a silicon atom, the silicon atom content is preferably from 2 to 50 mass %, more preferably from 2 to 30 mass %, based on the molecular weight of the compound (G). In the case where the compound (G) is the resin (G), the content of the silicon atom-containing repeating unit is preferably from 10 to 100 mass %, more preferably from 20 to 100 mass %, based on all repeating units in the resin (G).

When the fluorine atom or silicon atom content based on the molecular weight of the compound (G) is in the range above, a fluorine atom or a silicon atom is sufficiently contained in the compound (G) and the surface free energy of the compound (G) can be adequately reduced to more unfailingly allow for uneven distribution of the compound (G) to the surface layer part of the resist film, so that excess acid generated in the surface layer of the exposed area can be more reliably trapped and the acid concentration distribution in the thickness direction in the exposed area of the resist film can be more unfailingly made uniform, which is considered to enable more reliably preventing the above-described problem such as T-top profile or bridge defect.

The content of the "repeating unit containing at least either one of a fluorine atom and a silicon atom" in the resin (G-a) is preferably from 20 to 80 mol %, more preferably from 25 to 70 mol %, still more preferably from 30 to 60 mol %, based on all repeating units constituting the resin (G).

The content of the "repeating unit containing a basic group or a group capable of increasing the basicity by the action of an acid" in the resin (G-a) is preferably from 20 to 80 mol %, more preferably from 25 to 70 mol %, still more preferably from 30 to 60 mol %, based on all repeating units constituting the resin (G).

The content of the "repeating unit containing at least either one of a fluorine atom and a silicon atom and a basic group or a group capable of increasing the basicity by the action of an acid" in the resin (G-b) is preferably from 20 to 80 mol %, more preferably from 25 to 70 mol %, still more preferably from 30 to 60 mol %, based on all repeating units constituting the resin (G).

The content of the repeating unit represented by formula (III') or (CII-AB) in the resin (G) is preferably from 20 to 80 mol %, more preferably from 25 to 70 mol %, still more preferably from 30 to 60 mol %, based on all repeating units constituting the resin (G).

The weight average molecular weight of the resin (G) is preferably from 1,000 to 100,000, more preferably from 1,000 to 50,000, still more preferably from 2,000 to 15,000, in terms of polystyrene as measured by the GPC method.

The polydispersity of the resin (G) is preferably from 1 to 5, more preferably from 1 to 3, still more preferably from 1 to 2. Within this range, more excellent resolution, pattern profile and roughness characteristics can be achieved.

As for the compound (G) (including the resin (G)), one kind of a compound may be used alone, or two or more kinds of compounds may be used in combination.

The content of the compound (G) (including the resin (G)) is preferably from 0.01 to 10 mass %, more preferably from 0.05 to 8 mass %, still more preferably from 0.1 to 5 mass %, based on the entire solid content of the composition.

As for the compound (G) (including the resin (G)), a commercially available product may be used or a compound synthesized by a conventional method may be used. Examples of the general synthesis method of the resin (G) include the same methods as those described above for the resin (A).

In the resin (G) (oligomer or polymer compound), it is of course preferred that the content of impurities such as metal is small, and in addition, the residual amount of monomers is also preferably from 0 to 10 mass %, more preferably from 0 to 5 mass %, still more preferably from 0 to 1 mass %.

In the case that resin (G) is a polymer compound, it is of course preferred that the content of impurities such as metal is small, and in addition, the residual amount of monomers or oligomer components is also preferably from 0 to 10 mass %, more preferably from 0 to 5 mass %, still more preferably from 0 to 1 mass %.

When these conditions are satisfied, the amount of extraneous substances in liquid and the change with aging of sensitivity or the like can be reduced.

[4] (C) Crosslinking Agent

The actinic ray-sensitive or radiation-sensitive resin composition of the present invention may contain a compound capable of crosslinking the resin (A) by the action of an acid (hereinafter referred to as a "crosslinking agent"), together with the resin (A). Here, a known crosslinking agent can be effectively used. In this case, as described above, the resin (A) preferably contains (a2) a repeating unit having an alcoholic hydroxyl group.

The crosslinking agent (C) is a compound having a crosslinking group capable of crosslinking the resin (A), and examples of the crosslinking group include a hydroxymethyl group, an alkoxymethyl group, a vinyl ether group and an epoxy group. The crosslinking agent (C) preferably has two or more of these crosslinking groups.

The crosslinking agent (C) is preferably a crosslinking agent of melamine-based compound, urea-based compound, alkylene urea-based compound or glycoluril-based compound.

Preferred examples of the crosslinking agent include a compound having an N-hydroxymethyl group, an N-alkoxymethyl group or an N-acyloxymethyl group.

The compound having an N-hydroxymethyl group, an N-alkoxymethyl group or an N-acyloxymethyl group is preferably a compound having two or more (more preferably from two to eight) partial structures represented by the following formula (CLNM-1).

(CLNM-1)

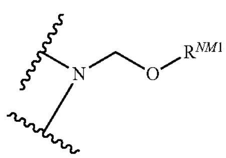

In formula (CLNM-1), $R^{NM1}$ represents a hydrogen atom, an alkyl group, a cycloalkyl group or an oxoalkyl group. The alkyl group of $R^{NM1}$ in formula (CLNM-1) is preferably a linear or branched alkyl group having a carbon number of 1 to 6, and the cycloalkyl group of $R^{NM1}$ is preferably a cycloalkyl group having a carbon number of 5 to 6. The oxoalkyl group of $R^{NM1}$ is preferably an oxoalkyl group having a carbon number of 3 to 6, and examples thereof include a β-oxopropyl group, a β-oxobutyl group, a β-oxopentyl group and a β-oxohexyl group.

More preferred embodiments of the compound having two or more partial structures represented by formula (CLNM-1) include a urea-based crosslinking agent represented by the following formula (CLNM-2), an alkylene urea-based crosslinking agent represented by the following formula (CLNM-3), a glycoluril-based crosslinking agent represented by the following formula (CLNM-4) and a melamine-based crosslinking agent represented by the following formula (CLNM-5).

(CLNM-2)

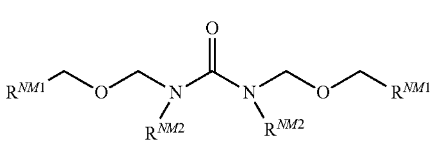

In formula (CLNM-2), each $R^{NM1}$ independently has the same meaning as $R^{NM1}$ in formula (CLNM-1).

Each $R^{NM2}$ independently represents a hydrogen atom, an alkyl group (preferably having a carbon number of 1 to 6) or a cycloalkyl group (preferably having a carbon number of 5 to 6).

Specific examples of the urea-based crosslinking agent represented by formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(tert-butoxymethyl)urea, N,N-di(cyclohexyloxymethyl)urea, N,N-di(cyclopentyloxymethyl)urea, N,N-di(adamantyloxymethyl)urea and N,N-di(norbornyloxymethyl)urea.

(CLNM-3)

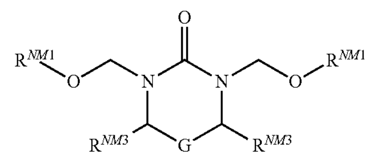

In formula (CLNM-3), each $R^{NM1}$ independently has the same meaning as $R^{NM1}$ in formula (CLNM-1).

Each $R^{NM3}$ independently represents a hydrogen atom, a hydroxyl group, a linear or branched alkyl group (preferably having a carbon number of 1 to 6), a cycloalkyl group (preferably having a carbon number of 5 to 6), an oxoalkyl group (preferably having a carbon number of 3 to 6), an alkoxy group (preferably having a carbon number of 1 to 6) or an oxoalkoxy group (preferably having a carbon number of 1 to 6).

G represents a single bond, an oxygen atom, a sulfur atom, an alkylene group (preferably having a carbon number of 1 to 3) or a carbonyl group. Specific examples thereof include a methylene group, an ethylene group, a propylene group, a 1-methylethylene group, a hydroxymethylene group and a cyanomethylene group.

Specific examples of the alkylene urea-based crosslinking agent represented by formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl)ethylene urea, N,N-di(butoxymethyl)-4,5-di(butoxymethyl)ethylene urea, N,N-di(tert-butoxymethyl)-4,5-di(tert-butoxymethyl)ethylene urea, N,N-di(cyclohexyloxymethyl)-4,5-di(cyclohexyloxymethyl)ethylene urea, N,N-di(cyclopentyloxymethyl)-4,5-di(cyclopentyloxymethyl)ethylene urea, N,N-di(adamantyloxymethyl)-4,5-di(adamantyloxymethyl)ethylene urea and N,N-di(norbornyloxymethyl)-4,5-di(norbornyloxymethyl)ethylene urea.

(CLNM-4)

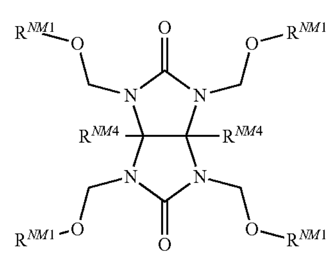

In formula (CLNM-4), each $R^{NM1}$ independently has the same meaning as $R^{NM1}$ in formula (CLNM-1).

Each $R^{NM4}$ independently represents a hydrogen atom, a hydroxyl group, an alkyl group, a cycloalkyl group or an alkoxy group.

Specific examples of the alkyl group (preferably having a carbon number of 1 to 6), cycloalkyl group (preferably having a carbon number of 5 to 6) and alkoxy group (preferably having a carbon number of 1 to 6) of $R^{NM4}$ include a methyl group, an ethyl group, a butyl group, a cyclopentyl group, a cyclohexyl group, a methoxy group, an ethoxy group and a butoxy group.

Specific examples of the glycoluril-based crosslinking agent represented by formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(tert-butoxymethyl)glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril and N,N,N,N-tetra(norbornyloxymethyl)glycoluril.

(CLNM-5)

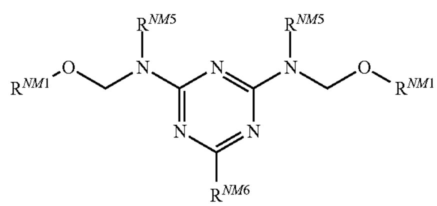

In formula (CLNM-5), each $R^{NM1}$ independently has the same meaning as $R^{NM1}$ in formula (CLNM-1).

Each $R^{NM5}$ independently represents a hydrogen atom, an alkyl group, a cycloalkyl group, an aryl group or an atomic group represented by the following formula (CLNM-5').

$R^{NM6}$ represents a hydrogen atom, an alkyl group, a cycloalkyl group, an aryl group or an atomic group represented by the following formula (CLNM-5").

(CLNM-5')

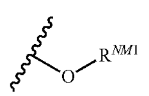

(CLNM-5")

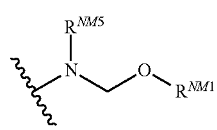

In formula (CLNM-5'), $R^{NM1}$ has the same meaning as $R^{NM1}$ in formula (CLNM-1).

In formula (CLNM-5"), $R^{NM1}$ has the same meaning as $R^{NM1}$ in formula (CLNM-1), and $R^{NM5}$ has the same meaning as $R^{NM5}$ in formula (CLNM-5).

Specific examples of the alkyl group (preferably having a carbon number of 1 to 6), cycloalkyl group (preferably having a carbon number of 5 to 6) and aryl group (preferably having a carbon number of 6 to 10) of $R^{NM5}$ and $R^{NM6}$ include a methyl group, an ethyl group, a propyl group, an isopropyl group, a butyl group, an isobutyl group, a tert-butyl group, a pentyl group, a cyclopentyl group, a hexyl group, a cyclohexyl group, a phenyl group and a naphthyl group.

Examples of the melamine-based crosslinking agent represented by formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, N,N,N,N,N,N-hexa(butoxymethyl)melamine, N,N,N,N,N,N-hexa(tert-butoxymethyl)melamine, N,N,N,N,N,N-hexa(cyclohexyloxymethyl)melamine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(tert-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine and N,N,N,N,N,N-hexa(tert-butoxymethyl)benzoguanamine.

The groups represented by $R^{NM1}$ to $R^{NM6}$ in formulae (CLNM-1) to (CLNM-5) may further have a substituent. Examples of the substituent which $R^{NM1}$ to $R^{NM6}$ may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), a cycloalkoxy group (preferably having a carbon number of 4 to 20), an acyl group (preferably having a carbon number of 2 to 20) and an acyloxy group (preferably having a carbon number of 2 to 20).

The crosslinking agent (C) may be a phenol compound having a benzene ring in the molecule.

The phenol compound is preferably a phenol derivative having a molecular weight of 1,200 or less, containing from three to five benzene rings in the molecule and further containing two or more hydroxymethyl groups or alkoxymethyl groups in total, where the hydroxymethyl groups or alkoxymethyl groups are bonded in a concentrated manner to at least any one benzene ring or distributed among the benzene rings. By virtue of using such a phenol derivative, the effects of the present invention are more remarkably brought out. The alkoxymethyl group bonded to the benzene ring is preferably an alkoxymethyl group having a carbon number of 6 or less. Specifically, a methoxymethyl group, an ethoxymethyl group, an n-propoxymethyl group, an i-propoxymethyl group, an n-butoxymethyl group, an i-butoxymethyl group, a sec-butoxymethyl group, and a tert-butoxymethyl group are preferred. An alkoxy-substituted alkoxy group such as 2-methoxyethoxy group and 2-methoxy-1-propyl group is also preferred.

The phenol compound is more preferably a phenol compound containing two or more benzene rings in the molecule and is preferably a phenol compound containing no nitrogen atom.

Specifically, a phenol compound having from two to eight crosslinking groups capable of crosslinking the resin (A) per molecule is preferred, and it is more preferred to contain from three to six crosslinking groups.

Out of these phenol derivatives, particularly preferred compounds are illustrated below. In the formulae, each of $L^1$ to $L^8$, which may be the same or different, represents a crosslinking group, and the crosslinking group is preferably a hydroxymethyl group, a methoxymethyl group or an ethoxymethyl group.

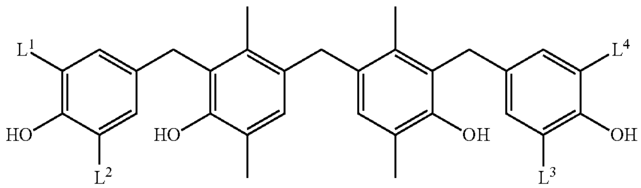
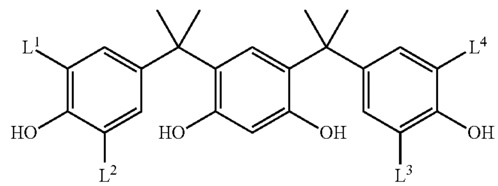
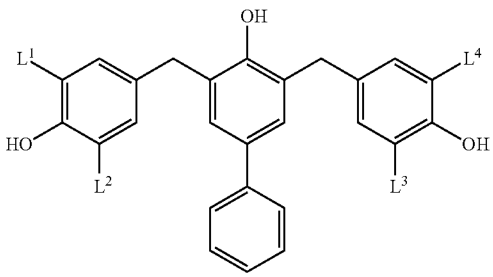
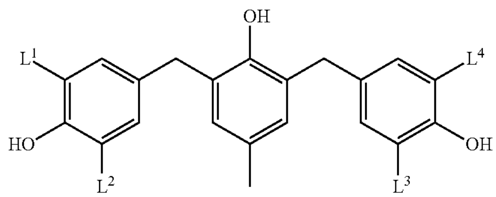
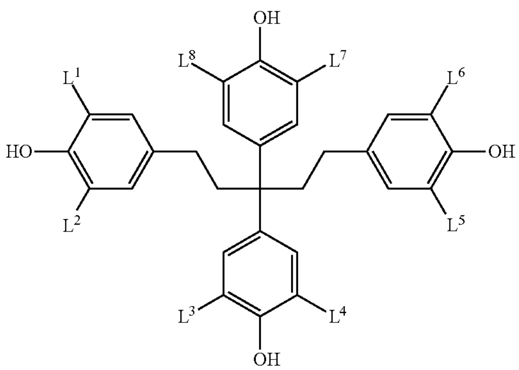
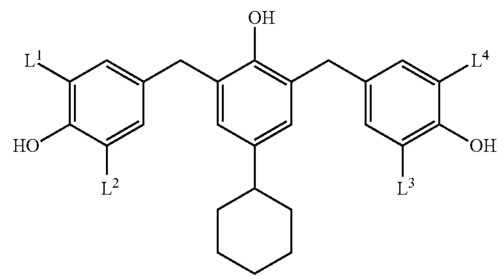
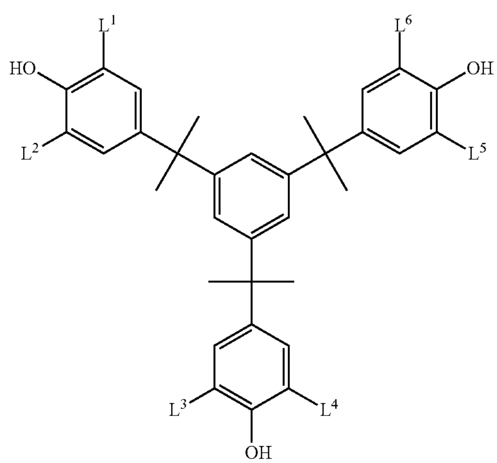
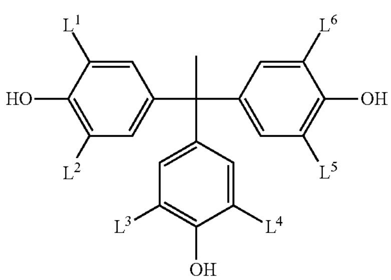
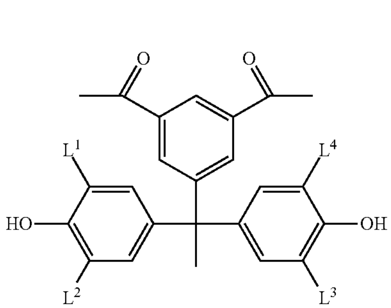
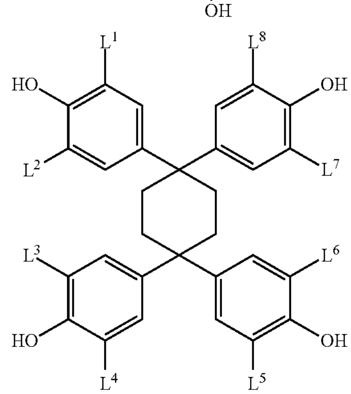

-continued
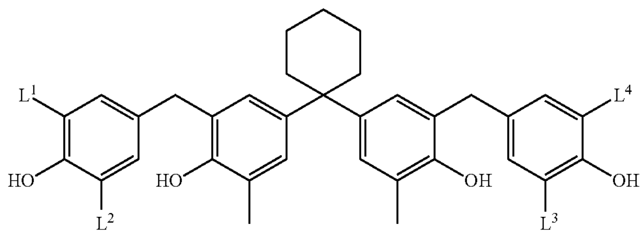
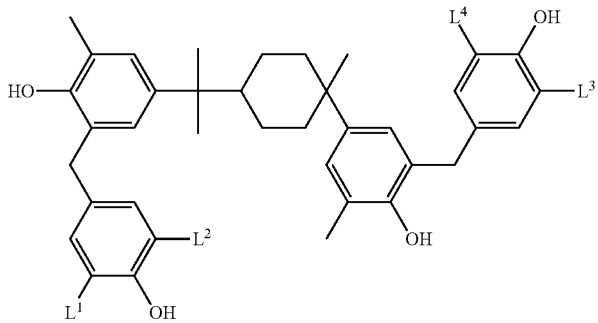
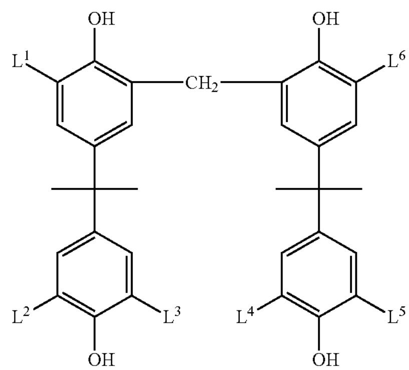
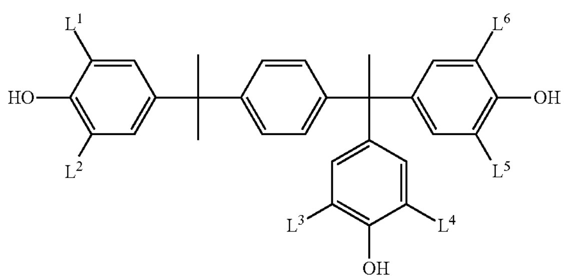
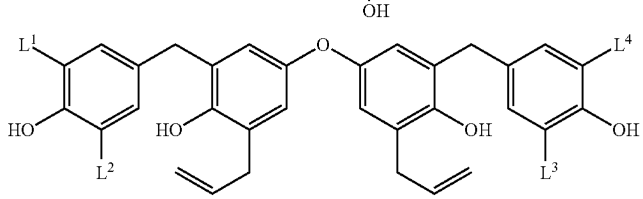
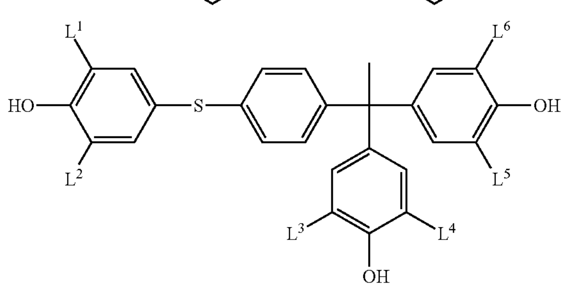
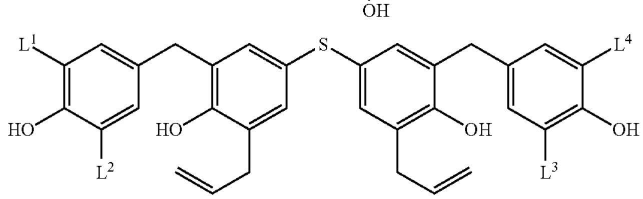
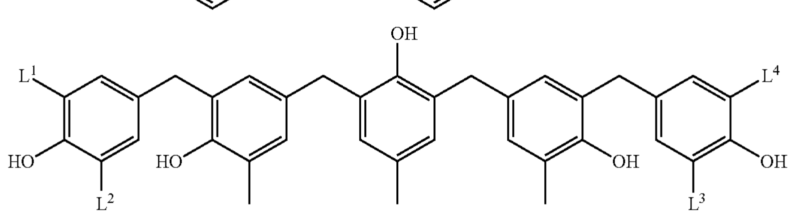

-continued

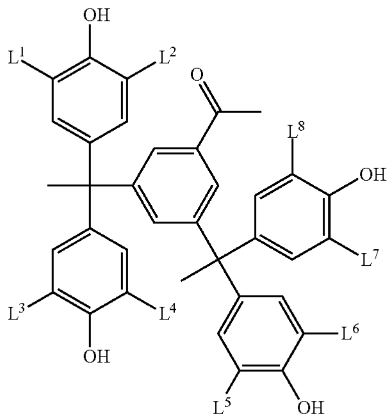

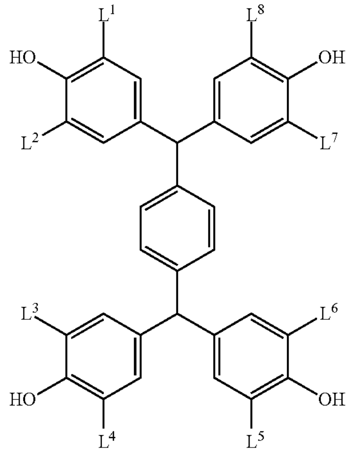

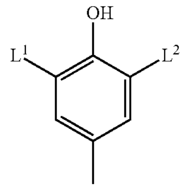

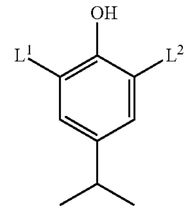

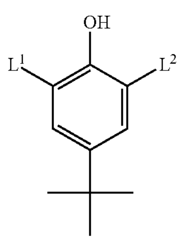

As for the phenol compound, a commercially available product may be used, or the compound may be synthesized by a known method. For example, a phenol derivative having a hydroxymethyl group can be obtained by reacting a phenol compound having no corresponding hydroxymethyl group (a compound where in the formulae above, each of $L^1$ to $L^8$ is a hydrogen atom) with formaldehyde in the presence of a base catalyst. At this time, in order to prevent resinification or gelling, the reaction is preferably performed at a temperature of 60° C. or less. Specifically, the compound can be synthesized by the method described, for example, in JP-A-6-282067 and JP-A-7-64285.

A phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. Specifically, the compound can be synthesized by the method described, for example, in EP632003A1. The thus-synthesized phenol derivative having a hydroxymethyl group or an alkoxymethyl group is preferred in view of stability during storage, and a phenol derivative having an alkoxymethyl group is particularly preferred in view of stability during storage. One of these phenol derivatives having two or more hydroxymethyl groups or alkoxymethyl groups in total that are bonded in a concentrated manner to any one benzene ring or distributed among the benzene rings, may be used alone, or two or more thereof may be used in combination.

The crosslinking agent (C) may be an epoxy compound having an epoxy group in the molecule.

The epoxy compound includes a compound represented by the following formula (EP2).

(EP2)

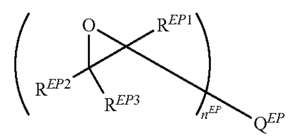

In formula (EP2), each of $R^{EP1}$ to $R^{EP3}$ independently represents a hydrogen atom, a halogen atom, an alkyl group or a cycloalkyl group, and these alkyl group and cycloalkyl group may have a substituent. Also, $R^{EP1}$ and $R^{EP2}$, or $R^{EP2}$ and $R^{EP3}$ may combine with each other to form a ring structure.

Examples of the substituent which the alkyl group and cycloalkyl group may have include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group and an alkylamide group.

$Q^{EP}$ represents a single bond or an $n^{EP}$-valent organic group. $R^{EP1}$ to $R^{EP3}$ may combine not only with each other but also with $Q^{EP}$ to form a ring structure.

$n^{EP}$ represents an integer of 2 or more and is preferably an integer of 2 to 10, more preferably from 2 to 6. However, when $Q^{EP}$ is a single bond, $n^{EP}$ is 2.

In the case where $Q^{EP}$ is an $n^{EP}$-valent organic group, for example, a chain or cyclic saturated hydrocarbon structure (preferably having a carbon number of 2 to 20), an aromatic ring structure (preferably having a carbon number of 6 to 30), and a structure where these structures are linked by a structure such as ether, ester, amide and sulfonamide, are preferred.
Specific examples of the compound having an epoxy structure are illustrated below, but the present invention is not limited thereto.
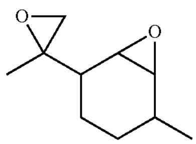
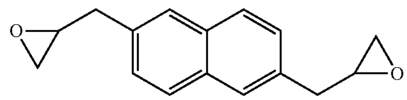
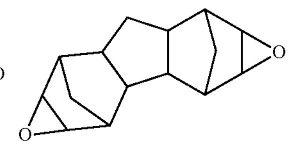
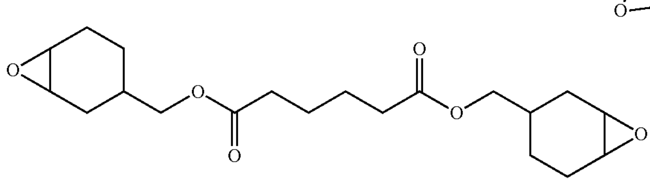
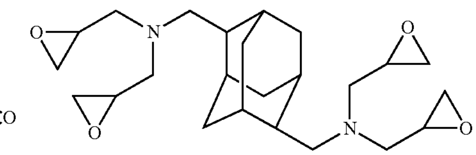
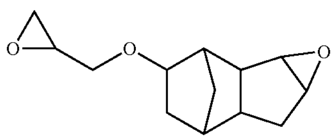
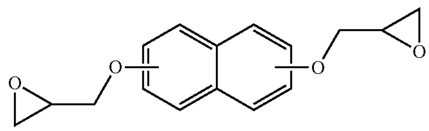
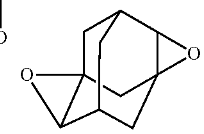
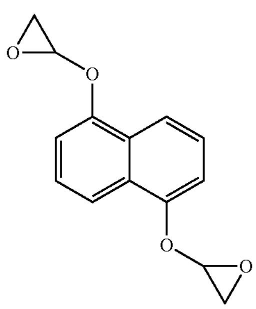
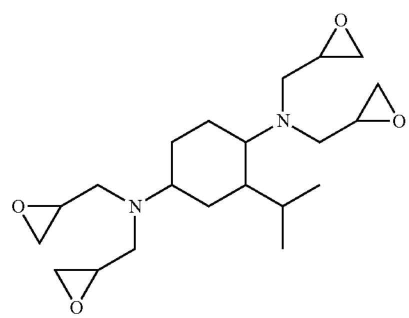
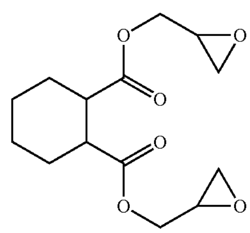
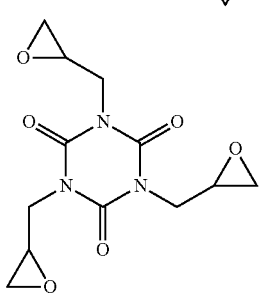
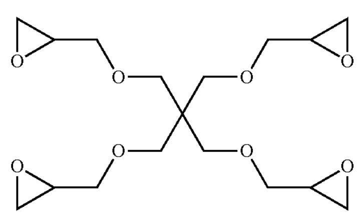
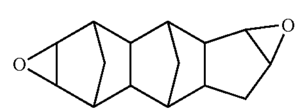
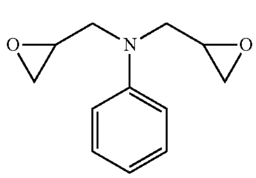
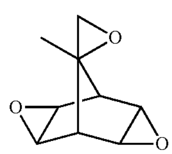
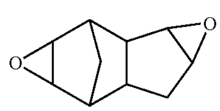
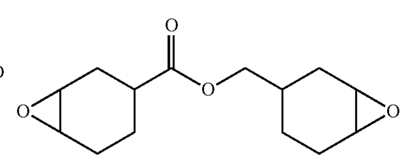
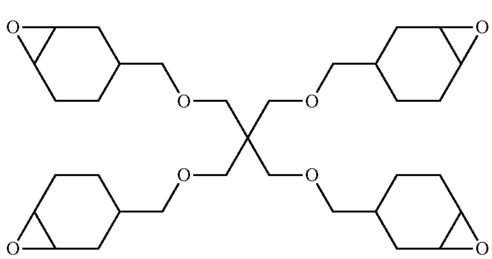
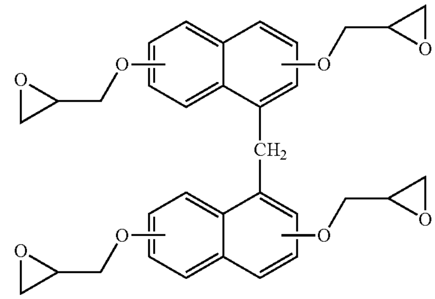

-continued
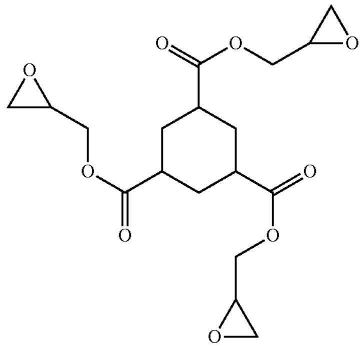
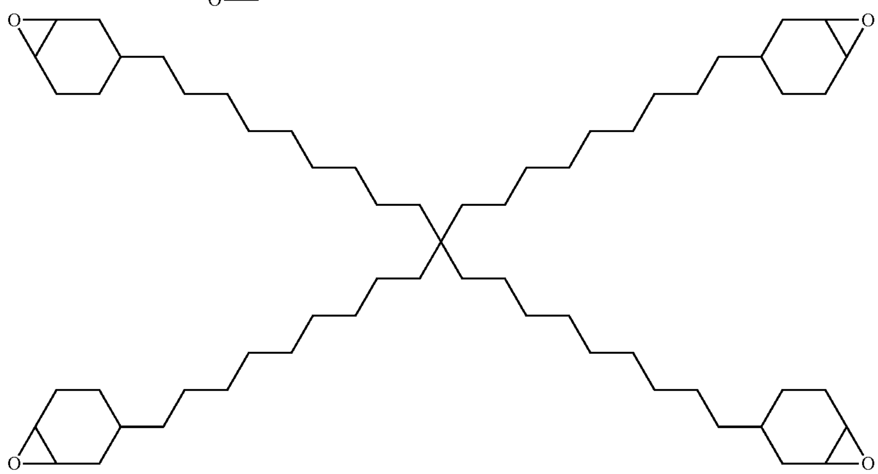
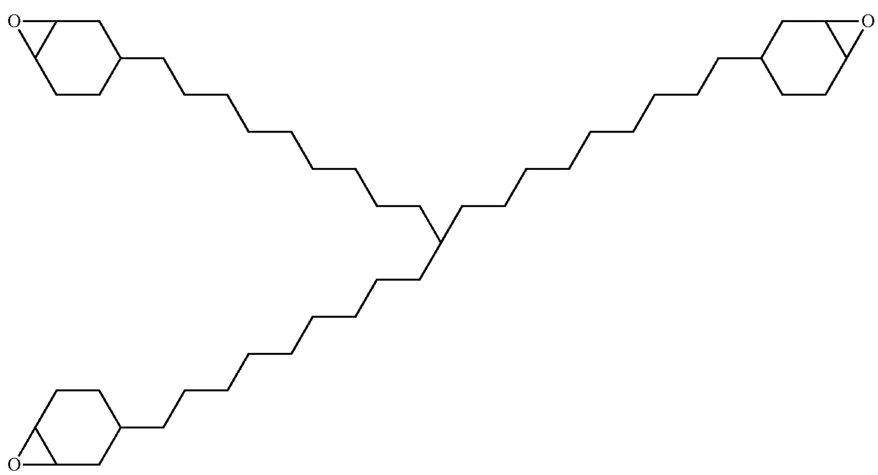
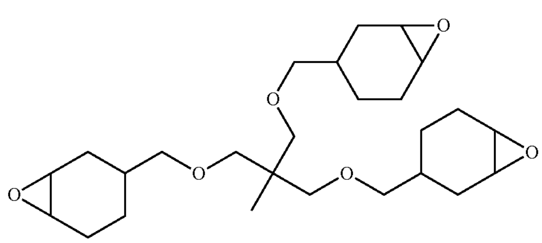
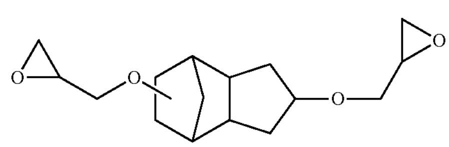

-continued

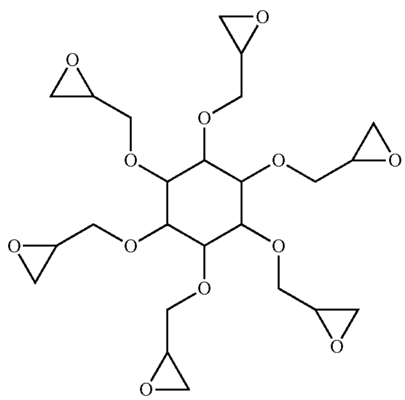

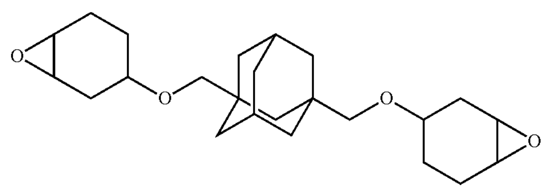

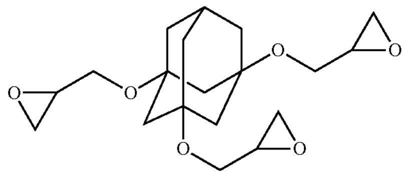

In the present invention, one crosslinking agent may be used alone, or two or more crosslinking agents may be used in combination.

In the case where the actinic ray-sensitive or radiation-sensitive resin composition contains a crosslinking agent, the content of the crosslinking agent in the composition is preferably from 3 to 15 mass %, more preferably from 4 to 12 mass %, still more preferably form 5 to 10 mass %, based on the entire solid content of the composition.

[5] (D) Solvent

The actinic ray-sensitive or radiation-sensitive resin composition for use in the present invention contains a solvent.

Examples of the solvent which can be used at the time of preparing the actinic ray-sensitive or radiation-sensitive resin composition for use in the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples and preferred examples of these solvents are the same as those described in paragraphs [0244] to [0248] of JP-A-2008-292975.

Specific examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Specific examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Specific examples of the alkyl lactate include methyl lactate, ethyl lactate, propyl lactate and butyl lactate.

Specific examples of the alkyl alkoxypropionate include ethyl 3-ethoxypropionate, methyl 3-methoxypropionate, methyl 3-ethoxypropionate and ethyl 3-methoxypropionate.

Specific examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Specific examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Specific examples of the alkylene carbonate include propylene carbonate, vinylene carbonate, ethylene carbonate and butylene carbonate.

Specific examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Specific examples of the alkyl pyruvate include methyl pyruvate, ethyl pyruvate and propyl pyruvate.

As for the solvent, those having a boiling point of 130° C. or more at ordinary temperature under atmospheric pressure are preferably used. Specific examples of such a solvent include cyclopentanone, γ-butyrolactone, cyclohexanone, ethyl lactate, ethylene glycol monoethyl ether acetate, PGMEA, ethyl 3-ethoxypropionate, ethyl pyruvate, 2-ethoxyethyl acetate, 2-(2-ethoxyethoxy)ethyl acetate and propylene carbonate.

One of these solvents may be used alone, or two or more thereof may be mixed and used.

In the present invention, a mixed solvent prepared by mixing a solvent containing a hydroxyl (hydroxy group) group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxy propionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is generally from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent is preferably a mixed solvent of two or more kinds of solvents containing propylene glycol monomethyl ether acetate.

[6] Hydrophobic Resin (HR)

The actinic ray-sensitive or radiation-sensitive resin composition (hereinafter also referred to as "a composition") of the present invention may contain a hydrophobic resin having at least either a fluorine atom or a silicon atom particularly when the resist composition is applied to immersion exposure (this hydrophobic resin is not equivalent to the resin (G)). The hydrophobic resin (HR) is unevenly distributed to the surface layer of the film and when the immersion medium is water, the static/dynamic contact angle on the resist film surface for water as well as the followability of immersion liquid can be enhanced.

The hydrophobic resin (HR) is, as described above, unevenly distributed to the interface but unlike a surfactant, need not have necessarily a hydrophilic group in the molecule and may not contribute to uniform mixing of polar/nonpolar substances.

The hydrophobic resin typically contains a fluorine atom and/or a silicon atom. Such a fluorine atom and/or a silicon atom may be contained in the main chain of the resin or contained in the side chain.

In the case where the hydrophobic resin contains a fluorine atom, the resin preferably contains, as the fluorine atom-containing partial structure, a fluorine atom-containing alkyl group, a fluorine atom-containing cycloalkyl group or a fluorine atom-containing aryl group.

The fluorine atom-containing alkyl group is a linear or branched alkyl group with at least one hydrogen atom being substituted for by a fluorine atom. This alkyl group preferably has a carbon number of 1 to 10, more preferably a carbon number of 1 to 4. The fluorine atom-containing alkyl group may further have a substituent other than fluorine atom.

The fluorine atom-containing cycloalkyl group is a monocyclic or polycyclic cycloalkyl group with at least one hydrogen atom being substituted for by a fluorine atom. This fluorine atom-containing cycloalkyl group may further have a substituent other than fluorine atom.

The fluorine atom-containing aryl group is an aryl group with at least one hydrogen atom being substituted for by a fluorine atom. Examples of this aryl group include a phenyl group and a naphthyl group. The fluorine atom-containing aryl group may further have a substituent other than fluorine atom.

Preferred examples of the fluorine atom-containing alkyl group, fluorine atom-containing cycloalkyl group and fluorine atom-containing aryl group include the groups represented by formulae (F2) to (F4) described in the resin (G) above.

Specific examples of the repeating unit containing a fluorine atom are the same as those exemplified in the resin (G) above.

In the case where the hydrophobic resin contains a silicon atom, the resin preferably contains an alkylsilyl structure or a cyclic siloxane structure, as the silicon atom-containing partial structure. The alkylsilyl structure is preferably a trialkylsilyl group-containing structure.

Preferred examples of the alkylsilyl structure and cyclic siloxane structure include the groups represented by formulae (CS-1) to (CS-3) described in the resin (G) above.

Specific examples of the repeating unit having a group represented by formulae (CS-1) to (CS-3) are the same as those exemplified in the resin (G).

The hydrophobic resin may further contain at least one group selected from the group consisting of the following (x) to (z):

(x) an acid group, (y) a lactone structure-containing group, an acid anhydride, or an acid imide group, and (z) an acid-decomposable group.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group. Preferred acid groups include a fluorinated alcohol group, a sulfonimide group and a bis(carbonyl)methylene group. Preferred fluorinated alcohol groups include hexafluoroisopropanol group.

The repeating unit having an acid group is, for example, a repeating unit where an acid group is directly bonded to the main chain of the resin, such as repeating unit by an acrylic acid or a methacrylic acid. This repeating unit may be a repeating unit where an acid group is bonded to the main chain of the resin through a linking group. Alternatively, in this repeating unit, an acid group may be introduced into the terminal of the resin by using an acid group-containing polymerization initiator or chain transfer agent at the polymerization.

The content of the repeating unit having an acid group is preferably from 1 to 50 mol %, more preferably from 3 to 35 mol %, still more preferably from 5 to 20 mol %, based on all repeating units in the hydrophobic resin.

Specific examples of the repeating unit having an acid group are illustrated below. In the formulae, Rx represents a hydrogen atom, $CH_3$, $CF_3$ or $CH_2OH$.

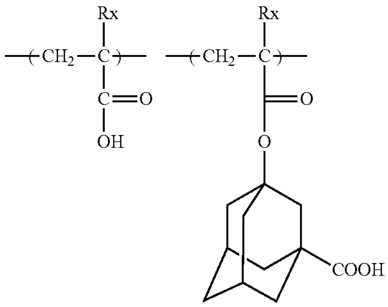
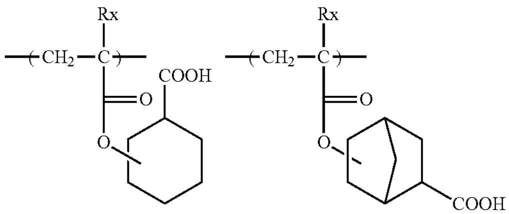
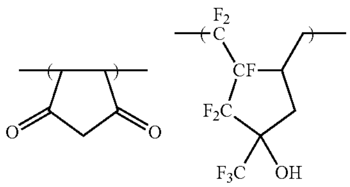
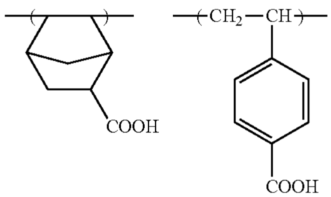
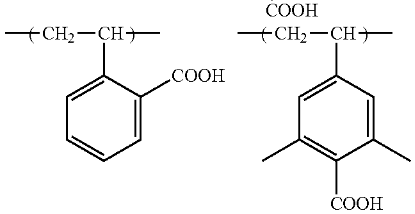
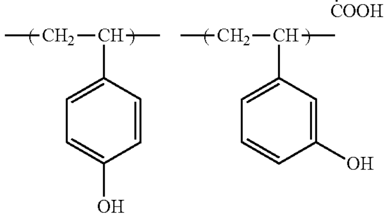
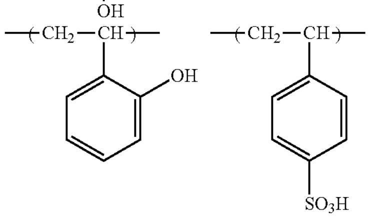
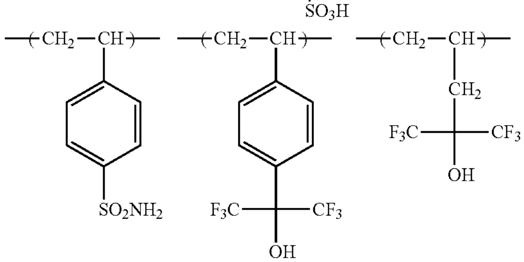
-continued
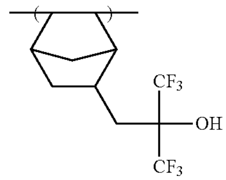
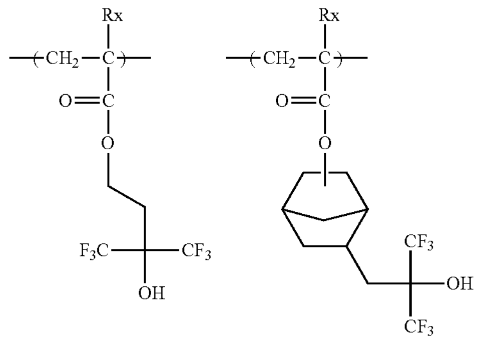
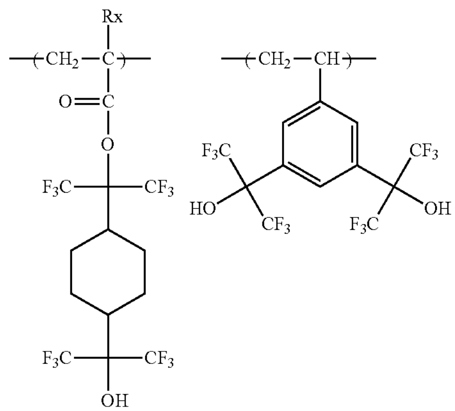
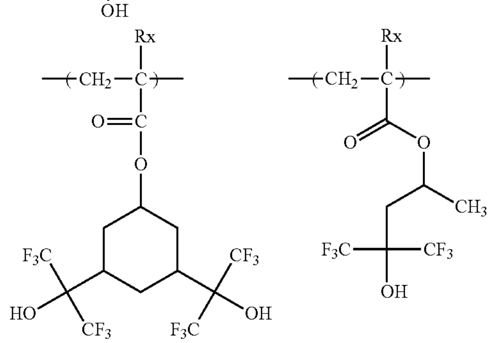
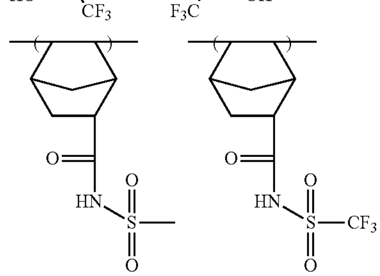
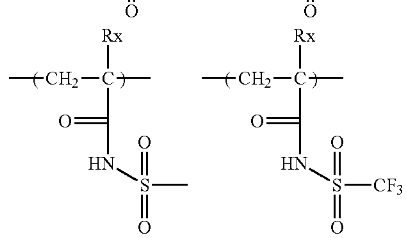

-continued

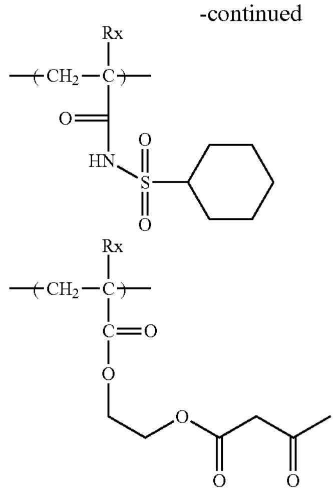

The (y) lactone structure-containing group, acid anhydride group or acid imide group is preferably a lactone structure-containing group.

The repeating unit having such a group is a repeating unit where the group is directly bonded to the main chain of the resin, such as repeating unit by an acrylic acid ester or a methacrylic acid ester. This repeating unit may also be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the resin (A).

The lactone structure-containing group is preferably a group having a partial structure represented by the following formula (KA-1). By virtue of having this structure, it is expected that, for example, the receding contact angle of the immersion liquid is enhanced.

(KA-1)

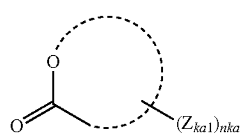

In formula (KA-1), $Z_{ka1}$ represents, when nka is 2 or more, each $Z_{ka1}$ independently represents, an alkyl group, a cycloalkyl group, an ether group, a hydroxy group, an amide group, an aryl group, a lactone ring group or an electron-withdrawing group. In the case where nka is 2 or more, the plurality of $Z_{ka1}$'s may combine with each other to form a ring. Examples of the ring include a cycloalkyl ring and a heterocyclic ring such as cyclic ether ring and lactone ring.

nka represents an integer of 0 to 10. nka is preferably an integer of 0 to 8, more preferably an integer of 0 to 5, still more preferably an integer of 1 to 4, yet still more preferably an integer of 1 to 3.

Incidentally, the structure represented by formula (KA-1) is a partial structure present in the main chain, side chain, terminal or the like of the resin and is present as a monovalent or higher valent substituent by removing at least one hydrogen atom contained in the structure.

$Z_{ka1}$ is preferably an alkyl group, a cycloalkyl group, an ether group, a hydroxy group or an electron-withdrawing group, more preferably an alkyl group, a cycloalkyl group or an electron-withdrawing group. The ether group is preferably an alkyl ether group or a cycloalkyl ether group.

The alkyl group of $Z_{ka1}$ may be either linear or branched, and the alkyl group may further have a substituent.

The alkyl group of $Z_{ka1}$ is preferably an alkyl group having a carbon number of 1 to 4, such as methyl group, ethyl group, n-propyl group, i-propyl group, n-butyl group, i-butyl group and tert-butyl group.

The cycloalkyl group of $Z_{ka1}$ may be monocyclic or polycyclic. In the latter case, the cycloalkyl group may be of crosslinked type. That is, in this case, the cycloalkyl group may have a bridged structure. Incidentally, a part of carbon atoms in the cycloalkyl group may be substituted with a heteroatom such as oxygen atom.

The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group.

Examples of the polycyclic cycloalkyl group include a group having a bicyclo, tricyclo or tetracyclo structure and having a carbon number of 5 or more. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group.

These structures may further have a substituent. Examples of the substituent include an alkyl group, a halogen atom, a hydroxyl group, an alkoxy group, a carboxy group and an alkoxycarbonyl group.

The alkyl group as the substituent is preferably a lower alkyl group such as methyl group, ethyl group, propyl group, isopropyl group and butyl group, more preferably a methyl group, an ethyl group, a propyl group or an isopropyl group.

The alkoxy group as the substituent is preferably an alkoxy group having a carbon number of 1 to 4, such as methoxy group, ethoxy group, propoxy group and butoxy group.

The alkyl group and alkoxy group as the substituent may have a further substituent, and examples of the further substituent include a hydroxyl group, a halogen atom and an alkoxy group (preferably having a carbon number of 1 to 4).

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group; a halogen atom; a nitro group; a cyano group; the above-described alkyl group; an alkoxy group such as methoxy group, ethoxy group, hydroxyethoxy group, propoxy group, hydroxypropoxy group, n-butoxy group, isobutoxy group, sec-butoxy group and tert-butoxy group; an alkoxycarbonyl group such as methoxycarbonyl group and ethoxycarbonyl group; an aralkyl group such as benzyl group, phenethyl group and cumyl group; an aralkyloxy group; an acyl group such as formyl group, acetyl group, butyryl group, benzoyl group, cinnamyl group and valeryl group; an acyloxy group such as butyryloxy group; an alkenyl group; an alkenyloxy group such as vinyloxy group, propenyloxy group, allyloxy group and butenyloxy group; the above-described aryl group; an aryloxy group such as phenoxy group; and an aryloxycarbonyl group such as benzoyloxy group.

Examples of the electron-withdrawing group of $Z_{ka1}$ include a halogen atom, a cyano group, an oxy group, a carbonyl group, a carbonyloxy group, an oxycarbonyl group, a nitrile group, a nitro group, a sulfonyl group, a sulfinyl group, a halo(cyclo)alkyl represented by —C($R_{f1}$)($R_{f2}$)—$R_{f3}$, a haloaryl group, and a combination thereof. The term "halo (cyclo)alkyl group" indicates a (cyclo)alkyl in which at least one hydrogen atom is substituted for by a halogen atom.

The halogen atom of $Z_{ka1}$ includes a fluorine atom, a chlorine atom, a bromine atom and an iodine atom. Among these, a fluorine atom is preferred.

In the halo(cyclo)alkyl group represented by —C($R_{f1}$)($R_{f2}$)—$R_{f3}$, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

In the halo(cyclo)alkyl group represented by —C($R_{f1}$)($R_{f2}$)—$R_{f3}$, each of $R_{f2}$ and $R_{f3}$ independently represents a hydrogen atom, a halogen atom or an organic group. Examples of the organic group include an alkyl group, a cycloalkyl group and an alkoxy group. These groups may further have a substituent such as halogen atom.

At least two members out of $R_{f1}$ to $R_{f3}$ may combine with each other to form a ring. Examples of the ring include a cycloalkyl ring, a halocycloalkyl ring, an aryl ring and a haloaryl ring.

Examples of the alkyl group and haloalkyl group of $R_{f1}$ to $R_{f3}$ include the alkyl groups described above for $Z_{ka1}$ and groups where at least a part of hydrogen atoms of such an alkyl group is substituted for by a halogen atom.

Examples of the halocycloalkyl group and haloaryl group include groups where at least a part of hydrogen atoms in the cycloalkyl group or aryl group described above for $Z_{ka1}$ is substituted for by a halogen atom. More preferred examples of the halocycloalkyl group and haloaryl group include a fluorocycloalkyl group represented by —$C_{(n)}F_{(2n-2)}H$ and a perfluoroaryl group. Here, the range of carbon number n is not particularly limited, but n is preferably an integer of 5 to 13, and n is more preferably 6.

$R_{f2}$ is preferably the same group as $R_{f1}$ or combines with $R_{f3}$ to form a ring.

The electron-withdrawing group is preferably a halogen atom, a halo(cyclo)alkyl group or a haloaryl group.

In the electron-withdrawing group, a part of fluorine atoms may be substituted for by an electron-withdrawing group except for fluorine atom.

Incidentally, when the electron-withdrawing group is a divalent or higher valent group, the remaining bond is used for bonding to an arbitrary atom or substituent. In this case, the partial structure above may be bonded to the main chain of the hydrophobic resin through a further substituent.

Out of the structures represented by formula (KA-1), a structure represented by the following formula (KY-1) is preferred.

(KY-1):

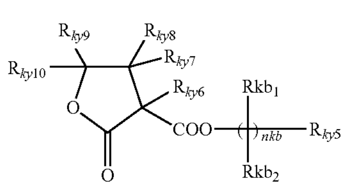

In formula (KY-1), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxy group, a cyano group, an amide group or an aryl group. At least two members out of $R_{ky6}$ to $R_{ky10}$ may combine with each other to form a ring.

$R_{ky5}$ represents an electron-withdrawing group. Examples of the electron-withdrawing group are the same as those for $Z_{ka1}$ in formula (KA-1). The electron-withdrawing group is preferably a halogen atom, a halo(cyclo)alkyl represented by —C($R_{f1}$)($R_{f2}$)—$R_{f3}$, or a haloaryl group. Specific examples of these groups are the same as specific examples in formula (KA-1).

nkb represents 0 or 1.

Each of $R_{kb1}$ and $R_{kb2}$ independently represents a hydrogen atom, an alkyl group, a cycloalkyl group, an aryl group or an electron-withdrawing group. Specific examples of these atomic groups are the same as those for $Z_{ka1}$ in formula (KA-1).

The structure represented by formula (KY-1) is preferably a structure represented by the following formula (KY-1-1).

(KY-1-1):

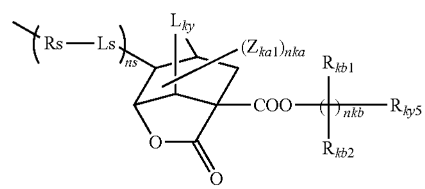

In formula (KY-1-1), $Z_{ka1}$ and nka have the same meanings as those in formula (KA-1). $R_{ky5}$, $R_{kb1}$, $R_{kb2}$ and nkb have the same meaning as those in formula (KY-1).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

Each Rs independently represents an alkylene group or a cycloalkylene group. When ns is 2 or more, each Rs may be the same as or different from every other Rs. Ls represents a single bond, an ether bond, an ester bond, an amide bond, a urethane bond or a urea bond, and when a plurality of Ls's are present, each Ls may be the same as or different from every other Ls.

ns is the repetition number of the linking group represented by —(Rs-Ls)- and represents an integer of 0 to 5.

Specific preferred examples of the repeating unit having a structure represented by formula (KA-1) are illustrated below, but the present invention is not limited thereto. Ra represents a hydrogen atom, a fluorine atom, a' methyl group or a trifluoromethyl group.

-continued
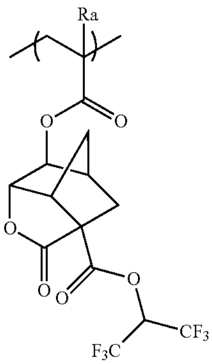
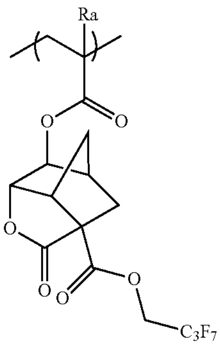
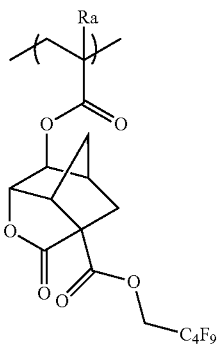
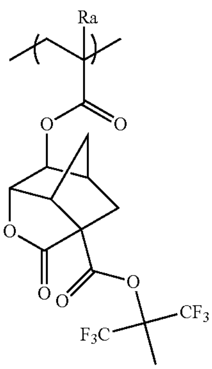
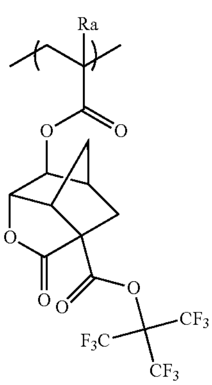
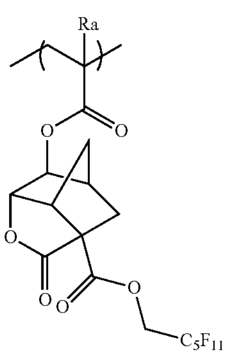
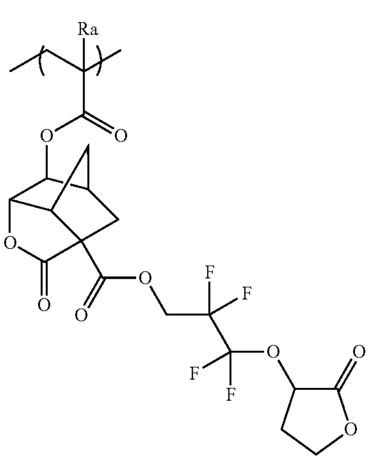
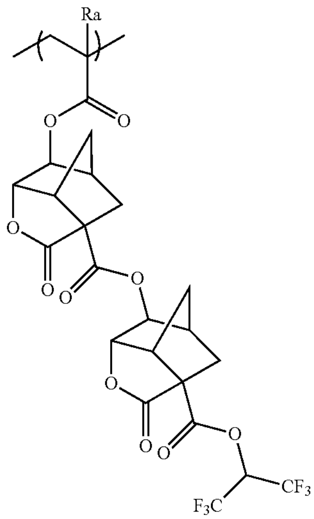
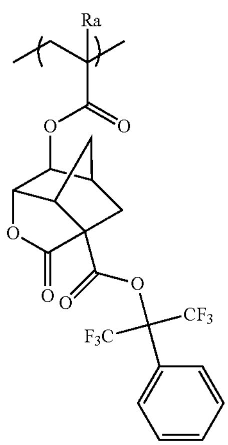
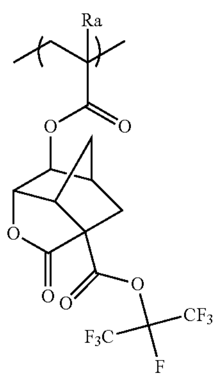
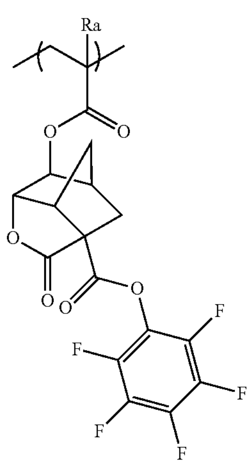
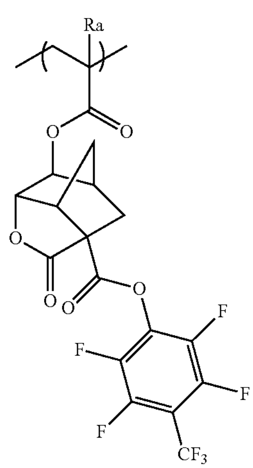

-continued

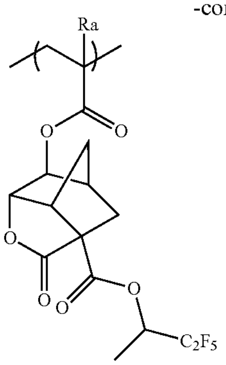

The content of the repeating unit having a lactone structure-containing group, an acid anhydride group or an acid imide group is preferably from 1 to 40 mol %, more preferably from 3 to 30 mol %, still more preferably from 5 to 15 mol %, based on all repeating units in the hydrophobic resin.

Examples of the (z) acid-decomposable group are the same as those described above in the paragraph of the (A) acid-decomposable resin.

The content of the repeating unit having an acid-decomposable group is preferably from 1 to 80 mol %, more preferably from 10 to 80 mol %, still more preferably from 20 to 60 mol %, based on all repeating units in the hydrophobic resin.

The hydrophobic resin may contain a repeating unit represented by formula (III') or (CII-AB) described in the resin (G).

Specific examples of the repeating unit represented by formula (III') or (CII-AB) are the same as those exemplified in the resin (G).

In the case where the hydrophobic resin (HR) contains a repeating unit represented by formula (III') or (CII-AB), the amount of the repeating unit is preferably from 1 to 100 mol %, more preferably from 5 to 95 mol %, still more preferably from 20 to 80 mol %, based on all repeating units constituting the hydrophobic resin (HR).

Specific examples of the hydrophobic resin are illustrated below. Also, the molar ratio of repeating units (corresponding to repeating units starting from the left), weight average molecular weight and polydispersity (Mw/Mn) of each resin are shown in the Table 2 later.

(HR-1)

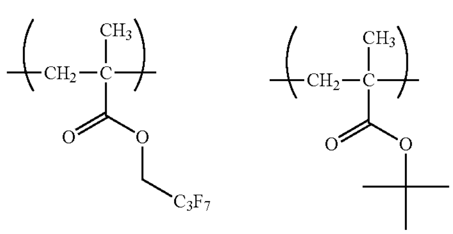

(HR-2)

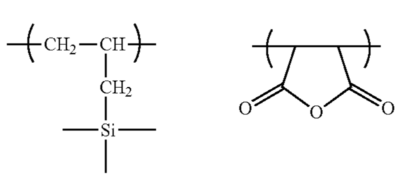

-continued (HR-3)

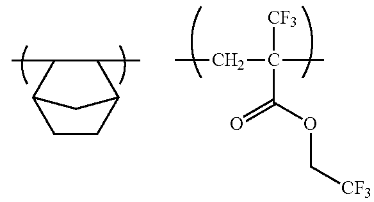

(HR-4)

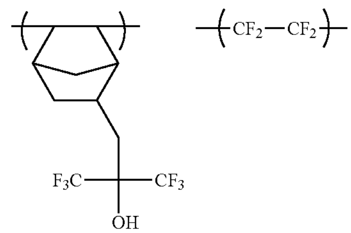

(HR-5)

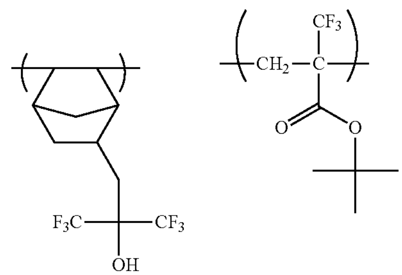

(HR-6)

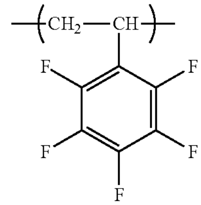

(HR-7)

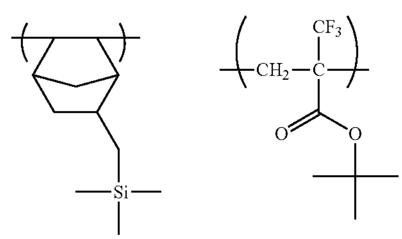

(HR-8)

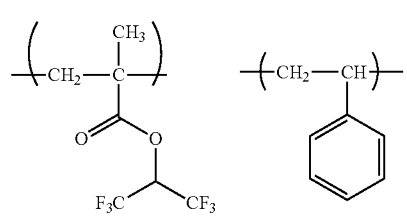

-continued
(HR-9)
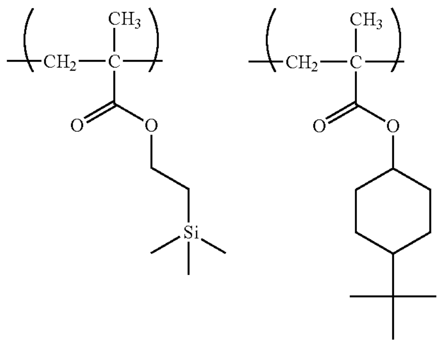
(HR-10)
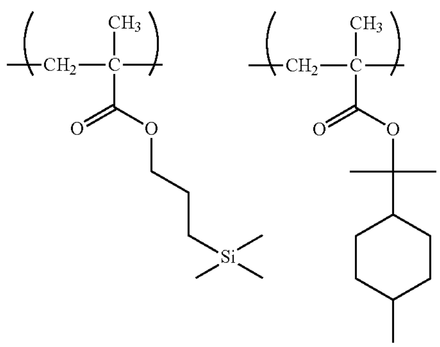
(HR-11)
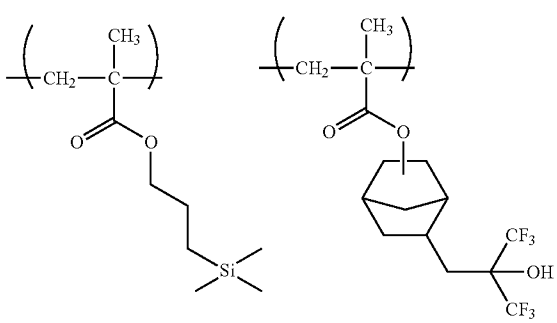
(HR-12)
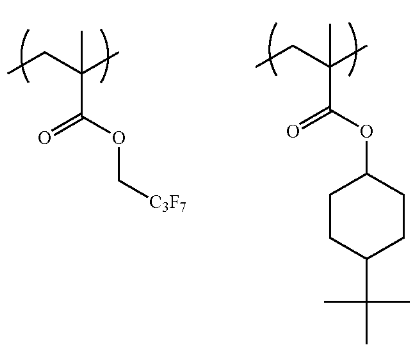
-continued
(HR-13)
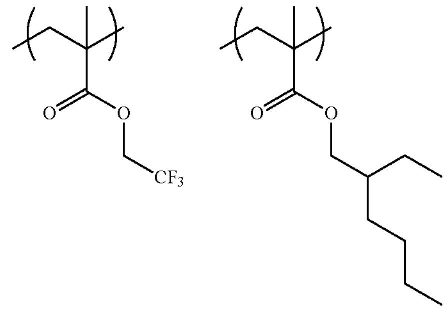
(HR-14)
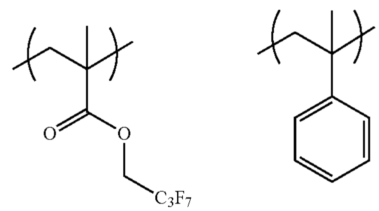
(HR-15)
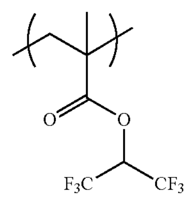
(HR-16)
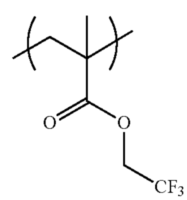
(HR-17)
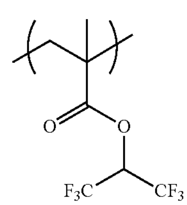
(HR-18)
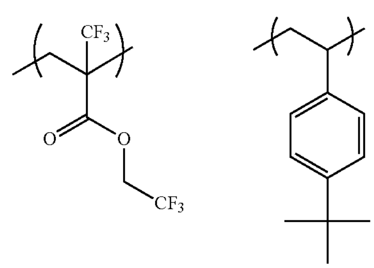

-continued
(HR-19)
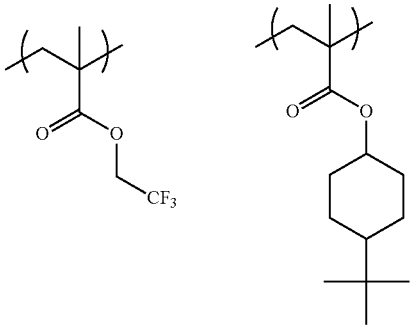
(HR-20)
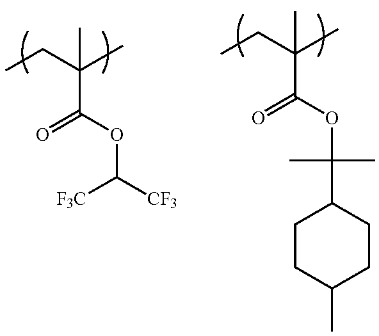
(HR-21)
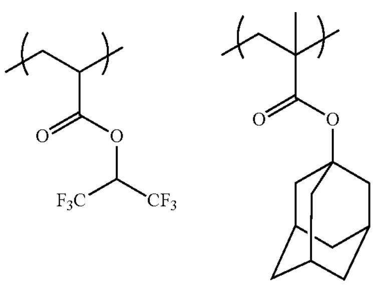
(HR-22)
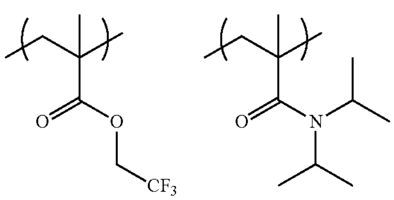
(HR-23)
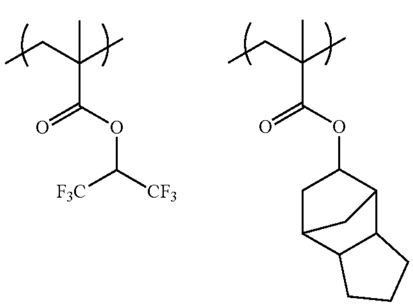
-continued
(HR-24)
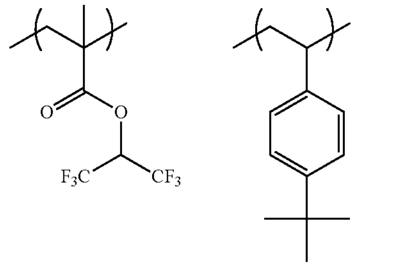
(HR-25)
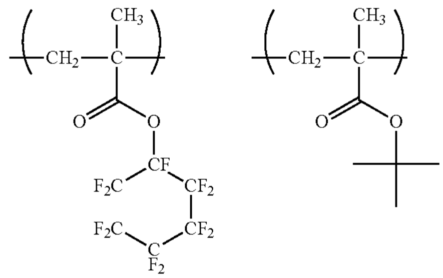
(HR-26)
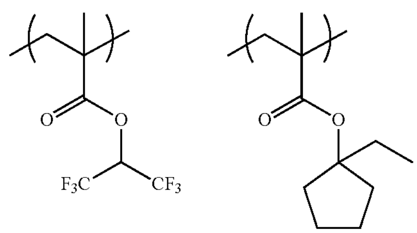
(HR-27)
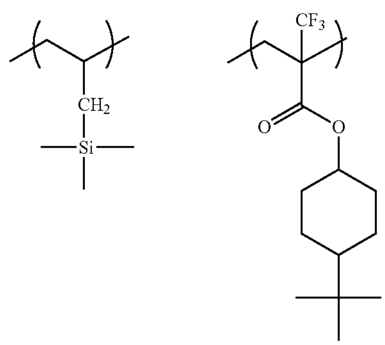
(HR-28)
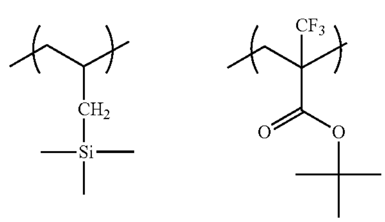
(HR-29)
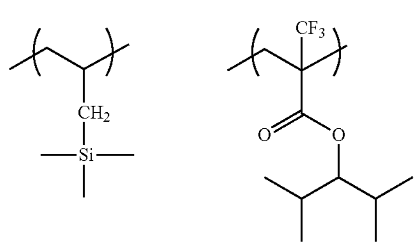

-continued
(HR-30)
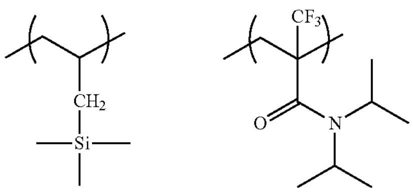
(HR-31)
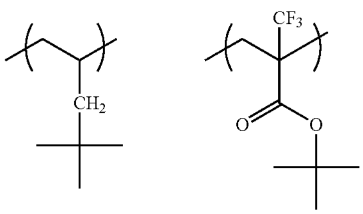
(HR-32)
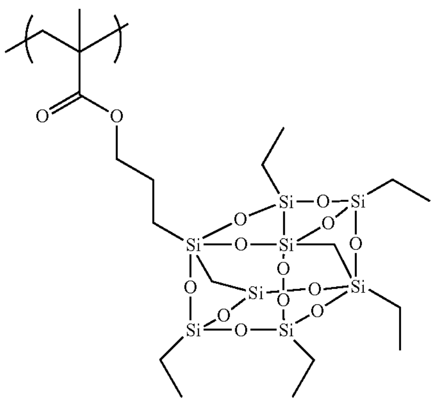
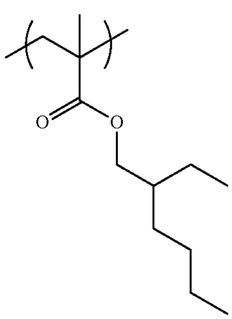
(HR-33)
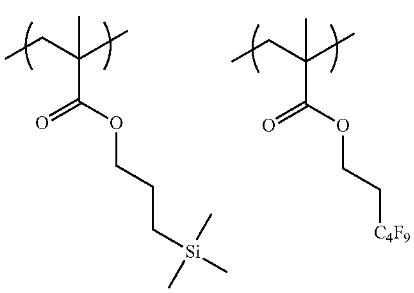
-continued
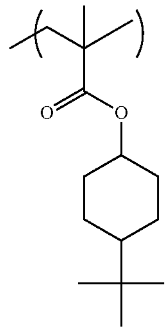
(HR-34)
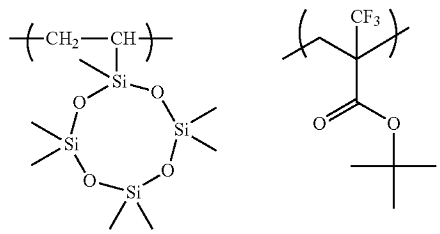
(HR-35)
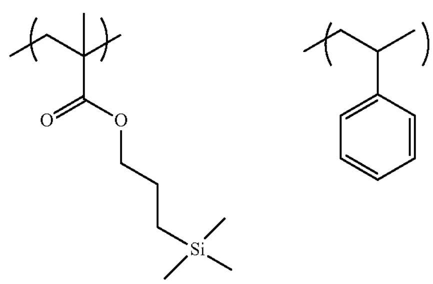
(HR-36)
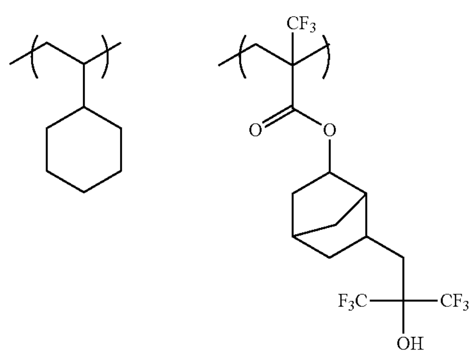
(HR-37)
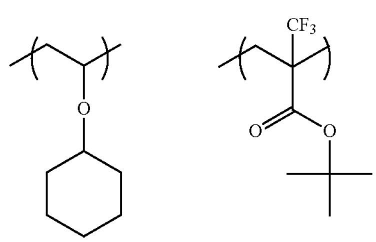

-continued
(HR-38)
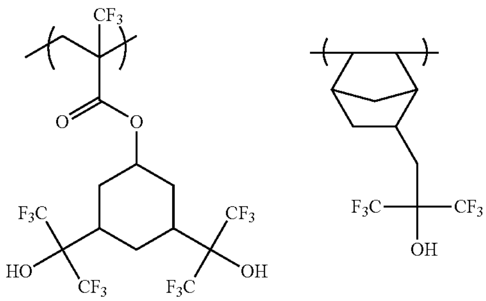
(HR-39)
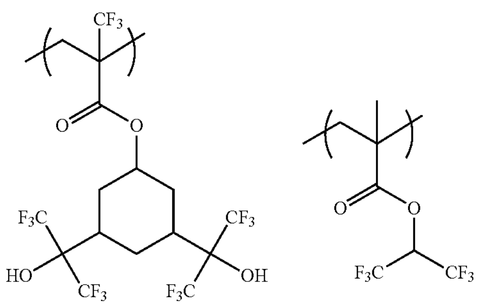
(HR-40)
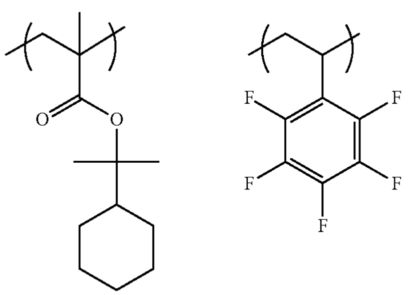
(HR-41)
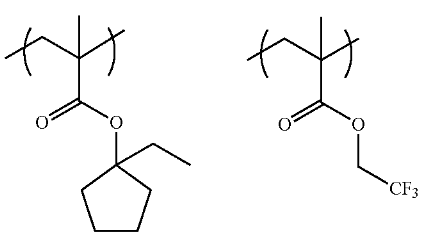
(HR-42)
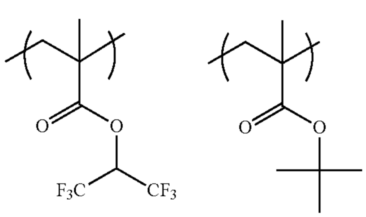
-continued
(HR-43)
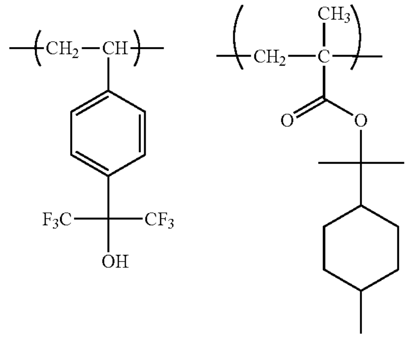
(HR-44)
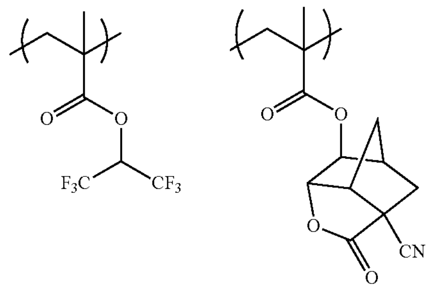
(HR-45)
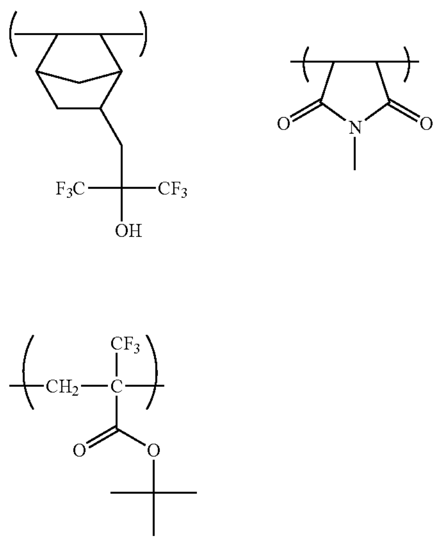
(HR-46)
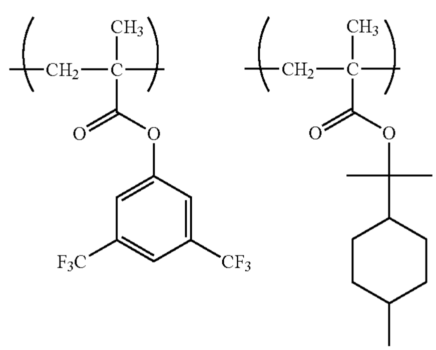

-continued
(HR-47)
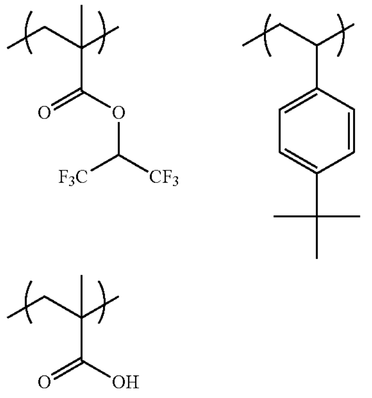
(HR-48)
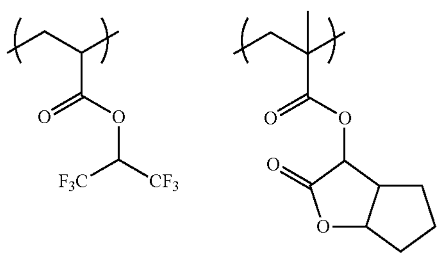
(HR-49)
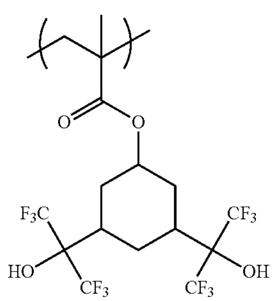
(HR-50)
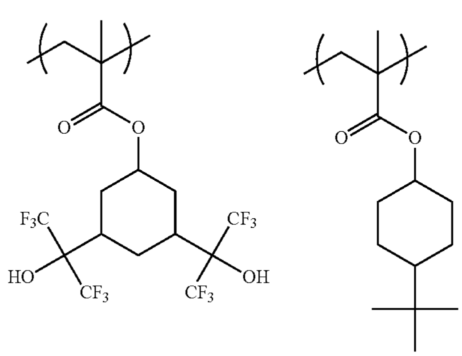
-continued
(HR-51)
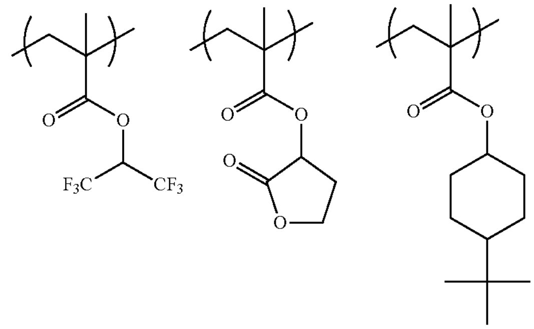
(HR-52)
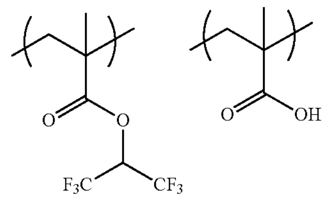
(HR-53)
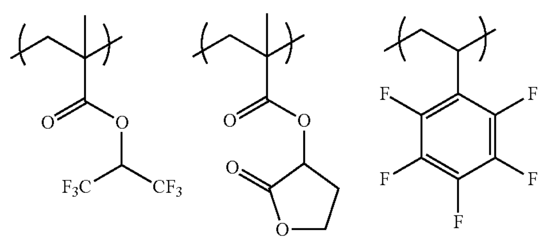
(HR-54)
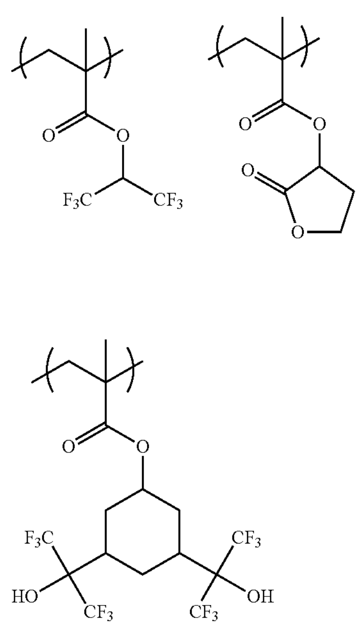

-continued
(HR-55)
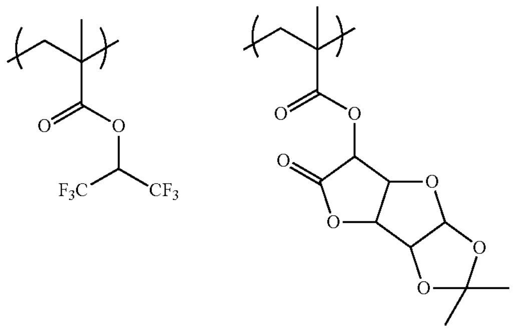
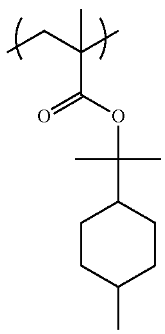
(HR-56)
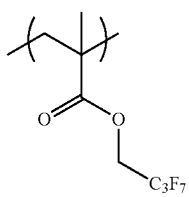
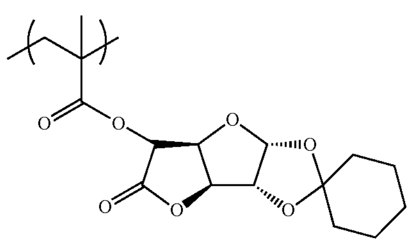
(HR-57)
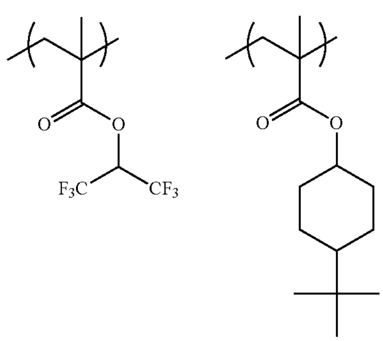
-continued
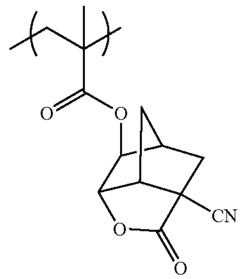
(HR-58)
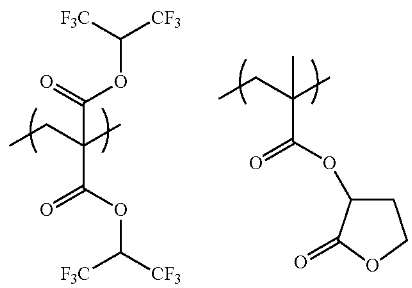
(HR-59)
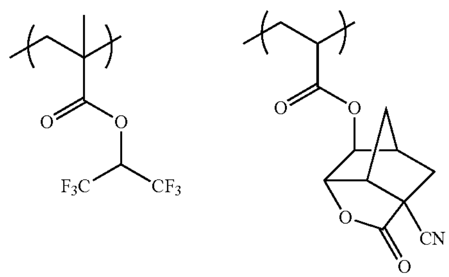
(HR-60)
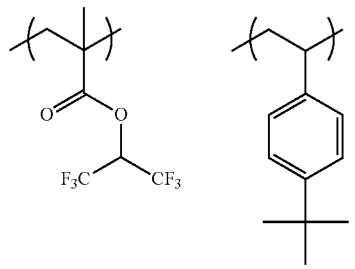
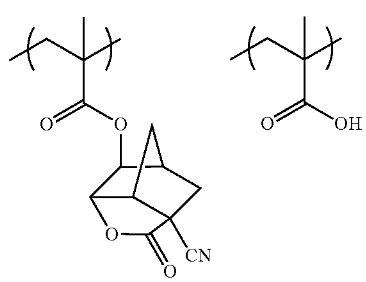

-continued (HR-61)

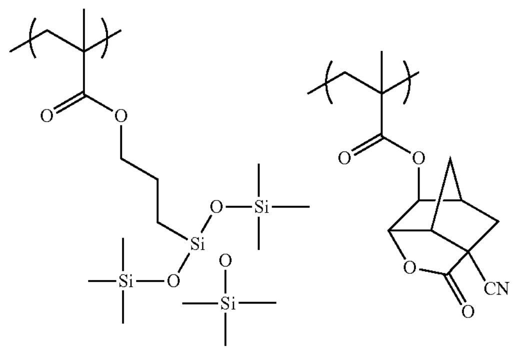

(HR-62)

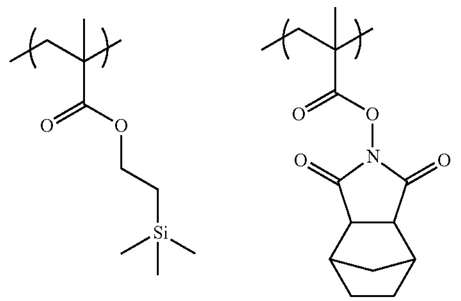

(HR-63)

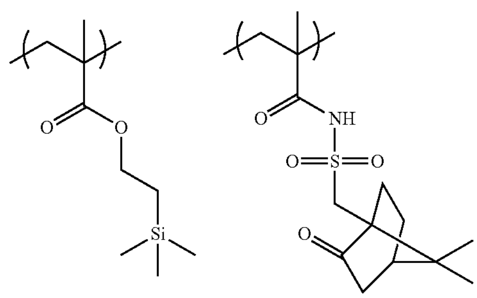

(HR-64)

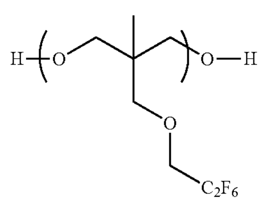

(HR-65)

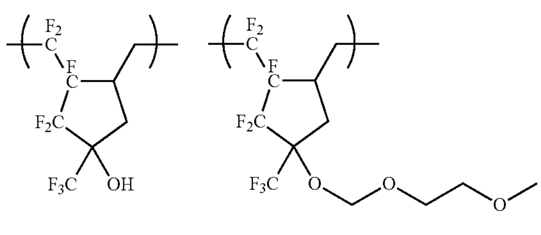

TABLE 2

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |

TABLE 2-continued

| Resin | Composition | Mw | Mw/Mn |
|---|---|---|---|
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

In the case where the hydrophobic resin contains a fluorine atom, the fluorine atom content is preferably from 5 to 80 mass %, more preferably from 10 to 80 mass %, based on the molecular weight of the hydrophobic resin. Also, the content of the fluorine atom-containing repeating unit is preferably from 10 to 100 mass %, more preferably from 30 to 100 mass %, based on all repeating units in the hydrophobic resin.

In the case where the hydrophobic resin contains a silicon atom, the silicon atom content is preferably from 2 to 50 mass %, more preferably from 2 to 30 mass %, based on the molecular weight of the hydrophobic resin. Also, the content of the silicon atom-containing repeating unit is preferably from 10 to 100 mol %, more preferably from 20 to 100 mol %, based on all repeating units in the hydrophobic resin.

The weight average molecular weight of the hydrophobic resin is preferably from 1,000 to 100,000, more preferably from 1,000 to 50,000, still more preferably from 2,000 to 15,000.

The polydispersity of the hydrophobic resin is preferably from 1 to 5, more preferably from 1 to 3, still more preferably from 1 to 2. Within this range, more excellent resolution, resist profile and roughness characteristics can be achieved.

One kind of a hydrophobic resin may be used alone, or two or more kinds of hydrophobic resins may be used in combination.

The content of the hydrophobic resin is preferably from 0.01 to 10 mass %, more preferably from 0.05 to 8 mass %, still more preferably from 0.1 to 5 mass %, based on the entire solid content of the composition.

As for the hydrophobic resin, a commercially available product may be used or a resin synthesized by a conventional method may be used. Examples of the general synthesis method of this resin include the same methods described above for the resin (A).

In the hydrophobic resin, it is of course preferred that the content of impurities such as metal is small, and in addition, the amount of residual monomers or oligomer components is also preferably from 0 to 10 mass %, more preferably from 0 to 5 mass %, still more preferably from 0 to 1 mass %. When these conditions are satisfied, the amount of extraneous substances in liquid and the change with aging of sensitivity or the like can be reduced.

[7] (F) Surfactant

The actinic ray-sensitive or radiation-sensitive resin composition of the present invention may further contain a surfactant and in the case of containing a surfactant, it is preferred to contain any one fluorine-containing and/or silicon-containing surfactant (a fluorine-containing surfactant, a silicon-containing surfactant or a surfactant containing both a fluorine atom and a silicon atom), or two or more kinds thereof.

When the composition of the present invention contains the surfactant above, a resist pattern with good sensitivity, resolution and adherence as well as little development defect can be obtained in using an exposure light source of 250 nm or less, particularly 220 nm or less.

Examples of the fluorine-containing and/or silicon-containing surfactant include the surfactants described in paragraph [0276] of U.S. Patent Application Publication 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate or methacrylate and/or a (poly(oxyalkylene)) methacrylate, and the polymer may have an irregular distribution or may be a block copolymer.

Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene).

Furthermore, the copolymer of a fluoro-aliphatic group-containing monomer and a (poly(oxyalkylene)) acrylate or methacrylate may be a ternary or higher copolymer obtained by simultaneously copolymerizing, for example, two or more different fluoro-aliphatic group-containing monomers or two or more different (poly(oxyalkylene)) acrylates or methacrylates.

Examples of this type of surfactant include Megaface F178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate or methacrylate with a (poly(oxyalkylene)) acrylate or methacrylate, and a copolymer of a $C_8F_{17}$ group-containing acrylate or methacrylate with a (poly(oxyethylene)) acrylate or methacrylate and a (poly(oxypropylene)) acrylate or methacrylate.

In the present invention, a surfactant other than the fluorine-containing and/or silicon-containing surfactant, described in paragraph [0280] of U.S. Patent Application Publication 2008/0248425, may also be used.

One of these surfactants may be used alone, or some of them may be used in combination.

In the case where the actinic ray-sensitive or radiation-sensitive resin composition contains a surfactant, the amount of the surfactant used is preferably from 0 to 2 mass %, more preferably from 0.0001 to 2 mass %, more preferably from 0.0005 to 1 mass %, based on the entire amount of the composition (excluding the solvent).

On the other hand, by setting the amount added of the surfactant to 10 ppm or less based on the entire amount of the actinic ray-sensitive or radiation-sensitive resin composition (excluding the solvent), the hydrophobic resin is more unevenly distributed to the surface, so that the resist film surface can be made more hydrophobic and the followability of water at the immersion exposure can be enhanced.

[8] (H) Compound Having Basicity or being Capable of Increasing the Basicity by the Action of an Acid, Except for the Compound (G)

The actinic ray-sensitive or radiation-sensitive resin composition of the present invention may contain a compound having basicity or being capable of increasing the basicity by the action of an acid, except for the compound (G) (that is, containing neither a fluorine atom nor a silicon atom), so as to reduce the change in performance with aging from exposure to heating.

Specific examples of the compound having basicity (basic compound) include a basic compound having a structure represented by the following formulae (A) to (E):

(A)
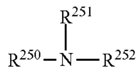
(B)
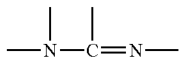
(C)
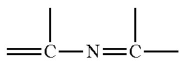
(D)
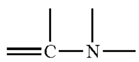
(E)
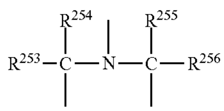

In formulae (A) and (E), each of $R^{250}$, $R_{251}$ and $R^{252}$ independently represents a hydrogen atom, an alkyl group, a cycloalkyl group, an aryl group or a heteroaryl group.

Each of $R^{253}$, $R^{254}$, $R^{255}$ and $R^{256}$ independently represents an alkyl group or a cycloalkyl group.

In the structure represented by formula (A), $R^{251}$ and $R^{252}$ may combine with each other to form a ring.

In the structures represented by formulae (B) to (D), two or more out of the bonds from the carbon atom and the bonds from the nitrogen atom may combine with each other to form a ring.

In the structure represented by formula (E), two or more out of $R^{253}$, $R^{254}$, $R^{255}$, $R^{256}$, the bonds from the carbon atom and the bonds from the nitrogen atom may combine with each other to form a ring.

Specific examples of $R^{251}$ and $R^{252}$ in formula (A) are the same as the definition and specific examples of $R^{201}$ and $R^{202}$ in the structure represented by formula (A) described above for the compound (G-1).

Specific examples of $R^{253}$, $R^{254}$, $R^{255}$ and $R^{256}$ in formula (E) are the same as specific examples of $R^{203}$, $R^{204}$, $R^{205}$ and $R^{206}$ in the structure represented by formula (A) described above for the compound (G-1).

In the structures represented by formulae (A) to (E), specific examples of the ring which may be formed by two or more members out of the groups and bonds are the same as those described in the compound (G-1).

In the structures represented by formulae (A) to (E), the groups and the rings which may be formed by combining together two or more members out of the groups and bonds may further have a substituent, and specific examples of the substituent are the same as specific examples of the substituent which $R^{201}$ and $R^{202}$ may further have, described for the structure represented by formula (A) of the compound (G-1).

The alkyl having a substituent or the cycloalkyl group having a substituent as $R^{250}$ to $R^{256}$ is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups may contain an oxygen atom, a sulfur atom or a nitrogen atom in the alkyl chain.

Preferred examples of the basic compound include guanidine, aminopyrrolidine, pyrazole, pyrazoline, piperazine, aminomorpholine, aminoalkylmorpholine and piperidine, and these may have a substituent. More preferred examples of the compound include a compound having an imidazole structure, a diazabicyclo structure, an onium hydroxide structure (particularly preferably a tetraalkylammonium hydroxide such as tetrabutylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, the compound may be at least one kind of a nitrogen-containing compound selected from the group consisting of a phenoxy group-containing amine compound, a phenoxy group-containing ammonium salt compound, a sulfonic acid ester group-containing amine compound and a sulfonic acid ester group-containing ammonium salt compound. Examples of these compounds include, but are not limited to, Compounds (C1-1) to (C3-3) illustrated in paragraph [0066] of U.S. Patent Application Publication 2007/0224539.

The compound capable of increasing the basicity by the action of an acid includes, for example, a compound represented by the following formula (F). Incidentally, the compound represented by the following formula (F) exhibits an effective basicity in the system as a result of elimination of the group capable of leaving by the action of an acid.

(F)
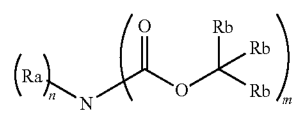

In formula (F), each Ra independently represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom (excluding a fluorine atom).

Examples of the alkyl group, cycloalkyl group, aryl group and aralkyl group (each of these alkyl, cycloalkyl, aryl and aralkyl groups may be substituted with the above-described functional group, an alkoxy group or a halogen atom (excluding a fluorine atom)) of R include:

a group derived from a linear or branched alkane such as methane, ethane, propane, butane, pentane, hexane, heptane, octane, nonane, decane, undecane and dodecane, or a group where the group derived from such an alkane is substituted with one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from such a cycloalkane is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from such an aromatic compound is substituted with one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from such a heterocyclic compound is substituted with one or more kinds of or one or more groups of linear or branched alkyl groups or aromatic compound-derived groups; a group where the group derived from a linear or branched alkane or the group derived from a cycloalkane is substituted with one or more kinds of or one or more groups of aromatic compound-derived groups such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from such a heterocyclic compound is substituted with one or more kinds of or one or more groups of linear or branched alkane-derived groups, cycloalkane-derived groups, aromatic compound-derived groups, heterocyclic compound-derived groups and functional groups such as hydroxyl group, cyano group, amino group, pyrrolidino group, piperidino group, morpholino group and oxo group.

Specific examples particularly preferred in the present invention include N-tert-butoxycarbonyldi-n-octylamine, N-tert-butoxycarbonyldi-n-nonylamine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adarnantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

As for the compound represented by formula (F), a commercial product may be used, or the compound may be synthesized from a commercially available amine by the method described, for example, in *Protective Groups in Organic Synthesis,* 4th edition. A most general method is a method of causing a dicarbonic acid ester or a haloformic acid ester to act on a commercially available amine to obtain the compound. In the formulae, X represents a halogen atom, and Ra and Rb have the same meanings as in formula (F).

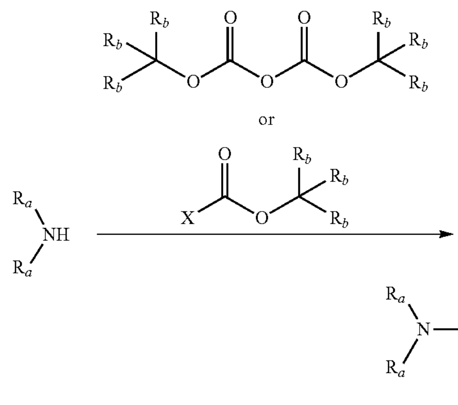

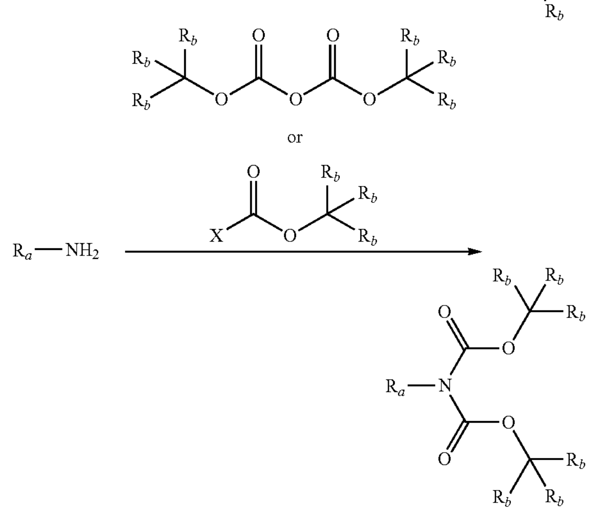

The molecular weight of the (H) compound having basicity or being capable of increasing the basicity by the action of an acid, except for the compound (G), is preferably from 250 to 2,000, more preferably from 400 to 1,000.

One of these compounds (H) is used alone, or two or more thereof are used.

In the case of containing the compound (H), the content thereof is preferably from 0.05 to 8.0 mass %, more preferably from 0.05 to 5.0 mass %, still more preferably from 0.05 to 4.0 mass %, based on the entire solid content of the resist composition.

[9] Basic Compound or Ammonium Salt Compound Whose Basicity Decreases Upon Irradiation with an Actinic Ray or Radiation The actinic ray-sensitive or radiation-sensitive resin composition of the present invention may contain a basic compound or ammonium salt compound whose basicity decreases upon irradiation with an actinic ray or radiation (hereinafter sometimes referred to as a "compound (PA)"). That is, the compound (PA) accompanies a change in the chemical structure upon irradiation with an actinic ray or radiation and has photosensitivity.

The compound (PA) is preferably (PA') a compound having a basic functional group or an ammonium group and a group capable of generating an acidic functional group upon irradiation with an actinic ray or radiation. That is, the compound (PA) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated due to decomposition of the compound (PA) or (PA') upon irradiation with an actinic ray or radiation and decreased in the basicity includes compounds represented by the following formulae (PA-I), (PA-II) and (PA-III), and from the standpoint that excellent effects can be attained in a high level in terms of both LWR and DOF, compounds represented by formulae (PA-II) and (PA-III) are preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents —$SO_3H$ or —$CO_2H$. Q corresponds to an acidic functional group that is generated upon irradiation with an actinic ray or radiation.

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of $A_1$ is preferably a divalent linking group having a carbon number of 2 to 12; and examples thereof include an alkylene group and a phenylene group. An alkylene group having at least one fluorine atom is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably perfluoroethylene group, perfluoropropylene group or perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes a group where a cycloalkyl group is substituted particularly on a linear or branched alkyl group (for example, an adamantylmethyl group, an adamantylethyl group, a cyclohexylethyl group and a camphor residue).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and includes, for example, a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. In these structures, from the standpoint of enhancing the basicity, it is preferred that all atoms adjacent to a nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to the nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. These groups each may have a substituent.

The alkyl group, cycloalkyl group, aryl group, aralkyl group and alkenyl group in the basic functional group- or ammonium group-containing alkyl, cycloalkyl, aryl, aralkyl and alkenyl groups of R are the same as the alkyl group, cycloalkyl group, aryl group, aralkyl group and alkenyl group described for Rx.

Examples of the substituent which the groups above each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, the substituent further includes an alkyl group (preferably having a carbon number of 1 to 20, more preferably a carbon number of 1 to 10). As for the aminoacyl group, the substituent further includes one or two alkyl groups (preferably having a carbon number of 1 to 20, more preferably a carbon number of 1 to 10). Examples of the alkyl group having a substituent include a perfluoroalkyl group such as perfluoromethyl group, perfluoroethyl group, perfluoropropyl group and perfluorobutyl group.

In the case where B is —N(Rx)-, R and Rx preferably combine together to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed of a combination of two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, the substituent further includes an alkyl group (preferably having a carbon number of 1 to 15). As for the aminoacyl group, the substituent includes one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

The compound represented by formula (PA-II) is described below.

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ combine together to form a ring and the ring formed has a basic functional group.

Each of $X_1$ and $X_2$ independently represents —CO— or —$SO_2$—.

Here, —NH— corresponds to the acidic functional group generated upon irradiation with an actinic ray or radiation.

The monovalent organic group as $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group in $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group in $Q_1$ and $Q_2$ may have a substituent and is preferably a cycloalkyl group having a carbon number of 3 to 20, and the ring may contain an oxygen atom or a nitrogen atom.

The aryl group in $Q_1$ and $Q_2$ may have a substituent and is preferably an aryl group having a carbon number of 6 to 14.

The aralkyl group in $Q_1$ and $Q_2$ may have a substituent and is preferably an aralkyl group having a carbon number of 7 to 20.

The alkenyl group in $Q_1$ and $Q_2$ may have a substituent and includes a group having a double bond at an arbitrary position of the alkyl group above.

Examples of the substituent which these groups each may have include the same groups as exemplified above as the substituent which the groups in formula (PA-I) each may have.

Preferred partial structures of the basic functional group which at least either $Q_1$ or $Q_2$ has are the same as those of the basic functional group in R of formula (PA-I).

In the case where $Q_1$ and $Q_2$ combine together to form a ring and the ring formed has a basic functional group, examples of the structure thereof include a structure where the organic group of $Q_1$ or $Q_2$ is further bonded with an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ combine together to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

In the case where B is —N(Qx)-, $Q_3$ and Qx may combine together to form a ring.

m represents 0 or 1.

Here, —NH— corresponds to the acidic functional group generated upon irradiation with an actinic ray or radiation.

$Q_1$ has the same meaning as $Q_1$ in formula (PA-II).

Examples of the organic group of Q are the same as those of the organic group of $Q_1$ and $Q_2$ in formula (PA-II).

The divalent linking group in $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group having a carbon number of 2 to 4.

The monovalent organic group in Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

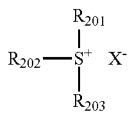

(PA2)

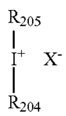

In formula (PA1), each of $R_{201}$, $R_{202}$ and $R_{203}$ independently represents an organic group, and specific examples thereof are the same as those for $R_{201}$, $R_{202}$ and $R_{203}$ of formula ZI in the acid generator above.

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH-moiety of the compound represented by formula (PA-II) or (PA-III).

In formula (PA2), each of $R_{204}$ and $R_{205}$ independently represents an aryl group, an alkyl group or a cycloalkyl group, and specific examples thereof are the same as those for $R_{204}$ and $R_{205}$ of formula ZII in the acid generator above.

$X^-$ represents a sulfonate or carboxylate anion resulting from elimination of a hydrogen atom in the —$SO_3H$ moiety or —COOH moiety of the compound represented by formula (PA-I), or an anion resulting from elimination of a hydrogen atom in the —NH-moiety of the compound represented by formula (PA-II) or (PA-III).

The compound (PA) decomposes upon irradiation with an actinic ray or radiation to generate, for example, a compound represented by formula (PA-I), (PA-II) or (PA-III).

The compound represented by formula (PA-I) is a compound having a sulfonic or carboxylic acid group together with a basic functional group or an ammonium group and thereby being reduced in or deprived of the basicity or changed from basic to acidic as compared with the compound (PA).

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (PA).

In the present invention, the expression "reduced in the basicity upon irradiation with an actinic ray or radiation" means that the acceptor property for a proton (an acid generated upon irradiation with an actinic ray or radiation) of the compound (PA) is decreased by the irradiation with an actinic ray or radiation. The expression "the acceptor property is decreased" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

In this way, a compound (PA) whose basicity decreases upon irradiation with an actinic ray or radiation is contained in the resist film, so that in the unexposed area, the acceptor property of the compound (PA) is sufficiently brought out and an unintended reaction between an acid diffused from the exposed area or the like and the resin (A) can be inhibited, whereas in the exposed area, the acceptor property of the compound (PA) decreases and the intended reaction of an acid with the resin (A) unfailingly occurs. Such an operation mechanism is considered to contribute to obtaining a pattern excellent in terms of line width variation (LWR), focus latitude (DOF) and pattern profile.

Incidentally, the basicity can be confirmed by measuring the pH, or a calculated value can be computed using a commercially available software.

Specific examples of the compound (PA) whose basicity decreases upon irradiation with an actinic ray or radiation include those described in JP-A-2006-208781 and JP-A-2006-330098.

Specific examples of the compound (PA) capable of generating a compound represented by formula (PA-I) upon irradiation with an actinic ray or radiation are illustrated below, but the present invention is not limited thereto.

(PA-1)

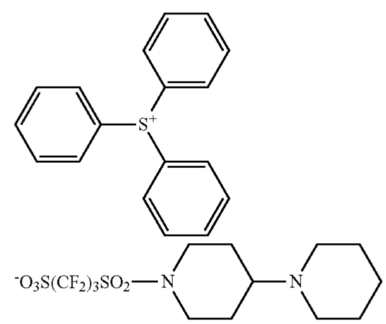

(PA-2)

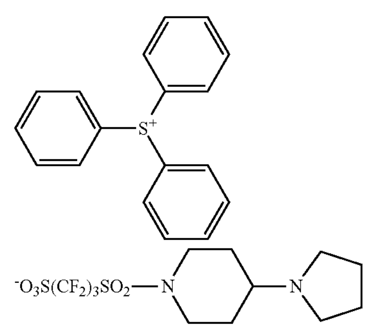

(PA-3)

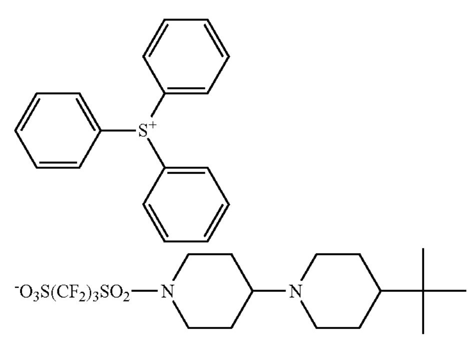

-continued
(PA-4)
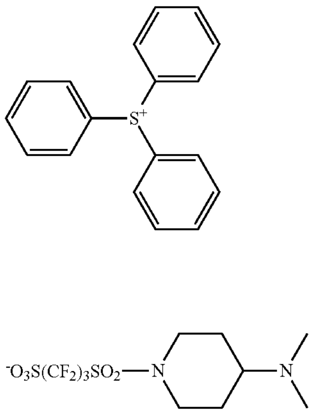
(PA-5)
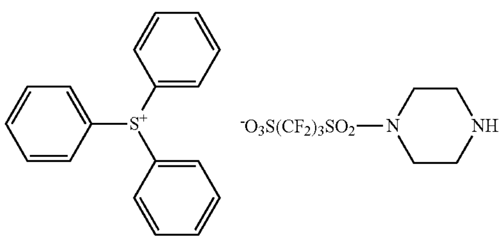
(PA-6)
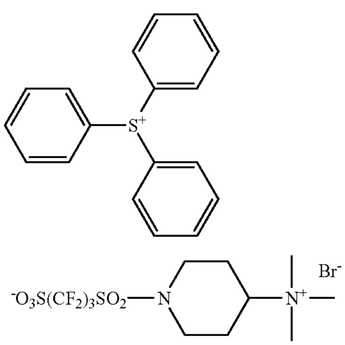
(PA-7)
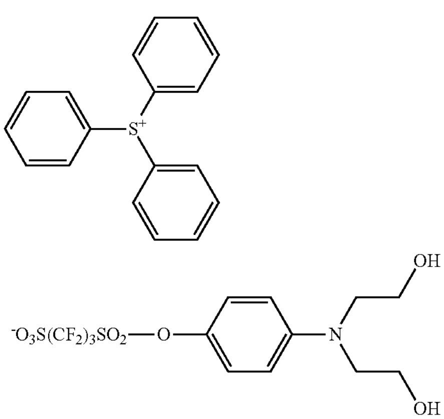
-continued
(PA-8)
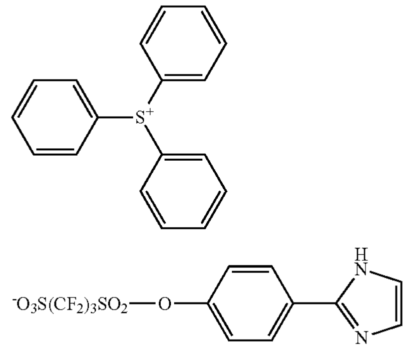
(PA-9)
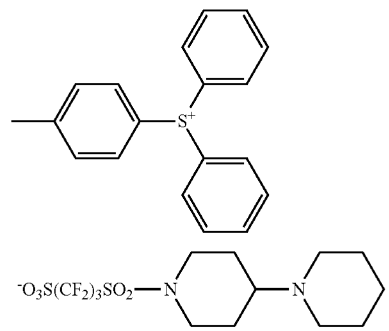
(PA-10)
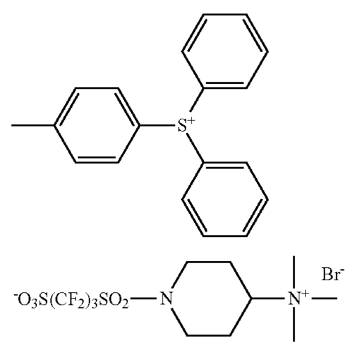
(PA-11)
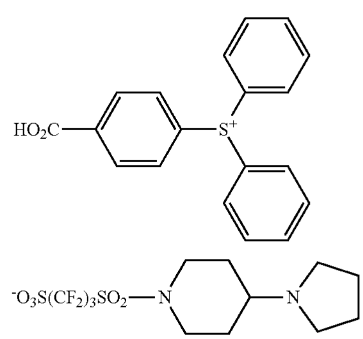

-continued
(PA-12)
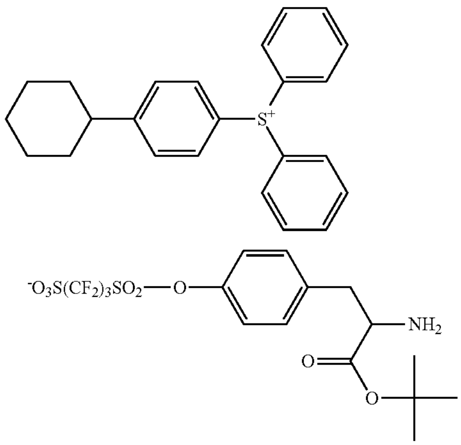
(PA-13)
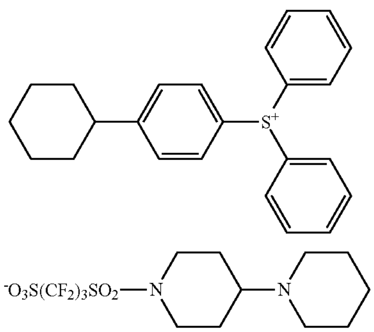
(PA-14)
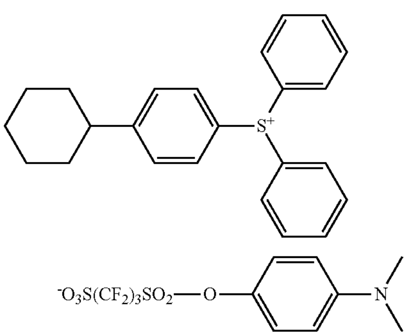
(PA-15)
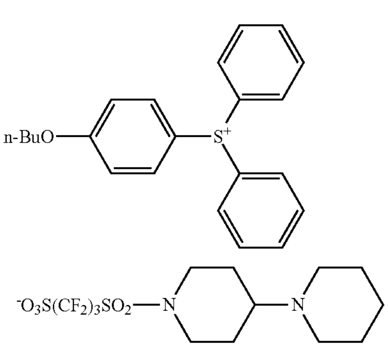
-continued
(PA-16)
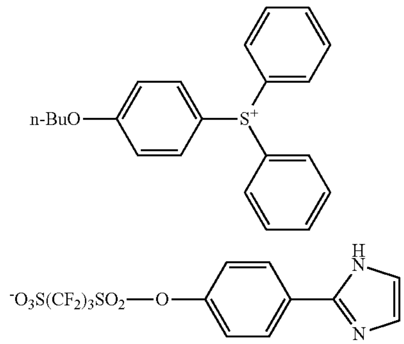
(PA-17)
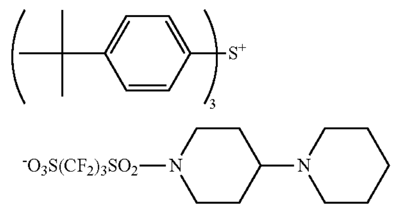
(PA-18)
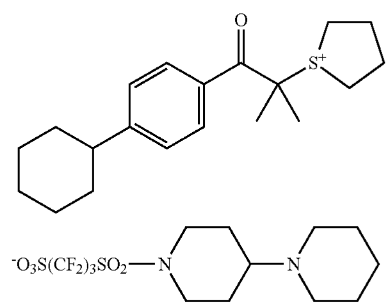
(PA-21)
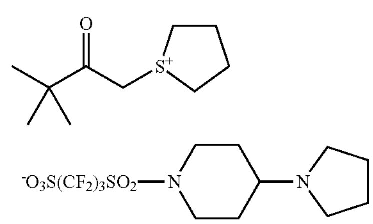
(PA-22)
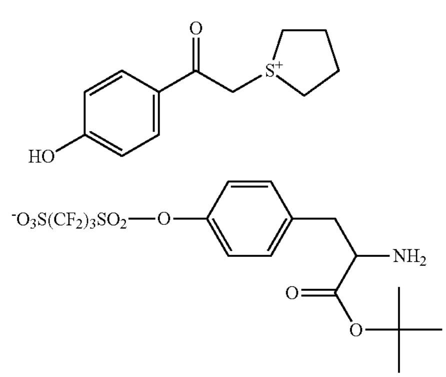

-continued
(PA-23)
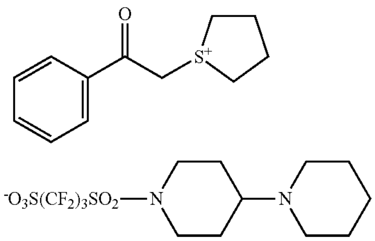
(PA-24)
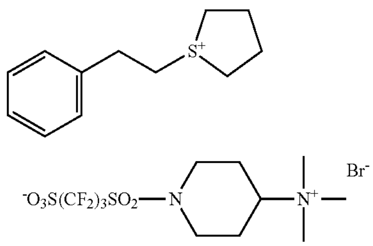
(PA-25)
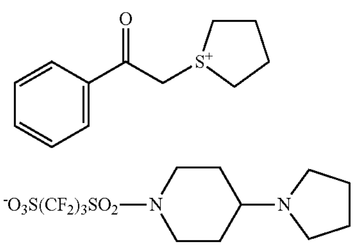
(PA-26)
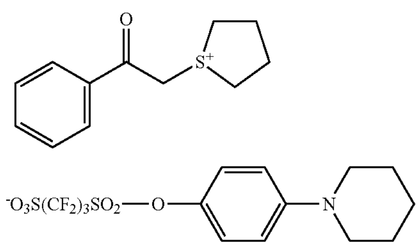
(PA-27)
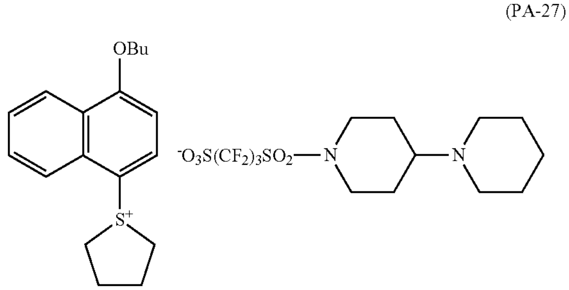
(PA-28)
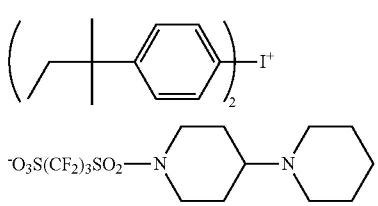
-continued
(PA-29)
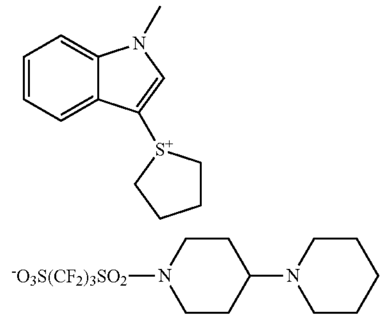
(PA-30)
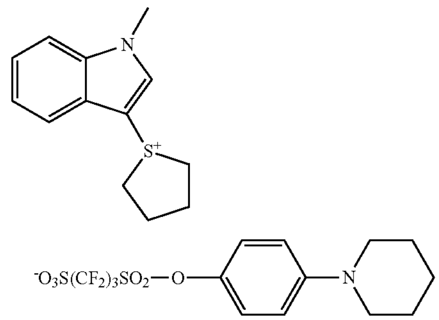
(PA-31)
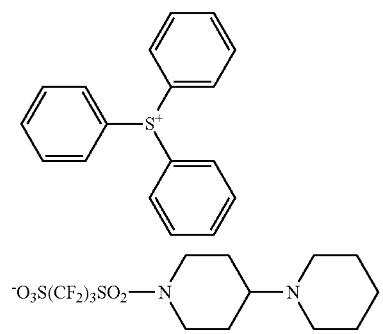
(PA-32)
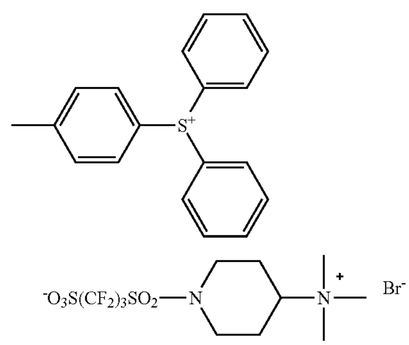
(PA-33)
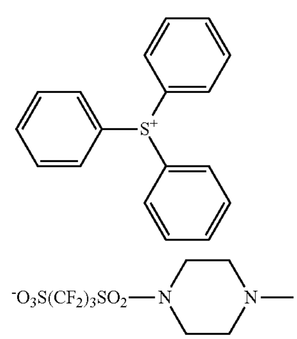

-continued
(PA-34)
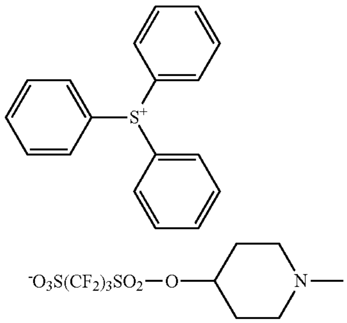
(PA-35)
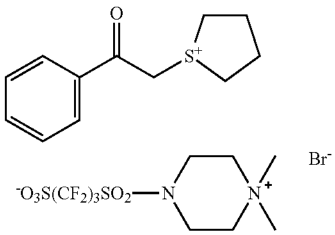
(PA-36)
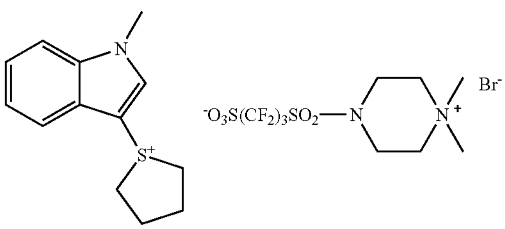
(PA-37)
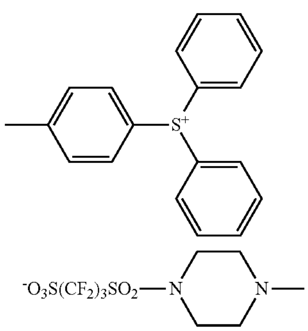
(PA-38)
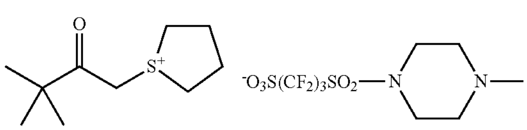
(PA-39)
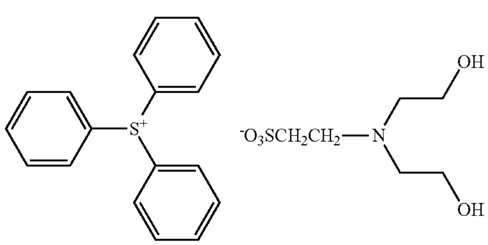
-continued
(PA-40)
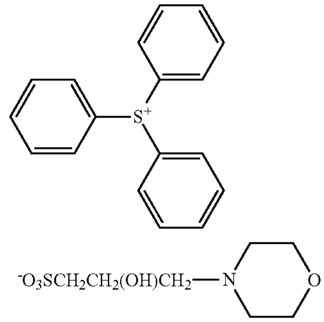
(PA-41)
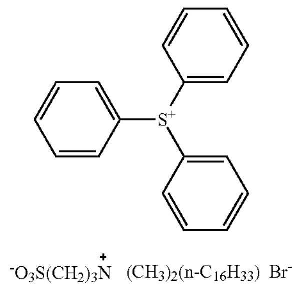
(PA-42)
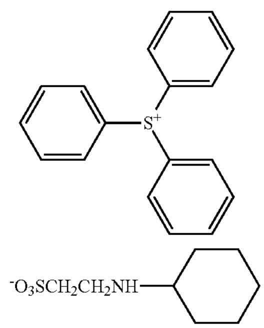
(PA-43)
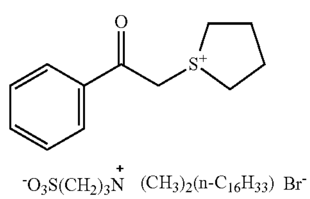
(PA-44)
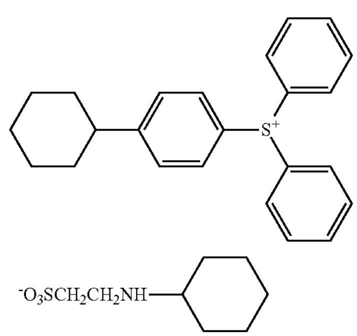

-continued
(PA-45)
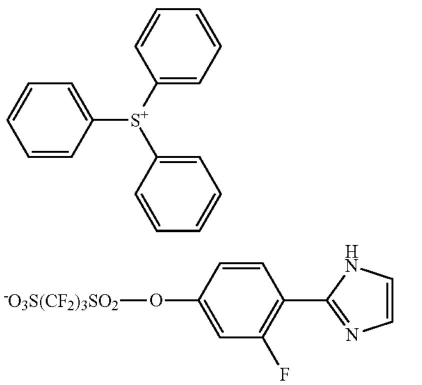
(PA-46)
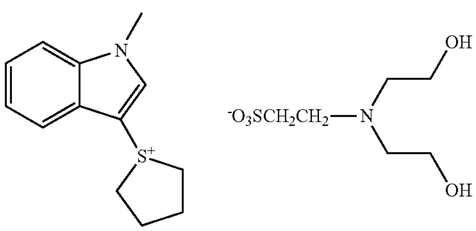
(PA-47)
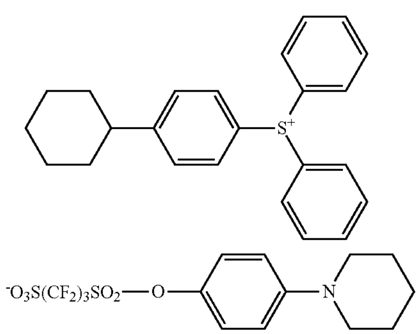
(PA-48)
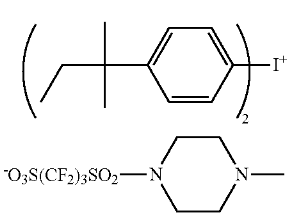
-continued
(PA-49)
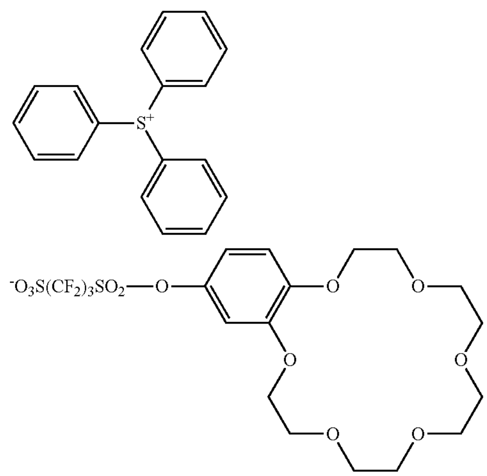
(PA-50)
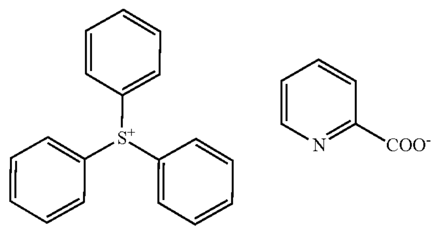
(PA-51)
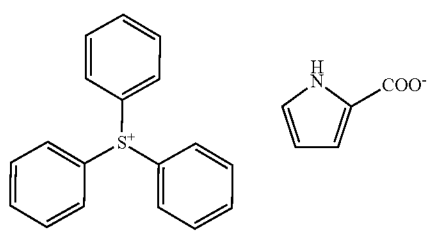
(PA-52)
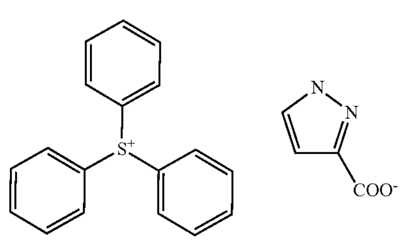
(PA-53)
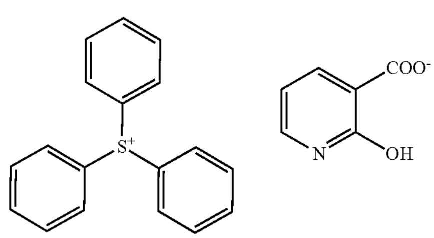

(PA-54)

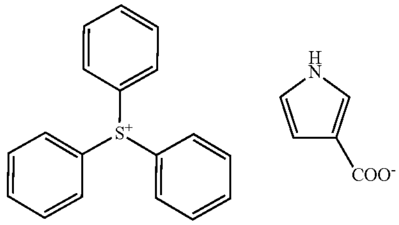

(PA-55)

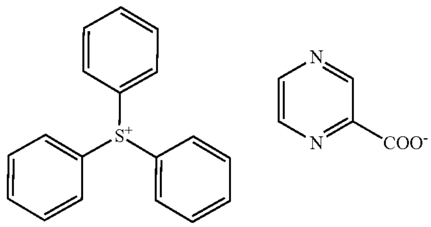

(PA-56)

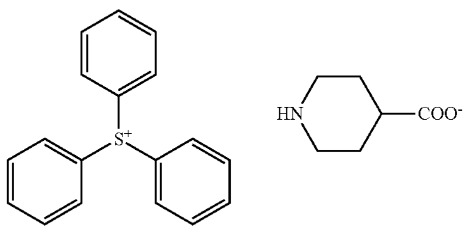

(PA-57)

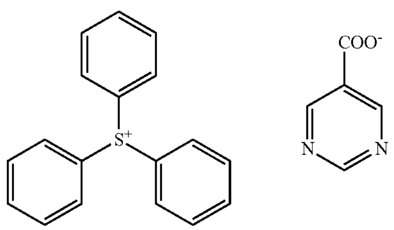

(PA-58)

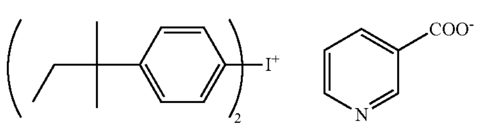

(PA-59)

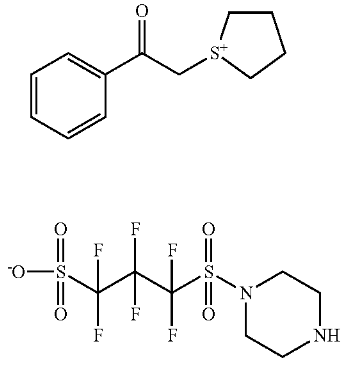

(PA-60)

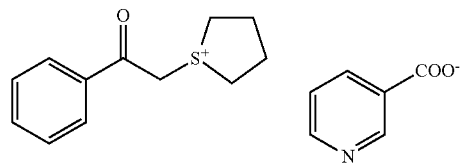

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may also be performed in accordance with the synthesis method described in JP-A-7-333851.

Specific examples of the compound (PA) capable of generating a compound represented by formula (PA-II) or (PA-III) upon irradiation with an actinic ray or radiation are illustrated below, but the present invention is not limited thereto.

(PA-61)

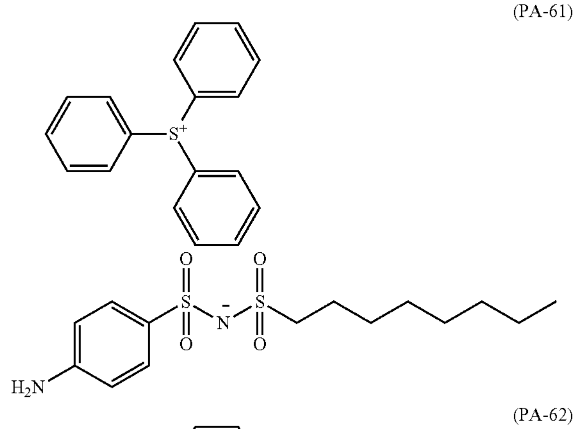

(PA-62)

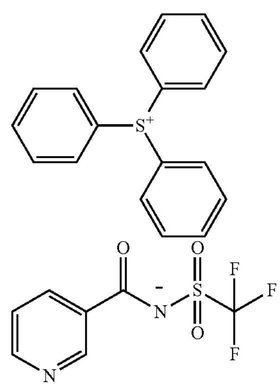

(PA-63)

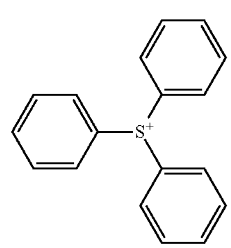

-continued
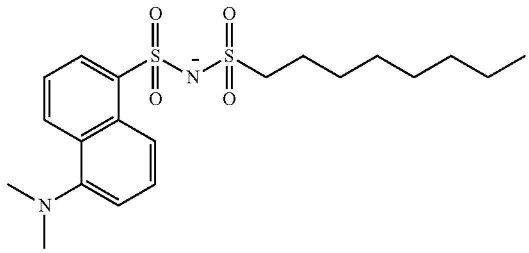
(PA-64)
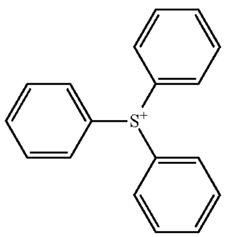
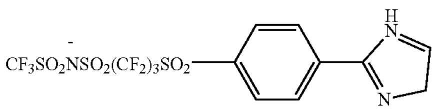
(PA-65)
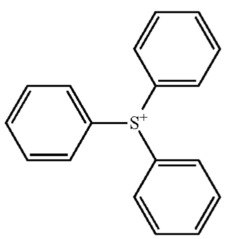
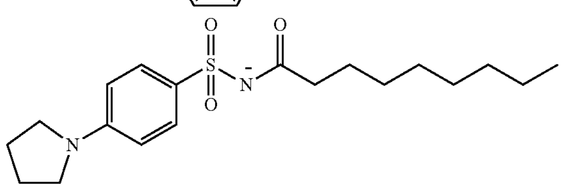
(PA-66)
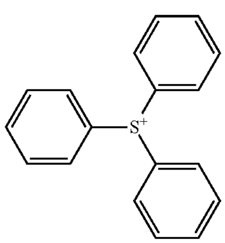
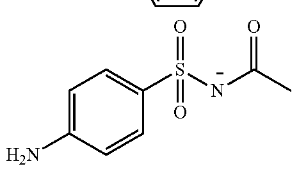
(PA-67)
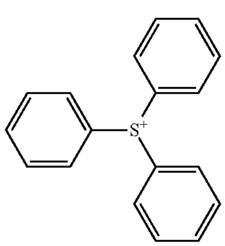
-continued
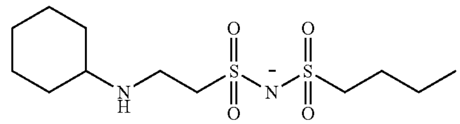
(PA-68)
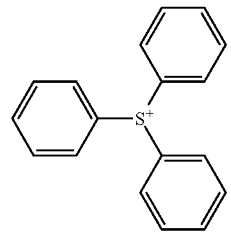
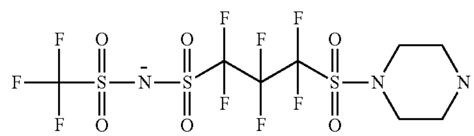
(PA-69)
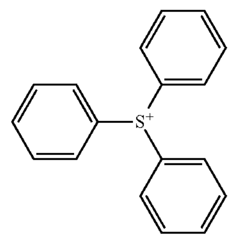
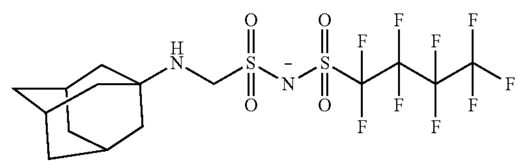
(PA-70)
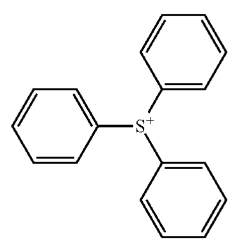
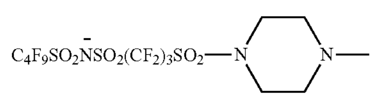
(PA-71)
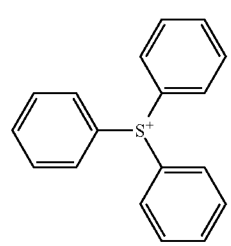
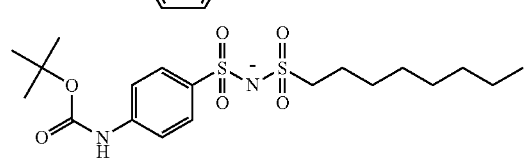

-continued
(PA-72)
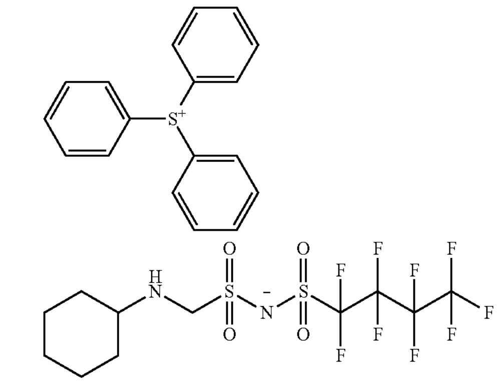
(PA-73)
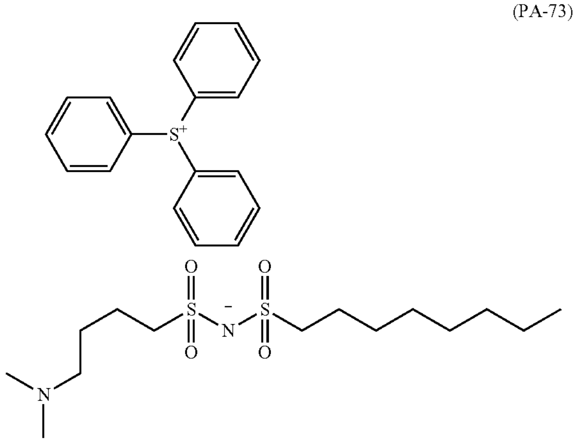
(PA-74)
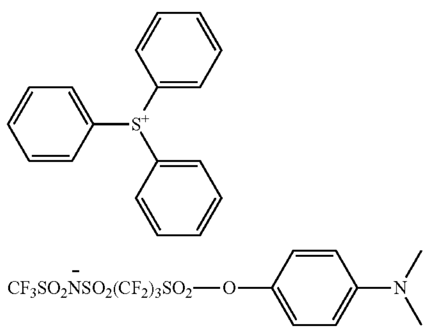
(PA-75)
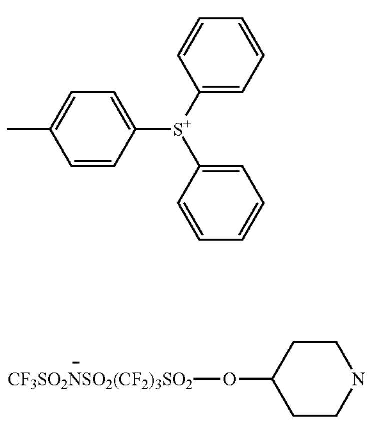
-continued
(PA-76)
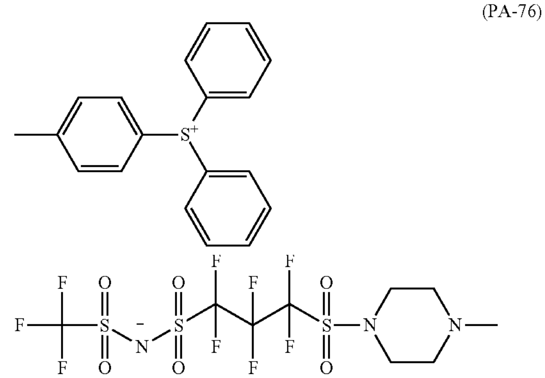
(PA-77)
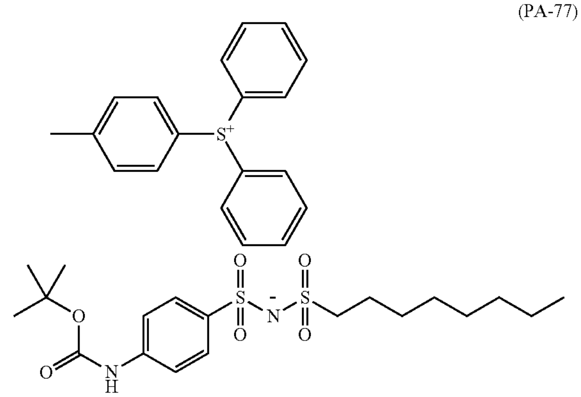
(PA-78)
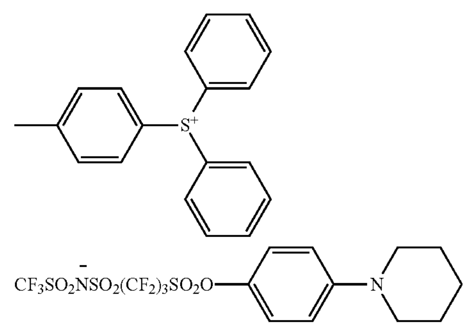
(PA-79)
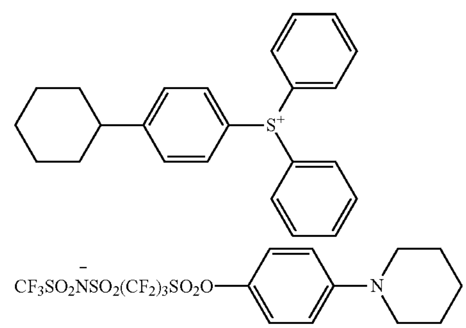
(PA-80)
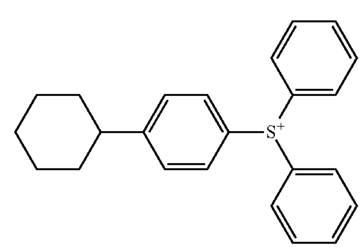

-continued
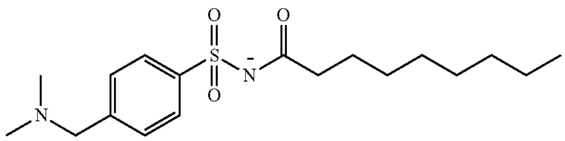
(PA-81)
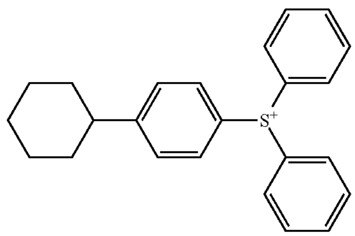
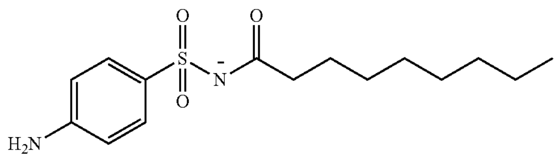
(PA-82)
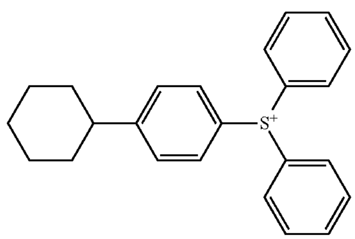
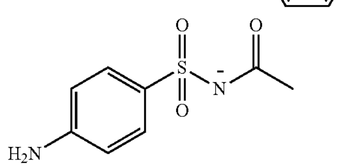
(PA-83)
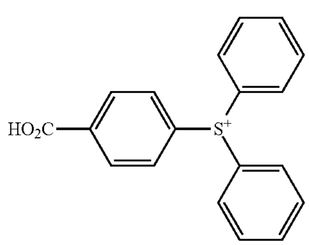
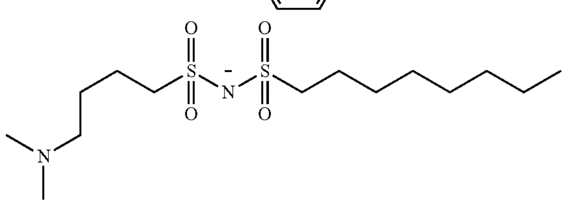
(PA-84)
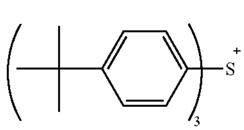
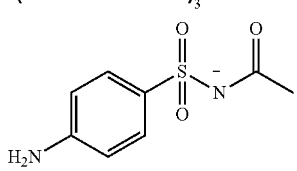
-continued
(PA-85)
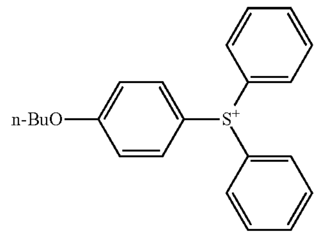
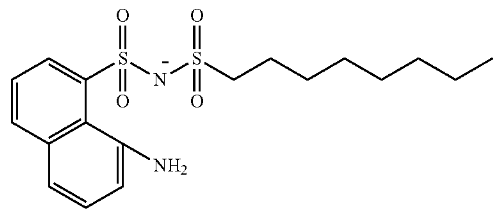
(PA-86)
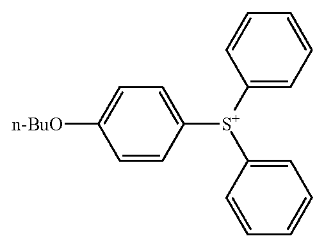
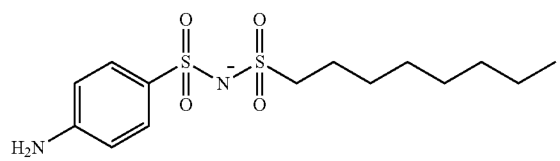
(PA-87)
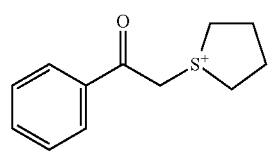
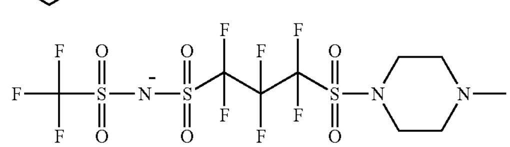
(PA-88)
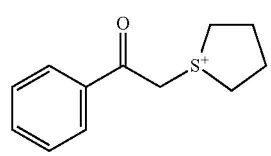
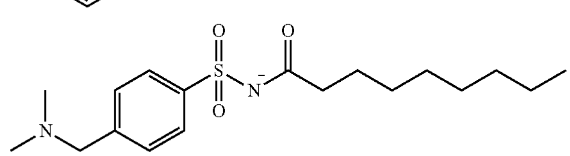
(PA-89)
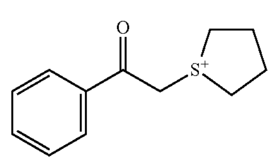

-continued
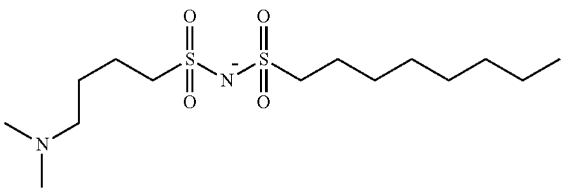
(PA-90)
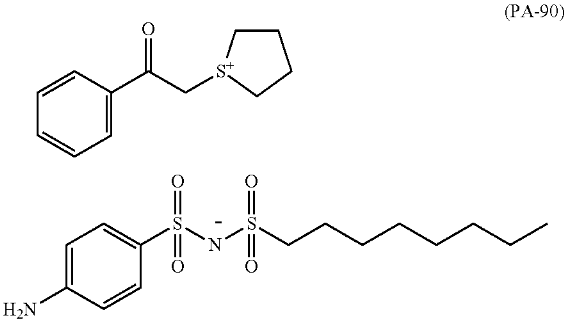
(PA-91)
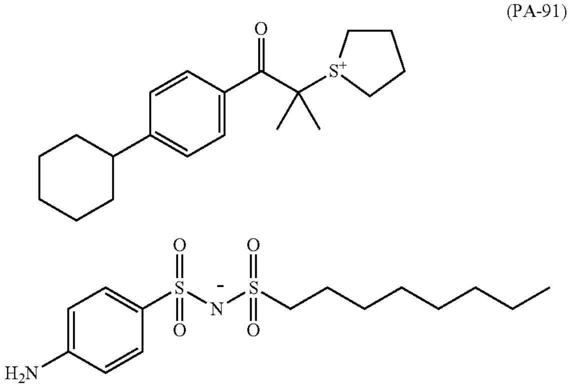
(PA-92)
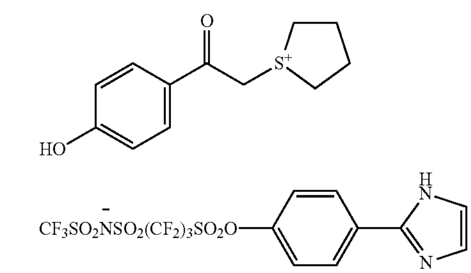
(PA-93)
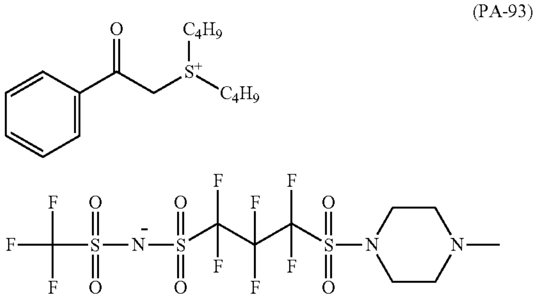
(PA-94)
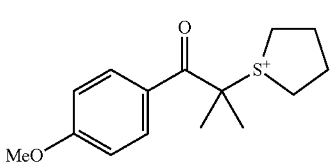
-continued
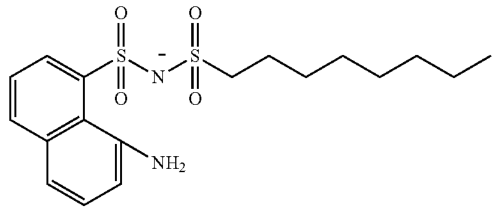
(PA-95)
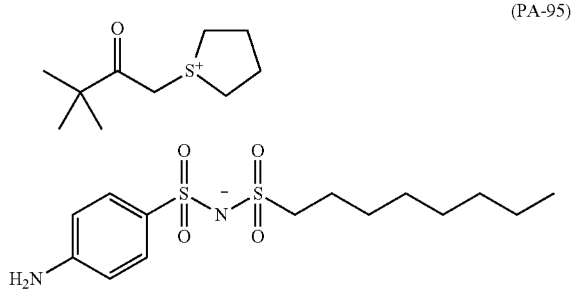
(PA-96)
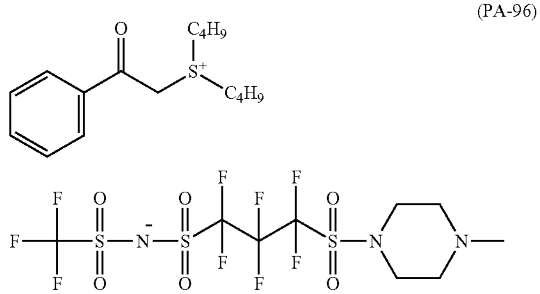
(PA-97)
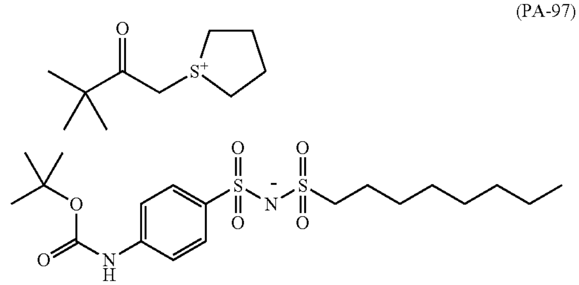
(PA-98)
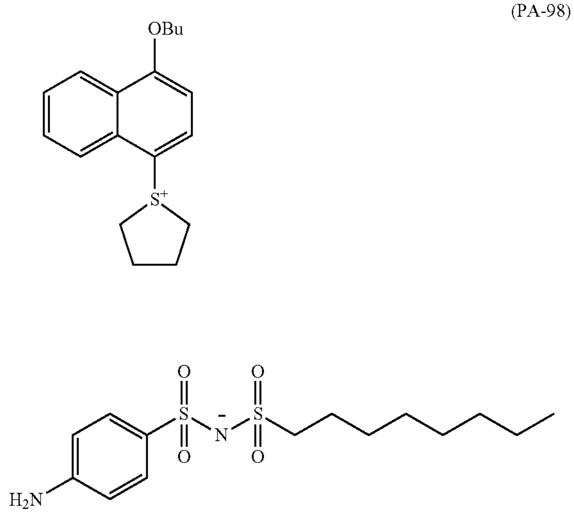

-continued
(PA-99)
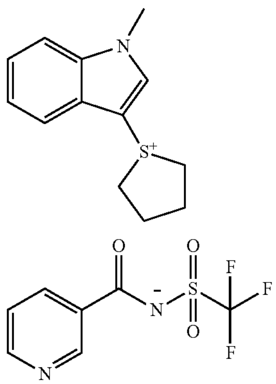
(PA-100)
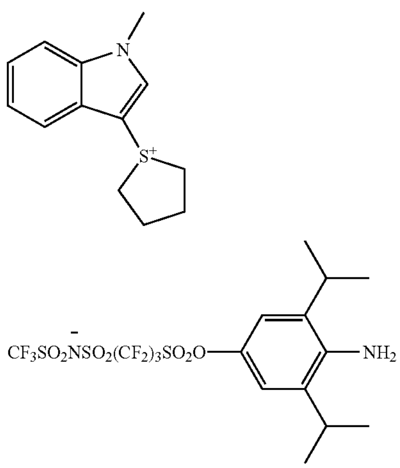
(PA-101)
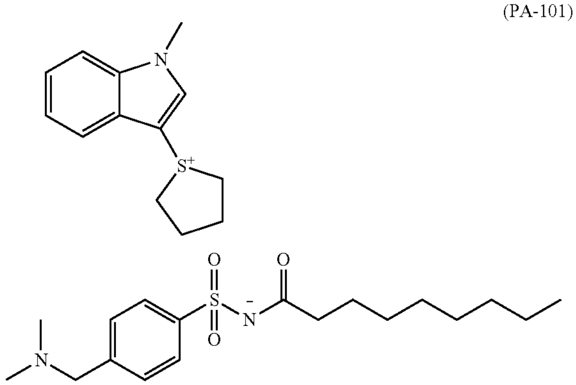
(PA-102)
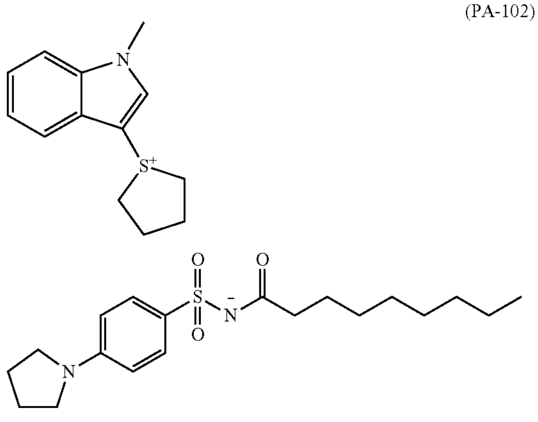
-continued
(PA-103)
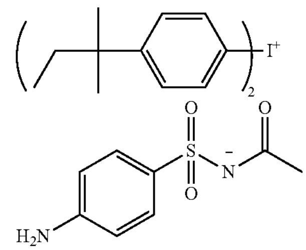
(PA-104)
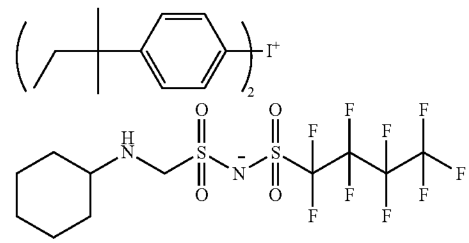
(PA-105)
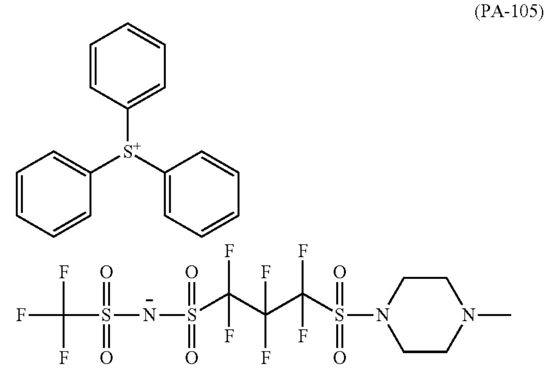
(PA-106)
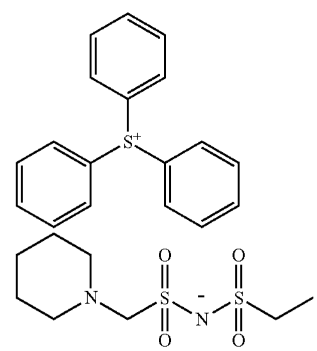
(PA-107)
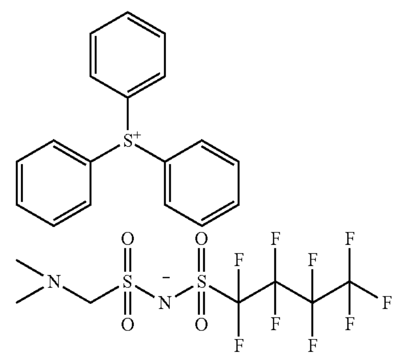
These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or an alcohol with an anhydride (e.g., $(R'O_2C)_2O$, $(R'SO_2)_2O$) or an acid chloride compound (e.g., $R'O_2CCl$, $R'SO_2Cl$) (R' is, for example, a methyl group, an n-octyl group or a trifluoromethyl group) under basic conditions. In particular, the synthesis may be performed in accordance with synthesis examples and the like in JP-A-2006-330098.

The molecular weight of the compound (PA) is preferably from 500 to 1,000.

In the case where the actinic ray-sensitive or radiation-sensitive resin composition of the present invention contains the compound (PA), the content thereof is preferably from 0.1 to 20 mass %, more preferably from 0.1 to 10 mass %, based on the solid content of the composition.

As for the compound (PA), one kind of a compound is used alone, or two or more kinds of compounds are used. Also, the compound (PA) may be used in combination with a basic compound described above.

[10] (I) Other Additives (I)

The actinic ray-sensitive or radiation-sensitive resin composition of the present invention may further contain, for example, a dye, a plasticizer, a photosensitizer, a light absorber, a dissolution inhibiting compound (sometimes referred to as a dissolution inhibitor), and a compound for accelerating dissolution in a developer (dissolution accelerator) (for example, a phenol compound having a molecular weight of 1,000 or less, or a carboxyl group-containing alicyclic or aliphatic compound), if desired.

The composition of the present invention may further contain a dissolution inhibiting compound. The "dissolution inhibiting compound" as used herein indicates a compound having a molecular weight of 3,000 or less and being capable of decomposing by the action of an acid to increase the solubility in an organic solvent-containing developer.

In view of causing no reduction in transparency to light at a wavelength of 220 nm or less, the dissolution inhibiting compound is preferably an alicyclic or aliphatic compound containing an acid-decomposable group, such as acid-decomposable group-containing cholic acid derivatives described in *Proceeding of SPIE,* 2724, 355 (1996). Examples of the acid-decomposable group and alicyclic structure are the same as those described above.

In the case of irradiating the resist composition of the present invention with KrF excimer laser or electron beam, the dissolution inhibiting compound is preferably a compound containing a structure where a phenolic hydroxyl group of a phenol compound is substituted with an acid-decomposable group. The phenol compound is preferably a compound containing from 1 to 9 phenol structures, more preferably from 2 to 6 phenol structures.

In the case where the composition of the present invention contains a dissolution inhibiting compound, the content thereof is preferably from 3 to 50 mass %, more preferably from 5 to 40 mass %, based on the entire solid content of the composition.

Specific examples of the dissolution inhibiting compound are illustrated below.

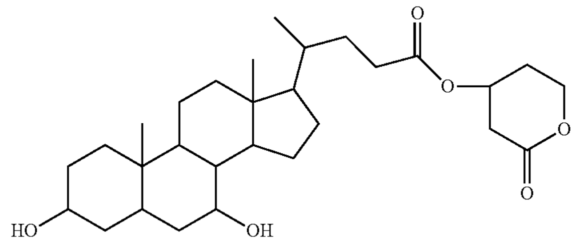

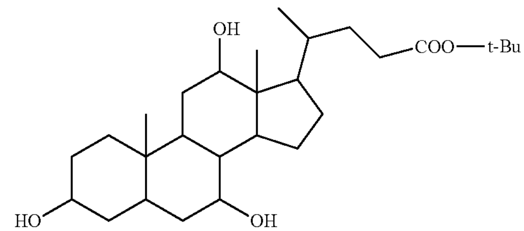

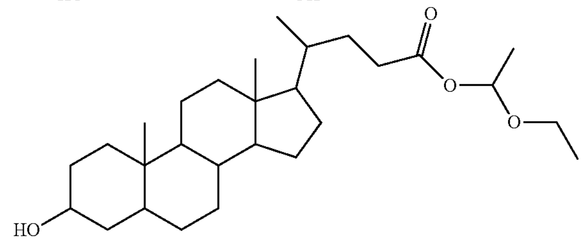

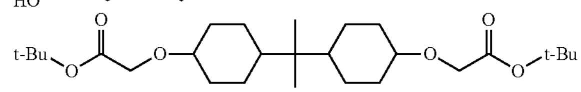

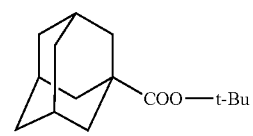

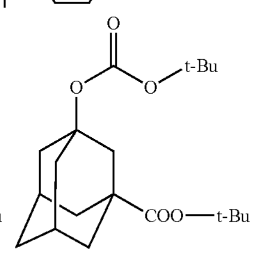

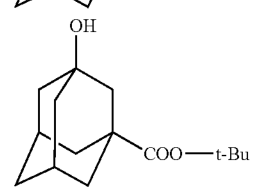

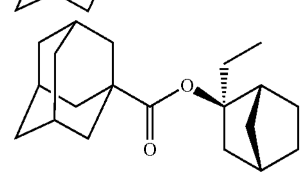

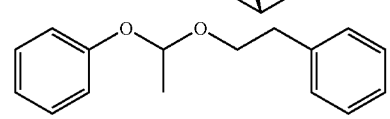

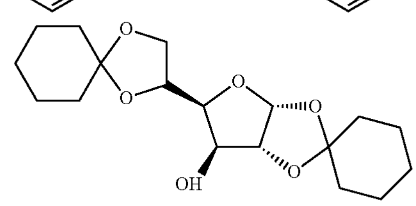

The phenol compound having a molecular weight of 1,000 or less can be easily synthesized by referring to the methods described, for example, in JP-A-4-122938, JP-A-2-28531, U.S. Pat. No. 4,916,210 and European Patent 219294.

Examples of the carboxyl group-containing alicyclic or aliphatic compound include a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

The entire solid content concentration of the composition of the present invention is usually from 1.0 to 10 mass %, preferably from 2.0 to 5.7 mass %, more preferably from 2.0 to 5.3 mass %. When the solid content concentration is in this range, the resist solution can be uniformly coated on a substrate and moreover, a resist pattern improved in the line edge roughness can be formed. The reasons therefor are not clearly know, but it is considered that by setting the solid content concentration to 10 mass % or less, preferably 5.7 mass % or less, the materials, particularly the photoacid generator, in the resist solution are prevented from aggregation, as a result, a uniform resist film can be formed.

The solid content concentration is a mass percentage of the mass of resist components excluding solvents, based on the total mass of the composition.

[11] Pattern Forming Method

The pattern forming method of the present invention includes:

(i) a step of forming a film (resist film) from an actinic ray-sensitive or radiation-sensitive resin composition (preferably a chemical amplification resist composition), (ii) a step of exposing the film, and (iii) a step of developing the exposed film by using an organic solvent-containing developer.

The resist film is formed from the above-described actinic ray-sensitive or radiation-sensitive resin composition of the present invention and, more specifically, is preferably formed on a substrate. In the pattern forming method of the present invention, the step of forming a film from a resist composition on a substrate, the step of exposing the film, and the development step can be performed by a generally known method.

The pattern forming method also preferably contains, after film formation, a pre-baking step (PB) before entering the exposure step.

Furthermore, the pattern forming method also preferably contains a post-exposure baking step (PEB) after the exposure step but before the development step.

As for the heating temperature, both PB and PEB are preferably performed at 40 to 130° C., more preferably 50 to 120° C., more preferably 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) are applicable.

In the present invention, the exposure of the resist film may be performed by filling a liquid (immersion medium) having a refractive index higher than that of air between the film and the lens at the irradiation with an actinic ray or radiation (immersion exposure). By this exposure, the resolution can be enhanced. The immersion medium used may be any liquid as long as it has a refractive index higher than that of air, but pure water is preferred.

In this case, the above-described hydrophobic resin may be previously added to the resist composition, or after forming a resist film, a sparingly immersion liquid-soluble film (hereinafter, sometimes referred to as a "topcoat") may be provided thereon.

The performance required of the topcoat, the use method thereof and the like are described in *Ekishin Lithography no Process to Zairyo* (*Process and Material of Immersion Lithography*), Chapter 7, CMC Shuppan.

In view of transparency to laser at a wavelength of 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. Furthermore, a commercially available topcoat material can also be appropriately used.

On peeling off the topcoat after exposure, a developer may be used or a releasing agent may be separately used. The releasing agent is preferably a solvent less permeating the film. From the standpoint that the peeling step can be performed simultaneously with the development step of the film, the topcoat is preferably peelable with a developer.

In the present invention, the substrate on which the film is formed is not particularly limited, and a substrate generally used in the production process of a semiconductor such as IC, in the production process of a liquid crystal device or a circuit board such as thermal head or in the lithography of other photo-fabrication processes, such as inorganic substrate (e.g., silicon, SiN, $SiO_2$, SiN) and coating-type inorganic substrate (e.g., SOG), can be used. If desired, an organic antireflection film may be formed between the film and the substrate.

Development Step:

As for the organic developer which can be used in performing the development by an organic solvent-containing developer, a developer containing a polar solvent such as ketone-based solvent, ester-based solvent, alcohol-based solvent, amide-based solvent and ether-based solvent, or a hydrocarbon-based solvent can be used. It is preferred to contain at least one kind of an organic solvent selected from a ketone-based solvent, an ester-based solvent, an alcohol-based solvent, an amide-based solvent and an ether-based solvent.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, methyl amyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, isoamyl acetate, n-pentyl acetate, propylene glycol monomethyl ether acetate, propylene glycol monoethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl propionate, methyl 3-methoxypropionate (MMP), ethyl propionate, ethyl 3-ethoxypropionate (EEP) and propyl propionate.

Above all, an alkyl acetate such as methyl acetate, butyl acetate, ethyl acetate, isopropyl acetate and amyl acetate and an alkyl propionate such as methyl propionate, ethyl propionate and propyl propionate is preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene, xylene and anisol and an aliphatic hydrocarbon-based solvent such as pentane, hexane, octane and decane.

A plurality of these solvents may be mixed, or within a range keeping the performance, the solvent may be used by mixing it with a solvent other than those described above or with water. However, in order to sufficiently bring out the effects of the present invention, the water content of the entire developer is preferably less than 10 mass %, and it is more preferred to contain substantially no water.

That is, the amount of the organic solvent used in the developer is preferably from 80 to 100 mass %, more preferably from 90 to 100 mass %, more preferably from 95 to 100 mass %, based on the entire amount of the developer.

In particular, the organic solvent-containing developer is preferably a developer containing at least one kind of a solvent selected from a ketone-based solvent, an ester-based solvent, an alcohol-based solvent, an amide-based solvent and an ether-based solvent.

The vapor pressure at 20° C. of the organic solvent-containing developer is preferably 5 kPa or less, more preferably 3 kPa or less, still more preferably 2 kPa or less. By setting the vapor pressure of the developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

Surfactant:

In the developer, a surfactant can be added in an appropriate amount, if desired.

As for the surfactant, those described above as the surfactant used in the resist composition can be used.

The amount of the surfactant used is usually from 0.001 to 5 mass %, preferably from 0.005 to 2 mass %, more preferably from 0.01 to 0.5 mass %, based on the entire amount of the developer.

Resin (A'):

The organic solvent-containing developer and the later-described rinsing solution may contain (A') a resin soluble in an organic solvent. In this case, it is presumed that the resin (A') is previously dissolved in the processing solution and the dissolution of the resist film in the processing solution or the permeation of the processing solution into the resist film is thereby accelerated.

The resin (A') is not particularly limited as long as it is soluble in an organic solvent, and resins for use in the resist composition may be suitably used, but an epoxy resin, a melamine resin, a urea resin, a polyester resin, a polyurethane resin, a polyimide resin and the like can also be used.

Examples of the (A') resin soluble in an organic solvent include a resin containing the following repeating units:

a repeating unit having an acid-decomposable group (a1),
a repeating unit having an alcoholic hydroxyl group (a2),
a repeating unit having a nonpolar group (a3),
a repeating unit having a polar group (a4),
a repeating unit having a lactone structure,
a repeating unit having an acid group, a repeating unit derived from hydroxystyrene or a derivative thereof, and a (meth)acryl ester repeating unit having an aromatic ring in the side chain.

Specific examples of this resin are the same as those of the resin contained in the resist composition.

The weight average molecular weight of the resin (A') for use in the present invention is preferably from 3,000 to 25,000, more preferably from 5,000 to 15,000, in terms of polystyrene as measured by the GPC method.

The polydispersity (molecular weight distribution) of the resin (A') is preferably from 1.2 to 3.0, more preferably from 1.4 to 1.8.

The blending amount of the resin (A') in the entire processing solution is preferably from 0.0001 to 10 mass %, more preferably from 0.001 to 5 mass %, based on the entire amount of the processing solution.

As for the resin (A'), one kind of a resin may be contained in the processing solution, or a plurality of kinds of resins may be contained.

The resin (A') for use in the present invention can be synthesized by a conventional method (for example, radical polymerization).

Examples of the developing method which can be applied include a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method).

In the case where the above-described various developing methods include a step of ejecting the developer toward the resist film from a development nozzle of a developing apparatus, the ejection pressure of the developer ejected (the flow velocity per unit area of the developer ejected) is preferably 2 $mL/sec/mm^2$ or less, more preferably 1.5 $mL/sec/mm^2$ or less, still more preferably 1 $mL/sec/mm^2$ or less. The flow velocity has no particular lower limit but in view of throughput, is preferably 0.2 $mL/sec/mm^2$ or more.

By setting the ejection pressure of the ejected developer to the range above, pattern defects attributable to the resist residue after development can be greatly reduced.

Details of this mechanism are not clearly known, but it is considered that thanks to the ejection pressure in the above-described range, the pressure imposed on the resist film by the developer possibly becomes small and the resist film or resist pattern is kept from inadvertent chipping or collapse.

Here, the ejection pressure ($mL/sec/mm^2$) of the developer is a value at the outlet of a development nozzle in a developing apparatus.

Examples of the method for adjusting the ejection pressure of the developer include a method of adjusting the ejection pressure by a pump or the like, and a method of adjusting the pressure by the supply from a pressurized tank and thereby changing the ejection pressure.

Rinsing Step:

After the step of performing development, a step of stopping the development by replacement with another solvent may be practiced.

A step of rinsing the resist film with a rinsing solution is preferably provided after the development with an organic solvent-containing developer. The rinsing solution is preferably a rinsing solution containing an organic solvent.

The rinsing solution for use in the rinsing step after the development with an organic solvent-containing developer is not particularly limited as long as it does not dissolve the resist pattern, and a solution containing a general organic solvent may be used. As for the rinsing solution, a rinsing solution containing at least one kind of an organic solvent selected from a hydrocarbon-based solvent, a ketone-based solvent, an ester-based solvent, an alcohol-based solvent, an amide-based solvent and an ether-based solvent is preferably used. The rinsing solution more preferably contains at least one kind of an organic solvent selected from a ketone-based solvent, an ester-based solvent, an alcohol-based solvent and an amide-based solvent, still more preferably contains an alcohol-based solvent or an ester-based solvent, yet still more preferably contains a monohydric alcohol, and even yet still more preferably contains a monohydric alcohol having a carbon number of 5 or more. The monohydric alcohol used in the rinsing step after the development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used. Among these, a branched alkyl alcohol having a carbon number of 5 or more is preferred.

A plurality of these components may be mixed, or the solvent may be used by mixing it with an organic solvent other than those described above.

The water content in the rinsing solution is preferably less than 10 mass %, more preferably less than 5 mass %, still more preferably less than 3 mass %. By setting the water content to less than 10 mass %, good development characteristics can be obtained.

In other words, the amount of the organic solvent used in the rinsing solution is preferably from 90 to 100 mass %, more preferably from 95 to 100 mass %, and most preferably from 97 to 100 mass %, based on the entire amount of the rinsing solution.

The vapor pressure at 20° C. of the rinsing solution used after the development with an organic solvent-containing developer is preferably from 0.05 to 5 kPa, more preferably from 0.1 to 5 kPa, and most preferably from 0.12 to 3 kPa. By setting the vapor pressure of the rinsing solution to be from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may also be used after adding thereto a surfactant and the resin (A') each in an appropriate amount. The kinds and amounts added of the surfactant and the resin (A') which can be incorporated are the same as those in the developer.

In the rinsing step, the wafer after development is washed using the above-described organic solvent-containing rinsing solution. The method for washing treatment is not particularly limited, but examples of the method which can be applied include a method of continuously ejecting the rinsing solution on the substrate spinning at a fixed speed (spin coating method), a method of dipping the substrate in a bath filled with the rinsing solution for a fixed time (dipping method), and a method of spraying the rinsing solution on the substrate surface (spraying method). Above all, it is preferred to perform the washing treatment by the spin coating method and after the washing, remove the rinsing solution from the substrate surface by spinning the substrate at a rotational speed of 2,000 to 4,000 rpm. The spinning time of the substrate can be set according to the rotational speed in the range achieving removal of the rinsing solution from the substrate surface but is usually from 10 seconds to 3 minutes.

The pattern forming method also preferably contains a heating step (post-baking) after the rinsing step. The developer and rinsing solution remaining between patterns and in the inside of the pattern are removed by the baking. The heating step after the rinsing step is performed at usually from 40 to 160° C., preferably from 70 to 95° C., and for usually from 10 seconds to 3 minutes, preferably from 30 to 90 seconds.

The pattern forming method according to the present invention may comprise a development step using an alkali developer (positive pattern forming step), in addition to the developing step by an organic solvent-containing developer. The order of the development step using an alkali developer and the development step using an organic solvent-containing developer is not particularly limited, but development using an alkali developer is preferably performed before development using an organic solvent-containing developer. Moreover, it is preferable that a heating step is accompanied before each developing step.

The kind of the alkali developer is not particularly limited, but usually, an aqueous tetramethylammonium hydroxide solution is used. In the alkali developer, alcohols and/or a surfactant may be added each in an appropriate amount.

The alkali concentration of the alkali developer is usually from 0.1 to 20 mass %. The pH of the alkali developer is usually from 10.0 to 15.0. As the alkali developer, it is particularly preferred to use a 2.38 mass % aqueous solution of tetramethylammonium hydroxide.

In the case of performing a rinsing treatment after the development using an alkali developer, the rinsing solution used here is typically pure water. In this rinsing solution, an appropriate amount of a surfactant may be added.

EXAMPLES

The present invention is described below by referring to Examples, but the present invention should not be construed as being limited thereto.

Synthesis Example 1

Synthesis of Resin (P-1)

In a nitrogen stream, a three-neck flask was charged with 40 g of a 6/4 (by mass) mixed solvent of propylene glycol monomethyl ether acetate and propylene glycol monomethyl ether and heated at 80° C. (Solvent 1). Monomers corresponding to the following repeating units were dissolved in a molar ratio of 40/10/40/10 in a 6/4 (by mass) mixed solvent of propylene glycol monomethyl ether acetate and propylene glycol monomethyl ether to prepare a 22 mass % monomer solution (400 g), and polymerization initiator V-601 (produced by Wako Pure Chemical Industries, Ltd.) in a concentration of 8 mol % based on the monomers was added thereto and dissolved. The resulting solution was added dropwise to Solvent 1 over 6 hours. After the completion of dropwise addition, the reaction was further allowed to proceed at 80° C. for 2 hours. The resulting reaction solution was left standing to cool and then poured in 3,600 ml of hexane/400 ml of ethyl acetate, and the powder precipitated was collected by filtration and dried, as a result, 74 g of Resin (P-1) was obtained. The weight average molecular weight of the obtained Resin (P-1) was 10,000 and the polydispersity (Mw/Mn) was 1.6.

(P-1)

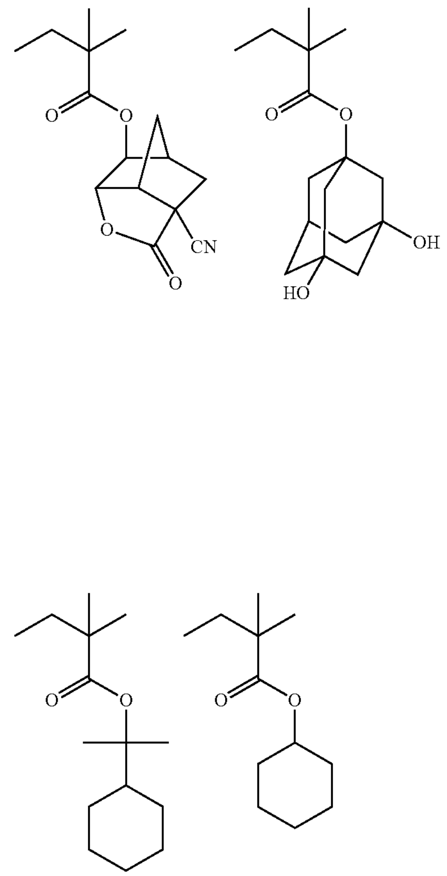

Synthesis Example 1-1

Synthesis of Resin (P1-1)

In a nitrogen stream, a three-neck flask was charged with 40 g of a 6/4 (by mass) mixed solvent of propylene glycol monomethyl ether acetate and propylene glycol monomethyl ether and heated at 80° C. (Solvent 1). Monomers corresponding to the following repeating units were dissolved in a molar ratio of 40/60 in a 6/4 (by mass) mixed solvent of propylene glycol monomethyl ether acetate and propylene glycol monomethyl ether to prepare a 22 mass % monomer solution (400 g), and polymerization initiator V-601 (produced by Wako Pure Chemical Industries, Ltd.) in a concentration of 8 mol % based on the monomers was added thereto and dissolved. The resulting solution was added dropwise to Solvent 1 over 6 hours. After the completion of dropwise addition, the reaction was further allowed to proceed at 80° C. for 2 hours. The resulting reaction solution was left standing to cool and then poured in 3,600 ml of hexane/400 ml of ethyl acetate, and the powder precipitated was collected by filtration and dried, as a result, 74 g of Resin (P1-1) was obtained. The weight average molecular weight of the obtained Resin (P1-1) was 11,000 and the polydispersity (Mw/Mn) was 1.6.

P1-1

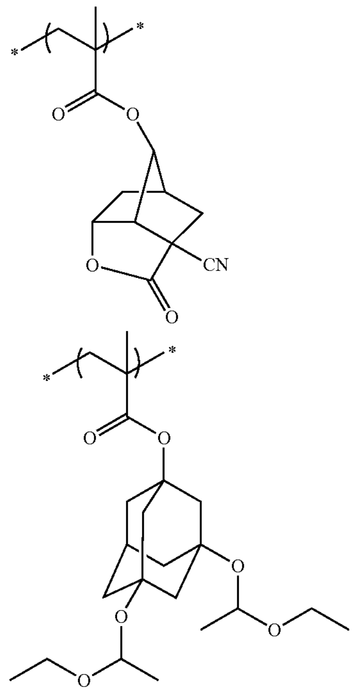

Synthesis Example 2

Synthesis of Hydrophobic Resin

Synthesis of Monomer (4):

The following Compound (1) was synthesized by the method described in International Publication No. 07/037,213, pamphlet.

150.00 Gram of water was added to 35.00 g of Compound (1), and 27.30 g of sodium hydroxide was further added. The mixture was stirred for 9 hours under heating and refluxing conditions. The resulting reaction solution was made acidic by adding hydrochloric acid and then extracted with ethyl acetate. The organic layers were combined and concentrated to obtain 36.90 g of Compound (2) (yield: 93%).

$^1$H-NMR (400 MHz in $(CD_3)_2CO$): σ (ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H).

Subsequently, 200 ml of $CHCl_3$ was added to 20.00 g of Compound (2), and 50.90 g of 1,1,1,3,3,3-hexafluoroisopropyl alcohol and 30.00 g of 4-dimethylaminopyridine were further added, followed by stirring. To the resulting solution, 22.00 g of 1-ethyl-3-(3-dimethylaminopropyl)carbodiimide hydrochloride was added, and the mixture was stirred for 3 hours. This reaction solution was added to 500 ml of 1 N HCl to stop the reaction, and the organic layer was washed further with 1 N HCl and then washed with water. The obtained organic layer was concentrated to obtain 30.00 g of Compound (3) (yield: 85%).

$^1$H-NMR (400 MHz in $(CD_3)_2CO$): σ (ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H).

Thereafter, 300.00 g of toluene was added to 15.00 g of Compound (3), and 3.70 g of methacrylic acid and 4.20 g of p-toluenesulfonic acid monohydrate were further added. The mixture was refluxed for 15 hours while azeotropically removing the water produced, and the resulting reaction solution was concentrated. The concentrate was purified by column chromatography to obtain 11.70 g of Compound (4) (yield: 65%).

$^1$H-NMR (400 MHz in $(CD_3)_2CO$): σ (ppm)=1.76-1.79 (1H), 1.93 (3H), 2.16-2.22 (2H), 2.57-2.61 (1H), 2.76-2.81 (1H), 3.73-3.74 (1H), 4.73 (1H), 4.84-4.86 (1H), 5.69-5.70 (1H), 6.12 (1H), 6.50-6.56 (1H).

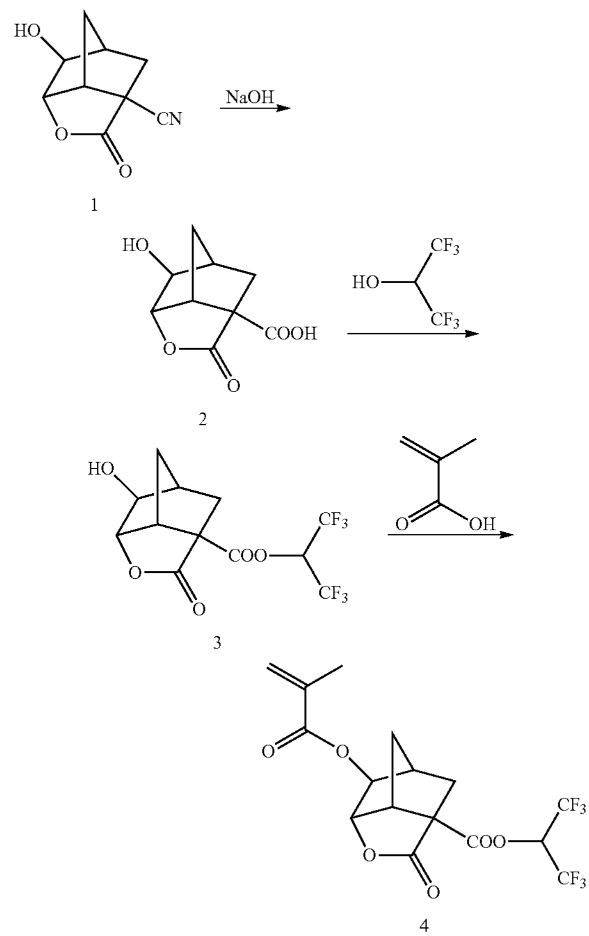

Synthesis of Hydrophobic Resin (6b):

Respective monomers corresponding to the following repeating units were charged in a ratio of 90/10 (by mol) and dissolved in PGMEA to prepare 450 g of a solution having a solid content concentration of 15 mass %. To this solution, 1 mol % of polymerization initiator V-601 produced by Wako Pure Chemical Industries, Ltd. was added and in a nitrogen atmosphere, the resulting mixture was added dropwise over 6 hours to 50 g of PGMEA heated to 100° C. After the completion of dropwise addition, the reaction solution was stirred for 2 hours. Once the reaction was completed, the reaction solution was cooled to room temperature and crystallized from 5 L of methanol, and the precipitated white powder was filtered to collect the objective Resin (6b).

The compositional ratio of the polymer determined from NMR was 90/10. Also, the weight average molecular weight in terms of standard polystyrene as determined by the GPC measurement was 12,000, and the polydispersity was 1.5.

(6b)

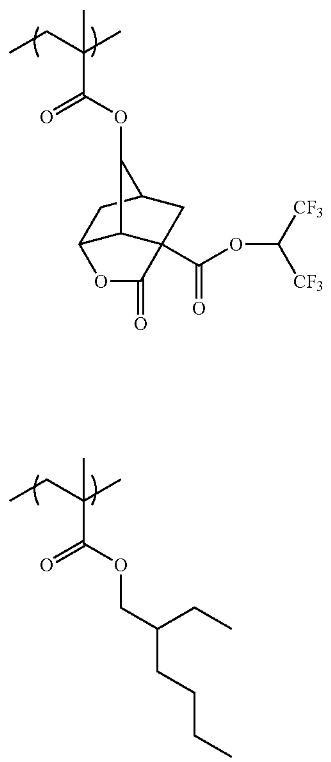

Resins (P-2) to (P-13) and Hydrophobic Resins (1b) to (5b) were synthesized in the same manner as in Synthesis Example 1 except for using monomers corresponding to respective repeating units to give a desired compositional ratio (molar ratio).

Moreover, Resins (P1-2) to (P1-14) were synthesized in the same manner as in Synthesis Example 1-1 except for using monomers corresponding to respective repeating units to give a desired compositional ratio (molar ratio).

Structures of Resins (P-2) to (P-13) and Hydrophobic Resins (1b) to (6b) are shown below. Also, the compositional ratio (by mol), weight average molecular weight and polydispersity of each of Resins (P-2) to (P-13) and Hydrophobic Resins (1b) to (6b), including Resin (P-1), are shown in Table 3.

Moreover, structures of Resins (P1-2) to (P1-14) are shown below. Also, the compositional ratio (by mol), weight average molecular weight and polydispersity of each of Resins (P1-2) to (P1-14), including Resin (P1-1), are shown in Table 4.

(P-2)

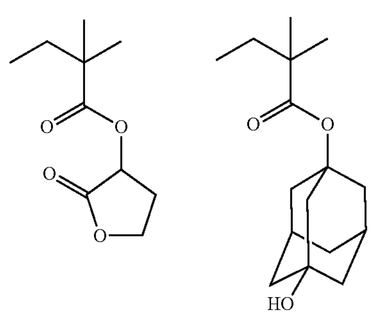

-continued

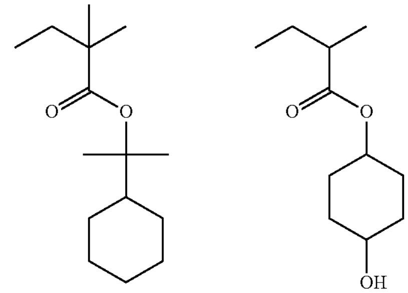

(P-3)

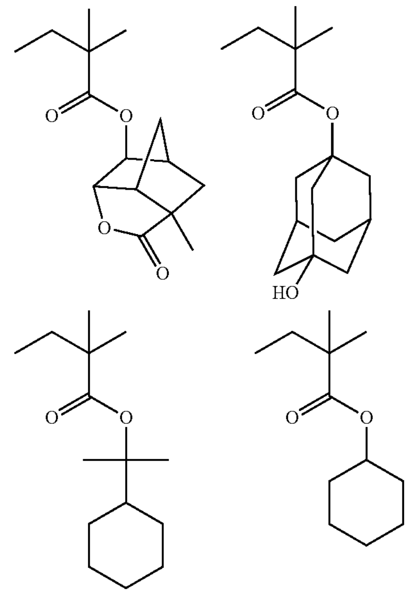

(P-4)

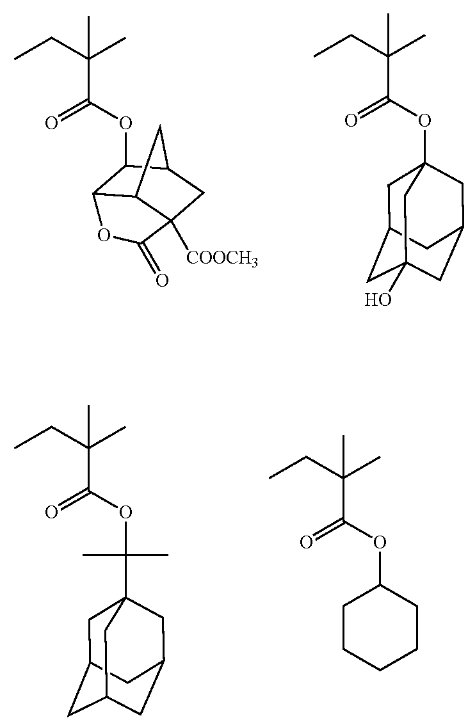

-continued
(P-5)
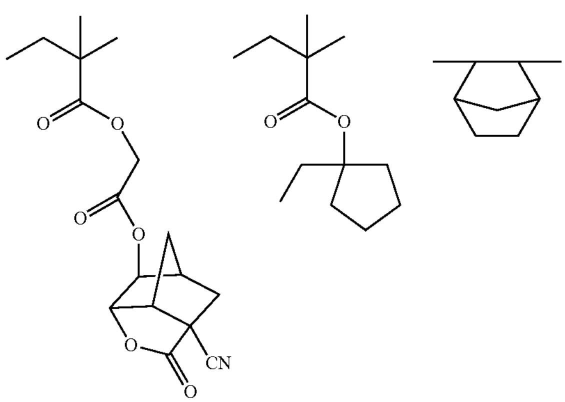
(P-6)
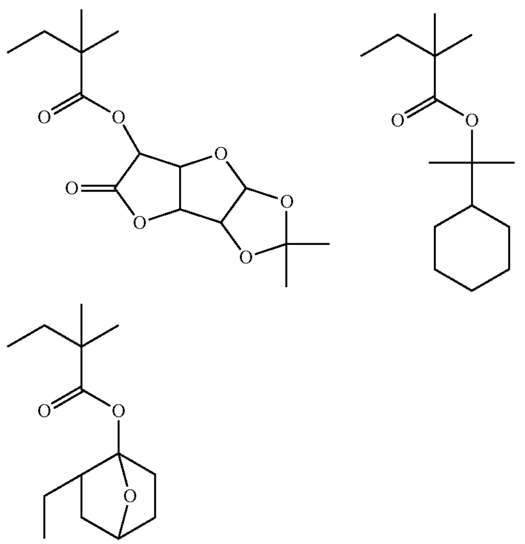
(P-7)
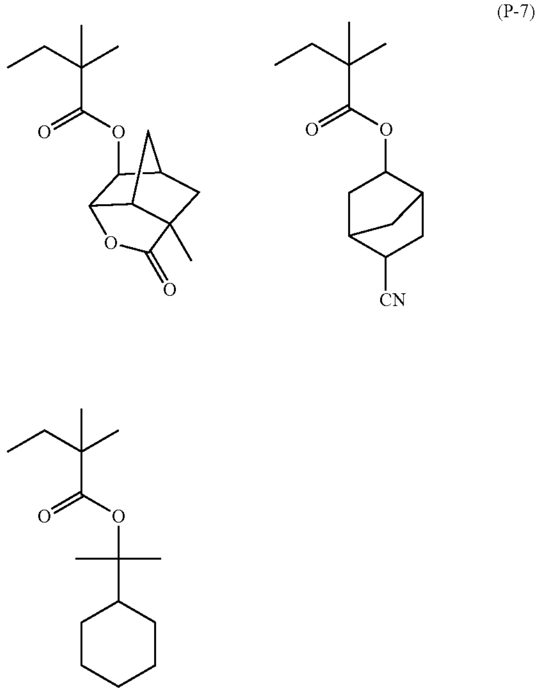
-continued
(P-8)
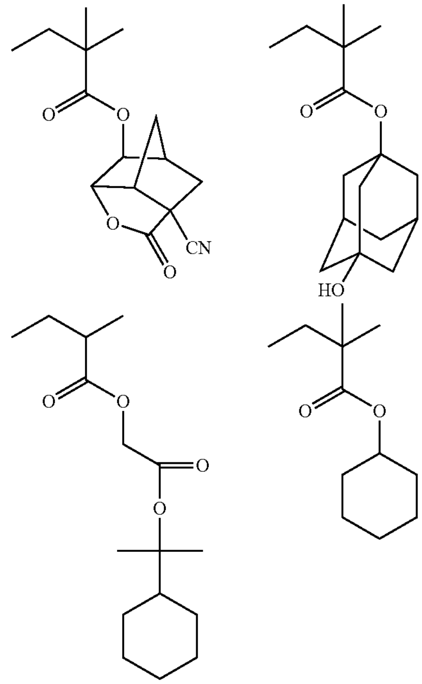
(P-9)
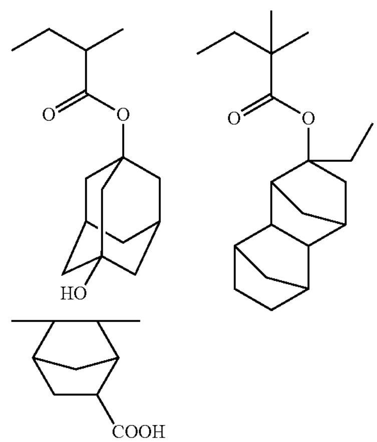
(P-10)
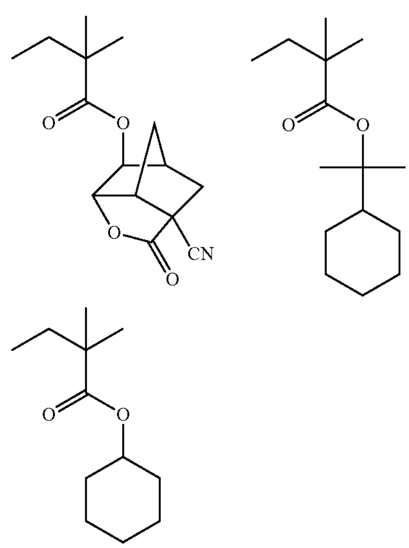

-continued
(P-11)
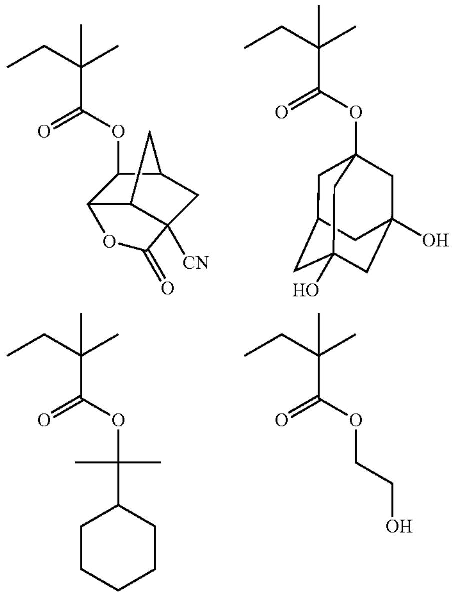
(P-12)
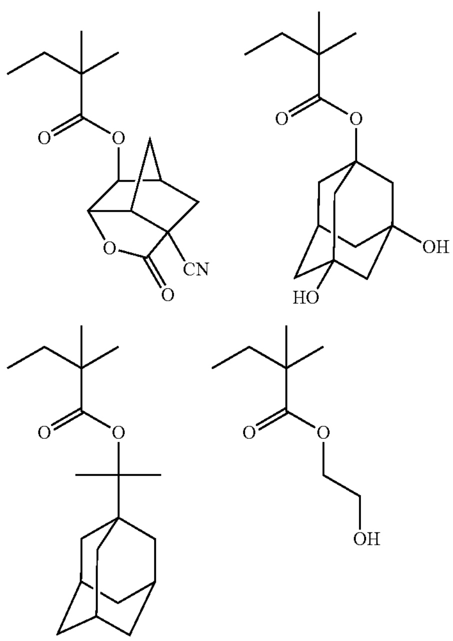
(P-13)
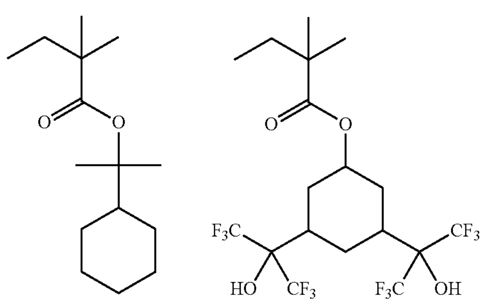
-continued
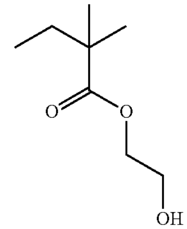
(1b)
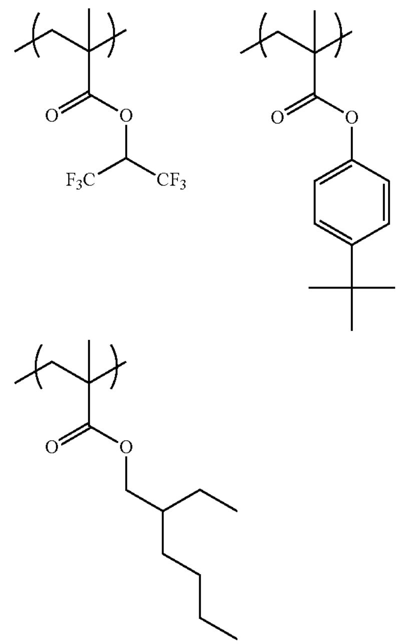
(2b)
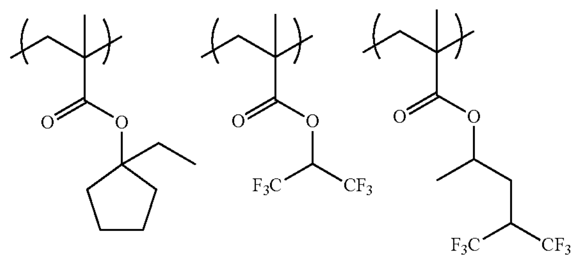
(3b)
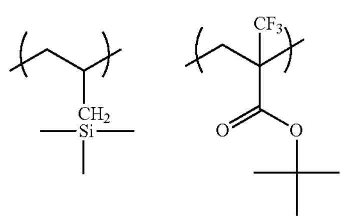
(4b)
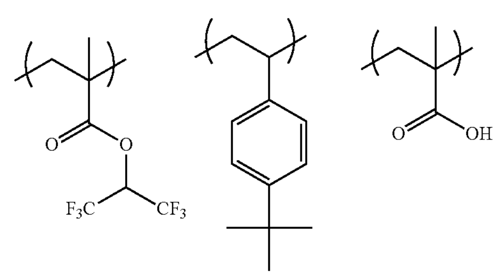

-continued
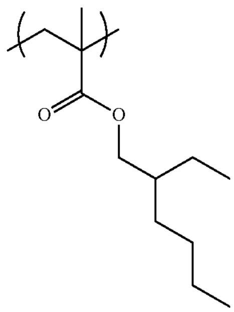
(5b)
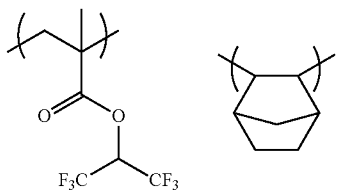
(6b)
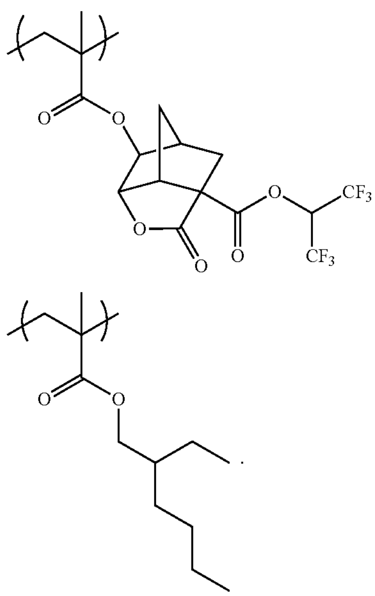
TABLE 3
| Resin | Composition (molar ratio) | Mw | Mw/Mn |
|---|---|---|---|
| (P-1) | 40/10/40/10 | 10000 | 1.6 |
| (P-2) | 40/10/40/10 | 8000 | 1.3 |
| (P-3) | 40/10/40/10 | 6000 | 1.5 |
| (P-4) | 35/15/35/15 | 15000 | 1.5 |
| (P-5) | 30/40/30 | 7000 | 1.5 |
| (P-6) | 30/40/30 | 10000 | 1.6 |
| (P-7) | 30/40/30 | 8500 | 1.4 |
| (P-8) | 40/10/40/10 | 6500 | 1.4 |
| (P-9) | 30/40/30 | 9000 | 1.5 |
| (P-10) | 30/40/30 | 13000 | 1.6 |
| (P-11) | 40/10/40/10 | 6500 | 1.5 |
| (P-12) | 40/10/40/10 | 8500 | 1.6 |
| (P-13) | 30/40/30 | 9000 | 1.5 |
| (1b) | 40/50/10 | 5000 | 1.3 |
| (2b) | 40/50/10 | 5000 | 1.4 |
| (3b) | 50/50 | 6000 | 1.6 |
| (4b) | 39/57/2/2 | 4000 | 1.3 |
| (5b) | 50/50 | 6000 | 1.6 |
| (6b) | 90/10 | 12000 | 1.5 |
P1-1
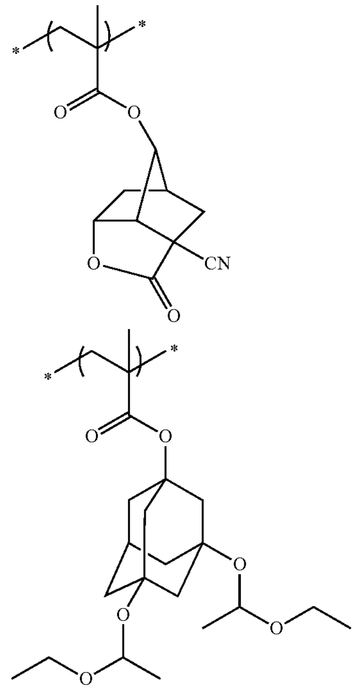
P1-2
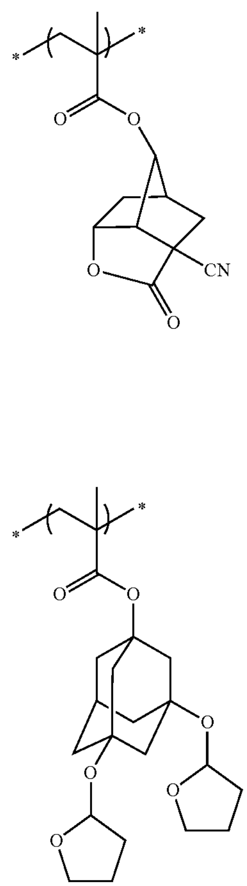

-continued
P1-3
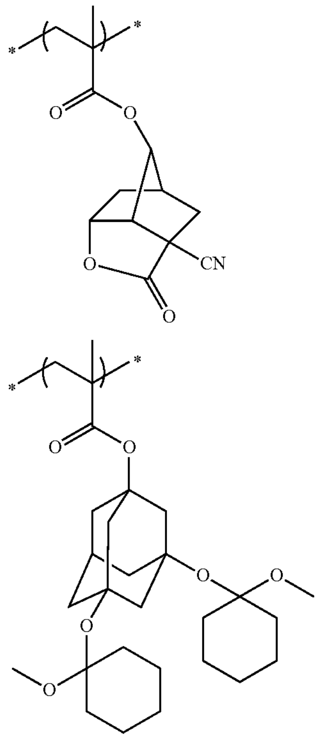
P1-4
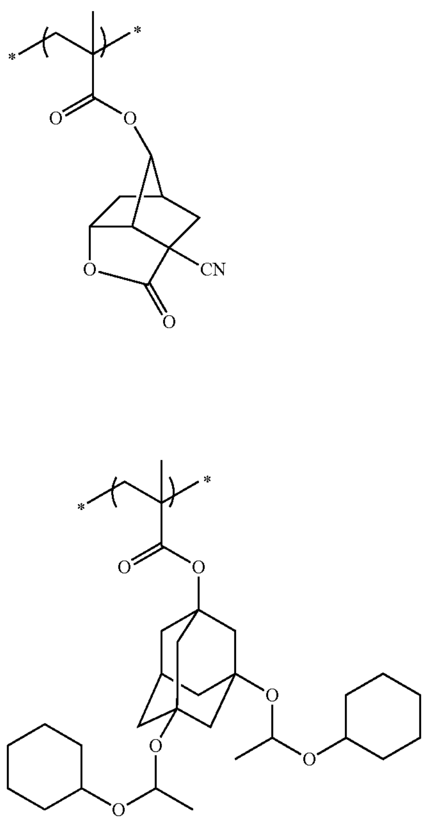
-continued
P1-5
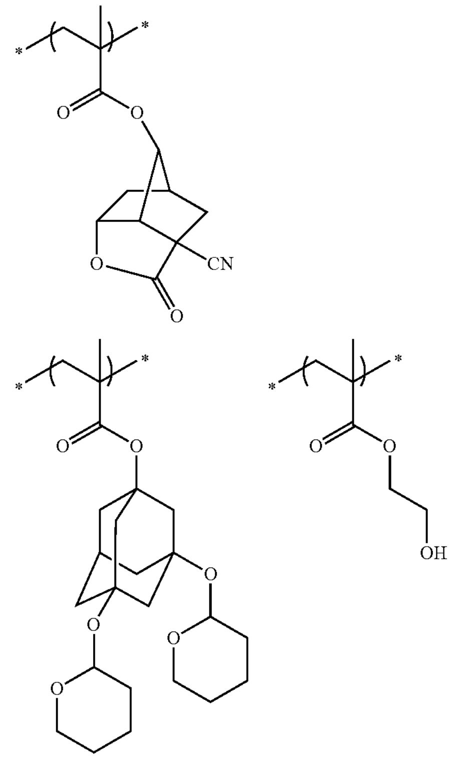
P1-6
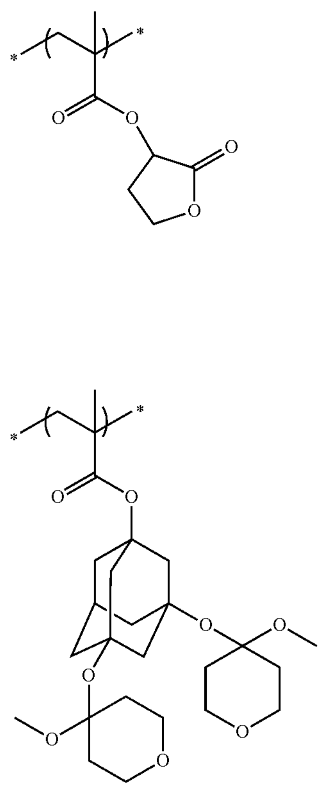

-continued
P1-7
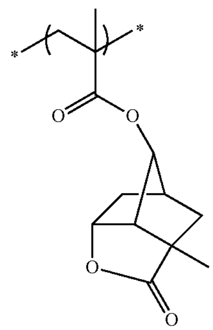
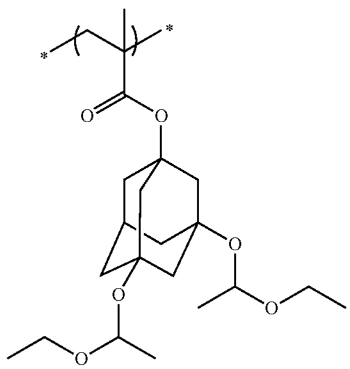
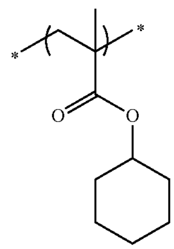
P1-8
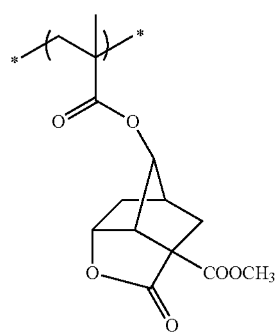
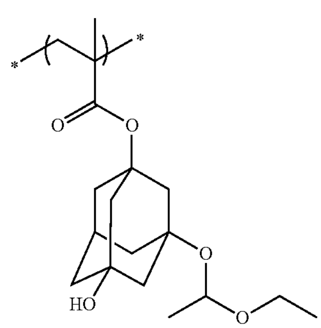
-continued
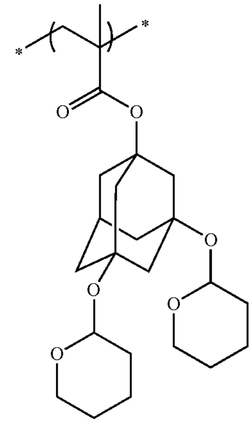
P1-9
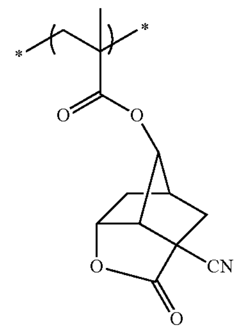
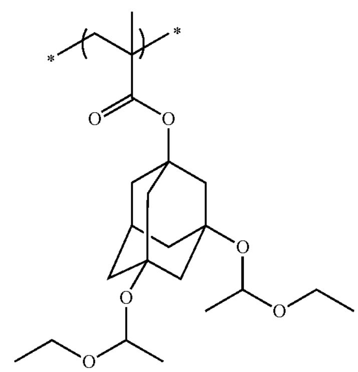
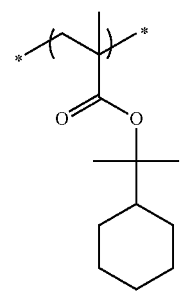
P1-10
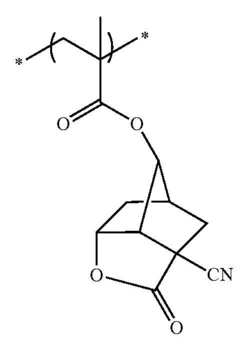

-continued
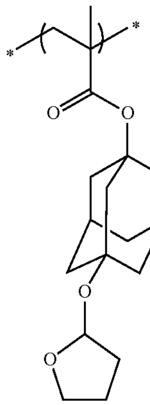
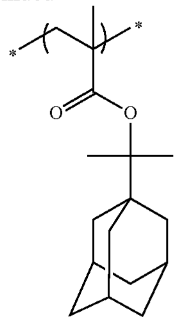
P1-11
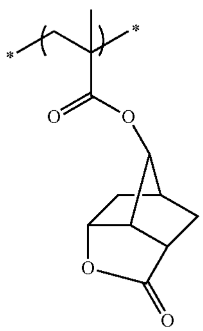
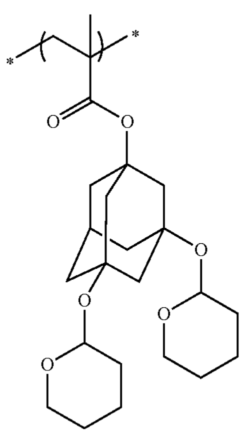
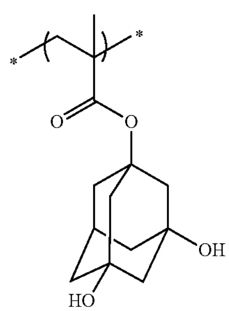
P1-12
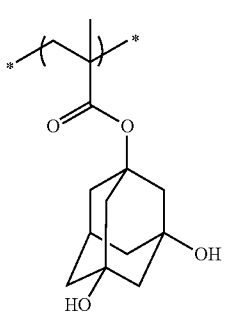
-continued
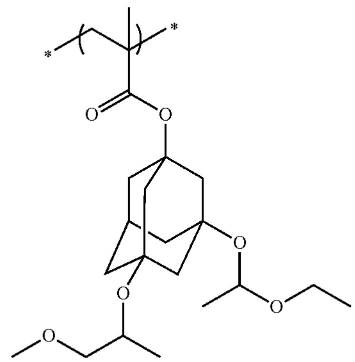
P1-13
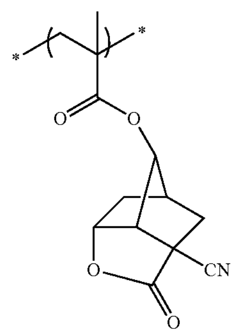
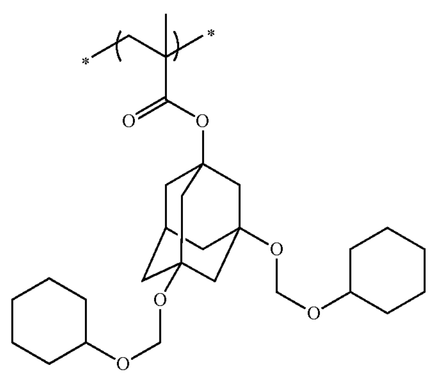
P1-14
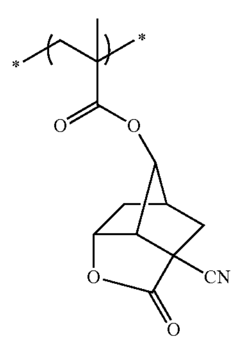

-continued

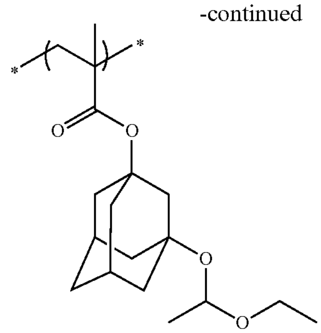

TABLE 4

| Resin | Composition (molar ratio) | Mw | Mw/Mn |
|---|---|---|---|
| (P1-1) | 40/60 | 11000 | 1.6 |
| (P1-2) | 40/60 | 10000 | 1.5 |
| (P1-3) | 50/50 | 10000 | 1.5 |
| (P1-4) | 40/60 | 9000 | 1.5 |
| (P1-5) | 40/50/10 | 9500 | 1.6 |
| (P1-6) | 50/50 | 11500 | 1.5 |
| (P1-7) | 40/50/10 | 10700 | 1.6 |
| (P1-8) | 40/10/50 | 8500 | 1.7 |
| (P1-9) | 40/40/20 | 9500 | 1.6 |
| (P1-10) | 40/50/10 | 10000 | 1.6 |
| (P1-11) | 30/60/10 | 9000 | 1.6 |
| (P1-12) | 20/80 | 8000 | 1.6 |
| (P1-13) | 40/60 | 12000 | 1.5 |
| (P1-14) | 40/60 | 11000 | 1.5 |

Synthesis Example 3

Synthesis of Triphenylsulfonium Acetate 5.07 Gram (13 mmol) of triphenylsulfonium iodide, 2.25 g (13.5 mmol) of silver acetate, 120 mL of acetonitrile and 60 mL of water were added, and the mixture was stirred at room temperature for 1 hour. The reaction solution was filtered to obtain a triphenylsulfonium acetate solution.

Synthesis Example 4

Synthesis of Compound PAG-1

In a nitrogen stream, 28.0 g (88.55 mmol) of 1,1,2,2,3,3-hexafluoropropane-1,3-disulfonyl difluoride, 17.92 g (177.1 mmol) of triethylamine and 210 mL of diisopropyl ether were cooled with ice, and a mixed solution containing 7.56 g (88.2 mmol) of piperidine and 105 mL of diisopropyl ether was added dropwise thereto over 30 minutes. This mixture was stirred for 1 hour under ice cooling and further stirred at room temperature for 1 hour. The organic layer was washed sequentially with water, with an aqueous saturated ammonium chloride solution and with water, and the resulting organic layer was dried over sodium sulfate. The solvent was removed, and 140 mL of ethanol and 1,400 mg of sodium hydroxide were added to the residue. After stirring at room temperature for 2 hours, the reaction solution was neutralized by adding dilute hydrochloric acid to obtain an ethanol solution of sulfonic acid.

The triphenylsulfonium acetate solution was added to the sulfonic acid solution above, and the mixture was stirred at room temperature for 2 hours. Thereafter, 2,100 mL of chloroform was added, and the organic layer was washed sequentially with water, with an aqueous saturated ammonium chloride solution and with water and then purified by column chromatography ($SiO_2$, chloroform/methanol=5/1) to obtain 21.0 g (32.76 mmol) of (PAG-1) of the formula shown below as a white solid.

$^1$H-NMR (300 $MH_z$, $CDCl_3$) δ 1.64 (bs, 6H), 3.29 (bs, 2H), 3.64 (bs, 2H), 7.70 (m, 15H).

$^{19}$F-NMR (300 MHz, $CDCl_3$) δ −111.1 (t, 2F), −114.3 (t, 2F), −119.4 (m, 2F).

(PAG-1)

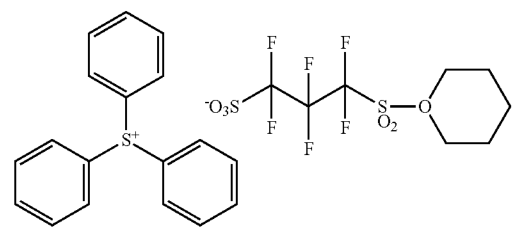

Photoacid Generators (PAG-2) to (PAG-12) of the following formulae were synthesized in the same manner as in Synthesis Examples 3 to 4 by using compounds each corresponding to the component (B).

(PAG-2)

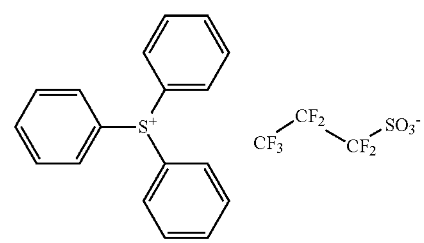

(PAG-3)

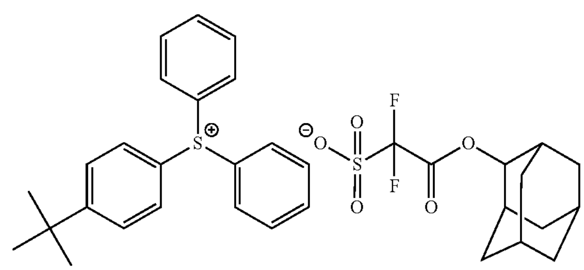

(PAG-4)

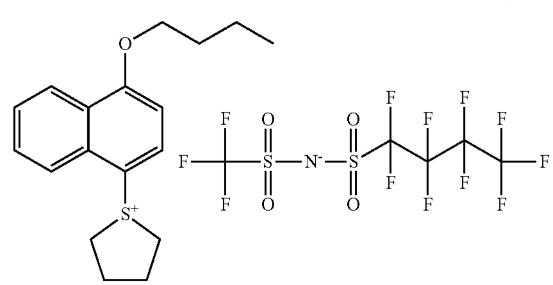

-continued (PAG-5)

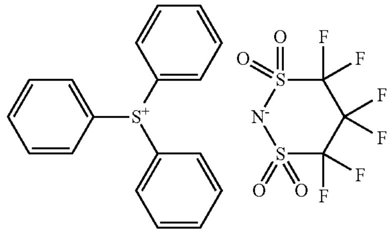

(PAG-6)

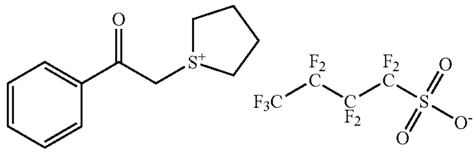

(PAG-7)

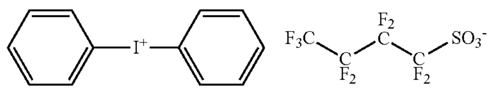

(PAG-8)

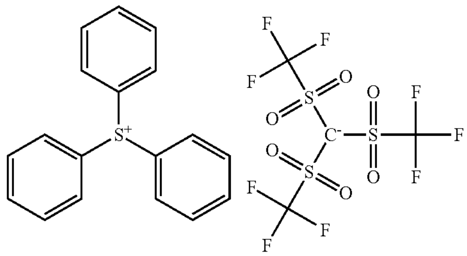

(PAG-9)

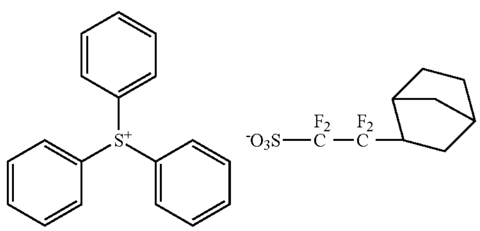

-continued (PAG-10)

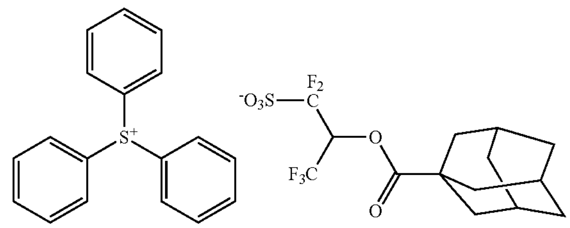

(PAG-11)

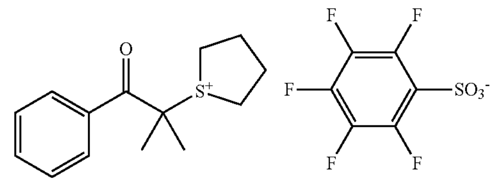

(PAG-12)

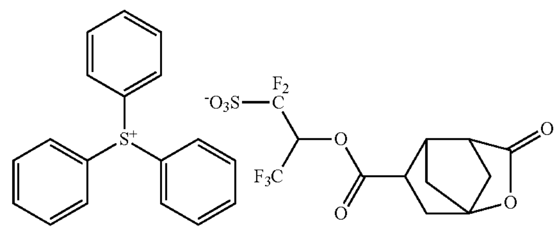

<Preparation of Resist and Topcoat Compositions>

The components shown in Table 5 below were dissolved in the solvent shown in Table 5 to prepare a solution having a solid content concentration of 3.5 mass %, and the solution was filtered through a polyethylene filter having a pore size of 0.03 μm. In this way, Resist Compositions Ar-1 to Ar-29 and Topcoat Composition t-1 were prepared.

Moreover, the components shown in Table 6 below were dissolved in the solvent shown in Table 6 to prepare a solution having a solid content concentration of 3.5 mass %, and the solution was filtered through a polyethylene filter having a pore size of 0.03 μm. In this way, Resist Compositions Ar1-1 to Ar1-26 and Topcoat Composition t-1 were prepared.

TABLE 5

| Resist | Resin (A) | mass/g | Acid Generator | mass/g | Acid Generator used in Combination | mass/g | Compound (G) | mass/g | Compound (H) or Compound (PA) | mass/g |
|---|---|---|---|---|---|---|---|---|---|---|
| Ar-1 | (P-1) | 10 | (PAG-1) | 0.8 | | | (B-7) | 0.09 | (B-1) | 0.06 |
| Ar-2 | (P-2) | 10 | (PAG-2) | 0.8 | | | (B-8) | 0.09 | (B-2) | 0.06 |
| Ar-3 | (P-3) | 10 | (PAG-3) | 0.8 | | | (B-9) | 0.09 | (B-3) | 0.06 |
| Ar-4 | (P-4) | 10 | (PAG-4) | 1.2 | (PAG-1) | 0.3 | (B-10) | 0.09 | (B-4) | 0.06 |
| Ar-5 | (P-5) | 10 | (PAG-5) | 0.4 | (PAG-6) | 0.4 | (B-11) | 0.09 | (B-5) | 0.06 |
| Ar-6 | (P-6) | 10 | (PAG-6) | 0.3 | (PAG-7) | 0.5 | (B-12) | 0.09 | (B-19) | 0.06 |
| Ar-7 | (P-7) | 10 | (PAG-7) | 0.8 | | | (B-7) | 0.15 | | |
| Ar-8 | (P-8) | 10 | (PAG-8) | 0.8 | | | (B-8) | 0.15 | | |
| Ar-9 | (P-9)/(P-10) | 5/5 | (PAG-9) | 0.8 | | | (B-9) | 0.15 | | |
| Ar-10 | (P-10) | 10 | (PAG-10) | 0.5 | (PAG-1) | 0.3 | (B-10)/(B-13) | 0.06/0.09 | | |
| Ar-11 | (P-11) | 10 | (PAG-11) | 0.4 | (PAG-6) | 0.4 | (B-11) | 0.15 | | |
| Ar-12 | (P-12) | 10 | (PAG-12) | 0.3 | (PAG-7) | 0.5 | (B-12) | 0.15 | | |
| Ar-13 | (P-13) | 10 | (PAG-1) | 0.8 | | | (B-13) | 0.15 | | |
| Ar-14 | (P-1) | 10 | (PAG-2) | 0.8 | | | (B-13) | 0.15 | | |
| Ar-15 | (P-2) | 10 | (PAG-3) | 0.8 | | | (B-12) | 0.15 | | |

TABLE 5-continued

| Resist | Crosslinking Agent (C) | mass/g | Surfactant (F) | mass/g | Hydrophobic Resin (HR) | mass/g | Solvent | Mass Ratio |
|---|---|---|---|---|---|---|---|---|
| Ar-1 | | | W-1 | 0.04 | (1b) | 0.06 | A3/B2 | 80/20 |
| Ar-2 | (CL-1) | 1.0 | W-2 | 0.04 | (2b) | 0.06 | A1/A2/B1 | 50/4/46 |
| Ar-3 | | | | | (3b) | 0.06 | A1/B1 | 60/40 |
| Ar-4 | | | W-1 | 0.04 | | | A1/B2 | 80/20 |
| Ar-5 | | | W-2 | 0.04 | (1b) | 0.06 | A2/B3 | 70/30 |
| Ar-6 | | | W-3 | 0.04 | (2b) | 0.06 | A3/B4 | 80/20 |
| Ar-7 | | | W-1 | 0.04 | (3b) | 0.06 | A3/B2 | 80/20 |
| Ar-8 | | | W-2 | 0.04 | (4b) | 0.06 | A1/A2/B1 | 50/4/46 |
| Ar-9 | | | W-3 | 0.04 | (5b) | 0.06 | A1/B1 | 60/40 |
| Ar-10 | | | W-1 | 0.04 | | | A1/B2 | 80/20 |
| Ar-11 | (X-1) | 1.0 | W-2 | 0.04 | (1b) | 0.06 | A2/B3 | 70/30 |
| Ar-12 | (X-2) | 1.0 | W-3 | 0.04 | (2b) | 0.06 | A3/B4 | 80/20 |
| Ar-13 | (X-3) | 1.0 | W-1 | 0.04 | (3b) | 0.06 | A3/B2 | 80/20 |
| Ar-14 | | | W-2 | 0.04 | (4b) | 0.06 | A1/A2/B1 | 50/4/46 |
| Ar-15 | (X-4) | 1.0 | W-3 | 0.04 | (5b) | 0.06 | A1/B1 | 60/40 |

| Resist | Resin (A) | mass/g | Acid Generator | mass/g | Acid Generator used in Combination | mass/g | Compound (G) | mass/g | Compound (H) or Compound (PA) | mass/g |
|---|---|---|---|---|---|---|---|---|---|---|
| Ar-16 | (P-3) | 10 | (PAG-4) | 1.2 | (PAG-1) | 0.3 | (B-11) | 0.15 | | |
| Ar-17 | (P-4) | 10 | (PAG-5) | 0.4 | (PAG-6) | 0.4 | (B-10) | 0.15 | | |
| Ar-18 | (P-5) | 10 | (PAG-6) | 0.8 | | | (B-7)/(B-9) | 0.09/0.06 | | |
| Ar-19 | (P-6) | 10 | (PAG-7) | 0.8 | | | (B-8) | 0.15 | | |
| Ar-20 | (P-7) | 10 | (PAG-8) | 0.8 | | | (B-7) | 0.15 | | |
| Ar-21 | (P-8) | 10 | (PAG-9) | 0.5 | (PAG-1) | 0.3 | (B-13) | 0.09 | (B-6) | 0.06 |
| Ar-22 | (P-9) | 10 | (PAG-10) | 0.5 | (PAG-1) | 0.3 | (B-14) | 0.09 | (B-5) | 0.06 |
| Ar-23 | (P-10) | 10 | (PAG-11) | 0.4 | (PAG-6) | 0.4 | (B-15) | 0.09 | (B-4) | 0.06 |
| Ar-24 | (P-11) | 10 | (PAG-12) | 0.3 | (PAG-7) | 0.5 | (B-16) | 0.09 | (B-3) | 0.06 |
| Ar-25 | (P-12) | 10 | (PAG-1) | 0.8 | | | (B-17) | 0.09 | (B-2) | 0.06 |
| Ar-26 | (P-13) | 10 | (PAG-2) | 0.8 | | | (B-18) | 0.09 | (B-1) | 0.06 |
| Ar-27 | (P-1) | 10 | (PAG-3) | 0.8 | | | | | (B-1)/(B-5) | 0.06/0.09 |
| Ar-28 | (P-11) | 10 | (PAG-5) | 0.4 | (PAG-6) | 0.4 | | | (B-3) | 0.15 |
| Ar-29 | (P-12) | 10 | (PAG-6) | 0.3 | (PAG-7) | 0.5 | | | (B-4) | 0.15 |
| t-1 | | | | | | | | | | |

| Resist | Crosslinking Agent (C) | mass/g | Surfactant (F) | mass/g | Hydrophobic Resin (HR) | mass/g | Solvent | Mass Ratio |
|---|---|---|---|---|---|---|---|---|
| Ar-16 | | | W-1 | 0.04 | (6b) | 0.06 | A1/B2 | 80/20 |
| Ar-17 | | | W-2 | 0.04 | (1b) | 0.06 | A2/B3 | 70/30 |
| Ar-18 | | | W-3 | 0.04 | (2b) | 0.06 | A3/B4 | 80/20 |
| Ar-19 | | | W-1 | 0.04 | (3b) | 0.06 | A3/B2 | 80/20 |
| Ar-20 | | | W-2 | 0.04 | (4b) | 0.06 | A1/A2/B1 | 50/4/46 |
| Ar-21 | | | W-3 | 0.04 | (5b) | 0.06 | A1/B1 | 60/40 |
| Ar-22 | | | W-1 | 0.04 | (6b) | 0.06 | A1/B2 | 80/20 |
| Ar-23 | | | W-2 | 0.04 | (1b) | 0.06 | A2/B3 | 70/30 |
| Ar-24 | (X-5) | 1.0 | W-3 | 0.04 | (2b) | 0.06 | A3/B4 | 80/20 |
| Ar-25 | (X-6) | 1.0 | W-1 | 0.04 | (3b) | 0.06 | A3/B2 | 80/20 |
| Ar-26 | (X-7) | 1.0 | W-2 | 0.04 | (4b) | 0.06 | A1/A2/B1 | 50/4/46 |
| Ar-27 | | | W-3 | 0.04 | (5b) | 0.06 | A1/B1 | 60/40 |
| Ar-28 | | | W-2 | 0.04 | (6b) | 0.06 | A2/B3 | 70/30 |
| Ar-29 | | | W-3 | 0.04 | (1b) | 0.06 | A3/B4 | 80/20 |
| t-1 | | | | | (2b) | 10 | C1 | 100 |

TABLE 6

| Resist | Resin (A) | mass/g | Acid Generator | mass/g | Acid Generator used in Combination | mass/g | Compound (G) | mass/g | Compound (H) or Compound (PA) | mass/g |
|---|---|---|---|---|---|---|---|---|---|---|
| Ar1-1 | (P1-1) | 10 | (PAG-1) | 0.8 | | | (B-7) | 0.09 | (B-1) | 0.06 |
| Ar1-2 | (P1-2) | 10 | (PAG-2) | 0.8 | | | (B-8) | 0.09 | (B-2) | 0.06 |
| Ar1-3 | (P1-3) | 10 | (PAG-3) | 0.8 | | | (B-9) | 0.09 | (B-3) | 0.06 |
| Ar1-4 | (P1-4) | 10 | (PAG-4) | 1.2 | (PAG-1) | 0.3 | (B-10) | 0.09 | (B-4) | 0.06 |
| Ar1-5 | (P1-5) | 10 | (PAG-5) | 0.4 | (PAG-6) | 0.4 | (B-11) | 0.09 | (B-5) | 0.06 |
| Ar1-6 | (P1-6) | 10 | (PAG-6) | 0.3 | (PAG-7) | 0.5 | (B-12) | 0.09 | (B-6) | 0.06 |
| Ar1-7 | (P1-7) | 10 | (PAG-7) | 0.8 | | | (B-7) | 0.15 | | |
| Ar1-8 | (P1-8) | 10 | (PAG-8) | 0.8 | | | (B-8) | 0.15 | | |
| Ar1-9 | (P1-9)/(P1-10) | 5/5 | (PAG-9) | 0.8 | | | (B-9) | 0.15 | | |
| Ar1-10 | (P1-10) | 10 | (PAG-10) | 0.5 | (PAG-1) | 0.3 | (B-10)/(B-13) | 0.06/0.09 | | |
| Ar1-11 | (P1-11) | 10 | (PAG-11) | 0.4 | (PAG-6) | 0.4 | (B-11) | 0.15 | | |
| Ar1-12 | (P1-12) | 10 | (PAG-12) | 0.3 | (PAG-7) | 0.5 | (B-12) | 0.15 | | |
| Ar1-13 | (P1-13) | 10 | (PAG-1) | 0.8 | | | (B-13) | 0.15 | | |

TABLE 6-continued

| | | | | | | | | | | |
|---|---|---|---|---|---|---|---|---|---|---|
| Ar1-14 | (P1-14) | 10 | (PAG-2) | 0.8 | | | (B-13) | 0.15 | | |
| Ar1-15 | (P1-1) | 10 | (PAG-3) | 0.8 | | | (B-12) | 0.15 | | |
| Ar1-16 | (P1-2) | 10 | (PAG-4) | 1.2 | (PAG-1) | 0.3 | (B-11) | 0.15 | | |
| Ar1-17 | (P1-3) | 10 | (PAG-5) | 0.4 | (PAG-6) | 0.4 | (B-10) | 0.15 | | |
| Ar1-18 | (P1-4) | 10 | (PAG-6) | 0.8 | | | (B-7)/(B-9) | 0.09/0.06 | | |
| Ar1-19 | (P1-5) | 10 | (PAG-7) | 0.8 | | | (B-8) | 0.15 | | |
| Ar1-20 | (P1-6) | 10 | (PAG-8) | 0.8 | | | (B-7) | 0.15 | | |
| Ar1-21 | (P1-7) | 10 | (PAG-9) | 0.5 | (PAG-1) | 0.3 | (B-13) | 0.09 | (B-19) | 0.06 |
| Ar1-22 | (P1-8) | 10 | (PAG-10) | 0.5 | (PAG-1) | 0.3 | (B-14) | 0.09 | (B-5) | 0.06 |
| Ar1-23 | (P1-9) | 10 | (PAG-11) | 0.4 | (PAG-6) | 0.4 | (B-15) | 0.09 | (B-4) | 0.06 |
| Ar1-24 | (P1-10) | 10 | (PAG-12) | 0.3 | (PAG-7) | 0.5 | (B-16) | 0.09 | (B-3) | 0.06 |
| Ar1-25 | (P1-11) | 10 | (PAG-1) | 0.8 | | | (B-17) | 0.09 | (B-2) | 0.06 |
| Ar1-26 | (P1-12) | 10 | (PAG-2) | 0.8 | | | (B-18) | 0.09 | (B-1) | 0.06 |
| t-1 | | | | | | | | | | |

| Resist | Surfactant | mass/g | Hydrophobic Resin | mass/g | Solvent | Mass Ratio |
|---|---|---|---|---|---|---|
| Ar1-1 | W-1 | 0.04 | (1b) | 0.06 | A3/B2 | 80/20 |
| Ar1-2 | W-2 | 0.04 | (2b) | 0.06 | A1/A2/B1 | 50/4/46 |
| Ar1-3 | | | (3b) | 0.06 | A1/B1 | 60/40 |
| Ar1-4 | W-1 | 0.04 | | | A1/B2 | 80/20 |
| Ar1-5 | W-2 | 0.04 | (1b) | 0.06 | A2/B3 | 70/30 |
| Ar1-6 | W-3 | 0.04 | (2b) | 0.06 | A3/B4 | 80/20 |
| Ar1-7 | W-4 | 0.04 | (3b) | 0.06 | A3/B2 | 80/20 |
| Ar1-8 | W-1 | 0.04 | (4b) | 0.06 | A1/A2/B1 | 50/4/46 |
| Ar1-9 | W-2 | 0.04 | (5b) | 0.06 | A1/B1 | 60/40 |
| Ar1-10 | W-3 | 0.04 | | | A1/B2 | 80/20 |
| Ar1-11 | W-4 | 0.04 | (1b) | 0.06 | A2/B3 | 70/30 |
| Ar1-12 | W-1 | 0.04 | (2b) | 0.06 | A3/B4 | 80/20 |
| Ar1-13 | W-2 | 0.04 | (3b) | 0.06 | A3/B2 | 80/20 |
| Ar1-14 | W-3 | 0.04 | (4b) | 0.06 | A1/A2/B1 | 50/4/46 |
| Ar1-15 | W-4 | 0.04 | (5b) | 0.06 | A1/B1 | 60/40 |
| Ar1-16 | W-1 | 0.04 | (6b) | 0.06 | A1/B2 | 80/20 |
| Ar1-17 | W-2 | 0.04 | (1b) | 0.06 | A2/B3 | 70/30 |
| Ar1-18 | W-3 | 0.04 | (2b) | 0.06 | A3/B4 | 80/20 |
| Ar1-19 | W-4 | 0.04 | (3b) | 0.06 | A3/B2 | 80/20 |
| Ar1-20 | W-1 | 0.04 | (4b) | 0.06 | A1/A2/B1 | 50/4/46 |
| Ar1-21 | W-2 | 0.04 | (5b) | 0.06 | A1/B1 | 60/40 |
| Ar1-22 | W-3 | 0.04 | (6b) | 0.06 | A1/B2 | 80/20 |
| Ar1-23 | W-4 | 0.04 | (1b) | 0.06 | A2/B3 | 70/30 |
| Ar1-24 | W-1 | 0.04 | (2b) | 0.06 | A3/B4 | 80/20 |
| Ar1-25 | W-2 | 0.04 | (3b) | 0.06 | A3/B2 | 80/20 |
| Ar1-26 | W-3 | 0.04 | (4b) | 0.06 | A1/A2/B1 | 50/4/46 |
| t-1 | | | (2b) | 10 | C1 | 100 |

Abbreviations in Tables 5 and 6 are as follows.

B-1 to B-19: Each indicates the compound shown below. Here, Compounds (B-7) to (B-18) come under the compound (G) and of these, all of Nitrogen-Containing Resins (B-12) to (B-18) correspond to the resin (G). Compound (B-19) comes under the compound (PA). Compound B-10 and Resin B-12 were synthesized by the following synthesis method, and other compounds were also synthesized in the same manner.

Synthesis Example 5

Synthesis of Compound B-10

50 ml of tetrahydrofuran (THF) was added to 2.3 g of 1-(tert-butoxycarbonyl)isonipecotic acid, and 3.4 g of 1,1,1,3,3,3-hexafluoroisopropyl alcohol and 1.7 g of 4-dimethylaminopyridine were further added, followed by stirring. To the resulting solution, 3.5 g of 1-ethyl-3-(3-dimethylaminopropyl)carbodiimide hydrochloride was added, and the mixture was stirred for 3 hours. The reaction solution was added to 30 ml of 1 N HCl to stop the reaction, and the organic layer was washed further with 1 N HCl and then washed with water. The obtained organic layer was concentrated to obtain 3.2 g of Compound (B-10) (yield: 83%).

$^1$H-NMR (400 MHz in $(CD_3)_2CO$): σ (ppm)=1.45 (9H), 1.60-1.75 (2H), 1.90-2.00 (2H), 2.70 (1H), 2.85-3.00 (2H), 3.95-4.10 (2H), 5.75 (1H).

Synthesis Example 6

Synthesis of Resin B-12

Respective monomers corresponding to the following repeating units were charged in a ratio of 39/49/10/2 (by mol) and dissolved in PGMEA to prepare 450 g of a solution having a solid content concentration of 15 mass %. To this solution, 1 mol % of polymerization initiator V-601 produced by Wako Pure Chemical Industries, Ltd. was added and in a nitrogen atmosphere, the resulting mixture was added dropwise over 6 hours to 50 g of PGMEA heated to 100° C. After the completion of dropwise addition, the reaction solution was stirred for 2 hours. Once the reaction was completed, the reaction solution was cooled to room temperature and crystallized from 5 L of methanol, and the precipitated white powder was filtered to collect the objective Resin B-12.

The compositional ratio of the polymer determined from NMR was 39/49/10/2. Also, the weight average molecular weight in terms of standard polystyrene as determined by the GPC measurement was 4,300, and the polydispersity was 1.5.

(B-1)
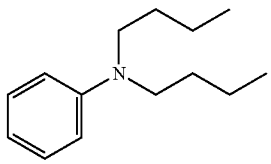
(B-2)
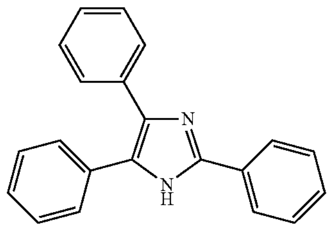
(B-3)
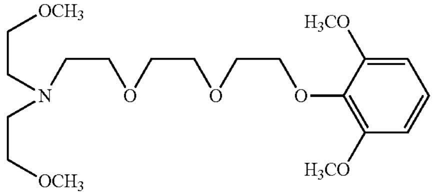
(B-4)
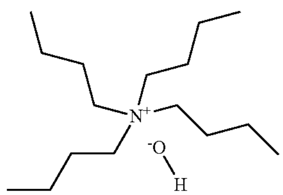
(B-5)
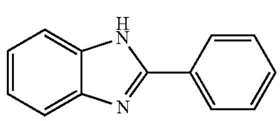
(B-6)
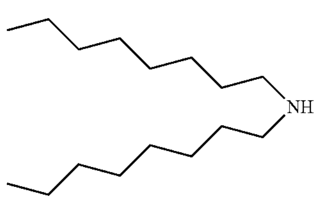
(B-7)
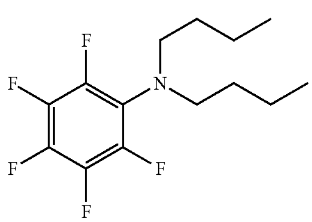
(B-8)
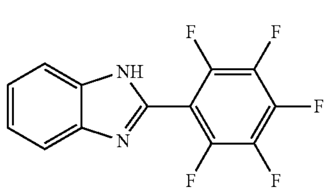
-continued
(B-9)
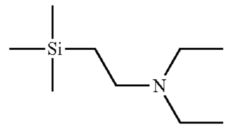
(B-10)
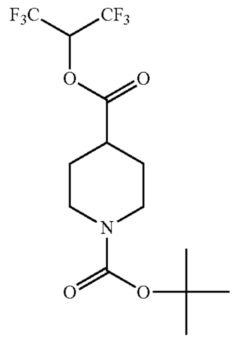
(B-11)
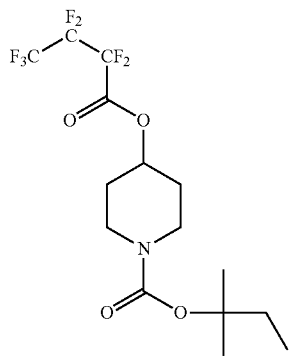
(B-12)
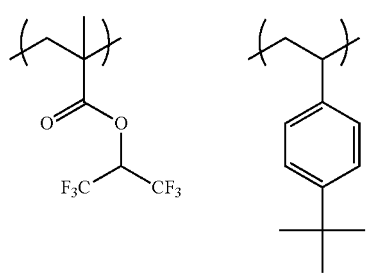
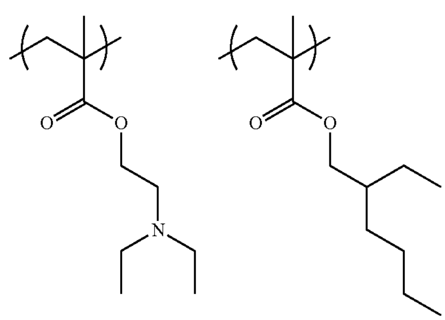

-continued
(B-13)
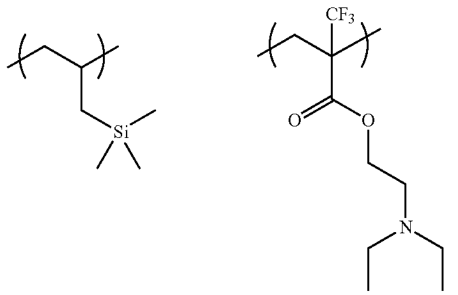
(B-14)
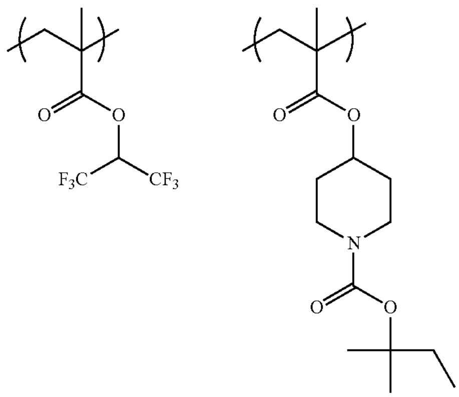
(B-15)
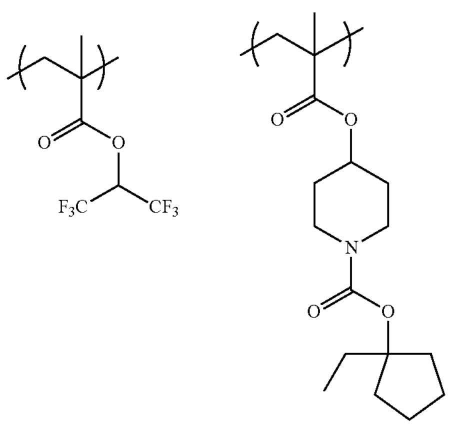
(B-16)
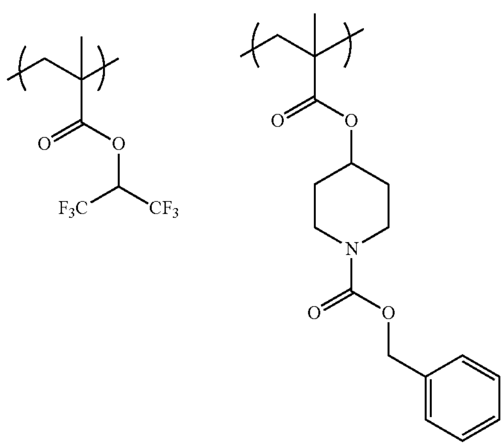
-continued
(B-17)
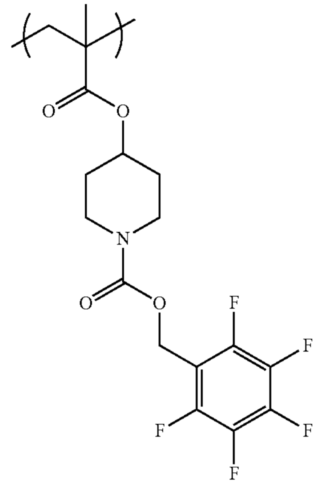
(B-18)
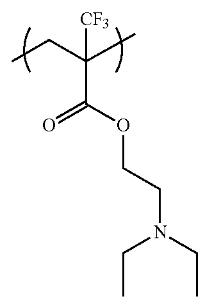
(B-19)
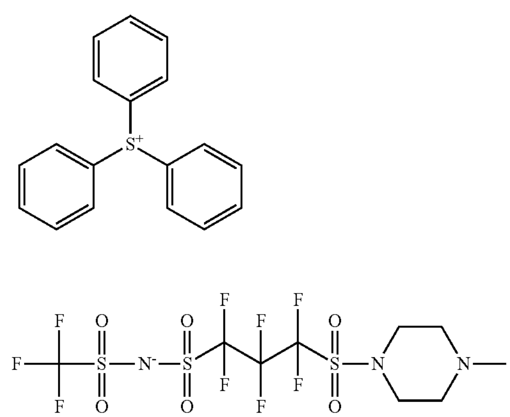
The compositional ratio (by mol), weight average molecular weight and polydispersity of each of Resins (B-12) to (B-18) are shown in Table 7.
TABLE 7
| Resin | Composition (molar ratio) | Mw | Mw/Mn |
|---|---|---|---|
| (B-12) | 39/49/10/2 | 4300 | 1.5 |
| (B-13) | 50/50 | 6200 | 1.6 |
| (B-14) | 50/50 | 5700 | 1.6 |
| (B-15) | 50/50 | 3600 | 1.8 |
| (B-16) | 50/50 | 4300 | 1.5 |
| (B-17) | 100 | 6100 | 1.6 |
| (B-18) | 100 | 5300 | 1.6 |
X-1 to X-7, CL-1: Each indicates the compound shown below.

(X-1)

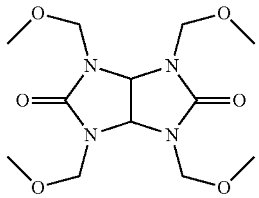

(X-2)

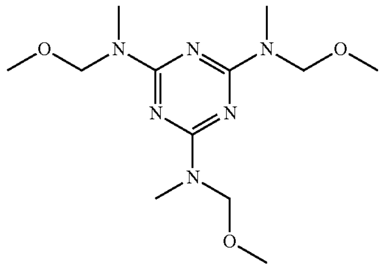

(X-3)

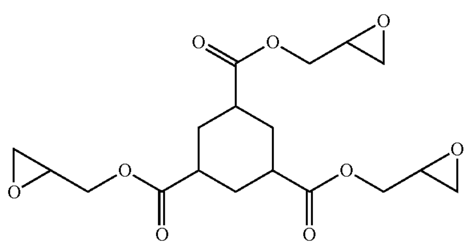

(CL-1)

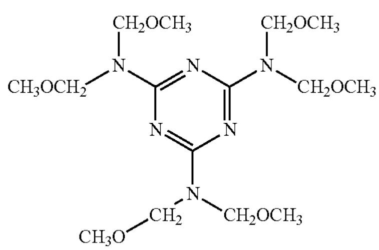

(X-4)

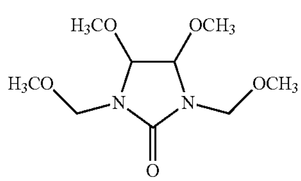

(X-5)

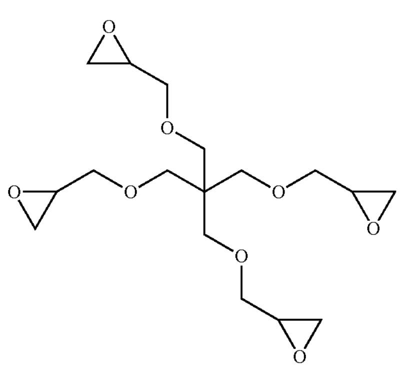

-continued (X-6)

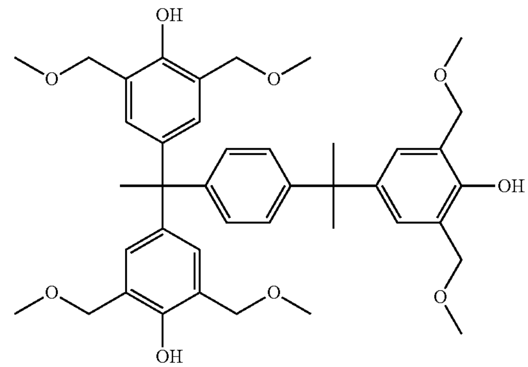

(X-7)

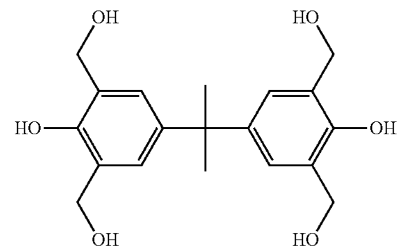

W-1: Megaface F176 (produced by Dainippon Ink & Chemicals, Inc.) (fluorine-containing)

W-2: Megaface R08 (produced by Dainippon Ink & Chemicals, Inc.) (fluorine- and silicon-containing)

W-3: Polysiloxane polymer KP-341 (produced by Shin-Etsu Chemical Co., Ltd.) (silicon-containing)

W-4: PF-6320 (produced by OMNOVA) (fluorine-containing)

A1: Propylene glycol monomethyl ether acetate (PGMEA)

A2: γ-Butyrolactone

A3: Cyclohexanone

B1: Propylene glycol monomethyl ether (PGME)

B2: Ethyl lactate

B3: 2-Heptanone

B4: Propylene carbonate

C1: Diisopentyl ether

Using the prepared resist composition, a resist pattern was formed by the following method.

Example 1

Exposure→Baking→Development→Rinsing, abbr. E-B-D-R

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar-1 was coated thereon and baked at 100° C. for 60 seconds to form a resist film having a thickness of 100 nm. The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 8 for 30 seconds, rinsed by puddling the rinsing solution shown in Table 8 for 30 seconds, then spun at a rotational speed of 4,000 rpm for 30 seconds and baked at 90° C. for 60 seconds to obtain a line-and-space resist pattern of 100 nm (1:1).

Examples 2, 3, 5, 10, 11, 14, 15, 18 to 23 and 26 and Comparative Examples 1 to 3

Line-and-space resist patterns of 100 nm (1:1) were obtained in the same manner as in the method of Example 1 except for employing the resist and conditions shown in Table 8.

Example 4

Immersion→Exposure→Baking→Development→Rinsing, abbr.: tiE-B-D-R

An organic antireflection film, ARC29SR (produced by Nissan Chemical Industries, Ltd.), was coated on a silicon wafer and baked at 205° C. for 60 seconds to form a 95 nm-thick antireflection film, and Resist Composition Ar-4 was coated thereon and baked at 100° C. for 60 seconds to form a resist film having a thickness of 100 nm. Furthermore, Topcoat Composition t-1 was coated thereon and baked at 100° C. for 60 seconds to form a 100 nm-thick topcoat film. The obtained wafer was subjected to pattern exposure using an ArF excimer laser immersion scanner (XT17001, manufactured by ASML, NA: 1.20, C-Quad, outer sigma: 0.981, inner sigma: 0.895, XY deflection) through an exposure mask (line/space=1/1). As for the immersion liquid, ultrapure water was used. Thereafter, the wafer was heated at 100° C. for 60 seconds, developed by puddling the developer shown in Table 8 for 30 seconds, rinsed by puddling the rising solution shown in Table 8 for 30 seconds, then spun at a rotational speed of 4,000 rpm for 30 seconds and baked at 90° C. for 60 seconds to obtain a line-and-space resist pattern of 100 nm (1:1).

Example 6

Immersion→Exposure→Baking→Development→Rinsing, abbr.: iE-B-D-R

An organic antireflection film, ARC29SR (produced by Nissan Chemical Industries, Ltd.), was coated on a silicon wafer and baked at 205° C. for 60 seconds to form a 95 nm-thick antireflection film, and Resist Composition Ar-6 was coated thereon and baked at 100° C. for 60 seconds to form a resist film having a thickness of 100 nm. The obtained wafer was subjected to pattern exposure using an ArF excimer laser immersion scanner (XT1700i, manufactured by ASML, NA: 1.20, C-Quad, outer sigma: 0.981, inner sigma: 0.895, XY deflection) through an exposure mask (line/space=1/1). As for the immersion liquid, ultrapure water was used. Thereafter, the wafer was heated at 100° C. for 60 seconds, developed by puddling the developer shown in Table 8 for 30 seconds, rinsed by puddling the rising solution shown in Table 8 for 30 seconds, then spun at a rotational speed of 4,000 rpm for 30 seconds and baked at 90° C. for 60 seconds to obtain a line-and-space resist pattern of 100 nm (1:1).

Examples 7 to 9, 12, 24 and 25

Line-and-space resist patterns of 100 nm (1:1) were obtained in the same manner as in the method of Example 6 except for employing the resist and conditions shown in Table 8.

Example 13

Exposure→Baking→Development, abbr.: E-B-D

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar-13 was coated thereon and baked at 100° C. for 60 seconds to form a resist film having a thickness of 100 nm. The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 8 for 30 seconds, spun at a rotational speed of 4,000 rpm for 30 seconds and then baked at 90° C. for 60 seconds to obtain a line-and-space resist pattern of 100 nm (1:1).

Example 16

Exposure→Baking→Development→Spin Rinsing, abbr.: E-B-D-R2

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar-16 was coated thereon and baked at 100° C. for 60 seconds to form a resist film having a thickness of 100 nm. The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 8 for 30 seconds, rinsed by flowing the rinsing solution shown in Table 8 on the wafer for 30 seconds while spinning the wafer at a rotational speed of 500 rpm, then spun at a rotational speed of 4,000 rpm for 30 seconds and baked at 90° C. for 60 seconds to obtain a line-and-space resist pattern of 100 nm (1:1).

Example 17

Exposure→Baking→Spin Development→Rinsing, abbr.: E-B-D2-R

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar-17 was coated thereon and baked at 100° C. for 60 seconds to form a resist film having a thickness of 100 nm. The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by flowing the developer shown in Table 8 on the wafer for 30 seconds while spinning the wafer at a rotational speed of 500 rpm, rinsed by puddling the rinsing shown in Table 8 for 30 seconds, then spun at a rotational speed of 4,000 rpm for 30 seconds and baked at 90° C. for 60 seconds to obtain a line-and-space resist pattern of 100 nm (1:1).

Example 27

Inorganic Antireflection Film Substrate→Exposure→Baking→Development→Rinsing, abbr.: 1-E-B-D-R A line-and-space resist pattern of 100 nm (1:1) was obtained in the same manner as in the method of Example 2 except for using an SiON substrate as the substrate having an inorganic antireflection film.

the optimal exposure dose, and the range of focus allowing for a pattern size of 100 nm±10% was determined. As the value is larger, the change in performance due to change of focus is smaller and the focus latitude (DOF) is better.

[Pattern Profile]

The pattern profile of the line-and-space resist pattern of 100 nm (1:1) at the optimal exposure dose and optimal focus was observed. The level giving a good pattern profile was rated A, and the level giving a T-top profile was rated B.

[Dimension Before Bridge]

TABLE 8

| | Resist | PB | Topcoat | Topcoat Baking | PEB | Developer | Rinsing Solution | Abbr. of Process |
|---|---|---|---|---|---|---|---|---|
| Example (1) | Ar-1 | 100 C. 60 s | none | none | 100 C. 60 s | butyl acetate | 1-hexanol | E-B-D-R |
| Example (2) | Ar-2 | 100 C. 60 s | none | none | 100 C. 60 s | butyl acetate | 1-hexanol | E-B-D-R |
| Example (3) | Ar-3 | 100 C. 60 s | none | none | 100 C. 60 s | B1 | 1-hexanol | E-B-D-R |
| Example (4) | Ar-4 | 100 C. 60 s | t-1 | 100 C. 60 s | 100 C. 60 s | B1 | 4-methyl-2-pentanol | tiE-B-D-R |
| Example (5) | Ar-5 | 100 C. 60 s | none | none | 100 C. 60 s | butyl acetate | 4-methyl-2-pentanol | E-B-D-R |
| Example (6) | Ar-6 | 100 C. 60 s | none | none | 100 C. 60 s | a mixed solvent of butyl acetate:B1 = 1:1 (by mass) | 4-methyl-2-pentanol | iE-B-D-R |
| Example (7) | Ar-7 | 100 C. 60 s | none | none | 100 C. 60 s | butyl acetate | 4-methyl-2-pentanol | iE-B-D-R |
| Example (8) | Ar-8 | 100 C. 60 s | none | none | 100 C. 60 s | butyl acetate | a mixed solvent of 1-hexanol:4-methyl-2-pentanol = 1:1 (by mass) | iE-B-D-R |
| Example (9) | Ar-9 | 100 C. 60 s | none | none | 100 C. 60 s | butyl acetate | 1-hexanol | iE-B-D-R |
| Example (10) | Ar-10 | 100 C. 60 s | none | none | 100 C. 60 s | butyl acetate | 1-hexanol | E-B-D-R |
| Example (11) | Ar-11 | 100 C. 60 s | none | none | 100 C. 60 s | butyl acetate | 1-hexanol | E-B-D-R |
| Example (12) | Ar-12 | 100 C. 60 s | none | none | 100 C. 60 s | butyl acetate | 1-hexanol | iE-B-D-R |
| Example (13) | Ar-13 | 100 C. 60 s | none | none | 100 C. 60 s | butyl acetate | None | E-B-D |
| Example (14) | Ar-14 | 100 C. 60 s | none | none | 100 C. 60 s | butyl acetate | 4-methyl-2-pentanol | E-B-D-R |
| Example (15) | Ar-15 | 100 C. 60 s | none | none | 100 C. 60 s | A1 | A1 | E-B-D-R |
| Example (16) | Ar-16 | 100 C. 60 s | none | none | 100 C. 60 s | butyl acetate | 4-methyl-2-pentanol | E-B-D-R2 |
| Example (17) | Ar-17 | 100 C. 60 s | none | none | 100 C. 60 s | butyl acetate | 4-methyl-2-pentanol | E-B-D2-R |
| Example (18) | Ar-18 | 100 C. 60 s | none | none | 100 C. 60 s | butyl acetate | 1-hexanol | E-B-D-R |
| Example (19) | Ar-19 | 100 C. 60 s | none | none | 100 C. 60 s | butyl acetate | 1-hexanol | E-B-D-R |
| Example (20) | Ar-20 | 100 C. 60 s | none | none | 100 C. 60 s | B1 | 1-hexanol | E-B-D-R |
| Example (21) | Ar-21 | 100 C. 60 s | none | none | 100 C. 60 s | butyl acetate | 1-hexanol | E-B-D-R |
| Example (22) | Ar-22 | 100 C. 60 s | none | none | 100 C. 60 s | butyl acetate | 1-hexanol | E-B-D-R |
| Example (23) | Ar-23 | 100 C. 60 s | none | none | 100 C. 60 s | butyl acetate | 1-hexanol | E-B-D-R |
| Example (24) | Ar-24 | 100 C. 60 s | none | none | 100 C. 60 s | B1 | 1-hexanol | iE-B-D-R |
| Example (25) | Ar-25 | 100 C. 60 s | none | none | 100 C. 60 s | B1 | 4-methyl-2-pentanol | iE-B-D-R |
| Example (26) | Ar-26 | 100 C. 60 s | none | none | 100 C. 60 s | butyl acetate | 4-methyl-2-pentanol | E-B-D-R |
| Example (27) | Ar-2 | 100 C. 60 s | none | none | 100 C. 60 s | butyl acetate | 1-hexanol | I-E-B-D-R |
| Comparative Example (1) | Ar-27 | 100 C. 60 s | none | none | 100 C. 60 s | butyl acetate | 4-methyl-2-pentanol | E-B-D-R |
| Comparative Example (2) | Ar-28 | 100 C. 60 s | none | none | 100 C. 60 s | butyl acetate | 4-methyl-2-pentanol | E-B-D-R |
| Comparative Example (3) | Ar-29 | 100 C. 60 s | none | none | 100 C. 60 s | butyl acetate | 4-methyl-2-pentanol | E-B-D-R |

In Table 8, PB means heating before exposure, and PEB means heating after exposure. Also, in the columns of PB, PEB and Topcoat Baking, for example, "100C60s" means heating at 100° C. for 60 seconds. A1 and B1 indicate the solvents described above.

<Evaluation Method>

Evaluation of Resolution:

[Line Width Roughness (LWR)]

The line-and-space resist pattern of 100 nm (1:1) was observed using a Critical Dimension scanning electron microscope (SEM, S-9380II, manufactured by Hitachi Ltd.). The line width was measured at 50 points at regular intervals in the range of 2 μm in the longitudinal direction of the space pattern and from its standard deviation, 3σ (nm) was computed, whereby the line width roughness was measured. A smaller value indicates better performance.

[Focus Latitude (DOF)]

The exposure dose and focus for forming a line-and-space resist pattern of 100 nm (1:1) were defined as an optimal exposure dose and an optimal focus, respectively. The focus was changed (defocused) while keeping the exposure dose at In the line-and-space resist pattern of 100 nm (1:1) at the optimal focus, the minimum space dimension before generation of a bridge defect was observed by changing the exposure dose. A smaller value indicates less generation of a bridge defect and better performance.

The evaluation results of Examples are shown together in Table 9 below.

TABLE 9

| | Resist | LWR [nm] | DOF [μm] | Pattern Profile | Dimension Before Bridge [nm] |
|---|---|---|---|---|---|
| Example (1) | Ar-1 | 6.1 | 0.65 | A | 35 |
| Example (2) | Ar-2 | 5.9 | 0.59 | A | 28 |
| Example (3) | Ar-3 | 6.3 | 0.64 | A | 36 |
| Example (4) | Ar-4 | 3.9 | 0.71 | A | 27 |
| Example (5) | Ar-5 | 5.4 | 0.60 | A | 34 |
| Example (6) | Ar-6 | 4.4 | 0.72 | A | 31 |
| Example (7) | Ar-7 | 6.2 | 0.61 | A | 35 |
| Example (8) | Ar-8 | 6.4 | 0.66 | A | 30 |
| Example (9) | Ar-9 | 6.5 | 0.59 | A | 38 |

TABLE 9-continued

| | Resist | LWR [nm] | DOF [μm] | Pattern Profile | Dimension Before Bridge [nm] |
|---|---|---|---|---|---|
| Example (10) | Ar-10 | 4.6 | 0.69 | A | 32 |
| Example (11) | Ar-11 | 4.7 | 0.68 | A | 27 |
| Example (12) | Ar-12 | 4.1 | 0.81 | A | 39 |
| Example (13) | Ar-13 | 6.8 | 0.56 | A | 37 |
| Example (14) | Ar-14 | 5.8 | 0.62 | A | 33 |
| Example (15) | Ar-15 | 5.5 | 0.76 | A | 26 |
| Example (16) | Ar-16 | 5.5 | 0.62 | A | 36 |
| Example (17) | Ar-17 | 4.8 | 0.69 | A | 32 |
| Example (18) | Ar-18 | 6.3 | 0.65 | A | 34 |
| Example (19) | Ar-19 | 5.5 | 0.65 | A | 30 |
| Example (20) | Ar-20 | 5.3 | 0.62 | A | 34 |
| Example (21) | Ar-21 | 6.0 | 0.63 | A | 35 |
| Example (22) | Ar-22 | 5.9 | 0.56 | A | 37 |
| Example (23) | Ar-23 | 6.5 | 0.60 | A | 29 |
| Example (24) | Ar-24 | 4.6 | 0.80 | A | 28 |
| Example (25) | Ar-25 | 6.1 | 0.71 | A | 40 |
| Example (26) | Ar-26 | 5.4 | 0.74 | A | 43 |
| Example (27) | Ar-2 | 5.6 | 0.63 | A | 32 |
| Comparative Example (1) | Ar-27 | 7.6 | 0.43 | B | 54 |
| Comparative Example (2) | Ar-28 | 7.9 | 0.49 | B | 57 |
| Comparative Example (3) | Ar-29 | 8.1 | 0.50 | B | 61 |

As apparent from Table 9, by developing the resist composition of the present invention with an organic solvent-containing developer, a high-precision fine pattern excellent in terms of line width roughness, focus latitude, pattern profile and defect performance can be stably formed.

Example 1-1

Exposure→Baking→Development→Rinsing, abbr. E-B-D-R

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar1-1 was coated thereon and baked at 100° C. for 60 seconds to form a resist film having a thickness of 100 nm.

The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 10 below for 30 seconds, rinsed by puddling the rinsing solution shown in the same Table for 30 seconds, then spun at a rotational speed of 4,000 rpm for 30 seconds and baked at 90° C. for 60 seconds to obtain a line-and-space resist pattern of 100 nm (1:1).

Examples 1-2, 1-3, 1-5, 1-10, 1-11, 1-14, 1-15, 1-18 to 1-23 and 1-26

Line-and-space resist patterns of 100 nm (1:1) were obtained in the same manner as in the method of Example 1-1 except for employing the resist and conditions shown in Table 10.

Example 1-6

Immersion Exposure→Baking→Development→Rinsing, abbr.: iE-B-D-R

An organic antireflection film, ARC29SR (produced by Nissan Chemical Industries, Ltd.), was coated on a silicon wafer and baked at 205° C. for 60 seconds to form a 95 nm-thick antireflection film, and Resist Composition Ar1-6 was coated thereon and baked at 100° C. for 60 seconds to form a resist film having a thickness of 100 nm.

The obtained wafer was subjected to pattern exposure using an ArF excimer laser immersion scanner (XT1700i, manufactured by ASML, NA: 1.20, C-Quad, outer sigma: 0.981, inner sigma: 0.895, XY deflection) through an exposure mask (line/space=1/1). At this time, ultrapure water was used as the immersion liquid. Thereafter, the wafer was heated at 100° C. for 60 seconds, developed by puddling the developer shown in Table 10 below for 30 seconds, rinsed by puddling the rising solution shown in the same Table for 30 seconds, then spun at a rotational speed of 4,000 rpm for 30 seconds and baked at 90° C. for 60 seconds to obtain a line-and-space resist pattern of 100 nm (1:1).

Examples 1-7 to 1-9, 1-12, 1-24 and 1-25

Line-and-space resist patterns of 100 nm (1:1) were obtained in the same manner as in the method of Example 1-6 except for employing the resist and conditions shown in Table 10.

Example 1-13

Exposure→Baking→Development, abbr.: E-B-D

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar1-13 was coated thereon and baked at 100° C. for 60 seconds to form a resist film having a thickness of 100 nm.

The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 10 below for 30 seconds, spun at a rotational speed of 4,000 rpm for 30 seconds and then baked at 90° C. for 60 seconds to obtain a line-and-space resist pattern of 100 nm (1:1).

Example 1-16

Exposure→Baking→Development→Spin Rinsing, abbr.: E-B-D-R2

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar1-16 was coated thereon and baked at 100° C. for 60 seconds to form a resist film having a thickness of 100 nm.

The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by puddling the developer shown in Table 10 below for 30 seconds, rinsed by flowing the rinsing solution shown in the same Table on the wafer for 30 seconds while spinning the wafer at a rotational speed of 500 rpm, then spun at a rotational speed of 4,000 rpm for 30 seconds and baked at 90° C. for 60 seconds to obtain a line-and-space resist pattern of 100 nm (1:1).

Example 1-17

Exposure→Baking→Spin Development→Rinsing, abbr.: E-B-D2-R

An organic antireflection film, ARC29A (produced by Nissan Chemical Industries, Ltd.), was coated on a silicon wafer and baked at 205° C. for 60 seconds to form a 86 nm-thick antireflection film, and Resist Composition Ar1-17 was coated thereon and baked at 100° C. for 60 seconds to form a resist film having a thickness of 100 nm.

The obtained wafer was subjected to pattern exposure using an ArF excimer laser scanner (PAS5500/1100, manufactured by ASML, NA: 0.75, Dipole, outer sigma: 0.89, inner sigma: 0.65) through an exposure mask (line/space=1/1). Thereafter, the wafer was heated at 100° C. for 60 seconds, developed by flowing the developer shown in Table 10 below on the wafer for 30 seconds while spinning the wafer at a rotational speed of 500 rpm, rinsed by puddling the rinsing shown in the same Table for 30 seconds, then spun at a rotational speed of 4,000 rpm for 30 seconds and baked at 90° C. for 60 seconds to obtain a line-and-space resist pattern of 100 nm (1:1).

Example 1-4

Immersion Exposure→Baking→Development→Rinsing, abbr.: tiE-B-D-R

An organic antireflection film, ARC29SR (produced by Nissan Chemical Industries, Ltd.), was coated on a silicon wafer and baked at 205° C. for 60 seconds to form a 95 nm-thick antireflection film, and Resist Composition Ar1-4 was coated thereon and baked at 100° C. for 60 seconds to form a resist film having a thickness of 100 nm. Furthermore, Topcoat Composition t-1 was coated thereon and baked at 100° C. for 60 seconds to form a 100 nm-thick topcoat film.

The obtained wafer was subjected to pattern exposure using an ArF excimer laser immersion scanner (XT1700i, manufactured by ASML, NA: 1.20, C-Quad, outer sigma: 0.981, inner sigma: 0.895, XY deflection) through an exposure mask (line/space=1/1). At this time, ultrapure water was used as the immersion liquid. Thereafter, the wafer was heated at 100° C. for 60 seconds, developed by puddling the developer shown in Table 10 below for 30 seconds, rinsed by puddling the rising solution shown in the same Table for 30 seconds, then spun at a rotational speed of 4,000 rpm for 30 seconds and baked at 90° C. for 60 seconds to obtain a line-and-space resist pattern of 100 nm (1:1).

Example 1-27

Inorganic Antireflection Film Substrate→Exposure→Baking→Development→Rinsing, abbr.: 1-E-B-D-R A line-and-space resist pattern of 100 nm (1:1) was obtained in the same manner as in the method of Example 1-2 except for using an SiON substrate as the substrate having an inorganic antireflection film.

TABLE 10

| | Resist | PB | Topcoat | Topcoat Baking | PEB | Developer (mass ratio) | Rinsing Solution (mass ratio) | Abbr. of Process |
|---|---|---|---|---|---|---|---|---|
| Example (1-1) | Ar1-1 | 100 C. 60 s | none | none | 100 C. 60 s | butyl acetate | 1-hexanol | E-B-D-R |
| Example (1-2) | Ar1-2 | 100 C. 60 s | none | none | 100 C. 60 s | butyl acetate | 1-hexanol | E-B-D-R |
| Example (1-3) | Ar1-3 | 100 C. 60 s | none | none | 100 C. 60 s | B1 | 1-hexanol | E-B-D-R |
| Example (1-4) | Ar1-4 | 100 C. 60 s | t-1 | 100 C. 60 s | 100 C. 60 s | B1 | 4-methyl-2-pentanol | tiE-B-D-R |
| Example (1-5) | Ar1-5 | 100 C. 60 s | none | none | 100 C. 60 s | butyl acetate | 4-methyl-2-pentanol | E-B-D-R |
| Example (1-6) | Ar1-6 | 100 C. 60 s | none | none | 100 C. 60 s | butyl acetate/B1 (50/50) | 4-methyl-2-pentanol | iE-B-D-R |
| Example (1-7) | Ar1-7 | 100 C. 60 s | none | none | 100 C. 60 s | butyl acetate | 4-methyl-2-pentanol | iE-B-D-R |
| Example (1-8) | Ar1-8 | 100 C. 60 s | none | none | 100 C. 60 s | butyl acetate | 1-hexanol/4-methyl-2-pentanol (50/50) | iE-B-D-R |
| Example (1-9) | Ar1-9 | 100 C. 60 s | none | none | 100 C. 60 s | butyl acetate | 1-hexanol | iE-B-D-R |
| Example (1-10) | Ar1-10 | 100 C. 60 s | none | none | 100 C. 60 s | butyl acetate | 1-hexanol | E-B-D-R |
| Example (1-11) | Ar1-11 | 100 C. 60 s | none | none | 100 C. 60 s | butyl acetate | 1-hexanol | E-B-D-R |
| Example (1-12) | Ar1-12 | 100 C. 60 s | none | none | 100 C. 60 s | butyl acetate | 1-hexanol | iE-B-D-R |
| Example (1-13) | Ar1-13 | 100 C. 60 s | none | none | 100 C. 60 s | butyl acetate | None | E-B-D |
| Example (1-14) | Ar1-14 | 100 C. 60 s | none | none | 100 C. 60 s | butyl acetate | 4-methyl-2-pentanol | E-B-D-R |
| Example (1-15) | Ar1-15 | 100 C. 60 s | none | none | 100 C. 60 s | A1 | A1 | E-B-D-R |
| Example (1-16) | Ar1-16 | 100 C. 60 s | none | none | 100 C. 60 s | butyl acetate | 4-methyl-2-pentanol | E-B-D-R2 |
| Example (1-17) | Ar1-17 | 100 C. 60 s | none | none | 100 C. 60 s | butyl acetate | 4-methyl-2-pentanol | E-B-D2-R |
| Example (1-18) | Ar1-18 | 100 C. 60 s | none | none | 100 C. 60 s | butyl acetate | 1-hexanol | E-B-D-R |
| Example (1-19) | Ar1-19 | 100 C. 60 s | none | none | 100 C. 60 s | butyl acetate | 1-hexanol | E-B-D-R |
| Example (1-20) | Ar1-20 | 100 C. 60 s | none | none | 100 C. 60 s | B1 | 1-hexanol | E-B-D-R |
| Example (1-21) | Ar1-21 | 100 C. 60 s | none | none | 100 C. 60 s | butyl acetate | 1-hexanol | E-B-D-R |
| Example (1-22) | Ar1-22 | 100 C. 60 s | none | none | 100 C. 60 s | butyl acetate | 1-hexanol | E-B-D-R |
| Example (1-23) | Ar1-23 | 100 C. 60 s | none | none | 100 C. 60 s | butyl acetate | 1-hexanol | E-B-D-R |
| Example (1-24) | Ar1-24 | 100 C. 60 s | none | none | 100 C. 60 s | B1 | 1-hexanol | iE-B-D-R |
| Example (1-25) | Ar1-25 | 100 C. 60 s | none | none | 100 C. 60 s | B1 | 4-methyl-2-pentanol | iE-B-D-R |
| Example (1-26) | Ar1-26 | 100 C. 60 s | none | none | 100 C. 60 s | butyl acetate | 4-methyl-2-pentanol | E-B-D-R |
| Example (1-27) | Ar1-2 | 100 C. 60 s | none | none | 100 C. 60 s | butyl acetate | 1-hexanol | I-E-B-D-R |

In Table 10, "PB" means heating before exposure, and "PEB" means heating after exposure. Also, in the columns of "PB", "Topcoat Baking" and "PEB", "XCYs" means that the heating was performed at X° C. for Y seconds. In the columns of "Developer" and "Rinsing Solution", A1 and B1 indicate the solvents described above.

<Evaluation Method>

[Sensitivity ($E_{opt}$)]

The obtained resist pattern was observed using a Critical Dimension scanning electron microscope (SEM, S-9380II, manufactured by Hitachi Ltd.), and the exposure dose when the line width of the pattern determined by measuring the line width at 50 points at regular intervals in the range of 2 μm in the longitudinal direction of the space pattern and obtaining the average thereof becomes the desired line width (the line-and-space of 100 nm (1:1)) was taken as the sensitivity of the resist.

[Line Width Roughness (LWR)]

The line-and-space resist pattern of 100 nm (1:1) was observed using a Critical Dimension scanning electron microscope (SEM; S-9380II, manufactured by Hitachi, Ltd.). The line width was measured at 50 points at regular intervals in the range of 2 μm in the longitudinal direction of the space pattern, and from its standard deviation, 3σ (nm) was computed, whereby the line width roughness was measured. A smaller value indicates better performance.

[Focus Latitude (DOF)]

The exposure dose and focus for forming a line-and-space resist pattern of 100 nm (1:1) were defined as an optimal exposure dose and an optimal focus, respectively. The focus was changed (defocused) while keeping the exposure dose at the optimal exposure dose, and the range of focus allowing for a pattern size of 100 nm±10% was determined. As the value is larger, the change in performance due to change of focus is smaller and the focus latitude (DOF) is better.

[Bridge Defect (Pattern Profile)]

The line-and-space resist pattern of 100 nm (1:1) at the optimal exposure dose and optimal focus was observed using a Critical Dimension scanning electron microscope (SEM, S-9380II, manufactured by Hitachi Ltd.). The level giving no bridge defect was rated A (Good), the level giving no bridge defect but giving a T-top profile was rated B (Fair), and the level giving a bridge defect was rated C (Insufficient).

The evaluation results of Examples are shown together in Table 11 below.

TABLE 11

| | Resist | $E_{opt}$ [mJ/cm$^2$] | LWR [nm] | DOF [μm] | Pattern Profile | Dimension Before Bridge [nm] |
|---|---|---|---|---|---|---|
| Example (1-1) | Ar1-1 | 28.7 | 4.6 | 0.65 | A | 30 |
| Example (1-2) | Ar1-2 | 31.5 | 4.1 | 0.65 | A | 34 |
| Example (1-3) | Ar1-3 | 19.6 | 5.5 | 0.61 | A | 34 |
| Example (1-4) | Ar1-4 | 34.1 | 3.3 | 0.85 | A | 28 |
| Example (1-5) | Ar1-5 | 22.3 | 2.9 | 0.57 | A | 36 |
| Example (1-6) | Ar1-6 | 20.7 | 3.8 | 0.62 | A | 25 |
| Example (1-7) | Ar1-7 | 41.5 | 4.2 | 0.70 | A | 36 |
| Example (1-8) | Ar1-8 | 23.9 | 5.2 | 0.60 | A | 32 |
| Example (1-9) | Ar1-9 | 36.7 | 5.0 | 0.70 | A | 40 |

TABLE 11-continued

| | Resist | $E_{opt}$ [mJ/cm$^2$] | LWR [nm] | DOF [μm] | Pattern Profile | Dimension Before Bridge [nm] |
|---|---|---|---|---|---|---|
| Example (1-10) | Ar1-10 | 33.4 | 2.8 | 0.89 | A | 28 |
| Example (1-11) | Ar1-11 | 35.1 | 3.8 | 0.58 | A | 27 |
| Example (1-12) | Ar1-12 | 22.0 | 3.0 | 0.91 | A | 29 |
| Example (1-13) | Ar1-13 | 46.3 | 6.8 | 0.65 | A | 26 |
| Example (1-14) | Ar1-14 | 29.5 | 6.4 | 0.63 | A | 28 |
| Example (1-15) | Ar1-15 | 25.8 | 3.8 | 0.87 | A | 22 |
| Example (1-16) | Ar1-16 | 37.8 | 4.6 | 0.56 | A | 34 |
| Example (1-17) | Ar1-17 | 22.1 | 3.2 | 0.69 | A | 33 |
| Example (1-18) | Ar1-18 | 30.3 | 4.3 | 0.72 | A | 32 |
| Example (1-19) | Ar1-19 | 21.0 | 5.0 | 0.56 | A | 35 |
| Example (1-20) | Ar1-20 | 22.6 | 3.8 | 0.74 | A | 34 |
| Example (1-21) | Ar1-21 | 48.1 | 6.0 | 0.60 | A | 25 |
| Example (1-22) | Ar1-22 | 21.5 | 5.2 | 0.56 | A | 32 |
| Example (1-23) | Ar1-23 | 29.4 | 4.4 | 0.82 | A | 24 |
| Example (1-24) | Ar1-24 | 30.7 | 4.4 | 0.78 | A | 22 |
| Example (1-25) | Ar1-25 | 38.6 | 5.8 | 0.71 | A | 30 |
| Example (1-26) | Ar1-26 | 23.3 | 5.2 | 0.71 | A | 27 |
| Example (1-27) | Ar1-2 | 33.1 | 6.4 | 0.59 | A | 33 |

As apparent from the results shown in Table 11, the composition according to Examples are excellent in the roughness characteristics, defocus latitude and bridge defect performance.

Examples 1-28 and 1-29

Line-and-space resist patterns of 100 nm (1:1) were obtained in the same manner as in the method of Example 1-1 except for employing the resist and conditions shown in Table 12 below.

TABLE 12

| | Resist | PB | Topcoat | Topcoat Baking | PEB | Developer | Rinsing Solution | Abbr. of Process |
|---|---|---|---|---|---|---|---|---|
| Example (1-28) | Ar1-1 | 100 C. 60 s | none | none | 80 C. 60 s | butyl acetate | 1-hexanol | E-B-D-R |
| Example (1-1) | Ar1-1 | 100 C. 60 s | none | none | 100 C. 60 s | butyl acetate | 1-hexanol | E-B-D-R |
| Example (1-29) | Ar1-1 | 100 C. 60 s | none | none | 120 C. 60 s | butyl acetate | 1-hexanol | E-B-D-R |

<Evaluation Method>

[PEB Temperature Dependency of Sensitivity]

With respect to Examples 1-28 and 1-29, the sensitivity $E_{opt}$ was measured in the same manner as above. The results obtained are shown in Table 13 below.

TABLE 13

| Example | Resist | PEB | $E_{opt}$ [mJ/cm$^2$] |
|---|---|---|---|
| Example (1-28) | Ar1-1 | 80 C. 60 s | 29.8 |
| Example (1-1) | Ar1-1 | 100 C. 60 s | 28.7 |
| Example (1-29) | Ar1-1 | 120 C. 60 s | 27.2 |

It is seen from the results shown in Table 13 that the composition according to Examples is low in the PEB temperature dependency of sensitivity.

<Resin (A)>

Resins (P1-15) to (P1-24) were synthesized in the same manner as Resin (P1-1).

-continued
P1-15
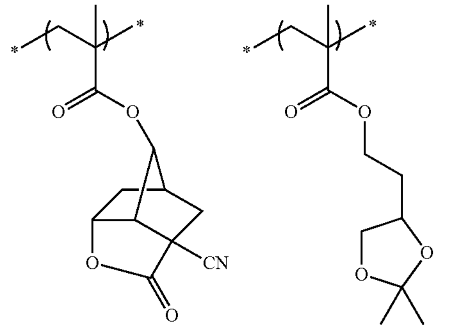
P1-16
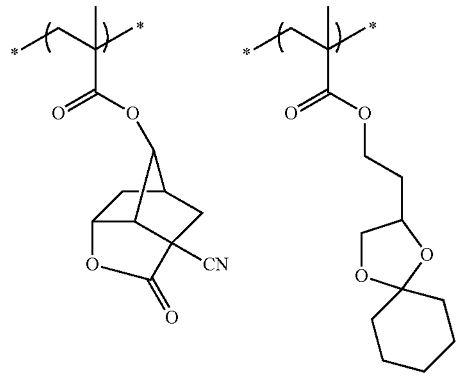
P1-17
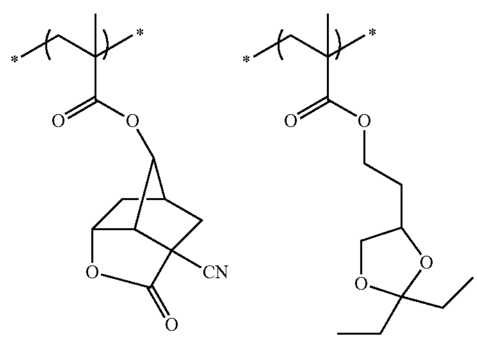
P1-18
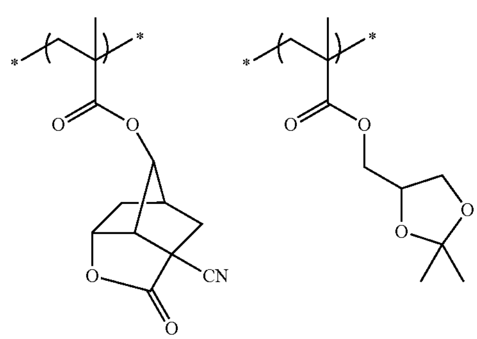
P1-19
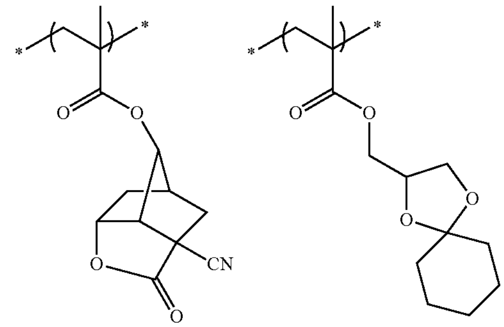
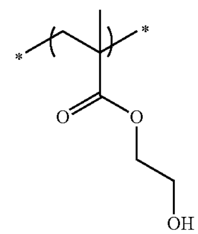
P1-20
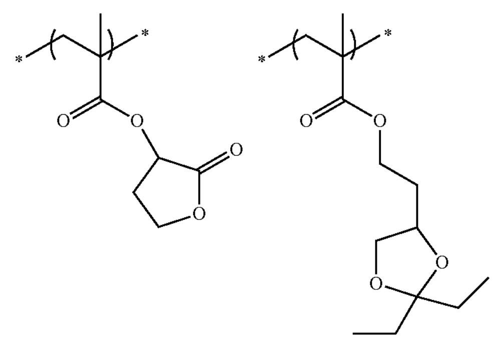
P1-21
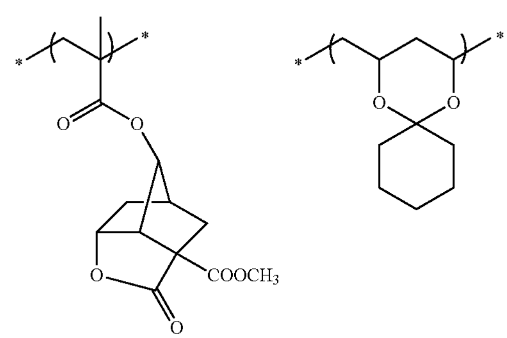

-continued

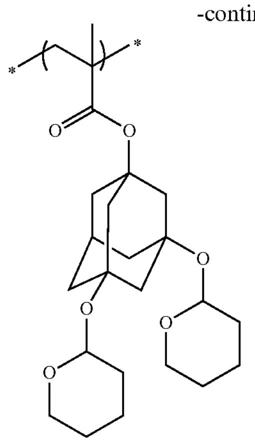

P1-22

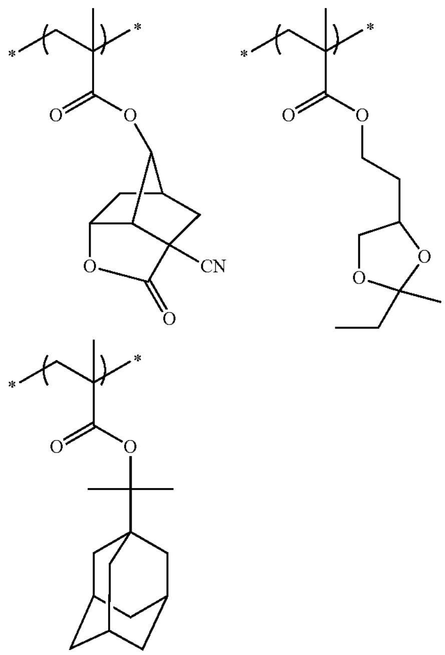

P1-23

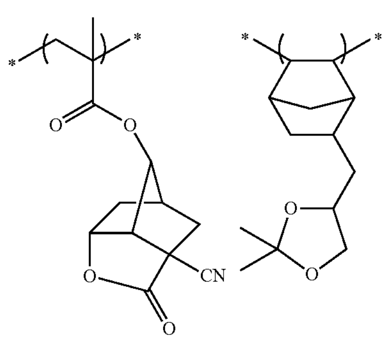

-continued

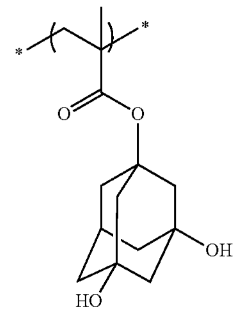

P1-24

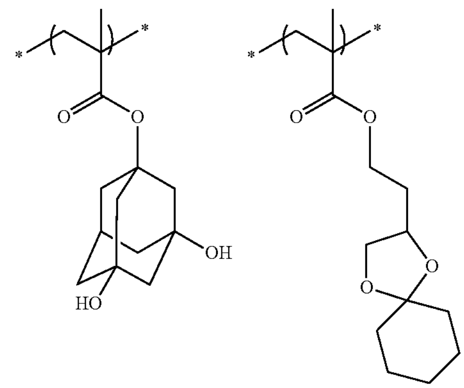

The compositional ratio (by mol), weight average molecular weight and polydispersity of each of Resins (P1-15) to (P1-24) are shown together in Table 14 below.

TABLE 14

| Resin | Composition (molar ratio) | Mw | Mw/Mn |
|---|---|---|---|
| (P1-15) | 40/60 | 9500 | 1.5 |
| (P1-16) | 40/60 | 9000 | 1.5 |
| (P1-17) | 50/50 | 12000 | 1.6 |
| (P1-18) | 40/60 | 11500 | 1.5 |
| (P1-19) | 40/50/10 | 10600 | 1.6 |
| (P1-20) | 50/50 | 8900 | 1.5 |
| (P1-21) | 40/10/50 | 11400 | 1.6 |
| (P1-22) | 40/50/10 | 10000 | 1.5 |
| (P1-23) | 30/60/10 | 13200 | 1.6 |
| (P1-24) | 20/80 | 8800 | 1.6 |

<Preparation of Resist Composition>

Using these resins, resist compositions shown in Table 15 below were prepared in the same manner as above.

TABLE 15

| Resist | Resin (A) | mass/g | Acid Generator | mass/g | Acid Generator used in Combination | mass/g | Compound (G) | mass/g |
|---|---|---|---|---|---|---|---|---|
| Ar1-29 | (P1-15) | 10 | (PAG-1) | 0.8 | | | (B-7) | 0.09 |
| Ar1-30 | (P1-16) | 10 | (PAG-2) | 0.8 | | | (B-8) | 0.09 |
| Ar1-31 | (P1-17) | 10 | (PAG-3) | 0.8 | | | (B-9) | 0.09 |
| Ar1-32 | (P1-18) | 10 | (PAG-4) | 1.2 | (PAG-1) | 0.3 | (B-10) | 0.09 |
| Ar1-33 | (P1-19) | 10 | (PAG-5) | 0.4 | (PAG-6) | 0.4 | (B-11) | 0.09 |

TABLE 15-continued

| | | | | | | | | |
|---|---|---|---|---|---|---|---|---|
| Ar1-34 | (P1-20) | 10 | (PAG-6) | 0.3 | (PAG-7) | 0.5 | (B-12) | 0.09 |
| Ar1-35 | (P1-21) | 10 | (PAG-8) | 0.8 | | | (B-8) | 0.15 |
| Ar1-36 | (P1-22) | 10 | (PAG-10) | 0.5 | (PAG-1) | 0.3 | (B-10)/(B-13) | 0.06/0.09 |
| Ar1-37 | (P1-23) | 10 | (PAG-11) | 0.4 | (PAG-6) | 0.4 | (B-11) | 0.15 |
| Ar1-38 | (P1-24) | 10 | (PAG-12) | 0.3 | (PAG-7) | 0.5 | (B-12) | 0.15 |
| Ar1-39 | (P1-15) | 10 | (PAG-3) | 0.8 | | | (B-12) | 0.15 |
| Ar1-40 | (P1-16) | 10 | (PAG-4) | 1.2 | (PAG-1) | 0.3 | (B-11) | 0.15 |
| Ar1-41 | (P1-17) | 10 | (PAG-5) | 0.4 | (PAG-6) | 0.4 | (B-10) | 0.15 |
| Ar1-42 | (P1-18) | 10 | (PAG-6) | 0.8 | | | (B-7)/(B-9) | 0.09/0.06 |
| Ar1-43 | (P1-19) | 10 | (PAG-7) | 0.8 | | | (B-8) | 0.15 |
| Ar1-44 | (P1-20) | 10 | (PAG-8) | 0.8 | | | (B-7) | 0.15 |
| Ar1-45 | (P1-21) | 10 | (PAG-10) | 0.5 | (PAG-1) | 0.3 | (B-14) | 0.09 |
| Ar1-46 | (P1-22) | 10 | (PAG-12) | 0.3 | (PAG-7) | 0.5 | (B-16) | 0.09 |
| Ar1-47 | (P1-23) | 10 | (PAG-1) | 0.8 | | | (B-17) | 0.09 |
| Ar1-48 | (P1-24) | 10 | (PAG-2) | 0.8 | | | (B-18) | 0.09 |

| Resist | Compound (H) or Compound (PA) | mass/g | Surfactant | mass/g | Hydrophobic Resin | mass/g | Solvent | Mass Ratio |
|---|---|---|---|---|---|---|---|---|
| Ar1-29 | (B-1) | 0.06 | W-1 | 0.04 | (1b) | 0.06 | A3/B2 | 80/20 |
| Ar1-30 | (B-2) | 0.06 | W-2 | 0.04 | (2b) | 0.06 | A1/A2/B1 | 50/4/46 |
| Ar1-31 | (B-3) | 0.06 | | | (3b) | 0.06 | A1/B1 | 60/40 |
| Ar1-32 | (B-4) | 0.06 | W-1 | 0.04 | | | A1/B2 | 80/20 |
| Ar1-33 | (B-5) | 0.06 | W-2 | 0.04 | (1b) | 0.06 | A2/B3 | 70/30 |
| Ar1-34 | (B-6) | 0.06 | W-3 | 0.04 | (2b) | 0.06 | A3/B4 | 80/20 |
| Ar1-35 | | | W-1 | 0.04 | (4b) | 0.06 | A1/A2/B1 | 50/4/46 |
| Ar1-36 | | | W-3 | 0.04 | | | A1/B2 | 80/20 |
| Ar1-37 | | | W-4 | 0.04 | (1b) | 0.06 | A2/B3 | 70/30 |
| Ar1-38 | | | W-1 | 0.04 | (2b) | 0.06 | A3/B4 | 80/20 |
| Ar1-39 | | | W-4 | 0.04 | (5b) | 0.06 | A1/B1 | 60/40 |
| Ar1-40 | | | W-1 | 0.04 | (6b) | 0.06 | A1/B2 | 80/20 |
| Ar1-41 | | | W-2 | 0.04 | (1b) | 0.06 | A2/B3 | 70/30 |
| Ar1-42 | | | W-3 | 0.04 | (2b) | 0.06 | A3/B4 | 80/20 |
| Ar1-43 | | | W-4 | 0.04 | (3b) | 0.06 | A3/B2 | 80/20 |
| Ar1-44 | | | W-1 | 0.04 | (4b) | 0.06 | A1/A2/B1 | 50/4/46 |
| Ar1-45 | (B-5) | 0.06 | W-3 | 0.04 | (6b) | 0.06 | A1/B2 | 80/20 |
| Ar1-46 | (B-3) | 0.06 | W-1 | 0.04 | (2b) | 0.06 | A3/B4 | 80/20 |
| Ar1-47 | (B-2) | 0.06 | W-2 | 0.04 | (3b) | 0.06 | A3/B2 | 80/20 |
| Ar1-48 | (B-1) | 0.06 | W-3 | 0.04 | (4b) | 0.06 | A1/A2/B1 | 50/4/46 |

Using these resist compositions, resist patterns were formed under the conditions shown in Table 16 below. In Table 16, the items such as “Abbr. of Process” have the same meanings as those described for Table 10.

The evaluation results of these Examples are shown together in Table 17 below. The evaluation methods and the like are the same as those described above.

TABLE 16

| Example | Resist | PB | Topcoat | Topcoat Baking | PEB | Developer (mass ratio) | Rinsing Solution (mass ratio) | Abbr. of Process |
|---|---|---|---|---|---|---|---|---|
| Example (1-30) | Ar1-29 | 100 C. 60 s | none | none | 100 C. 60 s | butyl acetate | 1-hexanol | E-B-D-R |
| Example (1-31) | Ar1-30 | 100 C. 60 s | none | none | 100 C. 60 s | butyl acetate | 1-hexanol | E-B-D-R |
| Example (1-32) | Ar1-31 | 100 C. 60 s | none | none | 100 C. 60 s | B1 | 1-hexanol | E-B-D-R |
| Example (1-33) | Ar1-32 | 100 C. 60 s | t-1 | 100 C. 60 s | 100 C. 60 s | B1 | 4-methyl-2-pentanol | tiE-B-D-R |
| Example (1-34) | Ar1-33 | 100 C. 60 s | none | none | 100 C. 60 s | butyl acetate | 4-methyl-2-pentanol | E-B-D-R |
| Example (1-35) | Ar1-34 | 100 C. 60 s | none | none | 100 C. 60 s | butyl acetate/B1 (50/50) | 4-methyl-2-pentanol | iE-B-D-R |
| Example (1-36) | Ar1-35 | 100 C. 60 s | none | none | 100 C. 60 s | butyl acetate | 1-hexanol/4-methyl-2-pentanol (50/50) | iE-B-D-R |
| Example (1-37) | Ar1-36 | 100 C. 60 s | none | none | 100 C. 60 s | butyl acetate | 1-hexanol | E-B-D-R |
| Example (1-38) | Ar1-37 | 100 C. 60 s | none | none | 100 C. 60 s | butyl acetate | 1-hexanol | E-B-D-R |
| Example (1-39) | Ar1-38 | 100 C. 60 s | none | none | 100 C. 60 s | butyl acetate | 1-hexanol | iE-B-D-R |
| Example (1-40) | Ar1-39 | 100 C. 60 s | none | none | 100 C. 60 s | A1 | A1 | E-B-D-R |
| Example (1-41) | Ar1-40 | 100 C. 60 s | none | none | 100 C. 60 s | butyl acetate | 4-methyl-2-pentanol | E-B-D-R2 |
| Example (1-42) | Ar1-41 | 100 C. 60 s | none | none | 100 C. 60 s | butyl acetate | 4-methyl-2-pentanol | E-B-D2-R |
| Example (1-43) | Ar1-42 | 100 C. 60 s | none | none | 100 C. 60 s | butyl acetate | 1-hexanol | E-B-D-R |
| Example (1-44) | Ar1-43 | 100 C. 60 s | none | none | 100 C. 60 s | butyl acetate | 1-hexanol | E-B-D-R |
| Example (1-45) | Ar1-44 | 100 C. 60 s | none | none | 100 C. 60 s | B1 | 1-hexanol | E-B-D-R |
| Example (1-46) | Ar1-45 | 100 C. 60 s | none | none | 100 C. 60 s | butyl acetate | 1-hexanol | E-B-D-R |
| Example (1-47) | Ar1-46 | 100 C. 60 s | none | none | 100 C. 60 s | B1 | 1-hexanol | iE-B-D-R |
| Example (1-48) | Ar1-47 | 100 C. 60 s | none | none | 100 C. 60 s | B1 | 4-methyl-2-pentanol | iE-B-D-R |
| Example (1-49) | Ar1-48 | 100 C. 60 s | none | none | 100 C. 60 s | butyl acetate | 4-methyl-2-pentanol | E-B-D-R |
| Example (1-50) | Ar1-30 | 100 C. 60 s | none | none | 100 C. 60 s | butyl acetate | 1-hexanol | I-E-B-D-R |

TABLE 17

| | Resist | $E_{opt}$ [mJ/cm$^2$] | LWR [nm] | DOF [µm] | Pattern Profile | Dimension Before Bridge [nm] |
|---|---|---|---|---|---|---|
| Example (1-30) | Ar1-29 | 31.6 | 4.5 | 0.73 | A | 29 |
| Example (1-31) | Ar1-30 | 39.7 | 3.9 | 0.68 | A | 34 |
| Example (1-32) | Ar1-31 | 13.7 | 4.9 | 0.77 | A | 32 |
| Example (1-33) | Ar1-32 | 30.3 | 2.9 | 0.99 | A | 27 |
| Example (1-34) | Ar1-33 | 21.2 | 2.8 | 0.62 | A | 37 |
| Example (1-35) | Ar1-34 | 27.5 | 3.6 | 0.68 | A | 24 |
| Example (1-36) | Ar1-35 | 30.1 | 4.8 | 0.68 | A | 33 |
| Example (1-37) | Ar1-36 | 29.7 | 2.7 | 1.13 | A | 26 |
| Example (1-38) | Ar1-37 | 33.3 | 3.4 | 0.67 | A | 28 |
| Example (1-39) | Ar1-38 | 29.3 | 2.6 | 0.99 | A | 30 |
| Example (1-40) | Ar1-39 | 18.1 | 3.4 | 0.98 | A | 21 |
| Example (1-41) | Ar1-40 | 33.6 | 4.3 | 0.58 | A | 33 |
| Example (1-42) | Ar1-41 | 21.0 | 3.1 | 0.88 | A | 35 |
| Example (1-43) | Ar1-42 | 40.3 | 4.1 | 0.84 | A | 30 |
| Example (1-44) | Ar1-43 | 23.1 | 4.5 | 0.61 | A | 33 |
| Example (1-45) | Ar1-44 | 28.5 | 3.4 | 0.81 | A | 31 |
| Example (1-46) | Ar1-45 | 19.1 | 4.9 | 0.63 | A | 30 |
| Example (1-47) | Ar1-46 | 40.8 | 4.0 | 0.99 | A | 23 |
| Example (1-48) | Ar1-47 | 42.5 | 5.6 | 0.82 | A | 34 |
| Example (1-49) | Ar1-48 | 29.4 | 4.9 | 0.77 | A | 25 |
| Example (1-50) | Ar1-30 | 44.7 | 5.7 | 0.65 | A | 33 |

It is seen from the results shown in Table 17 that the compositions according to Examples are excellent in terms of roughness characteristics, focus latitude and bridge defect performance.

The PEB temperature dependency was evaluated in the same manner as above except for employing the resists and conditions shown in Table 18 below. The results obtained are shown in Table 19 below.

TABLE 18

| | Resist | PB | Topcoat | Topcoat Baking | PEB | Developer | Rinsing Solution | Abbr. of Process |
|---|---|---|---|---|---|---|---|---|
| Example (1-51) | Ar1-29 | 100 C. 60 s | none | none | 80 C. 60 s | butyl acetate | 1-hexanol | E-B-D-R |
| Example (1-52) | Ar1-29 | 100 C. 60 s | none | none | 100 C. 60 s | butyl acetate | 1-hexanol | E-B-D-R |
| Example (1-53) | Ar1-29 | 100 C. 60 s | none | none | 120 C. 60 s | butyl acetate | 1-hexanol | E-B-D-R |

TABLE 19

| Example | Resist | PEB | $E_{opt}$ [mJ/cm$^2$] |
|---|---|---|---|
| Example (1-51) | Ar1-29 | 80 C. 60 s | 32.7 |
| Example (1-52) | Ar1-29 | 100 C. 60 s | 31.6 |
| Example (1-53) | Ar1-29 | 120 C. 60 s | 31.1 |

It is seen from the results shown in Table 19 that the compositions according to Examples are low in the PEB temperature dependency of sensitivity.

INDUSTRIAL APPLICABILITY

According to the present invention, there can be provided a pattern forming method capable of forming a pattern favored with wide focus latitude (DOF), small line width variation (LWR) and excellent pattern profile and reduced in the bridge defect, an actinic ray-sensitive or radiation-sensitive resin composition (preferably a chemical amplification resist composition, more preferably a chemical amplification negative resist composition), and a resist film.

The entire disclosure of Japanese Patent Application No. 2010-3386 filed on Jan. 8, 2010, Japanese Patent Application No. 2010-77431 filed on Mar. 30, 2010 and Japanese Patent Application No. 2010-261576 filed on Nov. 24, 2010, from which the benefit of foreign priority has been claimed in the present application, is incorporated herein by reference, as if fully set forth.

The invention claimed is:

1. A pattern forming method comprising:

(i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid, wherein the compound (G) has a molecular weight of 500 or less.

2. The pattern forming method according to claim 1, wherein the resin (A) contains a first repeating unit having a group capable of decomposing by the action of an acid to produce an alcoholic hydroxy group.

3. The pattern forming method according to claim 1, wherein the compound (G) is a nitrogen-containing compound.

4. The pattern forming method according to claim 3, wherein the compound (G) is a compound represented by the following formula (1):

(1)

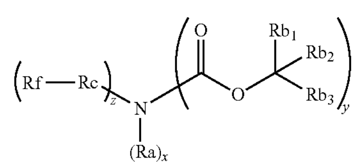

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and $x+y+z=3$, when $x=z=1$, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

5. The pattern forming method according to claim 1, wherein the composition further contains a crosslinking agent (C).

6. The pattern forming method according to claim 1, wherein the developer contains at least one kind of an organic solvent selected from a ketone solvent, an ester solvent, an alcohol solvent, an amide solvent and an ether solvent.

7. The pattern forming method according to claim 1, which further comprises (iv) a step of rinsing the film with a rinsing solution.

8. The pattern forming method according to claim 7, wherein the rinsing solution is preferably a rinsing solution containing at least one kind of an organic solvent selected from a hydrocarbon solvent, a ketone solvent, an ester solvent, an alcohol solvent, an amide solvent and an ether solvent.

9. The pattern forming method according to claim 1, wherein an exposure in the step of exposing the film is an immersion exposure.

10. The pattern forming method according to claim 1, wherein the resin (A) contains at least either a repeating unit represented by formula (1) or a repeating unit represented by formula (2):

(1)

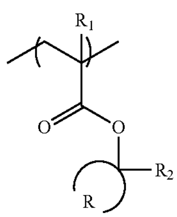

(2)

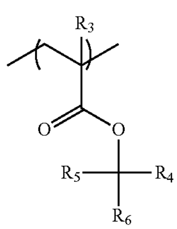

wherein, in formulae (1) and (2), each of $R_1$ and $R_3$ independently represents a hydrogen atom, a methyl group which may have a substituent, or a group represented by —$CH_2$—$R_9$;

$R_9$ represents a hydroxyl group or a monovalent organic group;

each of $R_2$, $R_4$, $R_5$ and $R_6$ independently represents an alkyl group or a cycloalkyl group; and R represents an atomic group necessary for forming an alicyclic structure together with the carbon atom.

11. The pattern forming method according to claim 10, wherein the resin (A) contains both a repeating unit represented by formula (1) and a repeating unit represented by formula (2).

12. A chemical amplification resist composition comprising:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid, wherein the compound (G) is a nitrogen-containing compound; and the compound (G) is a compound represented by the following formula (1):

(1)

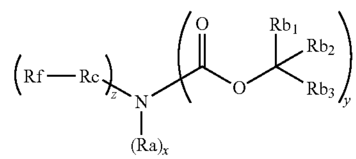

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and x+y+z=3, when x=z=1, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

13. The chemical amplification resist composition according to claim 12, wherein the resin (A) contains a first repeating unit having a group capable of decomposing by the action of an acid to produce an alcoholic hydroxy group.

14. The chemical amplification resist composition according to claim 12, wherein the compound (G) has a molecular weight of 500 or less.

15. The chemical amplification resist composition according to claim 12, wherein the composition further contains a crosslinking agent (C).

16. A resist film formed by the composition according to claim 12.

17. The chemical amplification resist composition according to claim 12, wherein the resin (A) contains at least either a repeating unit represented by formula (1) or a repeating unit represented by formula (2):

(1)

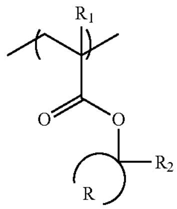

(2)

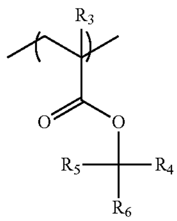

wherein, in formulae (1) and (2), each of $R_1$ and $R_3$ independently represents a hydrogen atom, a methyl group which may have a substituent, or a group represented by —$CH_2$—$R_9$;

$R_9$ represents a hydroxyl group or a monovalent organic group;

each of $R_2$, $R_4$, $R_5$ and $R_6$ independently represents an alkyl group or a cycloalkyl group; and R represents an atomic group necessary for forming an alicyclic structure together with the carbon atom.

18. The chemical amplification resist composition according to claim 17, wherein the resin (A) contains both a repeating unit represented by formula (1) and a repeating unit represented by formula (2).

19. A pattern forming method comprising:

(i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid;

wherein the compound (G) is a compound represented by the following formula (1):

(1)

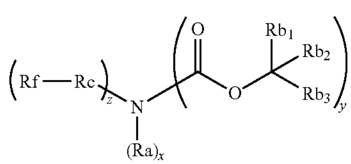

wherein, each of Ra, $Rb_1$, $Rb_2$ and $Rb_3$ independently represents a hydrogen atom, an alkyl group, a cycloalkyl group, an aryl group or an aralkyl group, and two members out of $Rb_1$ to $Rb_3$ may combine with each other to form a ring, provided that all of $Rb_1$ to $Rb_3$ are not a hydrogen atom at the same time, Rc represents a single bond or a divalent linking group, Rf represents an organic group, x represents 0 or 1, y represents 1 or 2, z represents 1 or 2, and x+y+z=3, when x=z=1, Ra and Rc may combine with each other to form a nitrogen-containing heterocyclic ring, when z=1, the organic group as Rf contains a fluorine atom or a silicon atom, when z=2, at least either one of two Rf's contains a fluorine atom or a silicon atom, when z=2, two Rc's may be the same or different, two Rf's may be the same or different, and two Rc's may combine with each other to form a ring, when y=2, two $Rb_1$'s may be the same or different, two $Rb_2$'s may be the same or different, and two $Rb_3$'s may be the same or different.

20. The pattern forming method according to claim 19, wherein the developer contains at least one kind of an organic solvent selected from a ketone solvent, an ester solvent, an alcohol solvent, an amide solvent and an ether solvent.

21. The pattern forming method according to claim 19, wherein the resin (A) contains at least either a repeating unit represented by formula (1) or a repeating unit represented by formula (2):

(1)

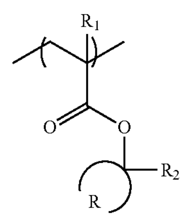

(2)

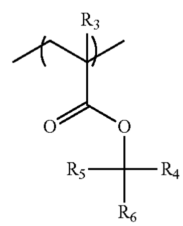

wherein, in formulae (1) and (2), each of $R_1$ and $R_3$ independently represents a hydrogen atom, a methyl group which may have a substituent, or a group represented by —$CH_2$—$R_9$;

$R_9$ represents a hydroxyl group or a monovalent organic group;

each of $R_2$, $R_4$, $R_5$ and $R_6$ independently represents an alkyl group or a cycloalkyl group;

R represents an atomic group necessary for forming an alicyclic structure together with the carbon atom.

22. The pattern forming method according to claim 21, wherein the resin (A) contains both a repeating unit represented by formula (1) and a repeating unit represented by formula (2).

23. A pattern forming method comprising:

(i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid;

wherein the composition further contains a crosslinking agent (C).

24. The pattern forming method according to claim 23, wherein the developer contains at least one kind of an organic solvent selected from a ketone solvent, an ester solvent, an alcohol solvent, an amide solvent and an ether solvent.

25. The pattern forming method according to claim 23, wherein the resin (A) contains at least either a repeating unit represented by formula (1) or a repeating unit represented by formula (2):

(1)

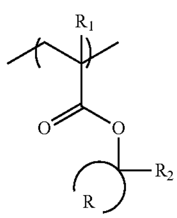

(2)

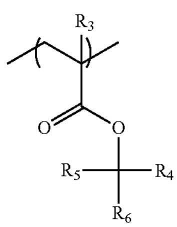

wherein, in formulae (1) and (2), each of $R_1$ and $R_3$ independently represents a hydrogen atom, a methyl group which may have a substituent, or a group represented by $—CH_2—R_9$;

$R_9$ represents a hydroxyl group or a monovalent organic group;

each of $R_2$, $R_4$, $R_5$ and $R_6$ independently represents an alkyl group or a cycloalkyl group; and R represents an atomic group necessary for forming an alicyclic structure together with the carbon atom.

26. The pattern forming method according to claim 25, wherein the resin (A) contains both a repeating unit represented by formula (1) and a repeating unit represented by formula (2).

27. A pattern forming method comprising:

(i) a step of forming a film from an actinic ray-sensitive or radiation-sensitive resin composition, (ii) a step of exposing the film, and (iii) a step of developing the exposed film by using an organic solvent-containing developer, wherein the actinic ray-sensitive or radiation-sensitive resin composition comprises:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and having basicity or being capable of increasing the basicity by the action of an acid;

wherein the compound (G) is a nitrogen-containing compound;

the compound (G) does not have a carbonyl group, sulfonyl group, cyano group or halogen atom bonded directly to a nitrogen atom; and the developer contains at least one kind of an organic solvent selected from a ketone solvent, an ester solvent, an amide solvent and an ether solvent.

28. The pattern forming method according to claim 27, wherein the compound (G) is a resin.

29. The pattern forming method according to claim 27, wherein the composition further contains a hydrophobic resin that is not equivalent to the component (G).

30. The pattern forming method according to claim 29, wherein the hydrophobic resin that is not equivalent to the component (G) has at least either a fluorine atom or a silicon atom.

31. The pattern forming method according to claim 27, wherein the resin (A) contains at least either a repeating unit represented by formula (1) or a repeating unit represented by formula (2):

(1)

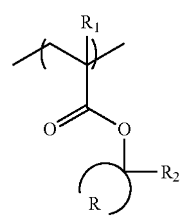

(2)

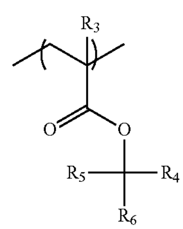

wherein, in formulae (1) and (2), each of $R_1$ and $R_3$ independently represents a hydrogen atom, a methyl group which may have a substituent, or a group represented by $—CH_2—R_9$;

$R_9$ represents a hydroxyl group or a monovalent organic group;

each of $R_2$, $R_4$, $R_5$ and $R_6$ independently represents an alkyl group or a cycloalkyl group; and R represents an atomic group necessary for forming an alicyclic structure together with the carbon atom.

32. The pattern forming method according to claim 31, wherein the resin (A) contains both a repeating unit represented by formula (1) and a repeating unit represented by formula (2).

33. A chemical amplification resist composition comprising:

(A) a resin capable of decreasing the solubility for an organic solvent-containing developer by the action of an acid, (B) a compound capable of generating an acid upon irradiation with an actinic ray or radiation, (D) a solvent, and (G) a compound having at least either one of a fluorine atom and a silicon atom and being capable of increasing the basicity by the action of an acid;

wherein the compound (G) is a resin.

34. The chemical amplification resist composition according to claim 33, wherein the compound (G) contains a nitrogen atom; and does not have a carbonyl group, sulfonyl group, cyano group or a halogen atom bonded directly to the nitrogen atom.

35. The chemical amplification resist composition according to claim 33, wherein the resin (A) contains at least either a repeating unit represented by formula (1) or a repeating unit represented by formula (2):

(1)

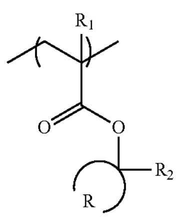

-continued (2)

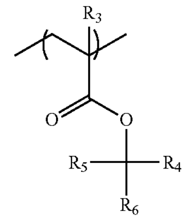

wherein, in formulae (1) and (2), each of $R_1$ and $R_3$ independently represents a hydrogen atom, a methyl group which may have a substituent, or a group represented by —$CH_2$—$R_9$;

$R_9$ represents a hydroxyl group or a monovalent organic group;

each of $R_2$, $R_4$, $R_5$ and $R_6$ independently represents an alkyl group or a cycloalkyl group; and R represents an atomic group necessary for forming an alicyclic structure together with the carbon atom.

36. The chemical amplification resist composition according to claim 35, wherein the resin (A) contains both the repeating unit represented by formula (1) and the repeating unit represented by formula (2).

* * * * *